(12) United States Patent

Hinoue et al.

(10) Patent No.: US 12,666,618 B2

(45) Date of Patent: Jun. 23, 2026

(54) THREE-DIMENSIONAL MEMORY DEVICE INCLUDING A SCHOTTKY SOURCE CONTACT STRUCTURE AND METHODS FOR FORMING THE SAME

(71) Applicant: SANDISK TECHNOLOGIES LLC, Addison, TX (US)

(72) Inventors: Tatsuya Hinoue, Yokkaichi (JP); Makoto Koto, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 381 days.

(21) Appl. No.: 18/413,918

(22) Filed: Jan. 16, 2024

(65) Prior Publication Data

US 2025/0234544 A1 Jul. 17, 2025

(51) Int. Cl.

| | |
|---|---|
| *H10B 43/27* | (2023.01) |
| *G11C 16/04* | (2006.01) |
| *H10B 41/10* | (2023.01) |
| *H10B 41/27* | (2023.01) |
| *H10B 41/35* | (2023.01) |
| *H10B 43/10* | (2023.01) |
| *H10B 43/35* | (2023.01) |
| *H10D 64/64* | (2025.01) |

(52) U.S. Cl.

CPC ......... *H10B 43/27* (2023.02); *G11C 16/0483* (2013.01); *H10B 41/10* (2023.02); *H10B 41/27* (2023.02); *H10B 41/35* (2023.02); *H10B 43/10* (2023.02); *H10B 43/35* (2023.02); *H10D 64/64* (2025.01)

(58) Field of Classification Search

CPC ............................... H10B 43/27; H10B 41/27

See application file for complete search history.

(56) References Cited

U.S. PATENT DOCUMENTS

| | | | |
|---|---|---|---|
| 10,629,616 | B1 | 4/2020 | Kai et al. |
| 11,195,781 | B2 | 12/2021 | Okina et al. |
| 11,201,107 | B2 | 12/2021 | Okina et al. |
| 11,355,486 | B2 | 6/2022 | Mizutani et al. |
| 11,393,836 | B2 | 7/2022 | Tsutsumi et al. |
| 11,482,539 | B2 | 10/2022 | Sharangpani et al. |

(Continued)

OTHER PUBLICATIONS

ISR—Notification of Transmittal of The International Search Report and The Written Opinion of the International Searching Authority for International Patent Application No. PCT/US2024/054889, mailed on Feb. 13, 2025, 23 pages.

(Continued)

*Primary Examiner* — Matthew L Reames

(74) *Attorney, Agent, or Firm* — THE MARBURY LAW GROUP PLLC

(57) ABSTRACT

A semiconductor structure includes an alternating stack of insulating layers and electrically conductive layers located on a semiconductor layer, a memory opening vertically extending through the alternating stack and the semiconductor layer, a memory opening fill structure located in the memory opening and containing a memory film and a vertical semiconductor channel, and a source layer that is formed at the bottom end of a vertical semiconductor channel. The source layer may comprise at least one metal that provides a Schottky contact to the vertical semiconductor channel.

20 Claims, 109 Drawing Sheets

(56)      References Cited

U.S. PATENT DOCUMENTS

| | | |
|---|---|---|
| 11,508,711 B2 | 11/2022 | Ninomiya et al. |
| 11,631,690 B2 | 4/2023 | Okina et al. |
| 11,676,954 B2 | 6/2023 | Rabkin et al. |
| 2017/0294447 A1 | 10/2017 | Lee et al. |
| 2020/0258817 A1 | 8/2020 | Okina et al. |
| 2021/0035965 A1 | 2/2021 | Mizutani et al. |
| 2021/0091063 A1 | 3/2021 | Ninomiya et al. |
| 2021/0335807 A1 | 10/2021 | Wu et al. |
| 2022/0130853 A1 | 4/2022 | Sharangpani et al. |
| 2022/0157841 A1 | 5/2022 | Tsutsumi et al. |
| 2022/0157842 A1 | 5/2022 | Tsutsumi et al. |
| 2022/0189984 A1 | 6/2022 | Okina |
| 2022/0208748 A1 | 6/2022 | Rabkin et al. |
| 2022/0302151 A1 | 9/2022 | Zhang et al. |
| 2022/0336484 A1 | 10/2022 | Iwai et al. |
| 2023/0209831 A1 | 6/2023 | Hopkins et al. |
| 2023/0232624 A1 | 7/2023 | Iwai et al. |
| 2023/0299006 A1 * | 9/2023 | Kim ........................ H10B 43/27 |

OTHER PUBLICATIONS

Endoh et al., "Novel Ultra High-Density Memory with a Stacked-Surrounding Gate Transistor (S-SGT) Structured Cell," IEDM Proc. (2001) 33-36.
U.S. Appl. No. 17/655,272, filed Mar. 17, 2022, SanDisk Technologies LLC.
U.S. Appl. No. 17/659,057, filed Apr. 13, 2022, SanDisk Technologies LLC.
U.S. Appl. No. 17/661,783, filed May 3, 2022, SanDisk Technologies LLC.
U.S. Appl. No. 17/662,926, filed May 11, 2022, SanDisk Technologies LLC.
U.S. Appl. No. 17/684,975, filed Mar. 2, 2022, SanDisk Technologies LLC.
U.S. Appl. No. 17/806,406, filed Jun. 10, 2022, SanDisk Technologies LLC.
U.S. Appl. No. 17/806,415, filed Jun. 10, 2022, SanDisk Technologies LLC.
U.S. Appl. No. 17/931,362, filed Sep. 12, 2022, SanDisk Technologies LLC.
U.S. Appl. No. 18/343,118, filed Jun. 28, 2023, Western Digital Technologies, Inc.
U.S. Appl. No. 18/343,162, filed Jun. 28, 2023, Western Digital Technologies, Inc.
U.S. Appl. No. 18/347,838, filed Jul. 6, 2023, SanDisk Technologies LLC.
U.S. Appl. No. 18/350,573, filed Jul. 11, 2023, SanDisk Technologies LLC.
U.S. Appl. No. 18/355,765, filed Jul. 20, 2023, SanDisk Technologies LLC.
U.S. Appl. No. 18/357,634, filed Jul. 24, 2023, SanDisk Technologies LLC.
U.S. Appl. No. 18/357,702, filed Jul. 24, 2023, SanDisk Technologies LLC.
U.S. Appl. No. 18/362,743, filed Jul. 24, 2023, SanDisk Technologies LLC.
U.S. Appl. No. 18/362,761, filed Jul. 31, 2023, SanDisk Technologies LLC.
U.S. Appl. No. 18/362,805, filed Jul. 31, 2023, Western Digital Technologies, Inc.
U.S. Appl. No. 18/363,460, filed Aug. 1, 2023, SanDisk Technologies LLC.
U.S. Appl. No. 18/363,486, filed Aug. 1, 2023, SanDisk Technologies LLC.
U.S. Appl. No. 18/413,859, filed Jan. 16, 2024, SanDisk Technologies LLC.
U.S. Appl. No. 18/413,990, filed Jan. 16, 2024, SanDisk Technologies LLC.
U.S. Appl. No. 18/450,095, filed Aug. 15, 2023, Western Digital Technologies, Inc.
U.S. Appl. No. 18/479,457, filed Oct. 2, 2023, Western Digital Technologies, Inc.

* cited by examiner

102

104

106

32B(32)

46B(46)

44

32

46

62

52
54
56
50
55
60

THREE-DIMENSIONAL MEMORY DEVICE INCLUDING A SCHOTTKY SOURCE CONTACT STRUCTURE AND METHODS FOR FORMING THE SAME

FIELD

The present disclosure relates generally to the field of semiconductor devices, and particularly to three-dimensional memory devices including a Schottky source contact structure and methods for forming the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor structure is provided, which comprises: an alternating stack of insulating layers and electrically conductive layers that alternate along a vertical direction, wherein a bottommost layer of the alternating stack comprises a bottommost electrically conductive layer; a memory opening vertically extending through the alternating stack; a memory opening fill structure located in the memory opening and comprising a vertical semiconductor channel and a vertical stack of memory elements; and a source layer contacting a bottom surface of the bottommost electrically conductive layer and a bottom surface of the vertical semiconductor channel.

According to another aspect of the present disclosure, a semiconductor structure is provided, which comprises: an alternating stack of insulating layers and electrically conductive layer that alternate along a vertical direction, wherein a bottommost layer of the alternating stack comprises a bottommost electrically conductive layer; a memory opening vertically extending through the alternating stack; a memory opening fill structure located in the memory opening and comprising a vertical semiconductor channel and a vertical stack of memory elements; a semiconductor material layer underlying the alternating stack, contacting an outer sidewall of the memory film and not directly contacting the vertical semiconductor channel; and a source layer underlying and contacting a bottom surface of the semiconductor material layer and contacting a bottom surface of the vertical semiconductor channel.

According to yet another aspect of the present disclosure, a method of forming a semiconductor structure comprises forming a stopper film over a carrier substrate; forming an alternating stack of insulating layers and spacer material layers over the stopper film, wherein the spacer material layers are formed as or are subsequently replaced with electrically conductive layers; forming a memory opening through the alternating stack and through the stopper film; forming a memory opening fill structure in the memory opening, wherein the memory opening fill structure comprises a vertical semiconductor channel and a vertical stack of memory elements; removing the carrier substrate such that protruding end portions of the memory film and the vertical semiconductor channel protrude below the alternating stack and the stopper film; at least partially removing the protruding end portion of at least one of the memory film and the vertical semiconductor channel using the stopper film as stopper; and forming a source layer on an exposed remaining end surface of the vertical semiconductor channel.

According to still another aspect of the present disclosure, a semiconductor structure comprises: a planar dielectric layer; an alternating stack of insulating layers and electrically conductive layers located over the planar dielectric layer; a memory opening vertically extending through the alternating stack and the planar dielectric layer; a memory opening fill structure located in the memory opening and comprising a semiconductor channel, a drain region electrically contacting an upper portion of the semiconductor channel, and a vertical stack of memory elements; and a source layer electrically contacting a lower portion of the semiconductor channel, wherein the source layer comprises a planar base portion and first, second and third step portions which protrude upwards toward the drain region from the planar base portion.

According to another aspect of the present disclosure, a method of forming a semiconductor structure comprises: forming a stack of a first sacrificial pedestal and a second sacrificial pedestal in at least one planar dielectric layer that overlies a carrier substrate; forming an alternating stack of insulating layers and spacer material layers over the planar dielectric layer, wherein the spacer material layers are formed as or are subsequently replaced with electrically conductive layers; forming a memory opening through the alternating stack and into the second sacrificial pedestal; removing the second sacrificial pedestal selective to the first sacrificial pedestal to expand the memory opening; forming a memory opening fill structure in the expanded memory opening, wherein the memory opening fill structure comprises a memory film, a semiconductor channel and a drain region electrically contacting an upper portion of the semiconductor channel; removing the carrier substrate; removing the first sacrificial pedestal and an end portion of the memory film; and forming a source layer on a lower portion of the semiconductor channel and the at least one planar dielectric layer.

According to an aspect of the present disclosure, a semiconductor structure is provided, which comprises: an alternating stack of insulating layers and electrically conductive layers overlying an etch-stop dielectric layer; a memory opening vertically extending through the alternating stack and at least partly through the etch-stop dielectric layer; a memory opening fill structure located in the memory opening and comprising a vertical semiconductor channel, a dielectric core that is laterally surrounded by the vertical semiconductor channel, and a memory film that laterally surrounds the vertical semiconductor channel; a metal capping layer contacting an end portion of the vertical semiconductor channel and a bottom portion of the dielectric core; and a source layer contacting the metal capping layer and a bottom surface of the etch-stop dielectric layer.

According to another aspect of the present disclosure, a method of forming a semiconductor structure is provided, which comprises: forming an alternating stack of insulating layers and spacer material layers over a carrier substrate, wherein the spacer material layers are formed as, or are subsequently replaced with, electrically conductive layers; forming a memory opening through the alternating stack; forming a memory opening fill structure in the memory opening, wherein the memory opening fill structure comprises a memory film and a vertical semiconductor channel; removing the carrier substrate; removing an end portion of the memory film; converting an end portion of the vertical semiconductor channel to a metal capping layer; and forming a source layer on the metal capping layer.

DETAILED DESCRIPTION

Figure 1:
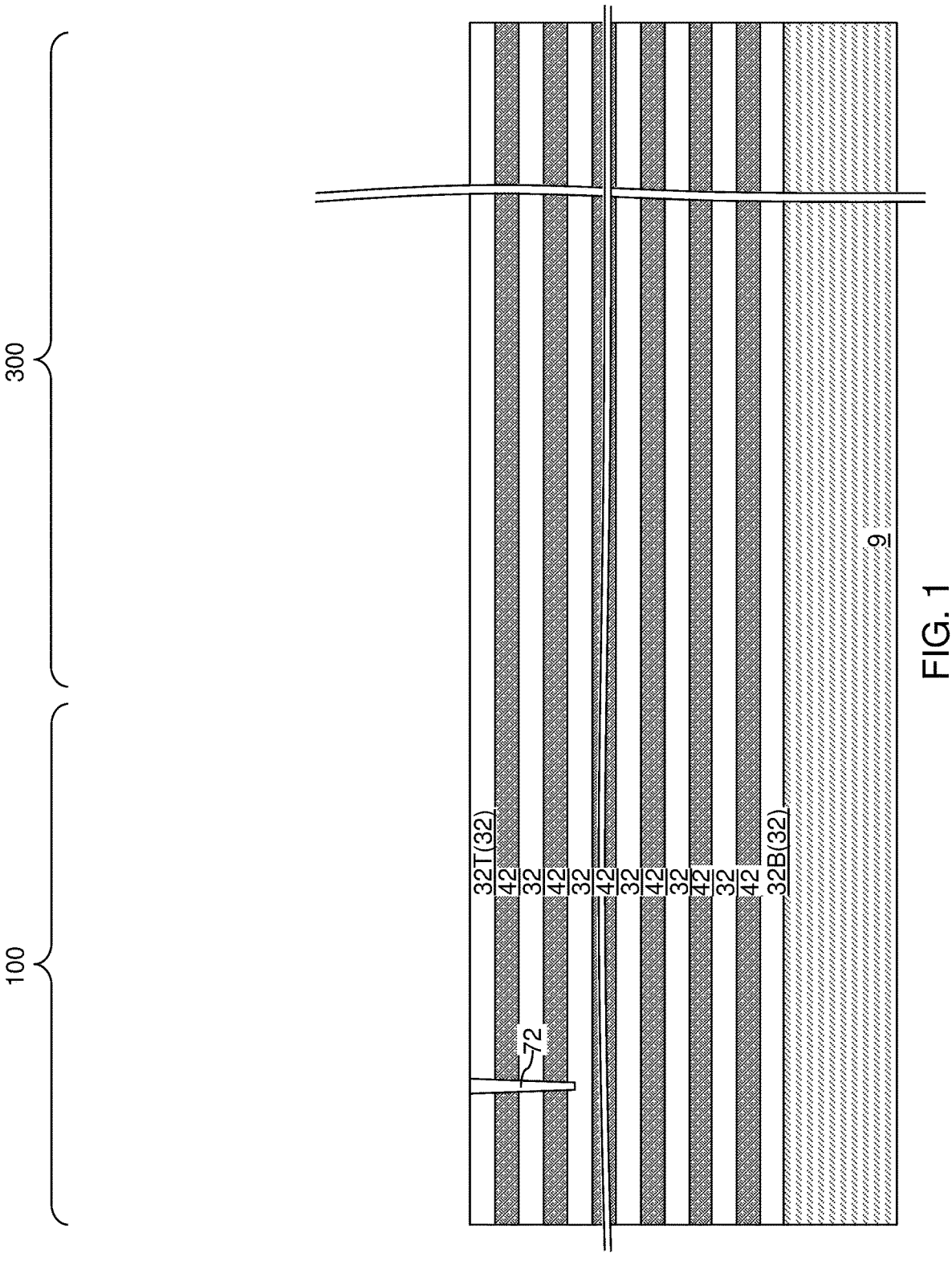
FIG. 1 is a schematic vertical cross-sectional view of a first exemplary structure after formation of an alternating stack of insulating layers and sacrificial material layers over a carrier substrate according to a first embodiment of the present disclosure.

As discussed above, the embodiments of the present disclosure are directed to a three-dimensional memory device including a Schottky source structure and methods for forming the same, the various aspects of which are described below. Embodiments of the disclosure can be employed to form various structures including a multilevel memory structure, non-limiting examples of which include three-dimensional memory devices comprising a plurality of memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, an element located "on" a second element can be located on the exterior side of a surface of the second element or on the interior side of the second element. As used herein, an element is located "directly on" a second element if there exist a physical contact between a surface of the element and a surface of the second element.

As used herein, an element is "electrically connected to" a second element if there exists a conductive path consisting of at least one conductive material between the element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased in a single erase operation. Each block contains a number of pages, which are the smallest unit that can be programmed, i.e., a smallest unit on which a read operation can be performed.

As used herein, a "semiconducting material" refers to a material having electrical conductivity in the range from $1\times10^{-5}$ S/m to $1\times10^{5}$ S/m. As used herein, a "semiconductor material" refers to a material having electrical conductivity in the range from $1\times10^{-5}$ S/m to 1 S/m in the absence of electrical dopants therein, and is capable of producing a doped material having electrical conductivity in a range from 1 S/m to $1\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1 \times 10^5$ S/m. As used herein, an "insulator material" or a "dielectric material" refers to a material having electrical conductivity less than $1 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1 \times 10^{-5}$ S/m to $1 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Referring to FIG. 1, a first exemplary structure according to a first embodiment of the present disclosure is illustrated. The first exemplary structure comprises a carrier substrate 9, which may be a semiconductor substrate or a conductive substrate. For example, the carrier substrate 9 may comprise a commercially available silicon wafer. Alternatively, the carrier substrate 9 may comprise any material that may be removed selective the materials of insulating layers 32 and dielectric material portions to be subsequently formed.

An alternating stack of first material layers and second material layers can be formed over the carrier substrate 9. The first material layers may be insulating layers, and the second material layers may be spacer material layers. In one embodiment, the spacer material layers may comprise sacrificial material layers 42. In this case, an alternating stack (32, 42) of insulating layers 32 and sacrificial material layers 42 can be formed over the carrier substrate 9. The insulating layers 32 comprise an insulating material such as undoped silicate glass or a doped silicate glass, and the sacrificial material layers 42 comprise a sacrificial material such as silicon nitride or a silicon-germanium alloy. In one embodiment, the insulating layers 32 (i.e., the first material layers) may comprise silicon oxide layers, and the sacrificial material layers 42 (i.e., the second material layers) may comprise silicon nitride layers.

The alternating stack (32, 42) may comprise multiple repetitions of a unit layer stack including an insulating layer 32 and a sacrificial material layer 42. The total number of repetitions of the unit layer stack within the alternating stack (32, 42) may be, for example, in a range from 8 to 1,024, such as from 32 to 256, although lesser and greater number of repetitions may also be employed. The topmost one of the insulating layers 32 is hereafter referred to as a topmost insulating layer 32T. The bottommost one of the insulating layers 32 is an insulating layer 32 that is most proximal to the carrier substrate 9 is herein referred to as a bottommost insulating layer 32B.

Each of the insulating layers 32 other than the topmost insulating layer 32T may have a thickness in a range from 20 nm to 100 nm, such as from 30 nm to 60 nm, although lesser and greater thicknesses may also be employed. Each of the sacrificial material layers 42 may have a thickness in a range from 20 nm to 100 nm, such as from 30 nm to 60 nm, although lesser and greater thicknesses may also be employed. In one embodiment, the topmost insulating layer 32T may have a thickness of about one half of the thickness of other insulating layers 32.

The first exemplary structure comprises a memory array region 100 in which a three-dimensional array of memory elements is to be subsequently formed, and a contact region 300 in which layer contact via structures contacting word lines are to be subsequently formed. Drain-select-level isolation structures 72 laterally extending along a first horizontal direction hd1 may be formed through a subset of the topmost sacrificial material layers 42 which will be replaced with drain side select gate electrodes in a subsequent step.

While an embodiment is described in which the spacer material layers are formed as sacrificial material layers 42, the spacer material layers may be formed as electrically conductive layers in an alternative embodiment. Generally, spacer material layers of the present disclosure may be formed as, or may be subsequently replaced at least partly with, electrically conductive layers.

Figure 2:
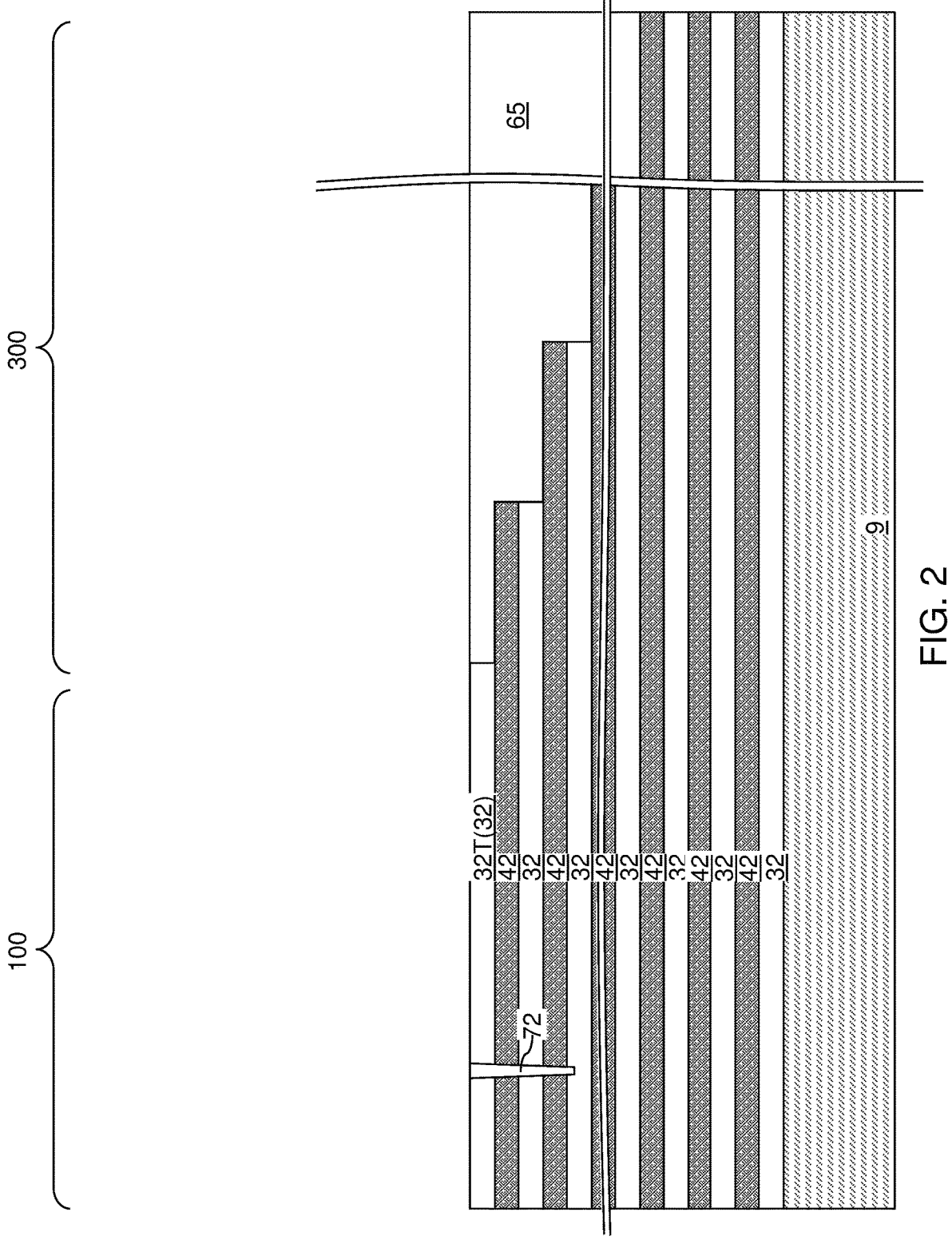
FIG. 2 is a schematic vertical cross-sectional view of the first exemplary structure after formation of stepped surfaces and a stepped dielectric material portion according to the first embodiment of the present disclosure.

Referring to FIG. 2, optional stepped surfaces are formed in the contact region 300. As used herein, "stepped surfaces" refer to a set of surfaces that include at least two horizontal surfaces and at least two vertical surfaces such that each horizontal surface is adjoined to a first vertical surface that extends upward from a edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The stepped cavity can have various stepped surfaces such that the horizontal cross-sectional shape of the stepped cavity changes in steps as a function of the vertical distance from the top surface of the carrier substrate 9. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The stepped surfaces of the alternating stack (32, 42) continuously extend from a bottommost layer within the alternating stack (32, 42) (such as the bottommost insulating layer 32B) to a topmost layer within the alternating stack (32, 42) (such as the topmost insulating layer 32T).

A stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases or decreases stepwise as a function of a vertical distance from a top surface of a substrate on which the element is present. If silicon oxide is employed for the stepped dielectric material portion 65, the silicon oxide of the stepped dielectric material portion 65 may, or may not, be doped with dopants such as B, P, and/or F.

Figure 3A:
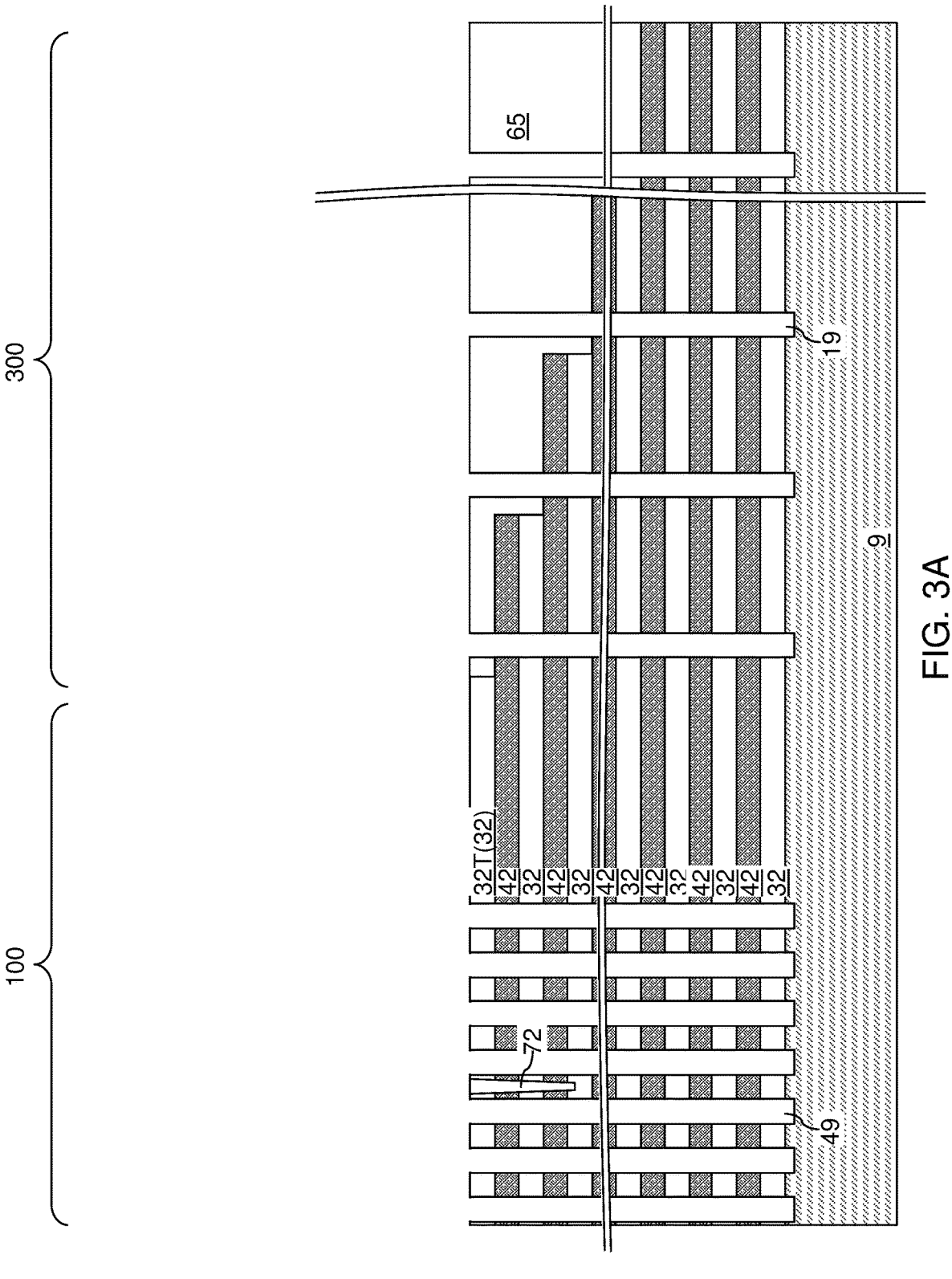
FIG. 3A is a schematic vertical cross-sectional view of the first exemplary structure after formation of memory openings and support openings according to the first embodiment of the present disclosure.
Figure 3B:
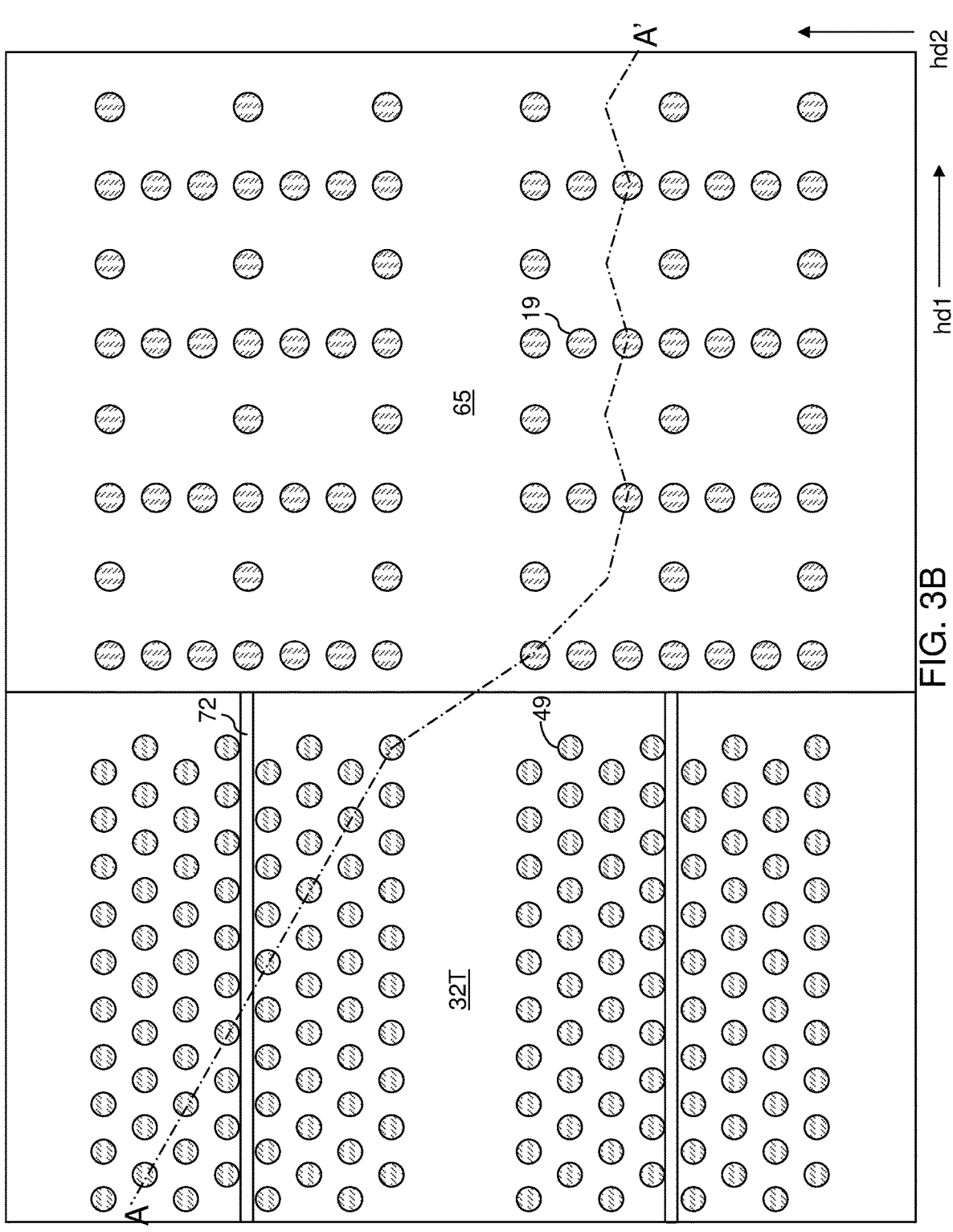
FIG. 3B is a top-down view of the first exemplary structure of FIG. 3A. The hinged vertical cross-sectional plane A-A' is the cut plane of the vertical cross-sectional view of FIG. 3A.

Referring to FIGS. 3A and 3B, an etch mask layer (such as a photoresist layer) can be formed over the alternating stack (32, 42), and can be lithographically patterned to form openings in the memory array region 100 and in the contact region 300. An anisotropic etch process can be performed to transfer the pattern of the openings in the etch mask layer through the stepped dielectric material portion 65 and the alternating stack (32, 42). Memory openings 49 are formed through the alternating stack (32, 42) in the memory array region 100. Support openings 19 can optionally be formed through the stepped dielectric material portion 65 and the alternating stack (32, 42) in the contact region 300.

Each of the memory openings 49 and the support openings 19 can vertically extend into the carrier substrate 9. In one embodiment, bottom surfaces of the memory openings 49 and the support openings 19 may be formed at or below the top surface of the carrier substrate 9. The memory openings 49 may have a diameter in a range from 60 nm to 400 nm, such as from 120 nm to 300 nm, although lesser and greater thicknesses may also be employed. The support openings 19 may have a diameter in a range from 60 nm to 400 nm, such as from 120 nm to 300 nm, although lesser and greater thicknesses may also be employed.

Each cluster of memory openings 49 may comprise a plurality of rows of memory openings 49 located in an area of a respective memory block. Each row of memory openings 49 may comprise a plurality of memory openings 49 that are arranged along the first horizontal direction (e.g., word line direction) hd1 with a uniform pitch. The rows of memory openings 49 may be laterally spaced from each other along the second horizontal direction (e.g., bit line direction) hd2, which may be perpendicular to the first horizontal direction hd2. In one embodiment, each cluster of memory openings 49 may be formed as a two-dimensional periodic array of memory openings 49.

Figure 4:
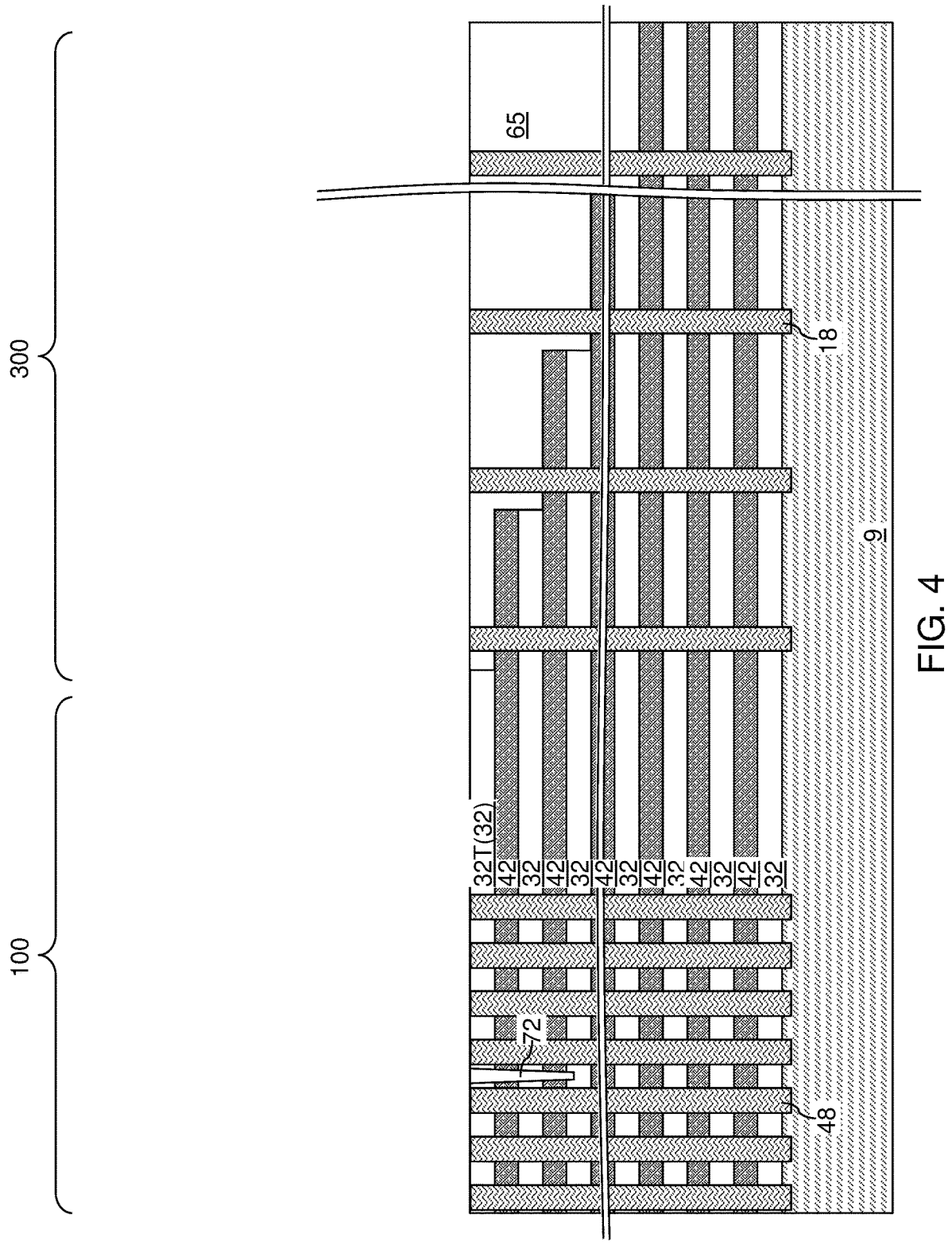
FIG. 4 is a schematic vertical cross-sectional view of the first exemplary structure after formation of sacrificial opening fill structures according to the first embodiment of the present disclosure.

Referring to FIG. 4, an optional sacrificial liner layer (such as a thin silicon oxide layer) and a sacrificial fill material can be deposited in the memory openings 49 and in the support openings 19. The sacrificial fill material may comprise a carbon-based material (such as amorphous carbon or diamond-like carbon), a semiconductor material such as amorphous silicon or silicon-germanium), a polymer material, or a dielectric material (such as organosilicate glass or borosilicate glass). Excess portions of the sacrificial fill material may be removed from above the horizontal plane including the top surface of the topmost insulating layer 32T. Each remaining portion of the sacrificial fill material that fills a memory opening 49 constitutes a sacrificial memory opening fill structure 48. Each remaining portion of the sacrificial fill material that fill a support opening 19 constitutes a sacrificial support opening fill structure 18.

Figure 5:
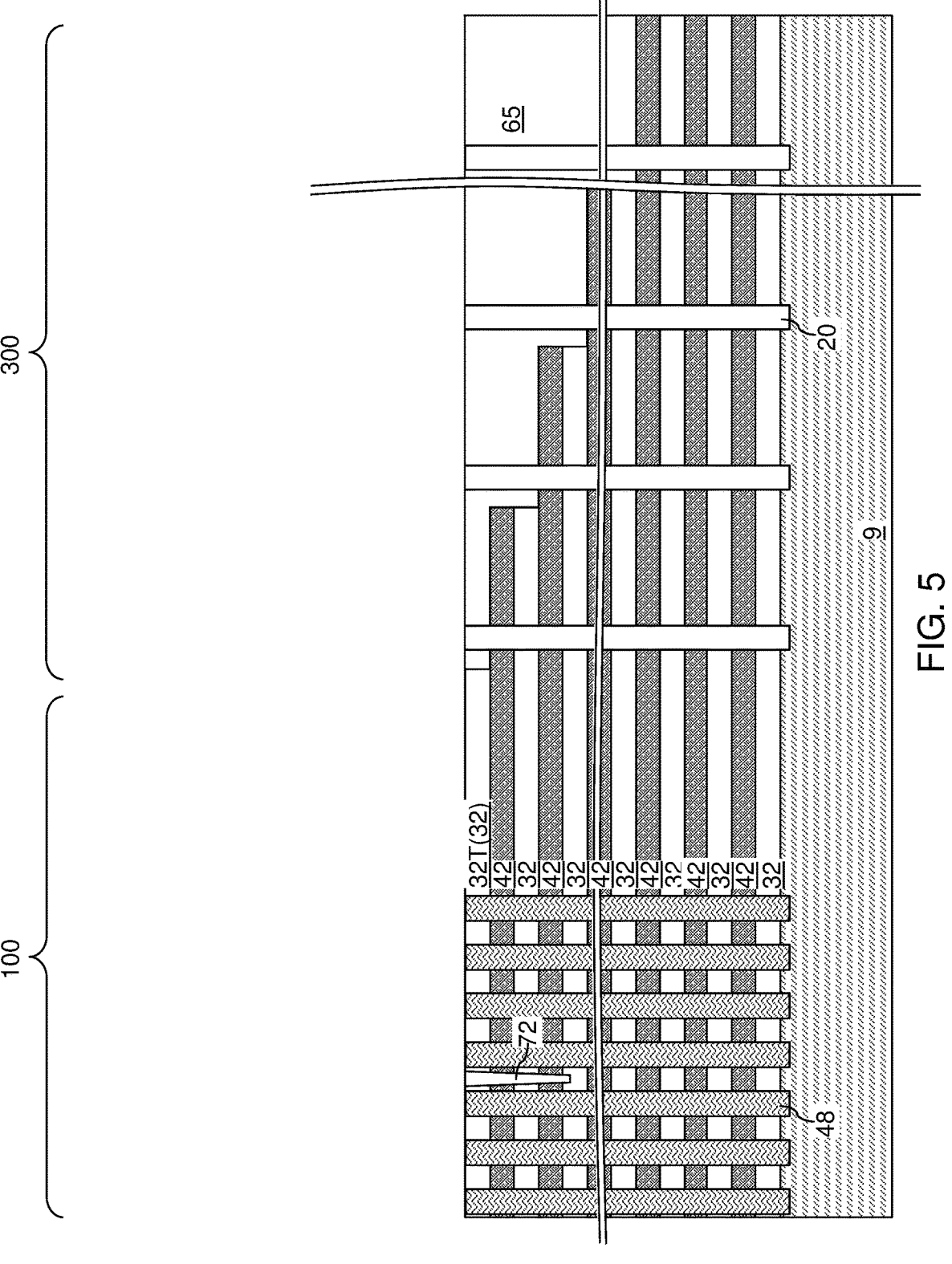
FIG. 5 is a vertical cross-sectional view of the first exemplary structure after formation of support pillars according to the first embodiment of the present disclosure.

Referring to FIG. 5, a photoresist layer (not shown) can be applied over the first exemplary structure, and can be lithographically patterned to cover the sacrificial memory opening fill structures 48 without covering the sacrificial support opening fill structures 18. The sacrificial support opening fill structures 18 are subsequently removed selective to the materials of the insulating layers 32, the sacrificial material layers 42, and the carrier substrate 9. Voids are formed in the volumes of the support openings 19 from which the sacrificial support opening fill structures 18 are removed.

A dielectric fill material, such as silicon oxide, can be deposited in the support openings 19 by a conformal deposition process. Excess portions of the dielectric fill material can be removed from above the top surface of the topmost insulating layer 32T, for example, by a recess etch process. Each portion of the dielectric fill material that fills a respective support opening 19 constitutes a support pillar 20, which can be employed to provide structural support to the insulating layers 32 and the stepped dielectric material portion 65 during replacement of the sacrificial material layers 42 with electrically conductive layers. Alternatively, the support openings 19 can be formed at a later step at the same time as the memory openings, and the support pillars 20 can be formed in the support openings 19 at the same time as the memory opening fill structures are formed in the memory openings, as will be described below.

Figure 6:
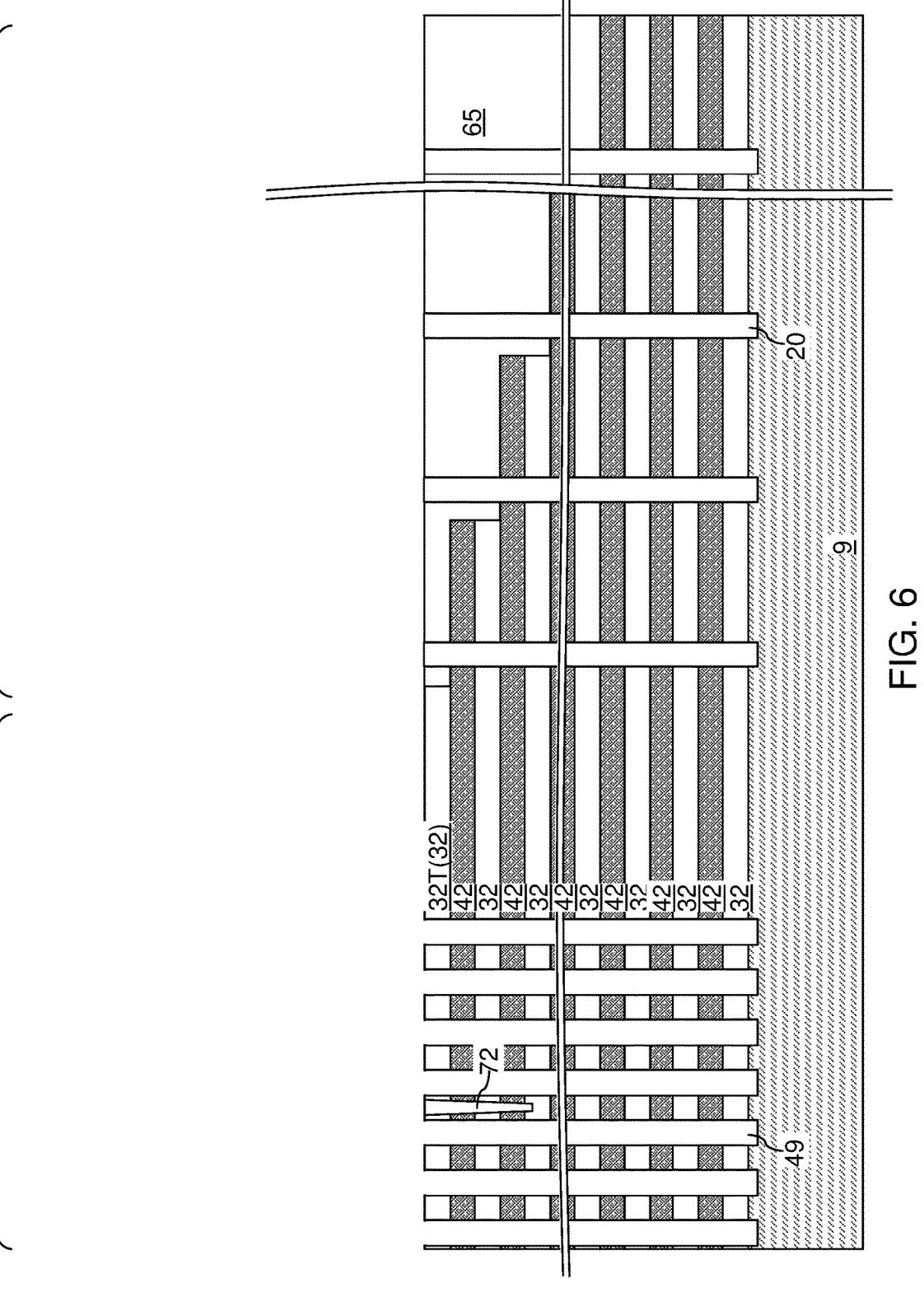
FIG. 6 is a schematic vertical cross-sectional view of the first exemplary structure after removal of sacrificial memory opening fill structures according to the first embodiment of the present disclosure.

Referring to FIG. 6, sacrificial memory opening fill structures 48 are subsequently removed selective to the materials of the insulating layers 32, the sacrificial material layers 42, and the carrier substrate 9. Voids are formed in the volumes of the memory openings 49 from which the sacrificial memory opening fill structures 48 are removed.

FIGS. 7A-7F are sequential vertical cross-sectional views of a memory opening 49 during formation of a memory opening fill structure 58 according to the first embodiments of the present disclosure.

Figures 7A, 7B:
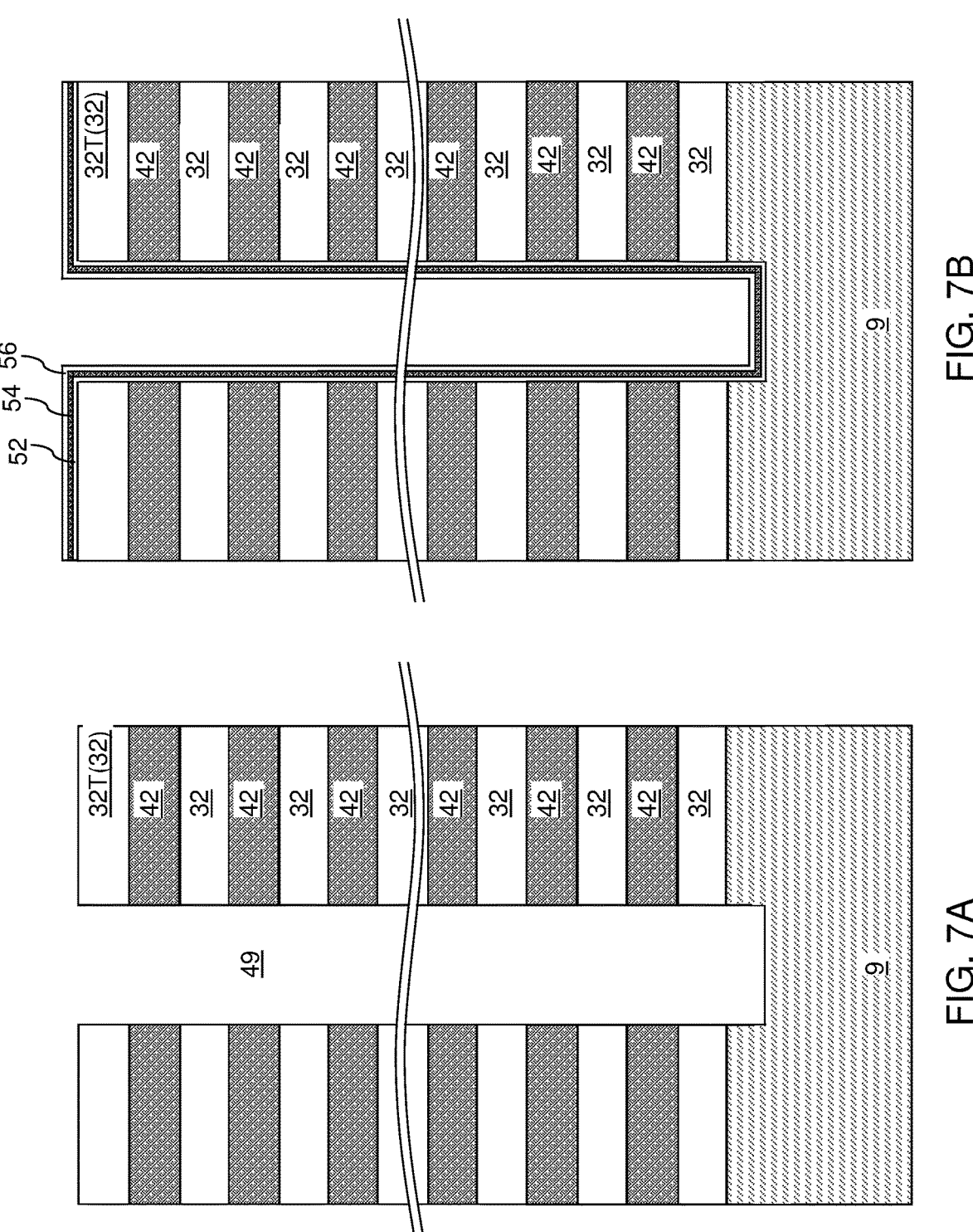
FIGS. 7A-7F are sequential vertical cross-sectional views of a memory opening during formation of a memory opening fill structure according to an embodiments of the present disclosure.

Referring to FIG. 7A, a memory opening 49 is illustrated after the processing steps of FIG. 6.

Referring to FIG. 7B, a layer stack including a memory material layer 54 can be conformally deposited. In an illustrative example, the layer stack may comprise an optional blocking dielectric layer 52, the memory material layer 54, and an optional dielectric liner 56. The memory material layer 54 includes a memory material, i.e., a material that can store data bits therein. The memory material layer 54 may comprise a charge storage material (such as silicon nitride), a ferroelectric material, a phase change memory material, or any other memory material that can store data bits by inducing a change in the electrical resistivity, ferroelectric polarization, or any other measurable physical property. In case the memory material layer 54 comprises a charge storage material, the optional dielectric liner 56 may comprise a tunneling dielectric layer.

Figures 7C, 7D:
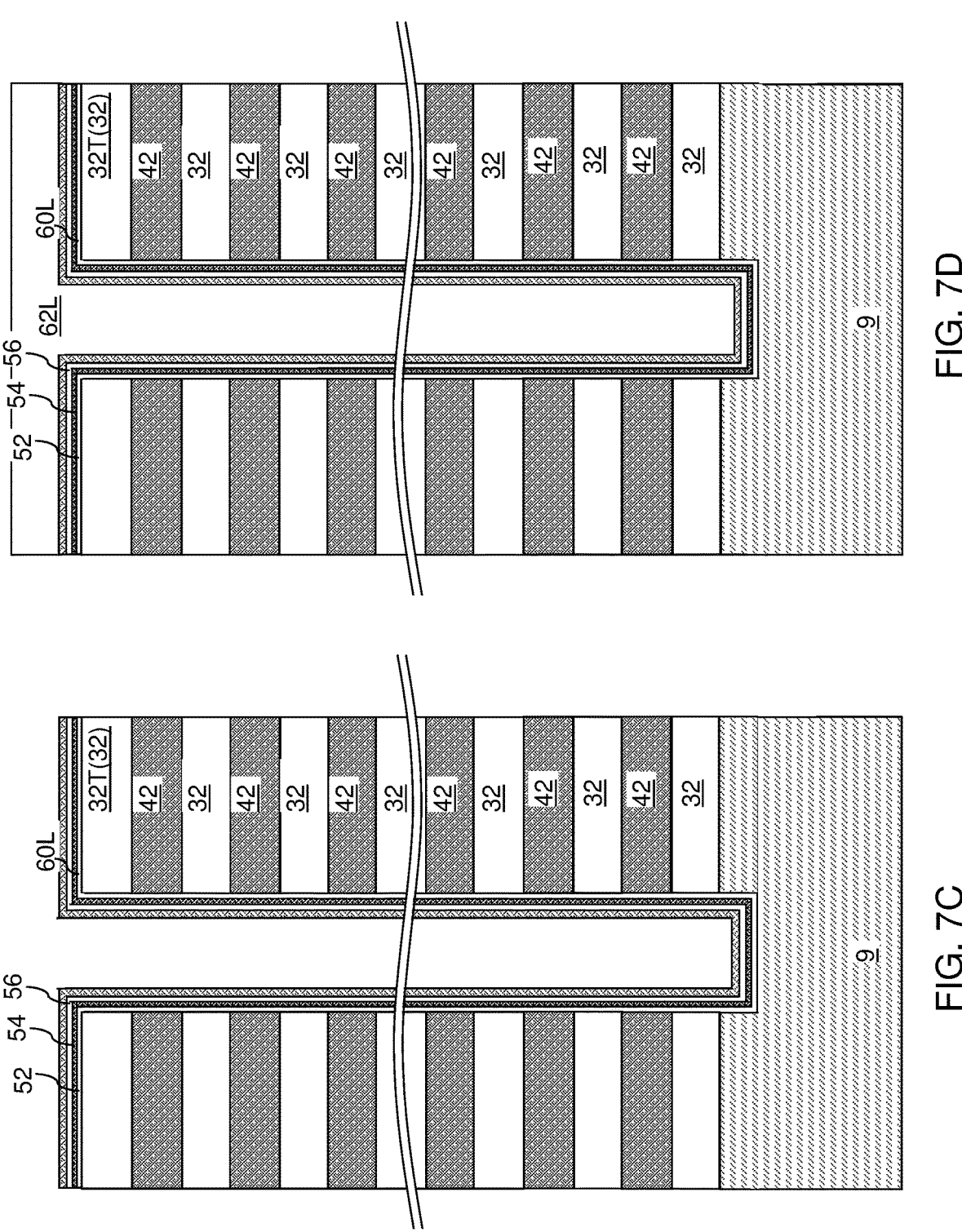

Referring to FIG. 7C, a semiconductor channel material layer 60L can be deposited over each memory film 50 by performing a conformal deposition process. If the semiconductor channel material layer 60L is doped, the semiconductor channel material layer 60L may have a doping of a first conductivity type, which may be p-type or n-type. The thickness of the semiconductor channel material layer 60L may be in a range from 5 nm to 50 nm, such as from 10 nm to 30 nm, although lesser and greater thicknesses may also be employed.

Referring to FIG. 7D, a dielectric core layer 62L comprising a dielectric fill material, such as silicon oxide, can be deposited in remaining volumes of the memory openings 49. While the dielectric core layer 62L can be deposited employing a conformal deposition process, such as a chemical vapor deposition process, the conformity of the conformal deposition process may not be perfect. Thus, the thickness of a bottom portion of the dielectric core layer 62L at the bottom of each memory opening 49 may be less than the thickness of an upper portion of the dielectric core layer 62L at the top of each memory opening 49.

Figures 7E, 7F:
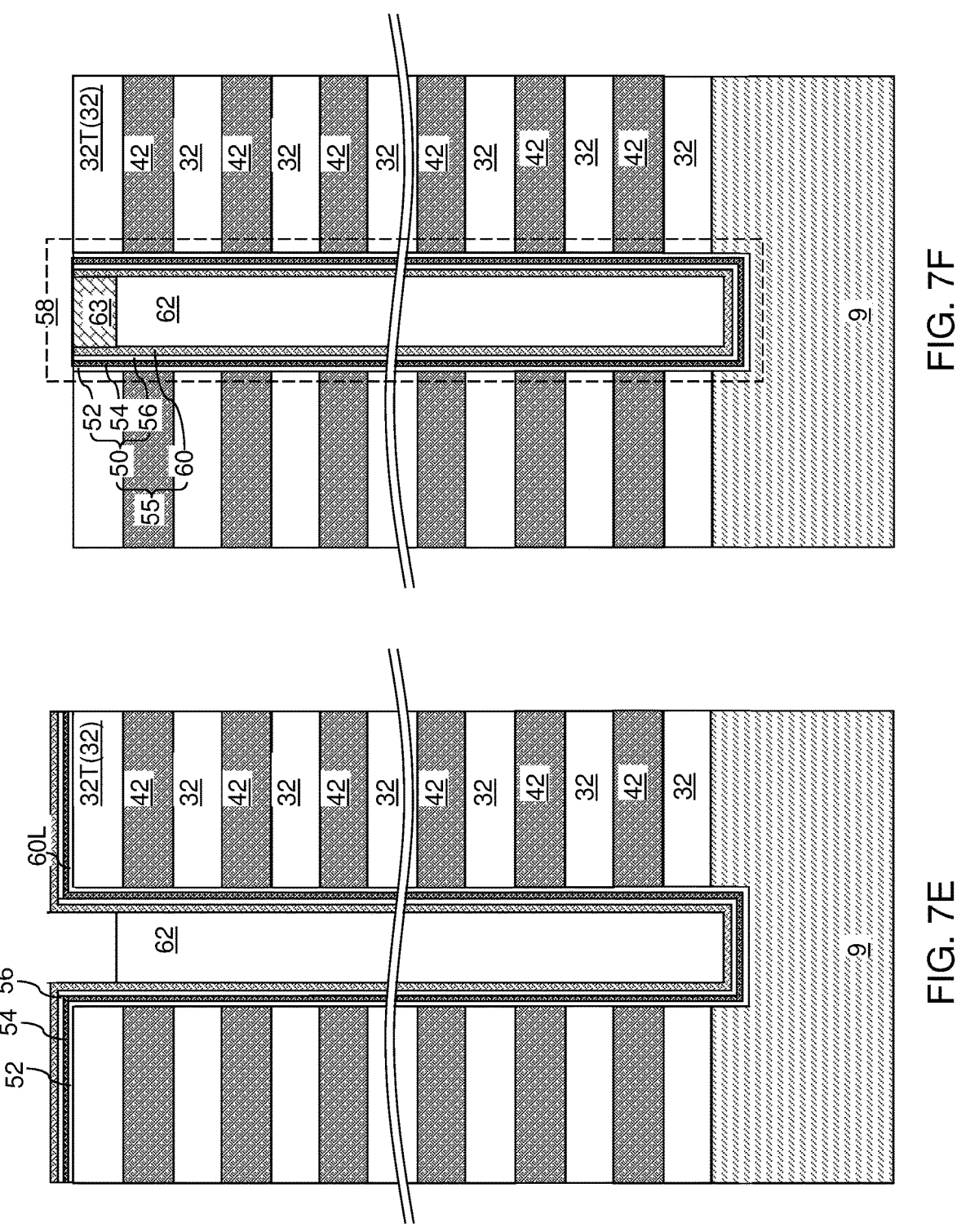

Referring to FIG. 7E, the dielectric core layer 62L can be vertically recessed such that each remaining portion of the dielectric core layer has a top surface at, or about, the horizontal plane including the bottom surface of the topmost insulating layers 32. Each remaining portion of the dielectric core layer constitutes a dielectric core 62.

Referring to FIG. 7F, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration in the deposited semiconductor material can be in a range from $5 \times 10^{18}/cm^3$ to $2 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel material layer 60L can be removed from above the horizontal plane including the top surface of the topmost insulating layer 32T, for example, by chemical mechanical planarization (CMP) or a recess etch process. Each remaining portion of the doped semiconductor material having a doping of the second conductivity type constitutes a drain region 63. Each remaining portion of the semiconductor channel material layer 60L (which has a doping of the first conductivity type) constitutes a vertical semiconductor channel 60.

Each portion of the layer stack including the memory material layer 54 that remains in a respective memory opening 49 constitutes a memory film 50. In one embodiment, a memory film 50 may comprise an optional blocking dielectric layer 52, a memory material layer 54, and an optional dielectric liner 56. Each contiguous combination of a memory film 50 and a vertical semiconductor channel 60 constitutes a memory stack structure 55. Each combination a memory stack structure 55, a dielectric core 62, and a drain region 63 within a memory opening 49 constitutes a memory opening fill structure 58. Each memory opening fill structure 58 comprises a respective vertical stack of memory elements, which may comprise portions of the memory material layer 54 located at levels of the sacrificial material layers 42, or generally speaking, at levels of spacer material layers that may be formed as, or may be subsequently replaced at least partly with, electrically conductive layers.

In an alternative embodiment, the support pillars 20 may be formed in the support openings 19 at the same time as the memory opening fill structures 58 are formed in the memory openings 49. In this case, the support pillars 20 comprise dummy memory opening fill structures having the same materials as the memory opening fill structures 58.

An anneal process can be performed to activate electrical dopants in the drain region 63 and in the vertical semiconductor channel 60. In this case, any amorphous semiconductor material (e.g., amorphous silicon) in the vertical semiconductor channel 60 is converted into a polycrystalline semiconductor material (e.g., polysilicon).

Figure 8A:
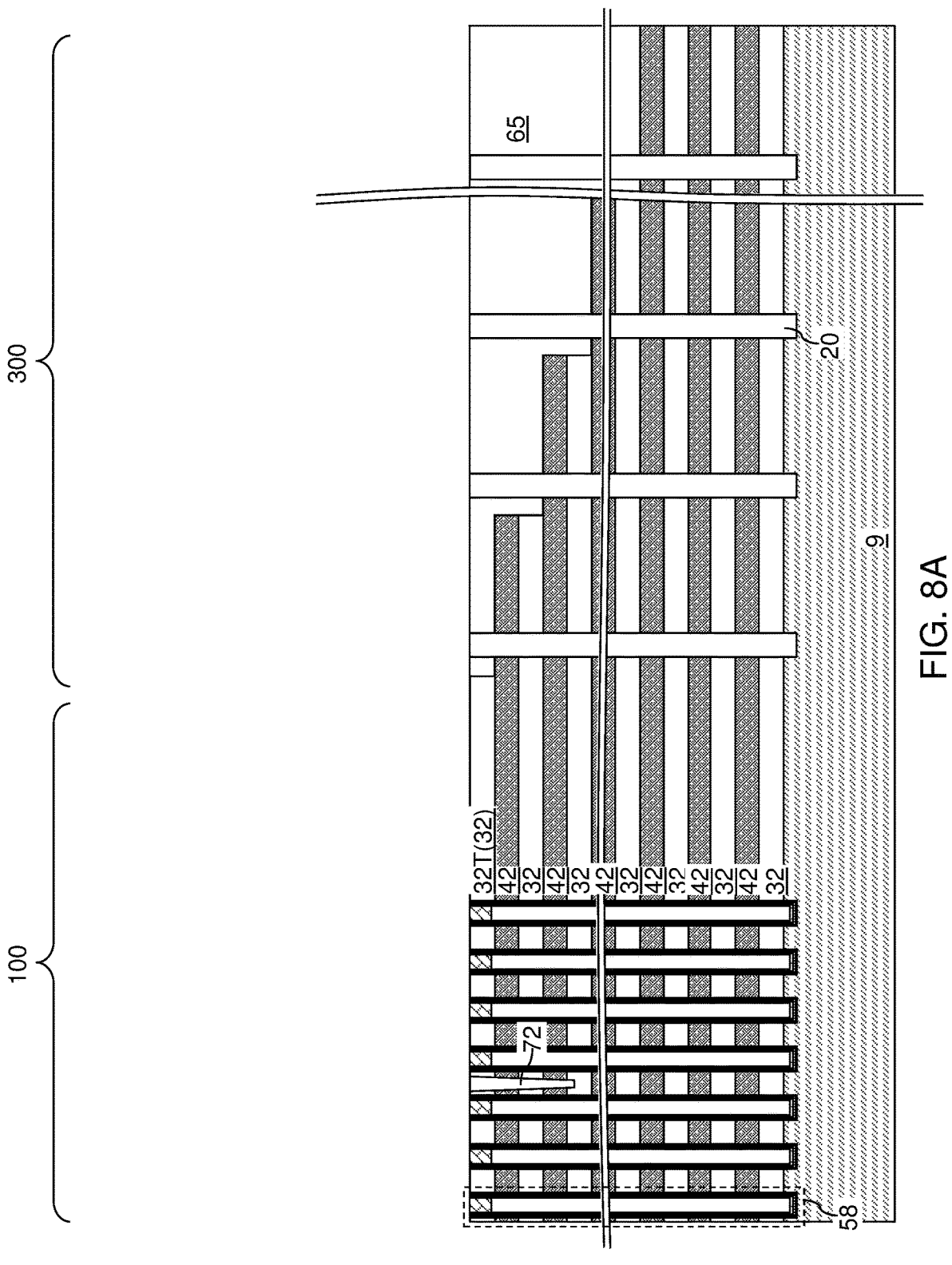
FIG. 8A is a schematic vertical cross-sectional view of the first exemplary structure after formation of memory opening fill structures according to the first embodiment of the present disclosure.
Figure 8B:
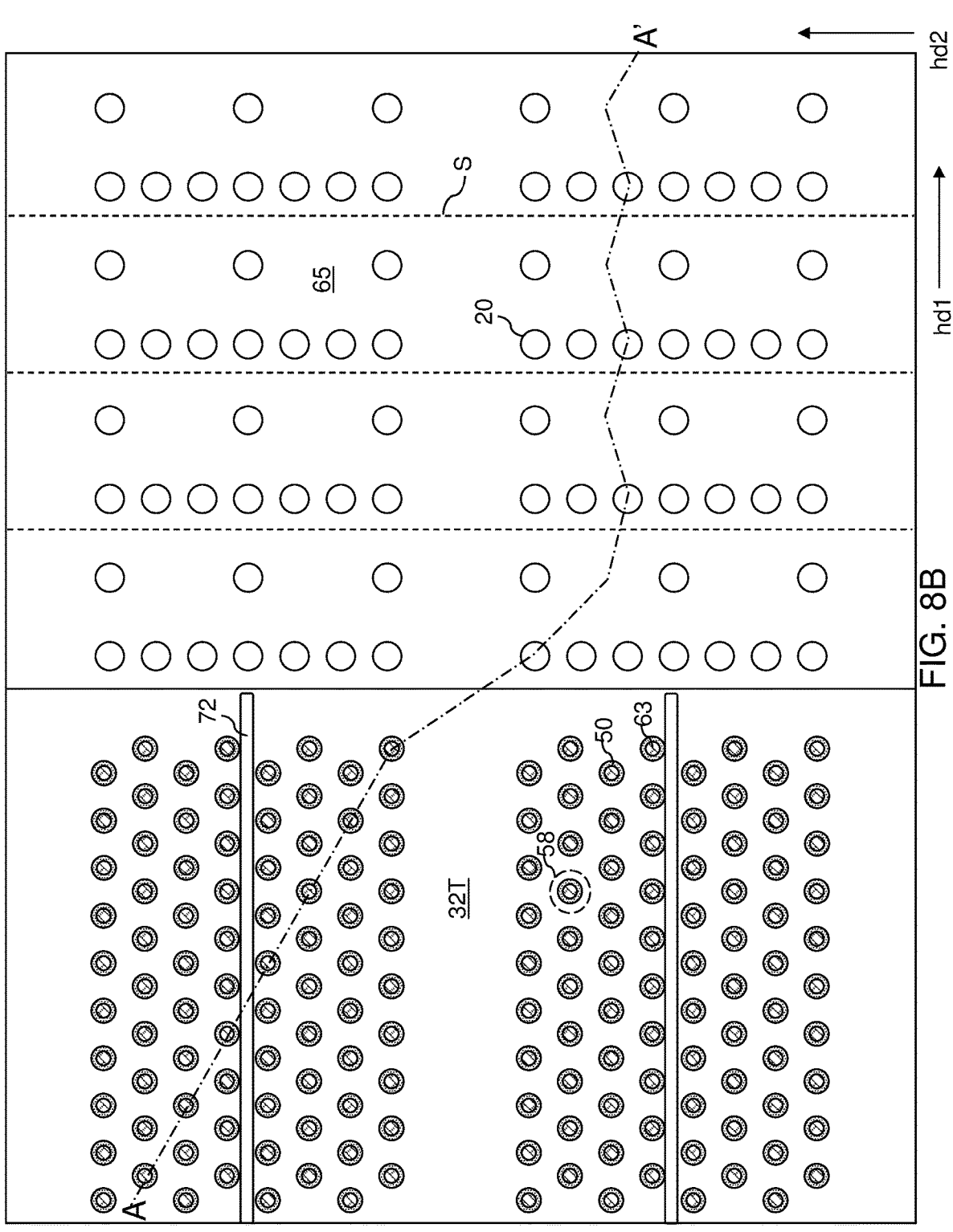
FIG. 8B is a top-down view of the first exemplary structure of FIG. 8A. The vertical plane A-A is the cut plane of the vertical cross-sectional view of FIG. 8A.

Referring to FIGS. 8A and 8B, the first exemplary structure is illustrated after formation of memory opening fill structures 58 within the memory openings 49. The memory opening fill structures 58 are located in the memory openings 49. Each of the memory opening fill structures 58 comprises a respective memory film 50 and a respective vertical semiconductor channel 60.

Figure 9A:
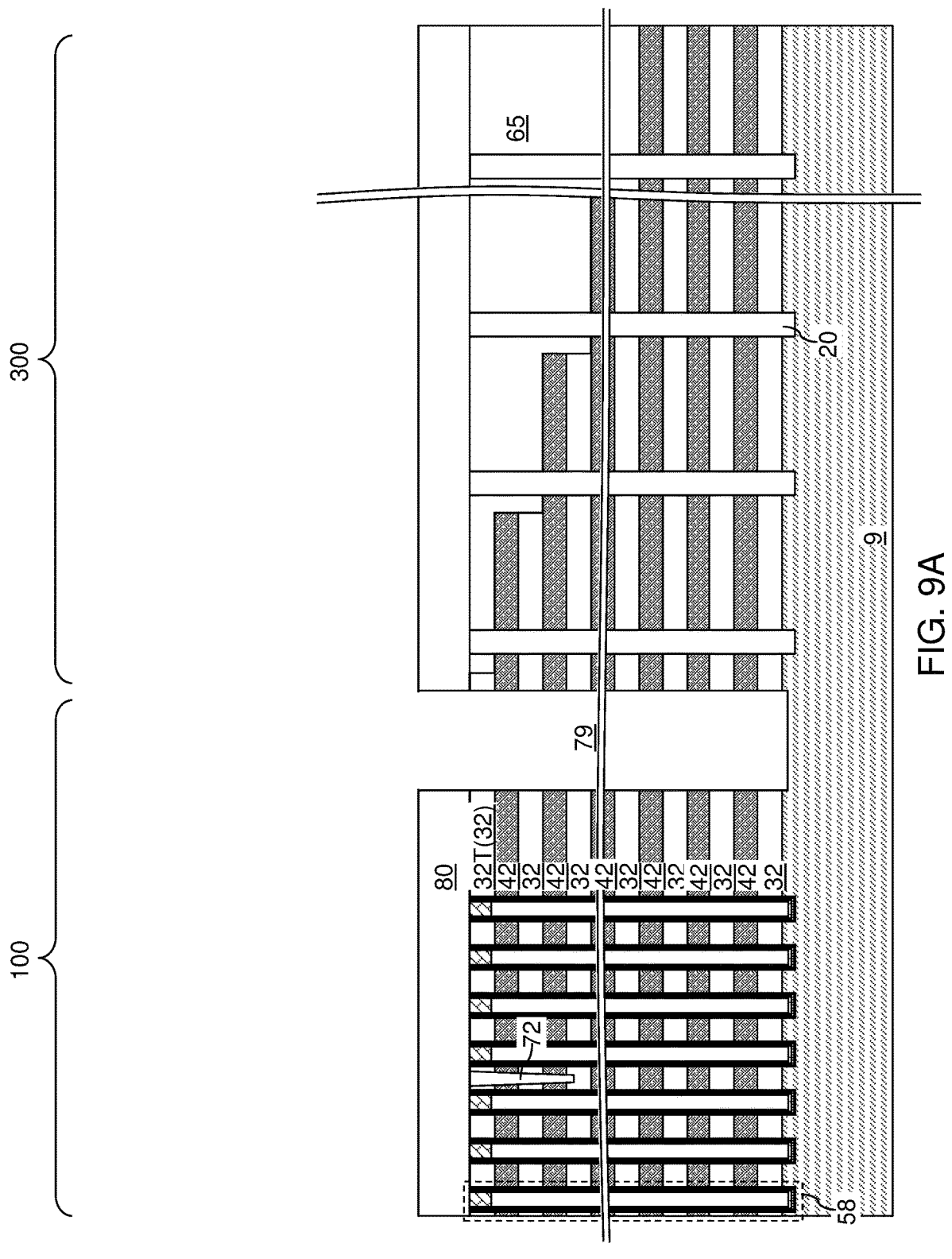
FIG. 9A is a vertical cross-sectional view of the first exemplary structure after formation of lateral isolation trenches according to the first embodiment of the present disclosure.
Figure 9B:
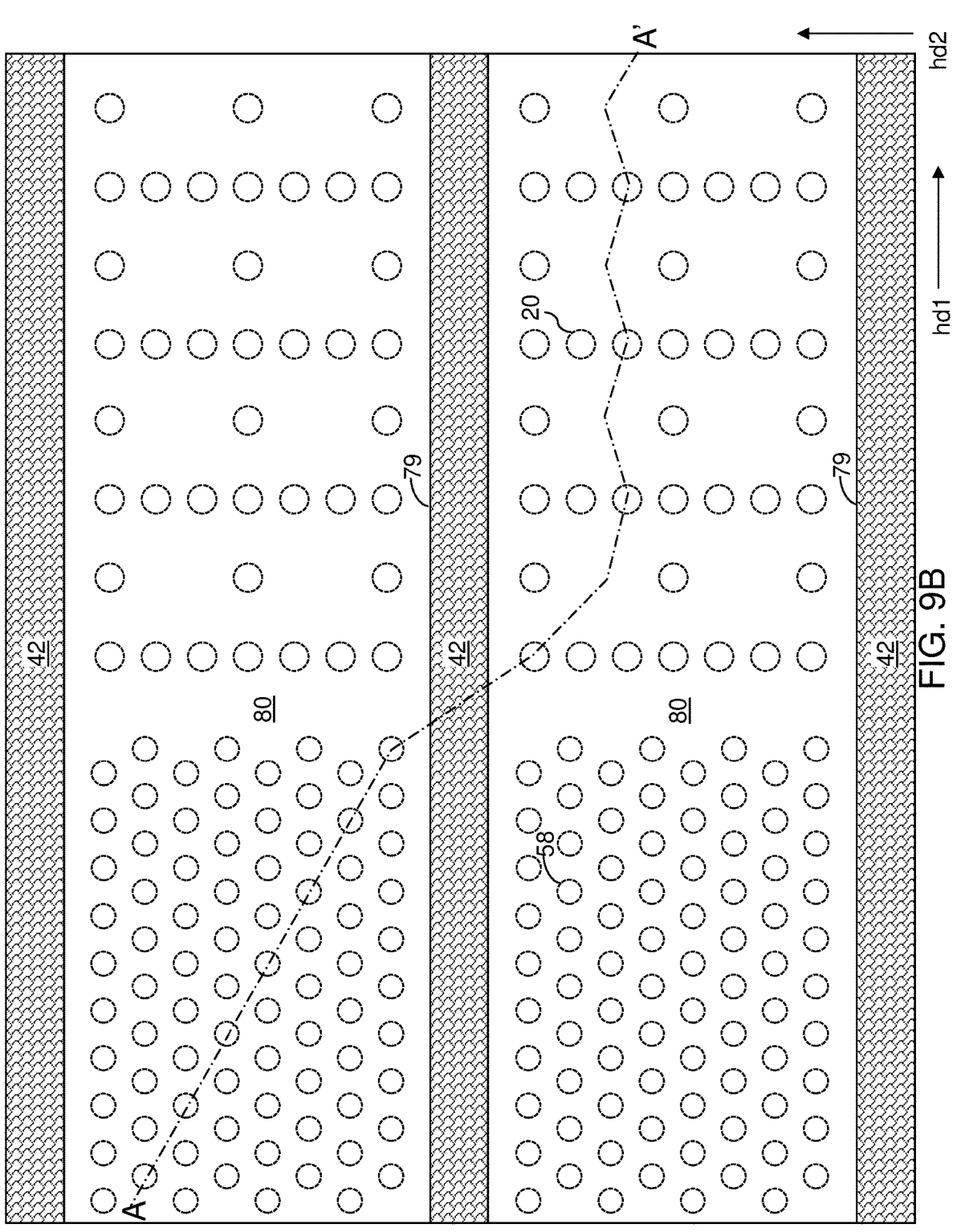
FIG. 9B is a top-down view of the first exemplary structure of FIG. 9A. The vertical plane A-A is the cut plane of the vertical cross-sectional view of FIG. 9A.

Referring to FIGS. 9A and 9B, a dielectric material, such as undoped silicate glass (i.e., silicon oxide) or a doped silicate glass can be deposited over the alternating stack (32, 42) to form a contact-level dielectric layer 80. The thickness of the contact-level dielectric layer 80 may be in a range from 100 nm to 600 nm, such as from 200 nm to 400 nm, although lesser and greater thicknesses may also be employed.

A photoresist layer (not shown) can be applied over the contact-level dielectric layer 80, and can be lithographically patterned to form elongated openings that laterally extend along the first horizontal direction hd1 between neighboring clusters of memory opening fill structures 58. An anisotropic etch process can be performed to transfer the pattern of the openings in the photoresist layer through the contact-level dielectric layer 80, the alternating stack (32, 42), and the stepped dielectric material portion 65, and to a top surface of the carrier substrate 9. Lateral isolation trenches 79 laterally extending along the first horizontal direction hd1 can be formed through the alternating stack (32, 42), the stepped dielectric material portion 65, and the contact-level dielectric layer 80. Each of the lateral isolation trenches 79 may comprise a respective pair of lengthwise sidewalls that are parallel to the first horizontal direction hd1 and vertically extend from the top surface of the contact-level dielectric layer 80 to the top surface of the carrier substrate 9. A surface of the carrier substrate 9 can be physically exposed underneath each lateral isolation trench 79. The photoresist layer can be subsequently removed, for example, by ashing.

Figure 10:
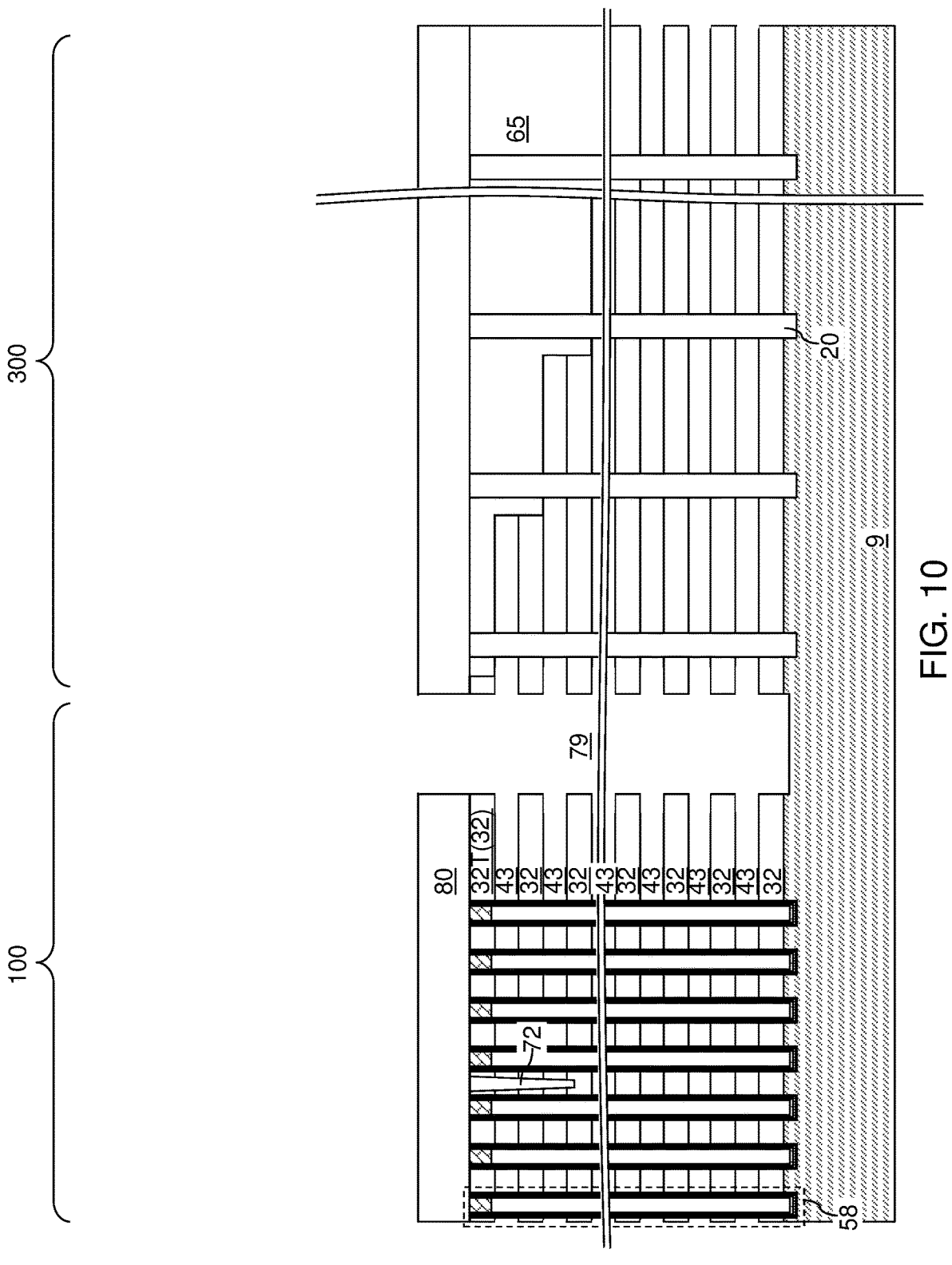
FIG. 10 is a vertical cross-sectional view of the first exemplary structure after formation of laterally-extending cavities according to the first embodiment of the present disclosure.

Referring to FIG. 10, an etchant that selectively etches the material of the sacrificial material layers 42 with respect to the material of the insulating layers 32 can be introduced into the lateral isolation trenches 79, for example, employing an isotropic etch process. Lateral recesses 43 are formed in volumes from which the sacrificial material layers 42 are removed. The removal of the sacrificial material layers 42 can be selective to the materials of the insulating layers 32, the stepped dielectric material portion 65, and the material of the outermost layer of the memory films 50. In one embodiment, the sacrificial material layers 42 can include silicon nitride, and the materials of the insulating layers 32 and the stepped dielectric material portion 65 can include silicon oxide.

The etch process that removes the second material selective to the first material and the outermost layer of the memory films 50 can be a wet etch process employing a wet etch solution, or can be a gas phase (dry) etch process in which the etchant is introduced in a vapor phase into the lateral isolation trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar 20, the stepped dielectric material portion 65, and the memory stack structures 55 provide structural support while the lateral recesses 43 are present within volumes previously occupied by the sacrificial material layers 42.

Each lateral recess 43 can be a laterally extending cavity having a lateral dimension that is greater than the vertical extent of the cavity. In other words, the lateral dimension of each lateral recess 43 can be greater than the height of the lateral recess 43. A plurality of lateral recesses 43 can be formed in the volumes from which the second material of the sacrificial material layers 42 is removed. The memory openings in which the memory stack structures 55 are formed are herein referred to as front side openings or front side cavities in contrast with the lateral recesses 43.

Each of the plurality of lateral recesses 43 can extend substantially parallel to the top surface of the carrier substrate 9. A lateral recess 43 can be vertically bounded by a top surface of an underlying insulating layer 32 and a bottom surface of an overlying insulating layer 32. In one embodiment, each lateral recess 43 can have a uniform height throughout.

Figure 11:
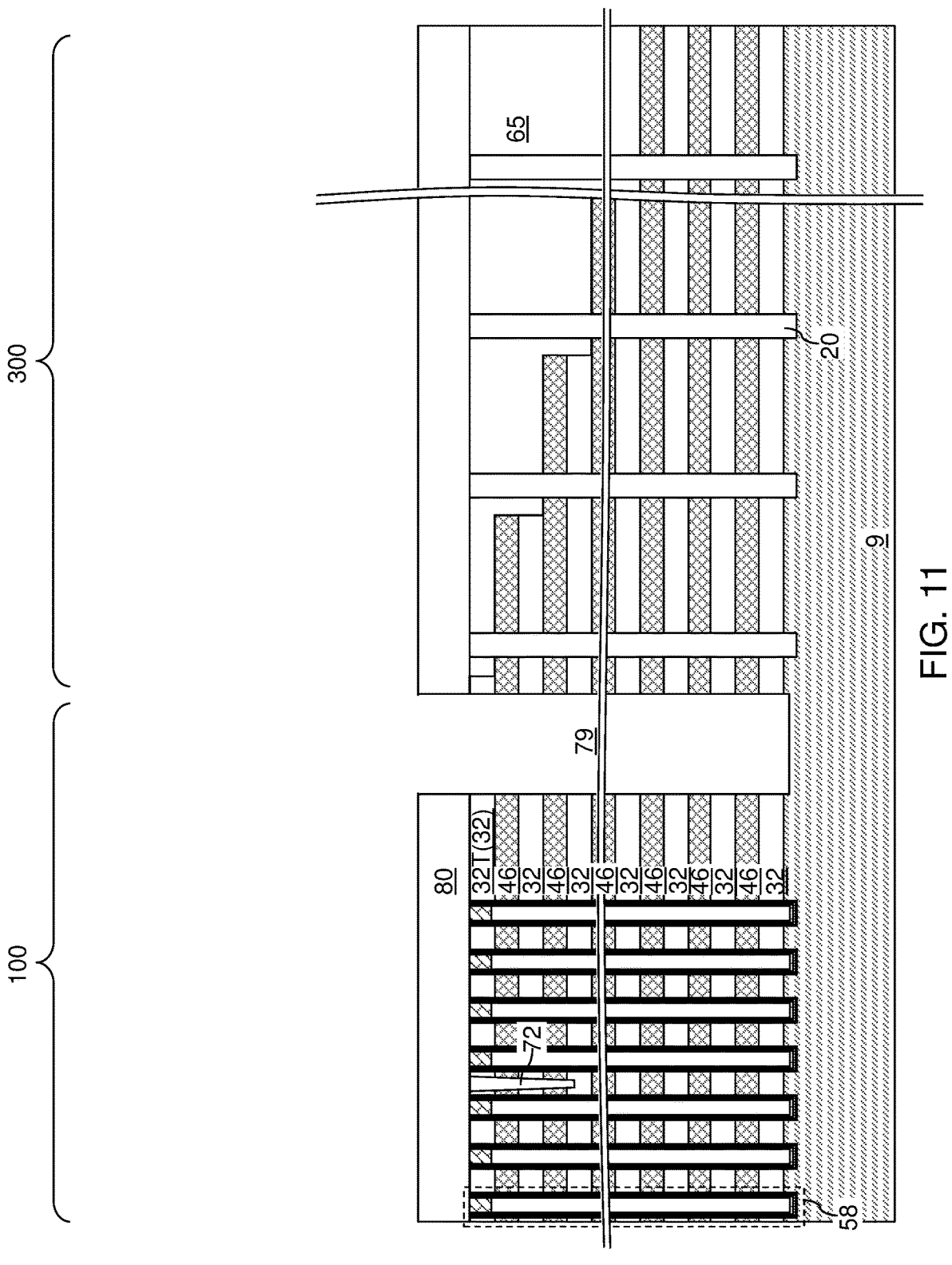
FIG. 11 is a schematic vertical cross-sectional view of the first exemplary structure after formation of electrically conductive layers according to the first embodiment of the present disclosure.

Referring to FIG. 11, an outer blocking dielectric layer (not expressly illustrated) can be optionally formed. The outer blocking dielectric layer, if present, comprises a dielectric material that functions as a control gate dielectric for the control gates to be subsequently formed in the lateral recesses 43. In case the blocking dielectric layer 52 is present within each memory opening, the outer blocking dielectric layer is optional. In case the blocking dielectric layer 52 is omitted, the outer blocking dielectric layer is present.

At least one conductive material can be deposited in the lateral recesses 43 by providing at least one reactant gas into the lateral recesses 43 through the lateral isolation trenches 79. A metallic barrier layer can be deposited in the lateral recesses 43. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in the plurality of lateral recesses 43, on the sidewalls of the at least one the lateral isolation trench 79, and over the top surface of the contact-level dielectric layer 80 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 can be formed in the plurality of lateral recesses 43, and a continuous metallic material layer can be formed on the sidewalls of each lateral isolation trench 79 and over the contact-level dielectric layer 80. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the lateral isolation trenches 79 or above the contact-level dielectric layer 80.

The deposited metallic material of the continuous electrically conductive material layer is etched back from the sidewalls of each lateral isolation trench 79 and from above the contact-level dielectric layer 80 by performing an isotropic etch process that etches the at least one conductive material of the continuous electrically conductive material layer. Each remaining portion of the deposited metallic material in the lateral recesses 43 constitutes an electrically conductive layer 46. Each electrically conductive layer 46 can be a conductive line structure. Thus, the sacrificial material layers 42 are replaced with the electrically conductive layers 46. Generally, the electrically conductive layers 46 can be formed by providing a metallic precursor gas into the lateral isolation trenches 79 and into the lateral recesses 43.

At least one uppermost electrically conductive layer 46 may comprise a drain side select gate electrode. At least one bottommost electrically conductive layer 46 may comprise a source side select gate electrode. The remaining electrically conductive layers 46 may comprise word lines. Each word line functions as a common control gate electrode for the plurality of vertical NAND strings (e.g., memory opening fill structures 58).

Figure 12A:
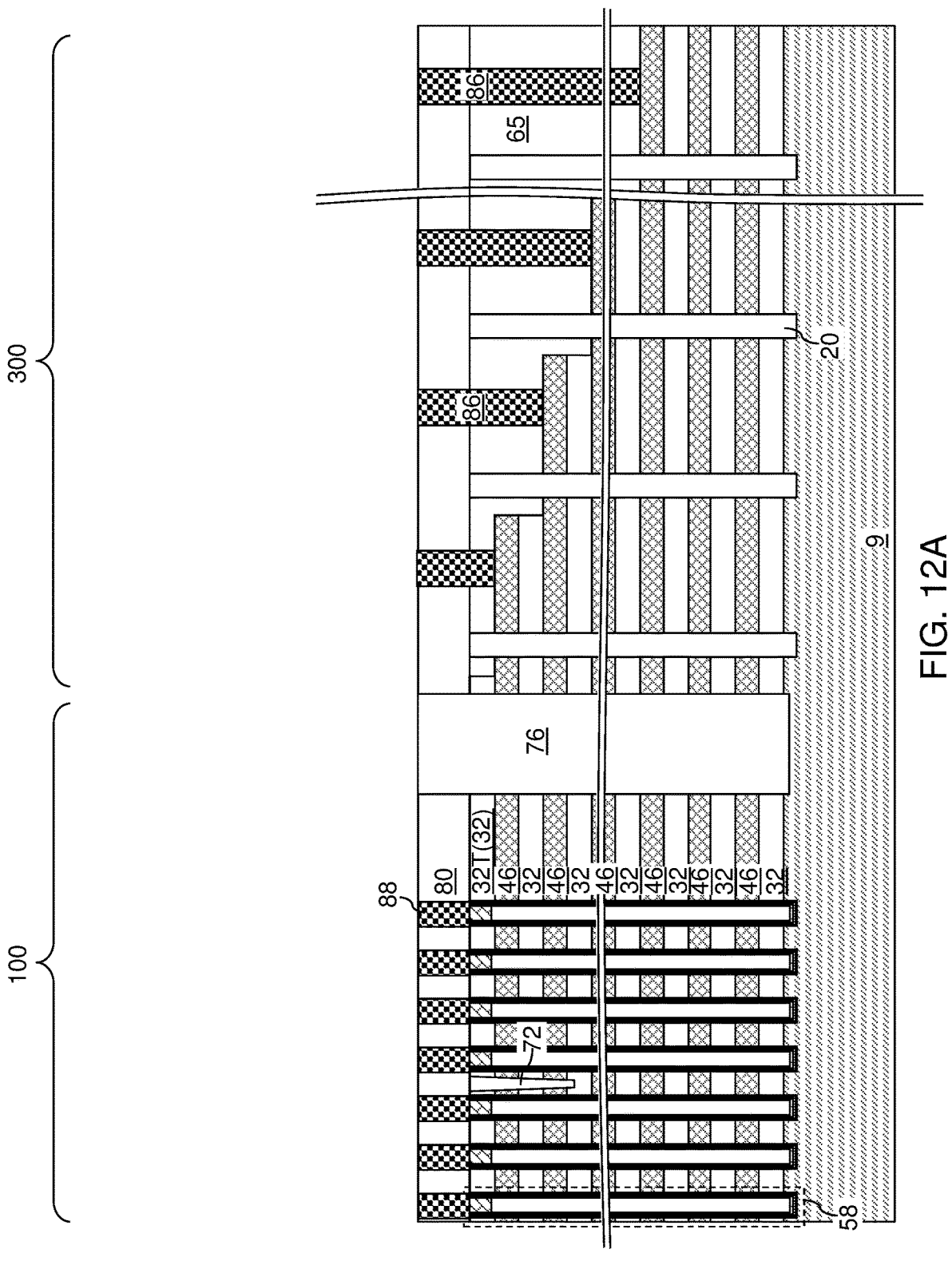
FIG. 12A is a vertical cross-sectional view of the first exemplary structure after formation of lateral isolation trench fill structures, layer contact via structures, and drain contact via structures according to the first embodiment of the present disclosure.
Figure 12B:
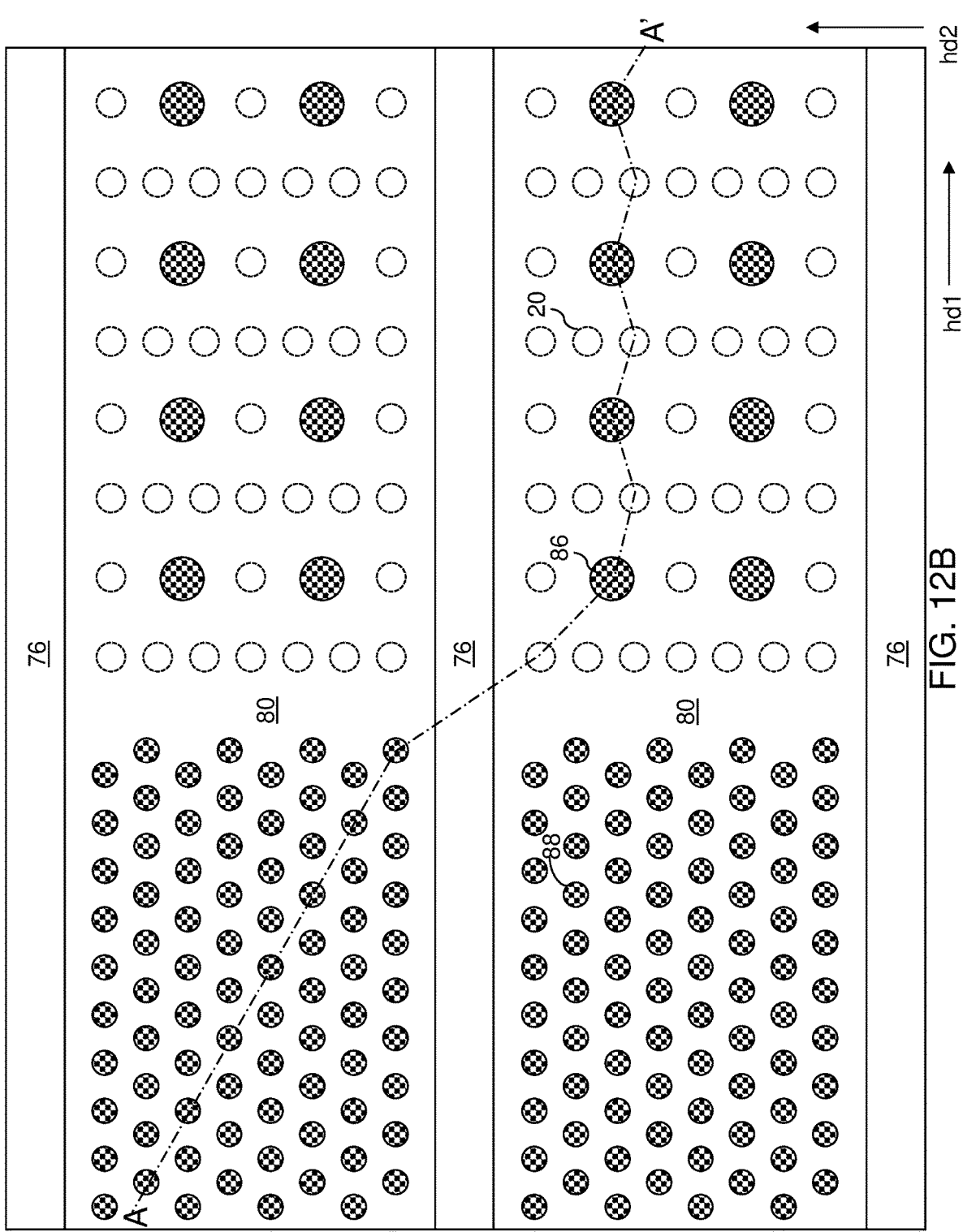
FIG. 12B is a top-down view of the first exemplary structure of FIG. 12A. The vertical plane A-A is the cut plane of the vertical cross-sectional view of FIG. 12A.

Referring to FIGS. 12A and 12B, a dielectric fill material, such as silicon oxide can be deposited in the lateral isolation trenches 79. Excess portions of the dielectric fill material can be removed from above the contact-level dielectric layer 80. Each remaining portion of the dielectric fill material that fills a respective one of the lateral isolation trenches 79 constitutes a lateral isolation trench fill structure 76, which may be a dielectric wall structure. In an alternative embodiment, an insulating spacer having a tubular configuration can be formed in peripheral portions of each of the lateral isolation trenches 79, and a through-stack conductive via structure may be formed within a respective one of the insulating spacers. In this case, each lateral isolation trench fill structure 76 may comprise a combination of a through-stack conductive via structure and an insulating spacer that laterally surrounds the through-stack conductive via structure.

Contact via structures (88, 86) can be formed through the contact-level dielectric layer 80, and optionally through the stepped dielectric material portion 65. For example, drain contact via structures 88 can be formed through the contact-level dielectric layer 80 on each drain region 63. Layer contact via structures 86 can be formed on the electrically conductive layers 46 through the contact-level dielectric layer 80, and through the stepped dielectric material portion 65.

Figure 13:
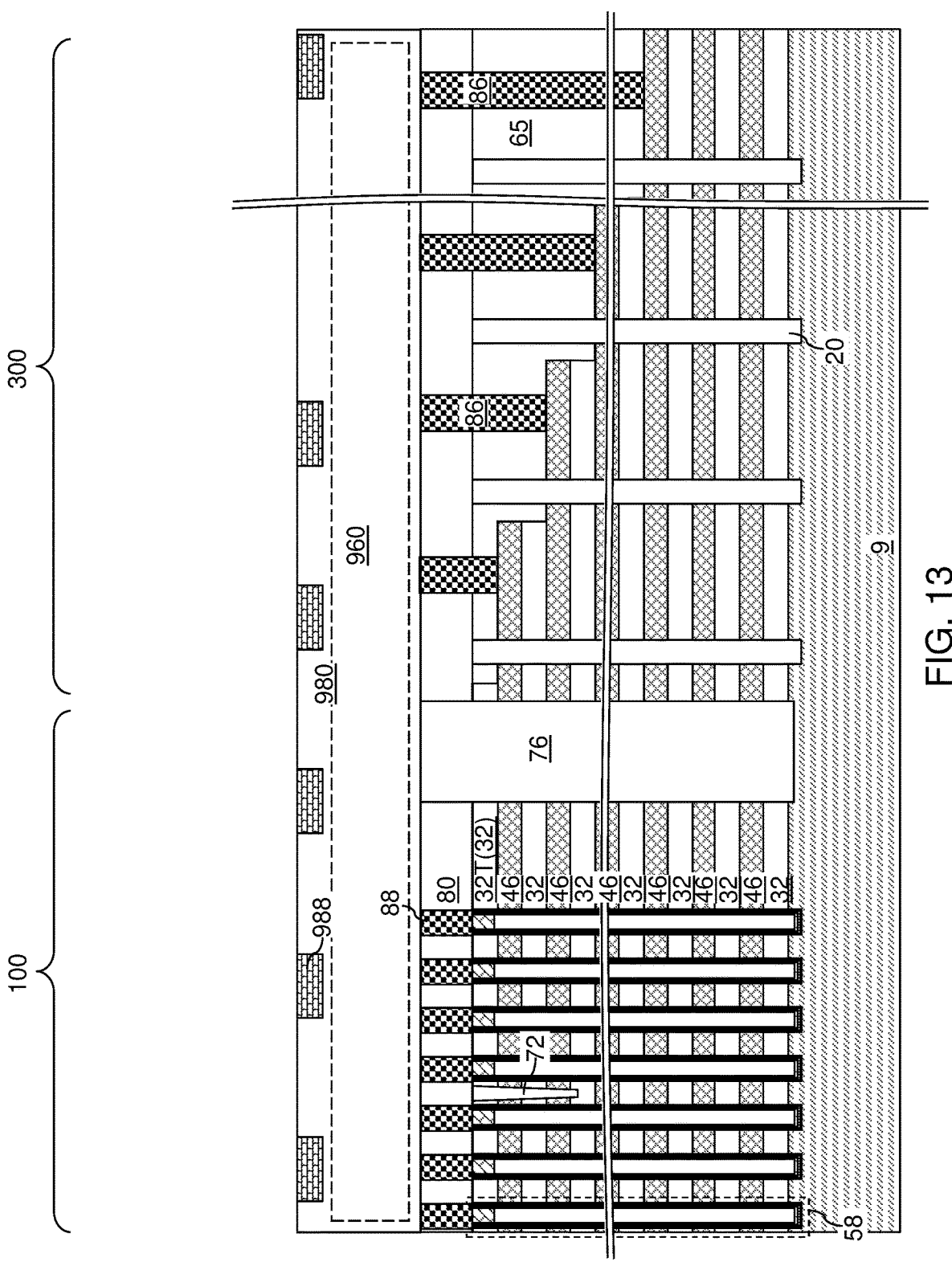
FIG. 13 is a vertical cross-sectional view of the first exemplary structure after formation of a memory die according to the first embodiment of the present disclosure.

Referring to FIG. 13, additional dielectric material layers and additional metal interconnect structures can be formed over the contact-level dielectric layer 80. The additional dielectric material layers may include at least one via-level dielectric layer, at least one additional line-level dielectric layer, and/or at least one additional line-and-via-level dielectric layer. The additional metal interconnect structures may comprise metal via structures, metal line structures, and/or integrated metal line-and-via structures. The additional dielectric material layers that are formed above the contact-level dielectric layer 80 are herein referred to as memory-side dielectric material layers 960. The additional metal interconnect structures are collectively referred to as memory-side dielectric material layers 960. The memory-side dielectric material layers 960 comprise a bit-line-level dielectric material layer embedding bit lines, which are a subset of the memory-side metal interconnect structures 980.

Metal bonding pads, which are herein referred to memory-side bonding pads 988, may be formed at the topmost level of the memory-side dielectric material layers 960. The memory-side bonding pads 988 may be electrically connected to the memory-side metal interconnect structures 980 and various nodes of the three-dimensional memory array including the electrically conductive layers 46 and the memory opening fill structures 58. A memory die 900 can thus be provided.

The memory-side dielectric material layers 960 are formed over the alternating stacks (32, 46). The memory-side metal interconnect structures 980 are embedded in the memory-side dielectric material layers 960. The memory-side bonding pads 988 can be embedded within the memory-side dielectric material layers 960, and specifically, within the topmost layer among the memory-side dielectric material layers 960. The memory-side bonding pads 988 can be electrically connected to the memory-side metal interconnect structures 980.

In one embodiment, the memory die 900 may comprise: a three-dimensional memory array underlying the first dielectric material layer 110 and comprising an alternating stack (32, 46) of insulating layers 32 and electrically conductive layers 46, a two-dimensional array of memory openings 49 vertically extending through the alternating stack (32, 46), and a two-dimensional array of memory opening fill structures 58 located in the two-dimensional array of memory openings 49 and comprising a respective vertical stack of memory elements and a respective vertical semiconductor channel 60; and a two-dimensional array of contact via structures (such as the drain contact via structures 88) overlying the three-dimensional memory array and electrically connected to a respective one of the vertical semiconductor channels 60.

Figure 14:
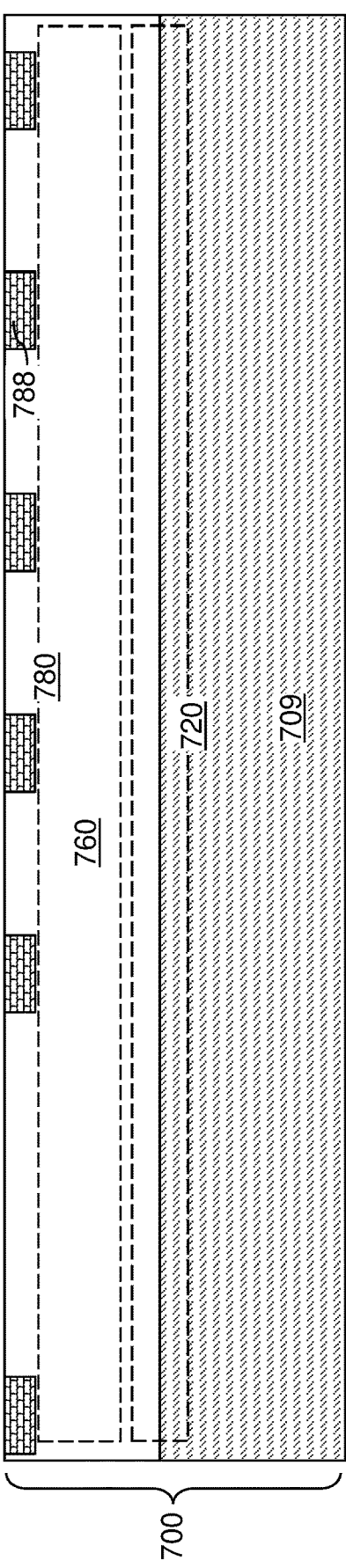
FIG. 14 is a vertical cross-sectional view of a logic die according to the first embodiment of the present disclosure.

Referring to FIG. 14, a logic die 700 can be provided. The logic die 700 includes a logic-side substrate 709, a peripheral circuit 720 located on the logic-side substrate 709 and comprising logic-side semiconductor devices (such as field effect transistors), logic-side metal interconnect structures 780 embedded within logic-side dielectric material layers 760, and logic-side bonding pads 788. The peripheral circuit 720 can be configured to control operation of the memory array within the memory die 900. Specifically, the peripheral circuit 720 can be configured to drive various electrical components within the memory array including, but not limited to, the electrically conductive layers 46, the drain regions 63, and a source contact structure to be subsequently formed. The peripheral circuit 720 can be configured to control operation of the vertical stack of memory elements in the memory array in the memory die 900.

Figure 15:
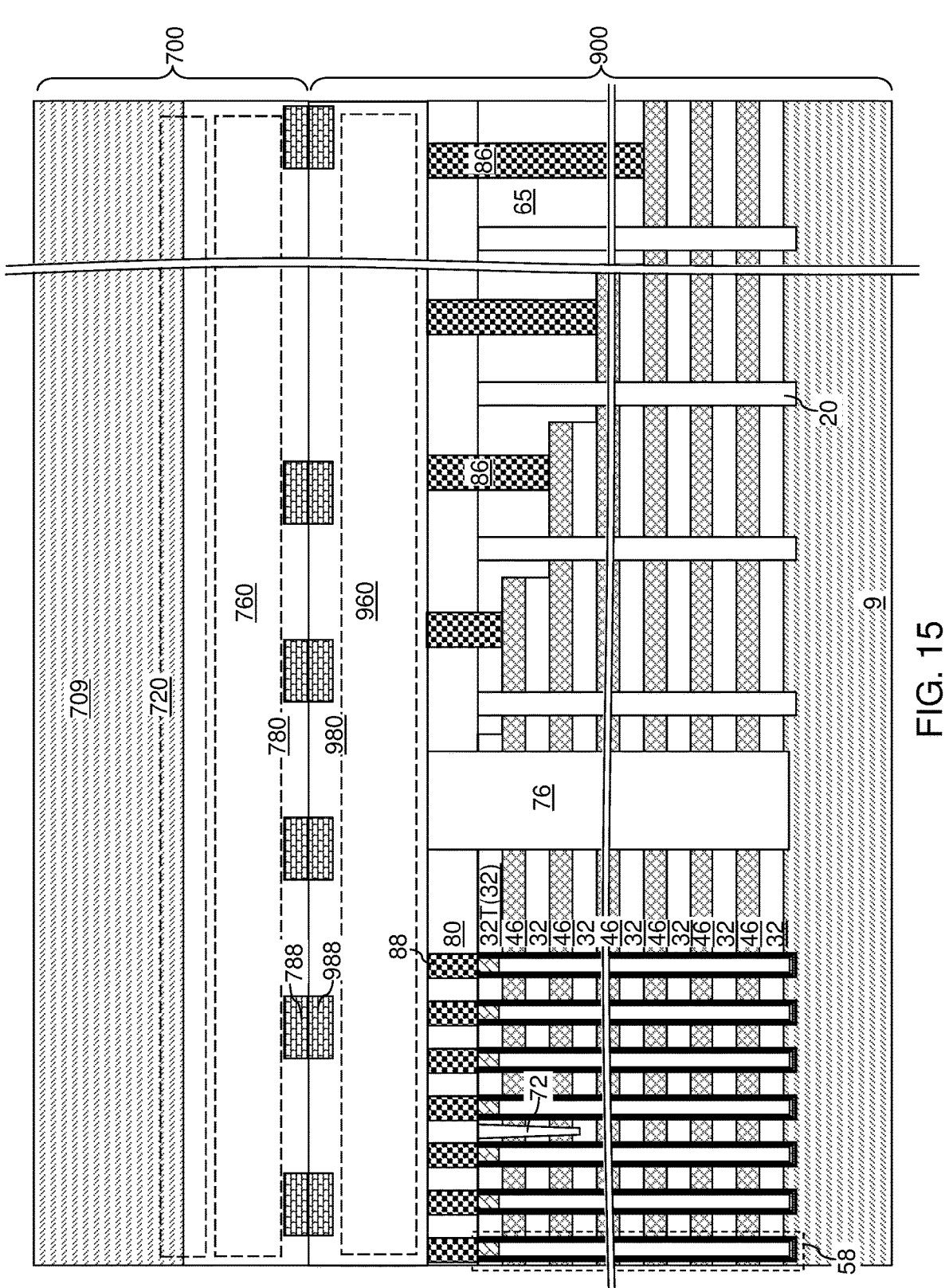
FIG. 15 is a vertical cross-sectional view of the first exemplary structure after attaching the logic die to the memory die according to the first embodiment of the present disclosure.

Referring to FIG. 15, the logic die 700 can be attached to the memory die 900, for example, by bonding the logic-side bonding pads 788 to the memory-side bonding pads 988 at a bonding interface. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads

788 within each logic die 700 can be bonded to the memory-side bonding pads 988 within a respective memory die 900.

Figure 16A:
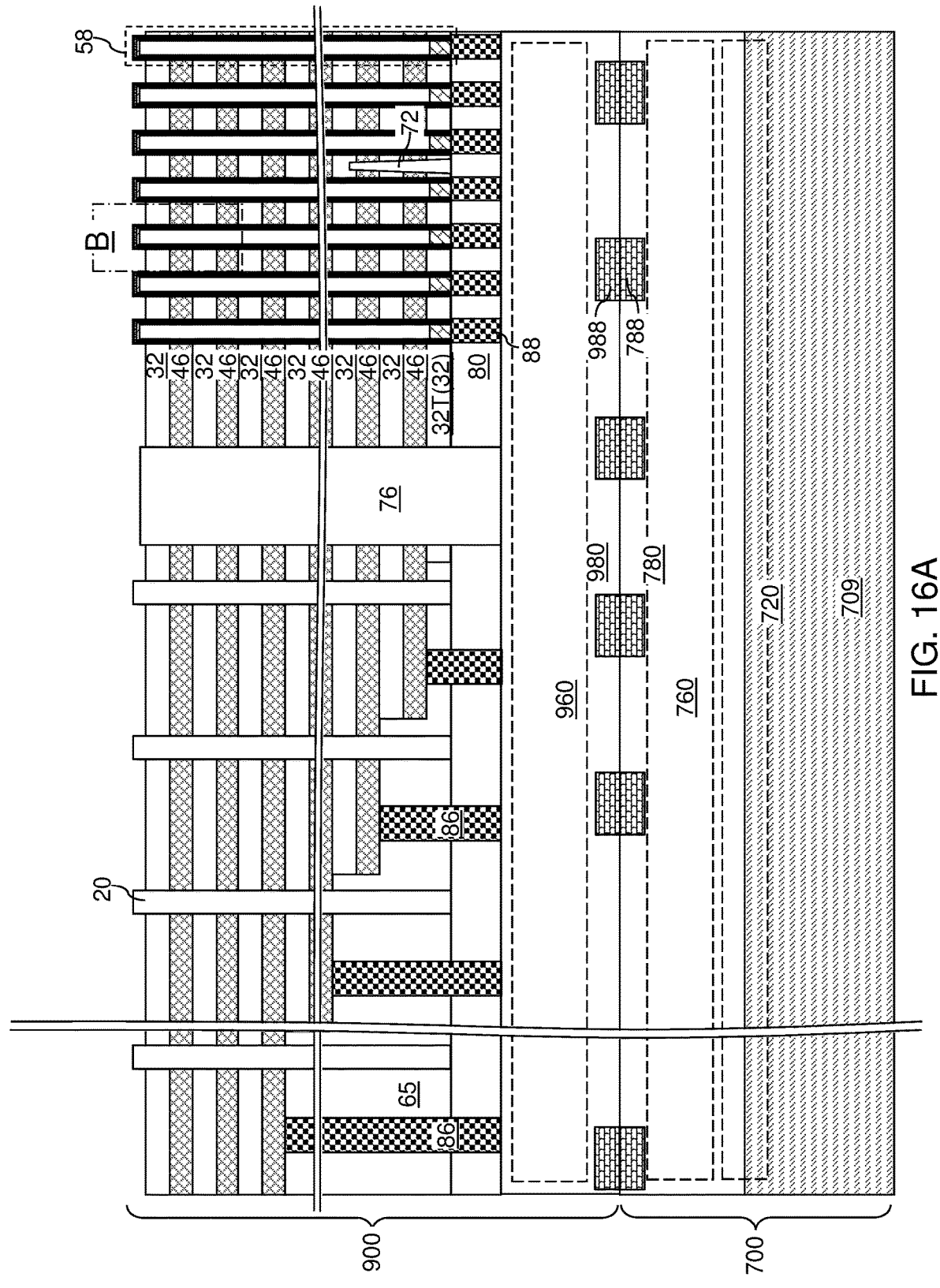
FIG. 16A is a vertical cross-sectional view of the first exemplary structure after removal of the carrier substrate according to the first embodiment of the present disclosure.
Figure 16B:
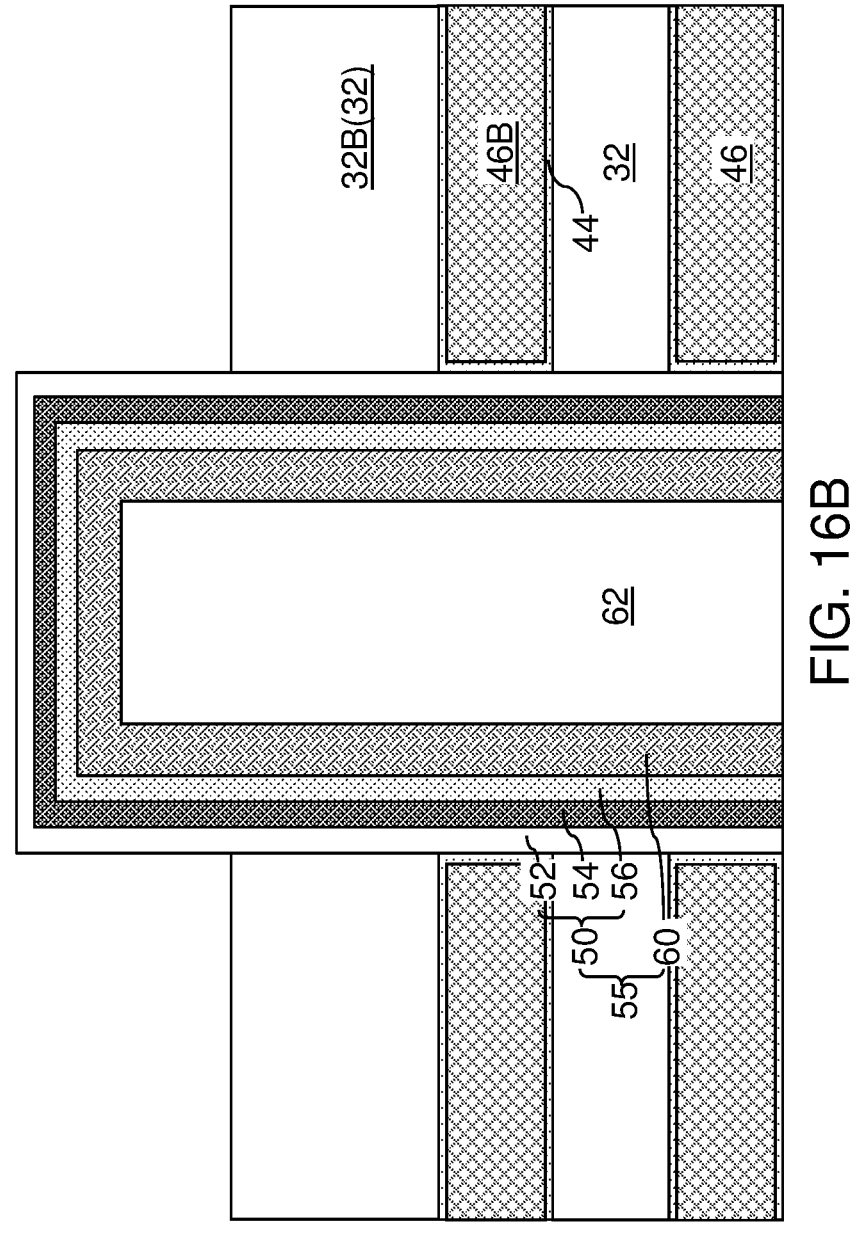
FIG. 16B is a magnified view of region B of FIG. 16A.

Referring to FIGS. 16A and 16B, the carrier substrate 9 can be removed, for example, by grinding, polishing, cleaving, an isotropic etch process, an anisotropic etch process, and/or a combination thereof. If a chemical mechanical polishing process or an etch process is employed as a terminal step for removing the carrier substrate 9, the bottommost insulating layer 32B may be employed as a polish stop or etch stop, respectively.

In one embodiment, at least a terminal step of at least one removal process that is employed to remove the carrier substrate 9 may comprise a selective wet etch process that etches the material of the carrier substrate 9 (such as a semiconductor material of the carrier substrate 9) selective to dielectric materials of the memory films 50. In an illustrative example, if the carrier substrate 9 comprises a semiconductor material, the terminal step of the at least one removal process may comprise a wet etch process using hot trimethyl-2 hydroxyethyl ammonium hydroxide ("hot TMY") or tetramethyl ammonium hydroxide (TMAH). The entirety of the carrier substrate 9 can be removed by the selective wet etch process. Backside end surfaces of the support pillars 20 can be physically exposed upon removal of the carrier substrate 9. The optional outer blocking dielectric layers 44 are illustrated in FIG. 16B, each of which embeds a respective electrically conductive layer 46. Alternatively, the optional outer blocking dielectric layers 44 may be omitted.

Figure 17A:
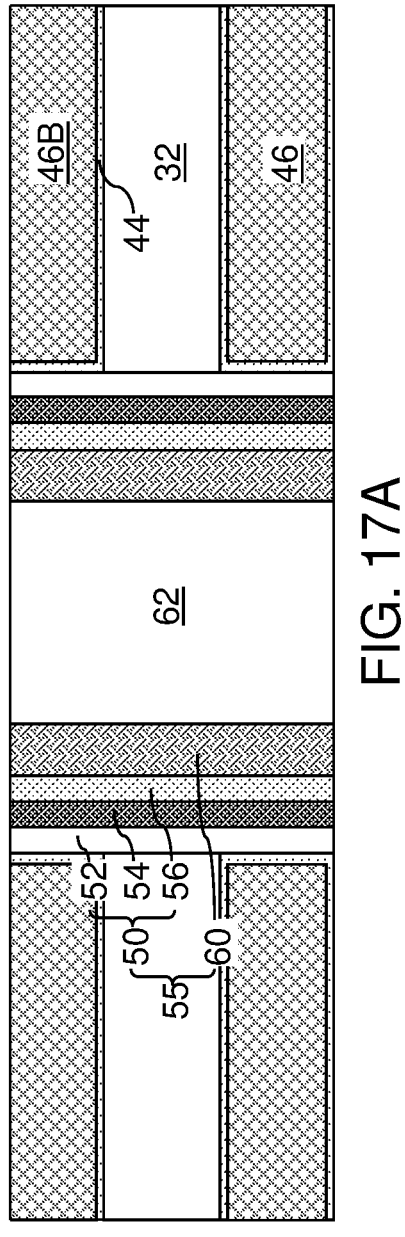
FIGS. 17A, 17B and 17D, and 17C and 17E are sequential vertical cross-sectional views of regions of the first exemplary structure during formation of a Schottky source structure according to respective first and second alternative configurations the first embodiment of the present disclosure.
Figure 17B:
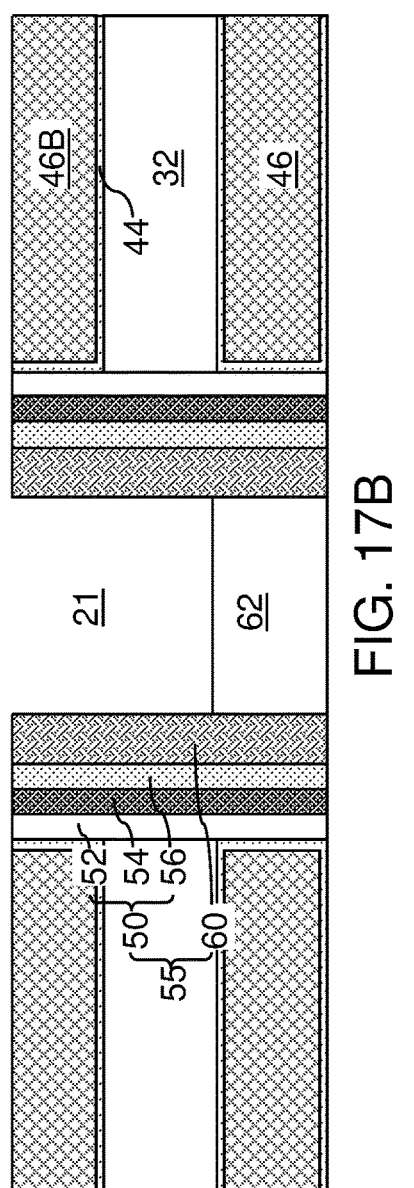
Figure 17C:
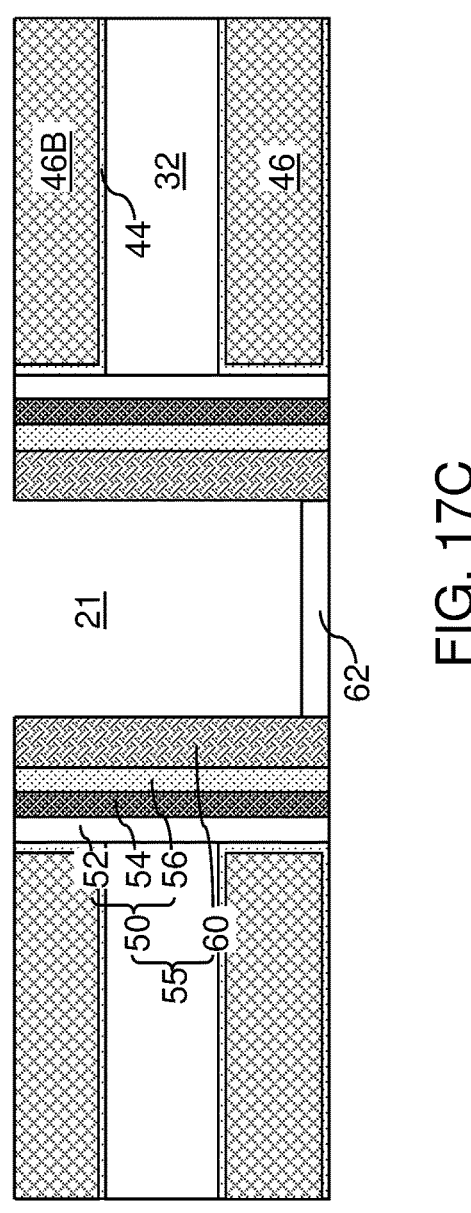

FIGS. 17A-17C are sequential vertical cross-sectional views of a region of the first exemplary structure during formation of a Schottky source structure according to the first embodiment of the present disclosure.

Referring to FIG. 17A, a chemical mechanical polishing process can be performed to remove a bottom portion of the alternating stack (32, 46) including the bottommost insulating layer 32B and a bottom portion of a bottommost electrically conductive layer 46B. In one embodiment, the chemical mechanical polishing process can be performed after removal of the carrier substrate 9 on the bottom side of the alternating stack (32, 46) until the bottommost electrically conductive layer 46B is exposed by the chemical mechanical polishing process. Thus, the bottommost electrically conductive layer 46B acts as a polish stop. Generally, all material portions underlying a horizontal plane contacting or passing through the bottommost electrically conductive layer 46B may be removed by the chemical mechanical polishing process. A horizontal surface of a remaining portion of the bottommost electrically conductive layer 46B within the alternating stack (32, 46) can be physically exposed. In one embodiment, the bottommost layer of the alternating stack (32, 46) comprises the bottommost insulating layer 32B, and the bottommost insulating layer 32B can be completely removed after removing the carrier substrate 9. All surfaces of remaining material portions on the backside of the alternating stack (32, 46) can be located within a horizontal plane. If the outer blocking dielectric layers 44, such as aluminum oxide outer blocking dielectric layers 44 are present in the memory device, then a portion of the outer blocking dielectric layer 44 remains between the bottommost electrically conductive layer 46B and the neighboring insulating layer 32 in the alternating stack (32, 46).

In one embodiment, each electrically conductive layer 46 within the alternating stack (32, 46) consists of a same set of at least one metallic material. In one embodiment, if a portion of the bottommost electrically conductive layer 46B is removed during the chemical mechanical polishing step, then all electrically conductive layers 46 within the alternating stack (32, 46) except the bottommost electrically conductive layer 46B have a first vertical thickness, and the bottommost electrically conductive layer 46B has a second vertical thickness that is less than the first vertical thickness.

Referring to FIG. 17B, an etch process can be performed to remove the material of the dielectric cores 62 selective to the materials of the vertical semiconductor channels 60, the memory films 50, and the bottommost electrically conductive layer 46. For example, a wet etch process employing dilute hydrofluoric acid can be performed to vertically recess bottom portions of the dielectric cores 62. In one embodiment, the duration of the etch process can be selected such that the vertically recessed horizontal surface of each dielectric core 62 is formed at the bottommost one of the insulating layers 32 that remain in the alternating stack (32, 46) or above the bottommost remaining one of the insulating layers 32 (i.e., past the bottommost remaining one of the insulating layers 32 in the direction of the source region 63). A recess cavity 21 can be formed in each volume from which the material of the dielectric cores 62 is removed. A cylindrical surface segment of an inner sidewall of each vertical semiconductor channel 60 can be physically exposed upon vertically recessing the bottom portions of the dielectric cores 62 and formation of the recess cavities 21.

In an alternative embodiment shown in FIG. 17C, the recess cavity 21 may extend above (in the direction of the source region 63) the second from the bottom electrically conductive layer 46 in the alternating stack (32, 46).

Figure 17D:
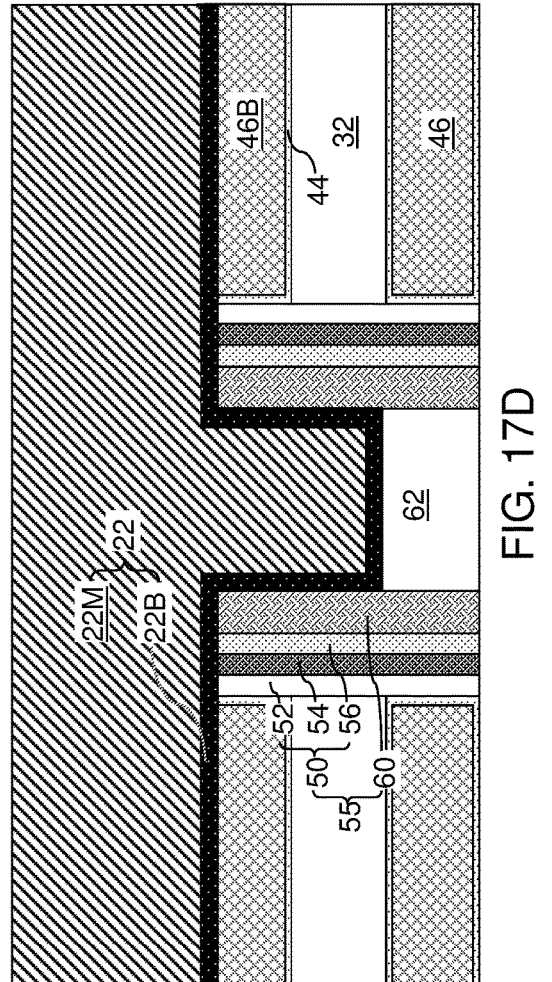
Figure 17E:
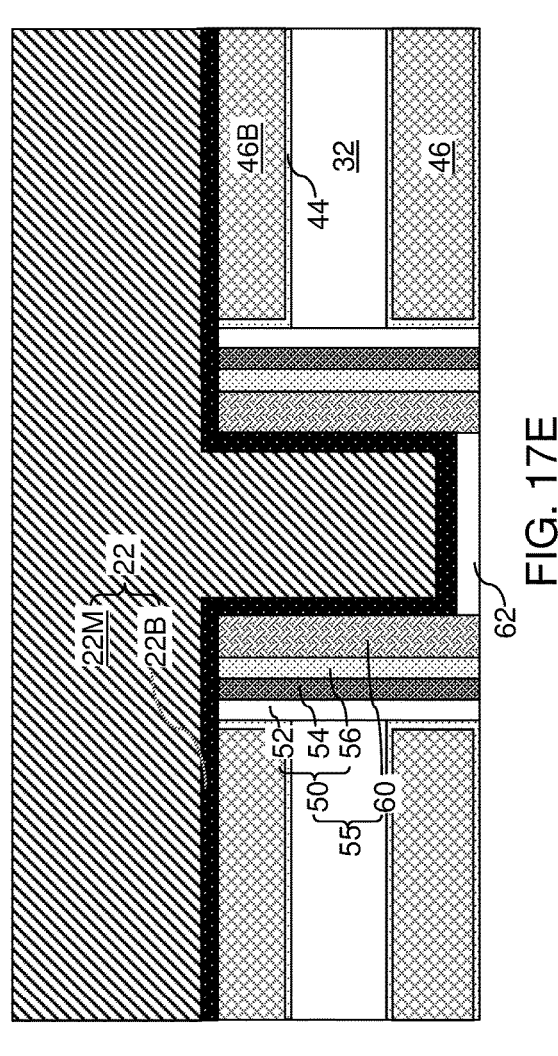

Referring to FIGS. 17D and 17E, a source layer 22 can be formed in the structures of FIGS. 17C and 17D, respectively. The source layer 22 is formed directly on each physically exposed cylindrical surface segment of the inner sidewalls and end surfaces of the vertical semiconductor channels 60, and on the physically-exposed horizontal surface of the r bottommost electrically conductive layer 46B. Thus, the source layer 22 contacts the bottom surface of the bottommost electrically conductive layer 46B and the bottom surfaces of the vertical semiconductor channels 60. Thus, a source line (22, 46B) comprises a combination of the bottommost electrically conductive layer 46B and the source layer 22. Optionally, a portion of the outer blocking dielectric layer 44 remains between the bottommost electrically conductive layer 46B portion of the source line (22, 46B) and the neighboring insulating layer 32 in the alternating stack (32, 46).

In one embodiment, the source layer 22 comprises a metallic barrier liner 22B which comprises a conductive metallic nitride material, such as TiN, WN, TaN or MoN, and is formed directly on the bottommost electrically conductive layer 46B, the memory films 50, and the vertical semiconductor channels 60. The thickness of the metallic barrier liner 22B may be in a range from 3 nm to 30 nm, although lesser and greater thicknesses may also be employed. The source layer 22 further comprises a metal layer 22M which consists essentially of an elemental metal (such as W, Co, Cu, Ru, Mo, Ti, Ta, etc.) and is deposited on the metallic barrier liner 22B. The thickness of a planar portion of the metal layer 22M may be in a range from 30 nm to 300 nm, although lesser and greater thicknesses may also be employed.

In one embodiment, each electrically conductive layer 46 within the alternating stack (32, 46) except the bottommost electrically conductive layer 46B is embedded within a respective first outer blocking dielectric layer 44. The first outer blocking dielectric layer 44 comprises a respective pair of horizontally-extending portions and a respective set of cylindrical vertically-extending portions. In one embodiment, the bottommost electrically conductive layer 46B is embedded within a second outer blocking dielectric layer 44 comprising a single horizontally-extending portion and an additional set of cylindrical vertically-extending portions. In one embodiment, the memory opening fill structure 58 is laterally surrounded by and is contacted by each of the first outer blocking dielectric layers 44 and the second outer blocking dielectric layer 44. The vertical edges of the additional cylindrical vertically-extending portions of the second outer blocking dielectric layer 44 are in contact with the source layer 22. The source layer 22 directly contacts the exposed bottom surface of the bottommost electrically conductive layer 46B.

In one embodiment, the memory opening fill structure 58 comprises a dielectric core 62 that is laterally surrounded by the vertical semiconductor channel 60, and an interface between the source layer 22 and the dielectric core 62 is vertically offset toward a topmost layer of the alternating stack (32, 46) (i.e., toward the source region 63) relative to a horizontal interface between the source layer 22 and the bottommost electrically conductive layer 46B. In one embodiment, the source layer 22 comprises a metallic barrier liner 22B comprising a conductive metallic nitride material in direct contact with each of the bottommost electrically conductive layer 46B, the memory film 50, and the vertical semiconductor channel 60, and a metal layer 22M consisting essentially of an elemental metal and underlying the metallic barrier liner 22B.

Figure 18:
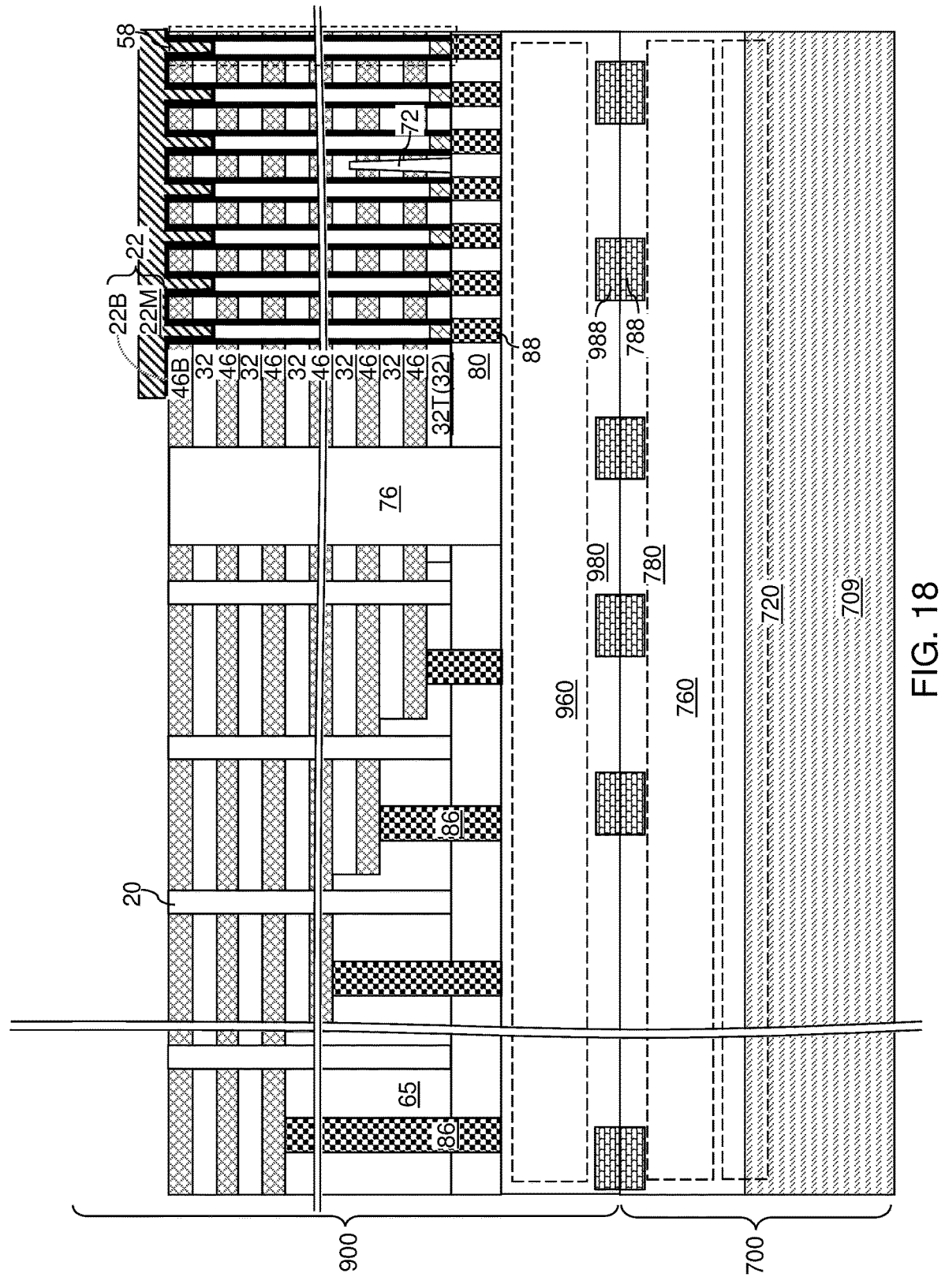
FIG. 18 is a vertical cross-sectional view of the first exemplary structure after formation of the Schottky source structure according to the first embodiment of the present disclosure.

Referring to FIG. 18, the source layer 22 can be patterned into one or more portions that are connected to the bottommost electrically conductive layer 46B. Each patterned source layer 22 comprises a Schottky source structure providing a Schottky junction to a respective set of vertical semiconductor channels 60.

Figure 19:
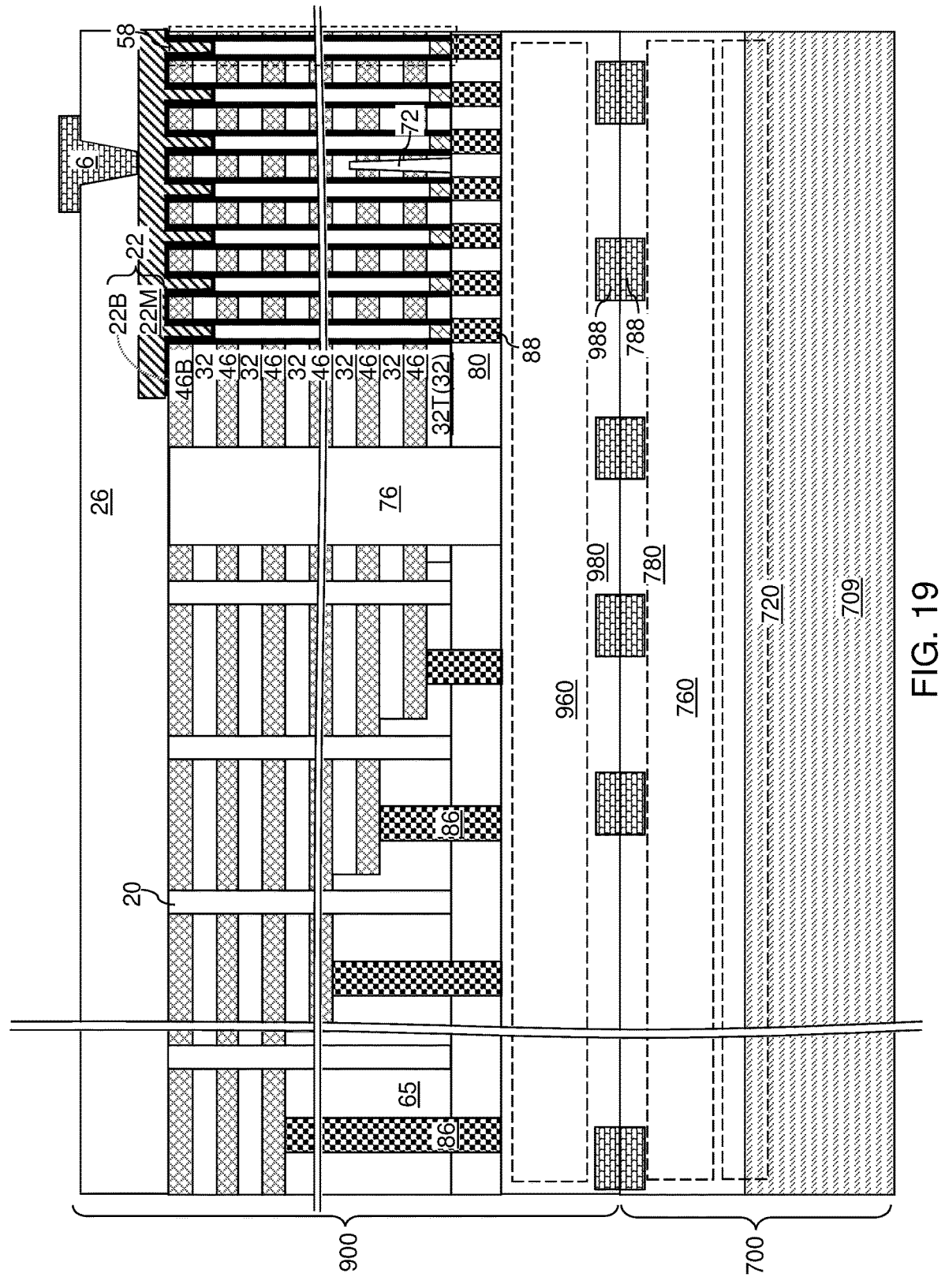
FIG. 19 is a vertical cross-sectional view of the first exemplary structure after formation of a backside dielectric layer and a source contact structure according to the first embodiment of the present disclosure.

Referring to FIG. 19, a backside dielectric layer 26 can be deposited over the source layer 22. An electrically conductive source contact structure 6 can be formed through the backside dielectric layer 26 on the source layer 22.

Figure 20:
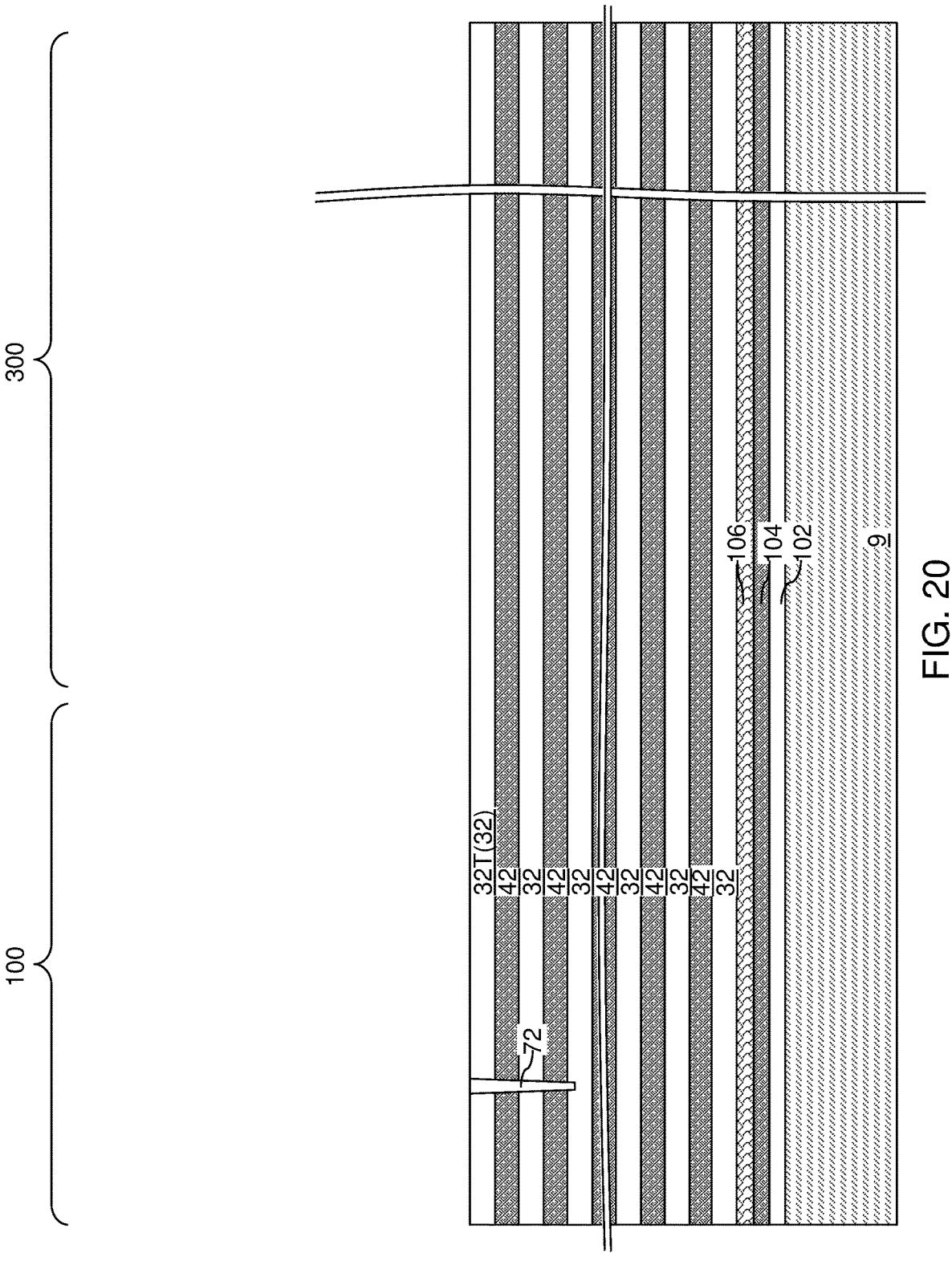
FIG. 20 is a schematic vertical cross-sectional view of a second exemplary structure after formation of a planar dielectric layer, a stopper dielectric layer, a semiconductor material layer, and an alternating stack of insulating layers and sacrificial material layers over a carrier substrate according to a second embodiment of the present disclosure.

Referring to FIG. 20, a second exemplary structure according to a second embodiment of the present disclosure can be derived from the first exemplary structure illustrated in FIG. 1 by forming a layer stack including a planar dielectric layer 102, a stopper dielectric layer 104, and a semiconductor material layer 106 on a top surface the carrier substrate 9 prior to formation of an alternating stack (32, 42) of insulating layers 32 and sacrificial material layers 42. The planar dielectric layer 102 comprises a dielectric material, such as undoped silicate glass (e.g., silicon oxide) or doped silicate glass, and may have a thickness in the range from 30 nm to 300 nm, although lesser and greater thicknesses may also be employed. The stopper dielectric layer 104 comprises a dielectric material different from that of the planar dielectric layer 102 that may be employed as a stopper material during a subsequent planarization process. In one embodiment, the stopper dielectric layer 104 comprises silicon nitride or a dielectric metal oxide, and may have a thickness in the range from 30 nm to 300 nm, although lesser and greater thicknesses may also be employed. The semiconductor material layer 106 comprises a semiconductor material such as silicon (e.g., amorphous silicon or polysilicon) or silicon germanium. In one embodiment, the semiconductor material layer 106 may be doped with electrical dopants of a second conductivity type (e.g., n-type dopants, such as phosphorus and/or arsenic), which is the opposite of a first conductivity type that is employed to dope vertical semiconductor channels. The atomic concentration of dopants of the second conductivity type in the semiconductor material layer 106 may be in the range from $5.0 \times 10^{18}/cm^3$ to $2.0 \times 10^{21}/cm^3$, although lesser and greater atomic concentrations may also be employed.

Figure 21:
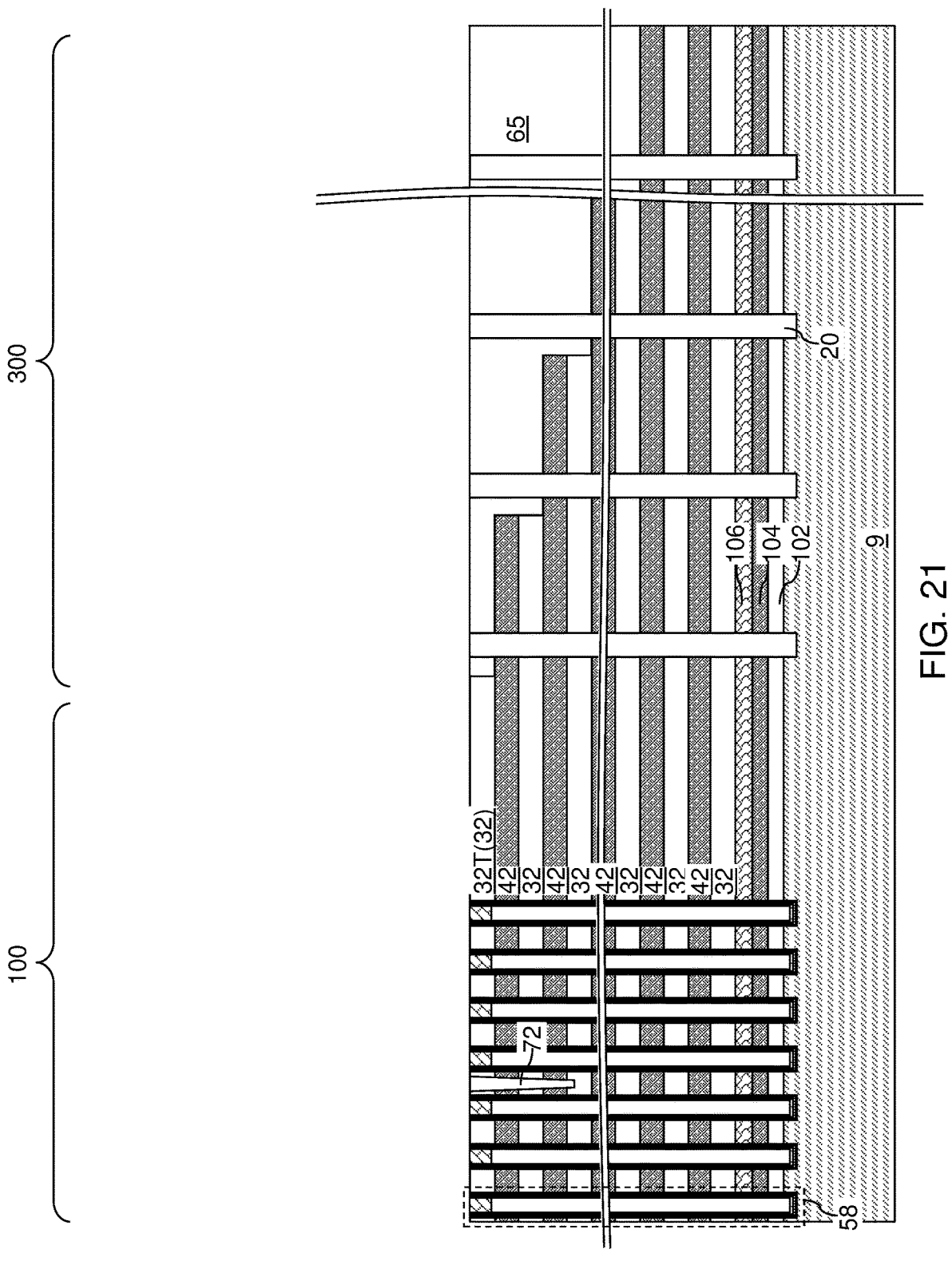
FIG. 21 is a schematic vertical cross-sectional view of the second exemplary structure after formation of memory opening fill structures and support pillars according to the second embodiment of the present disclosure.

Referring to FIG. 21, the processing steps described with reference to FIGS. 2-8B can be subsequently performed. The chemistry of the anisotropic etch process employed to form the memory openings 49 and the support openings 19 may be modified as needed in view of the presence of the layer stack of the semiconductor material layer 106, the stopper dielectric layer 104, and the planar dielectric layer 102. In one embodiment, bottom surfaces of the memory openings 49 and the support openings 19 may formed in an upper portion of the carrier substrate 9. Accordingly, bottom surfaces of the memory opening fill structures 58 and the support pillars 20 may formed in an upper portion of the carrier substrate 9.

Figure 22:
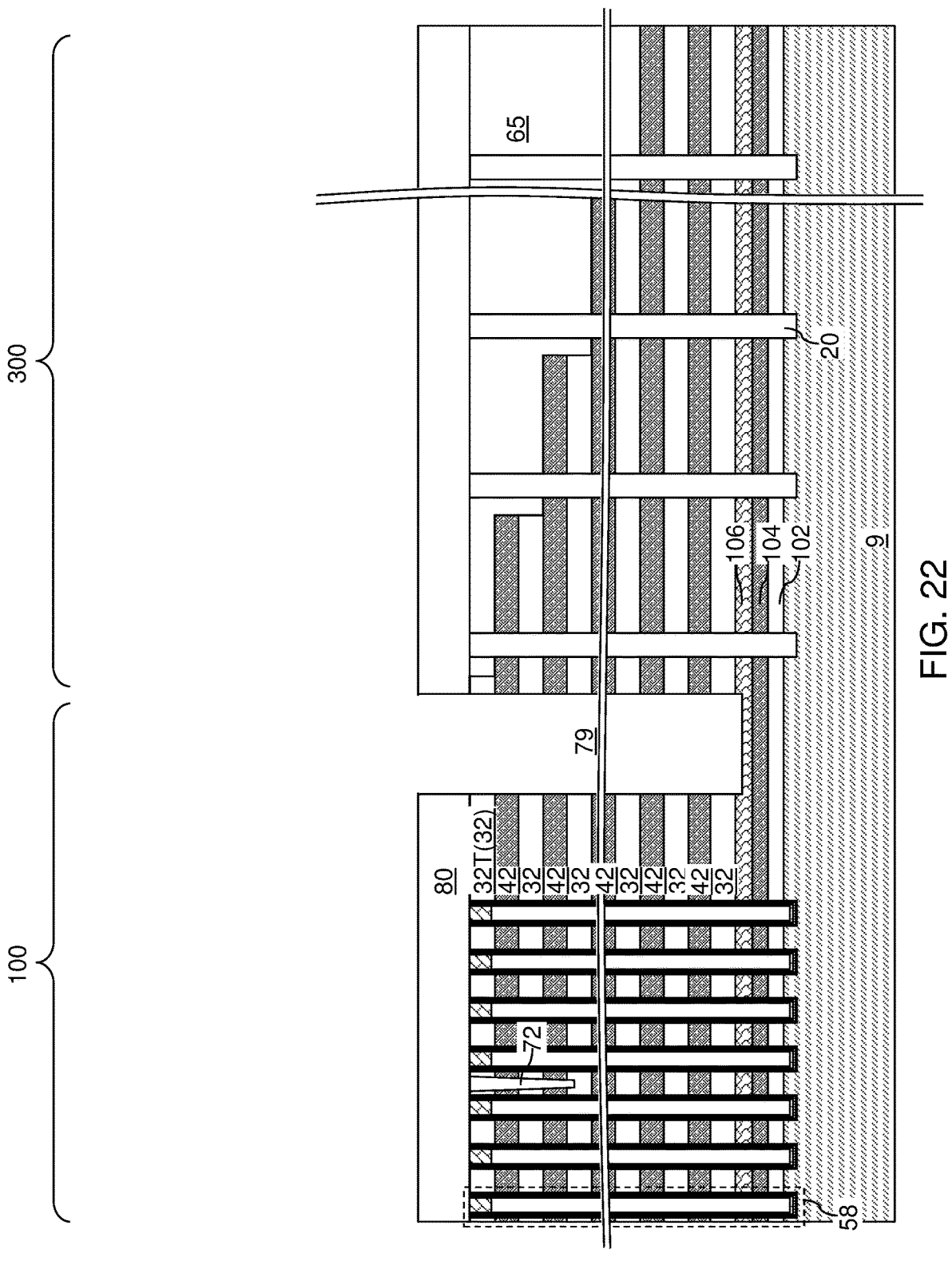

Referring to FIG. 22, the processing steps described with reference to FIGS. 9A and 9B can be performed to form a contact-level dielectric layer 80, and to form lateral isolation trenches 79. In one embodiment, the semiconductor material layer 106 may be employed as an etch stop layer during formation of the lateral isolation trenches 79, such that the isolation trenches 79 do not extend all the way through the semiconductor material layer 106 and do not reach the stopper dielectric layer 104.

Figure 23:
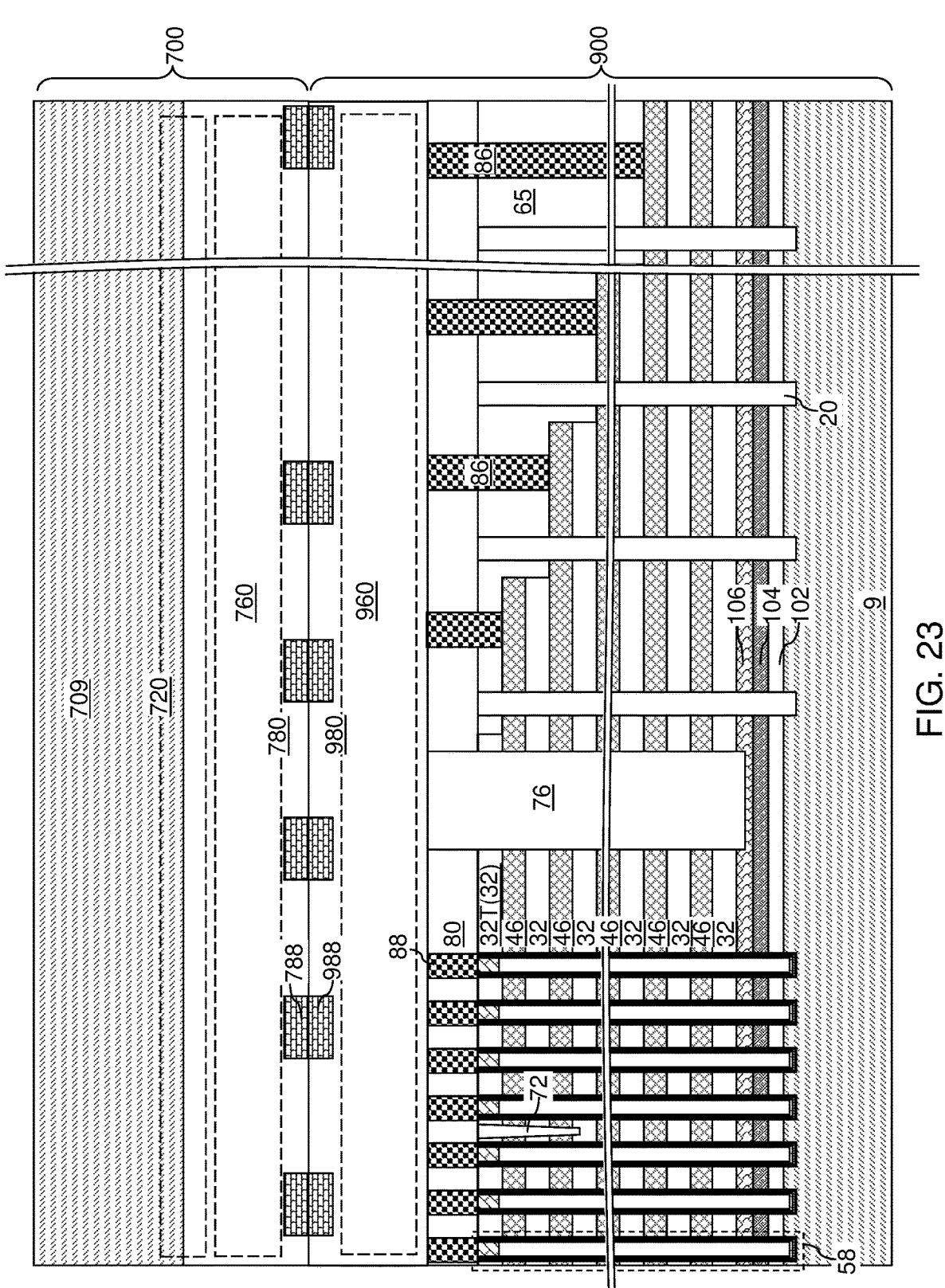
FIG. 23 is a vertical cross-sectional view of the second exemplary structure after attaching the logic die to the memory die according to the second embodiment of the present disclosure.

Referring to FIG. 23, the processing steps described with reference to FIGS. 10-13 can be performed to replace the sacrificial material layers 42 with electrically conductive layers 46. Various contact via structures (88, 86) can be formed, and memory-side dielectric material layers 960 embedding memory-side metal interconnect structures 980 and memory-side bonding pads 988 can be formed. A memory die 900 can be provided. Subsequently, the processing steps described with reference to FIGS. 14 and 15 can be performed to provide a logic die 700, and to bond the logic die 700 to the memory die 900.

Figure 24A:
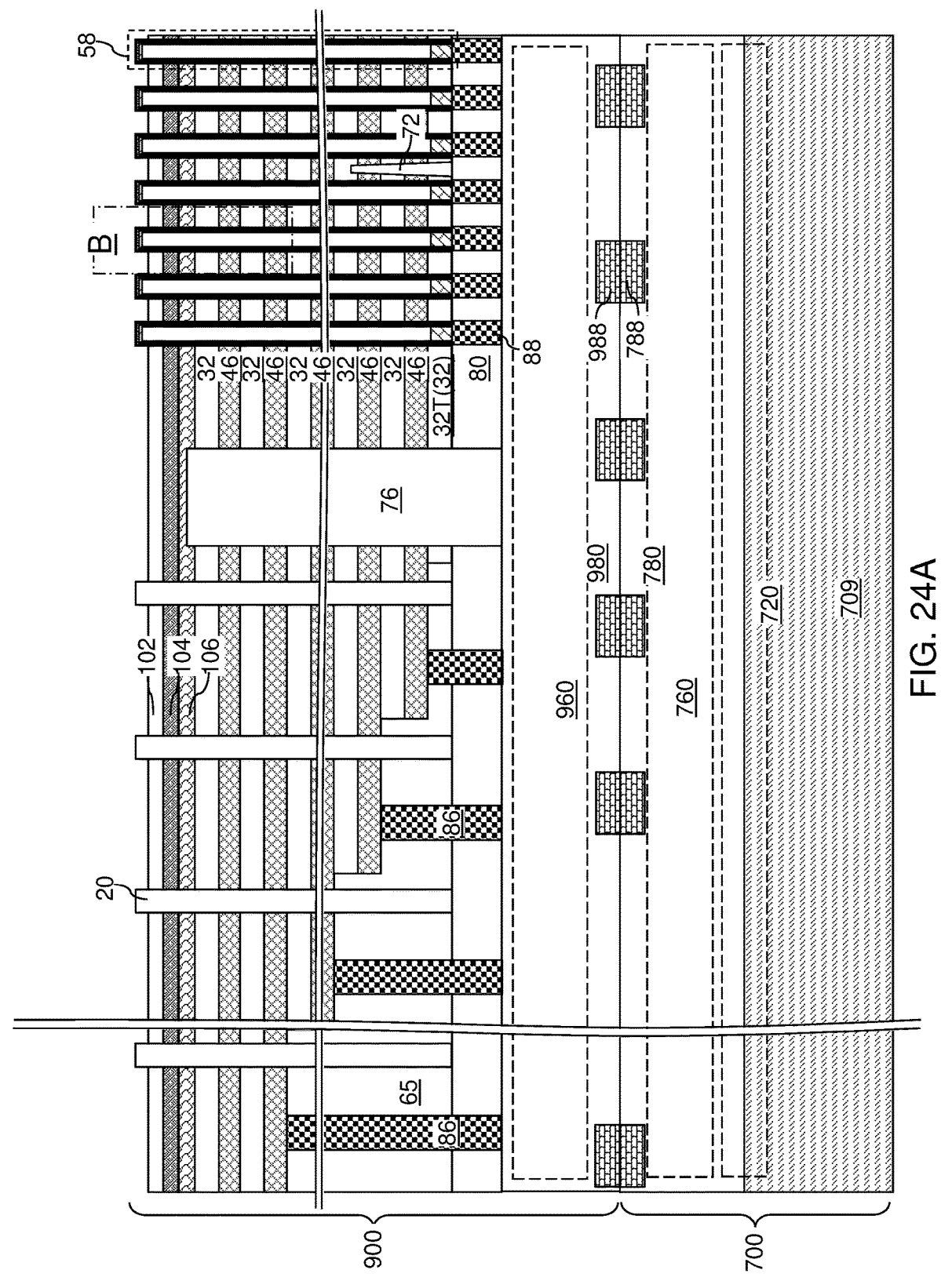
FIG. 24A is a vertical cross-sectional view of the second exemplary structure after removal of the carrier substrate according to the second embodiment of the present disclosure.
Figure 24B:
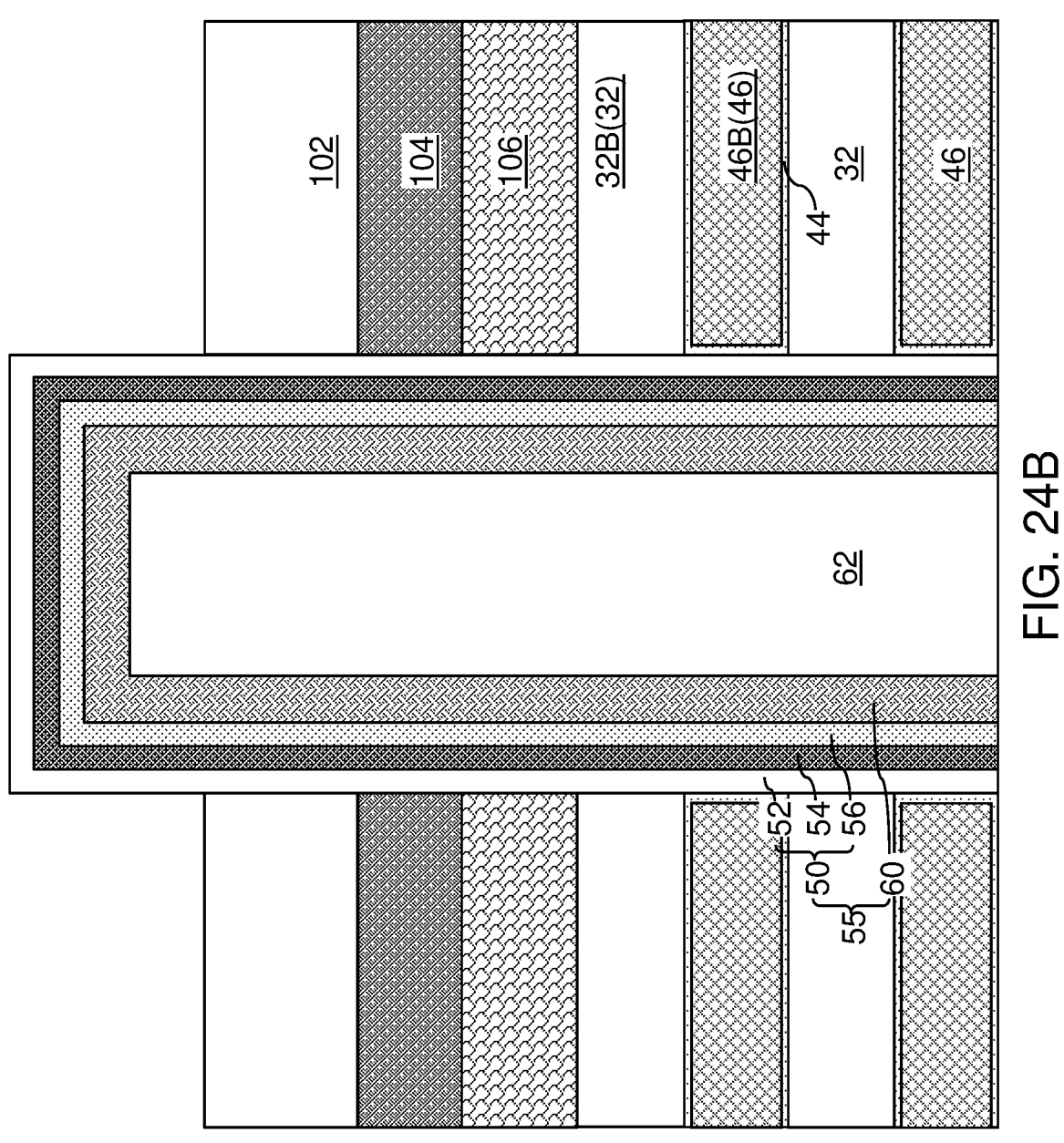
FIG. 24B is a magnified view of region B of FIG. 24A.

Referring to FIGS. 24A and 24B, the processing steps described with reference to FIGS. 16A and 16B can be performed to remove the carrier substrate 9 selective to the planar dielectric layer 102 and the memory opening fill structures 58, i.e., selective to the memory film 50 portions of the memory opening fill structures 58.

FIGS. 25A-25G are sequential vertical cross-sectional views of a region of the second exemplary structure during formation of a Schottky source structure according to the second embodiment of the present disclosure.

Figure 25A:
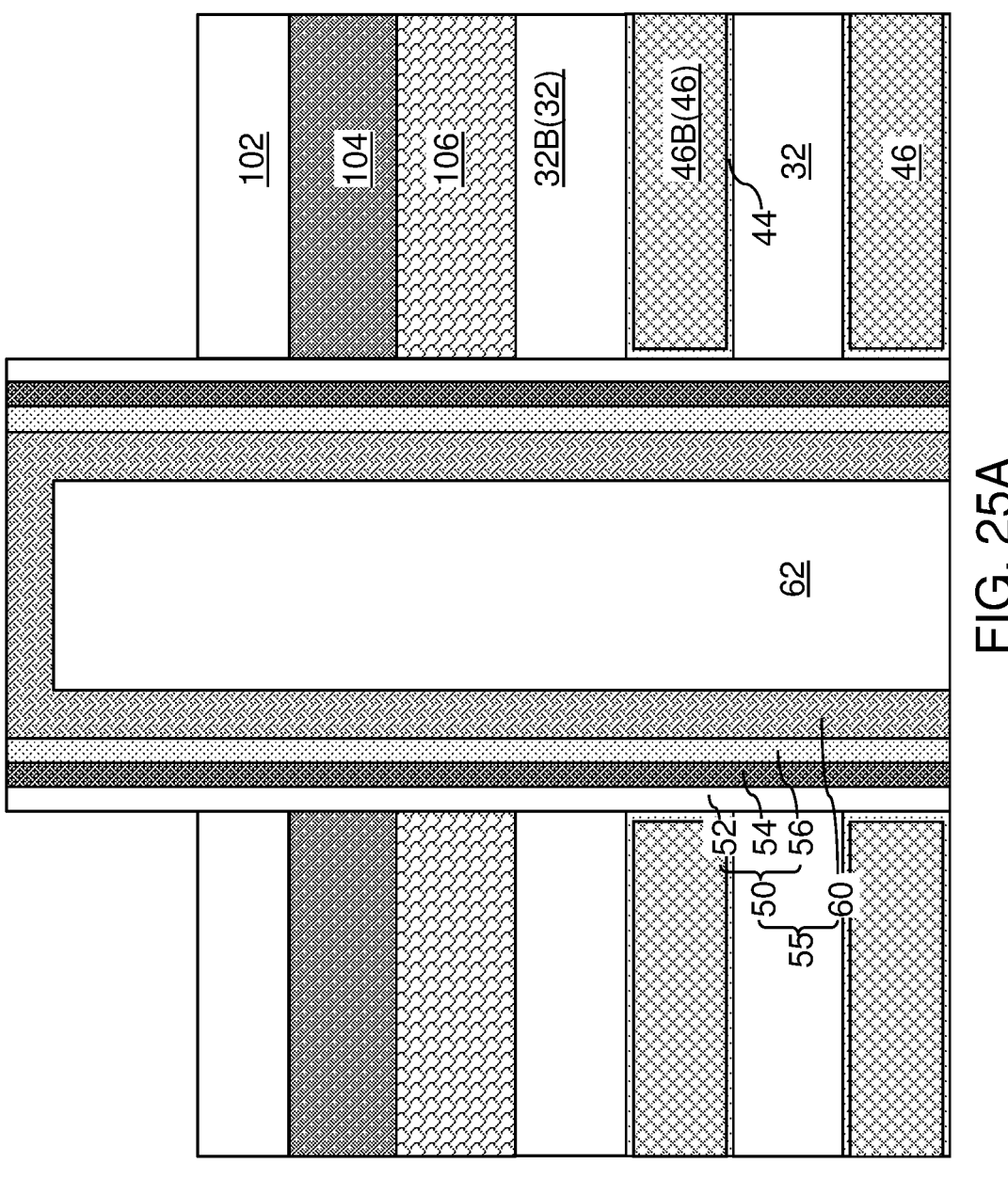
FIGS. 25A-25G are sequential vertical cross-sectional views of a region of the second exemplary structure during formation of a Schottky source structure according to the second embodiment of the present disclosure.

Referring to FIG. 25A, a sequence of selective etch processes can be performed to remove a physically exposed end portion of the memory film 50 selective to the vertical semiconductor channel 60 in each memory opening fill structure 58. For example, the sequence of selective etch processes may comprise a first selective etch process that etches the material of the blocking dielectric layer 52 selective to the material of the memory material layer 54, a second selective etch process that etches the material of the memory material layer 54 selective to the material of the dielectric liner 56, and a third selective etch process that etches the material of the dielectric liner 56 selective to the material of the vertical semiconductor channel 60. A surface portion of the planar dielectric layer 102 can be collaterally recessed during removal of the physically exposed to end portion of each memory film 50.

Figure 25B:
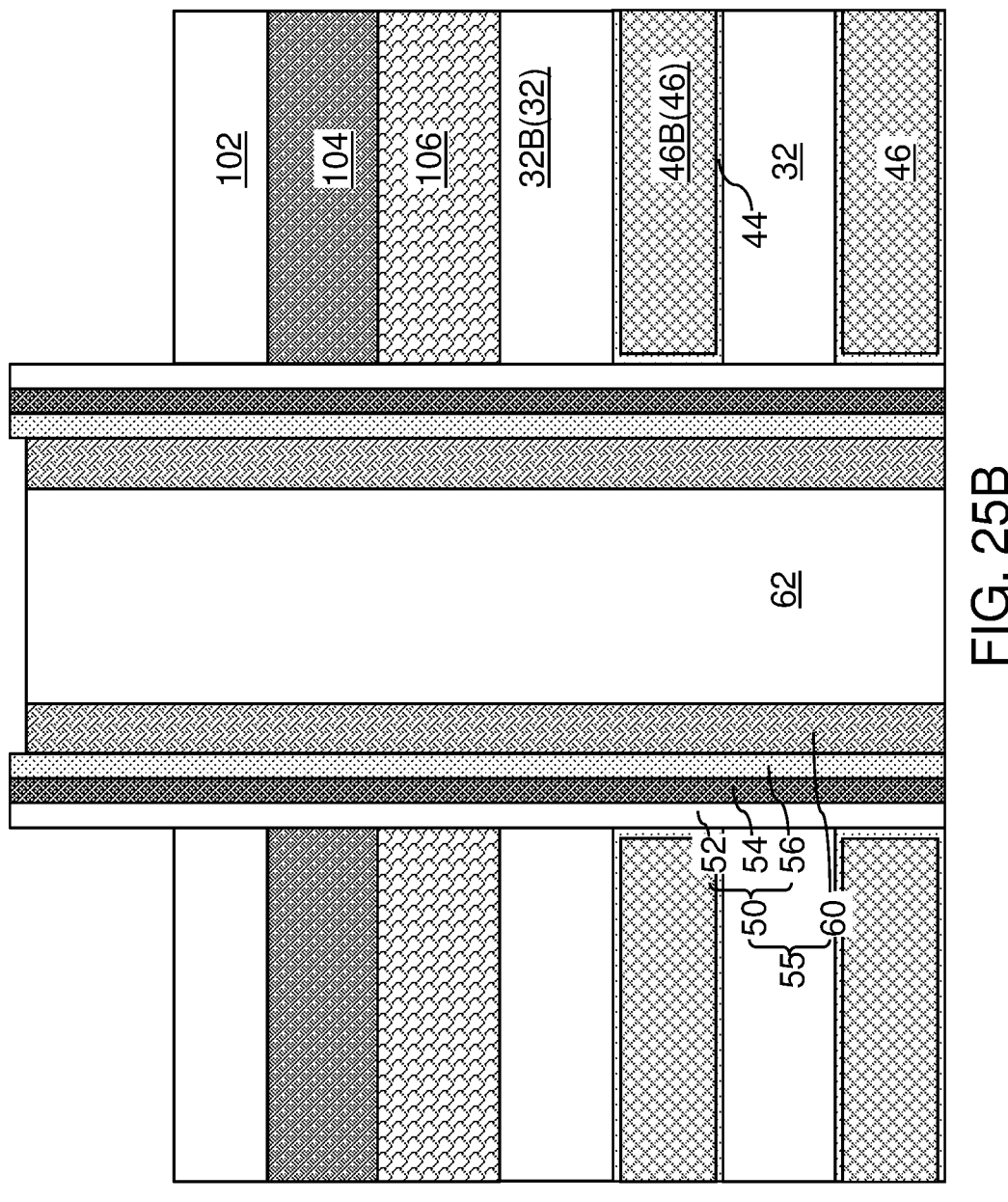

Referring to FIG. 25B, an isotropic etch process can be performed to remove a physically exposed end portion of each vertical semiconductor channel 60. For example, a wet etch process employing hot trimethyl-2 hydroxyethyl ammonium hydroxide ("hot TMY") or tetramethyl ammonium hydroxide (TMAH) may be performed to remove the physically exposed end portion of each vertical semiconductor channel 60. Bottom surfaces of dielectric cores 62 can be exposed during this step.

Figure 25C:
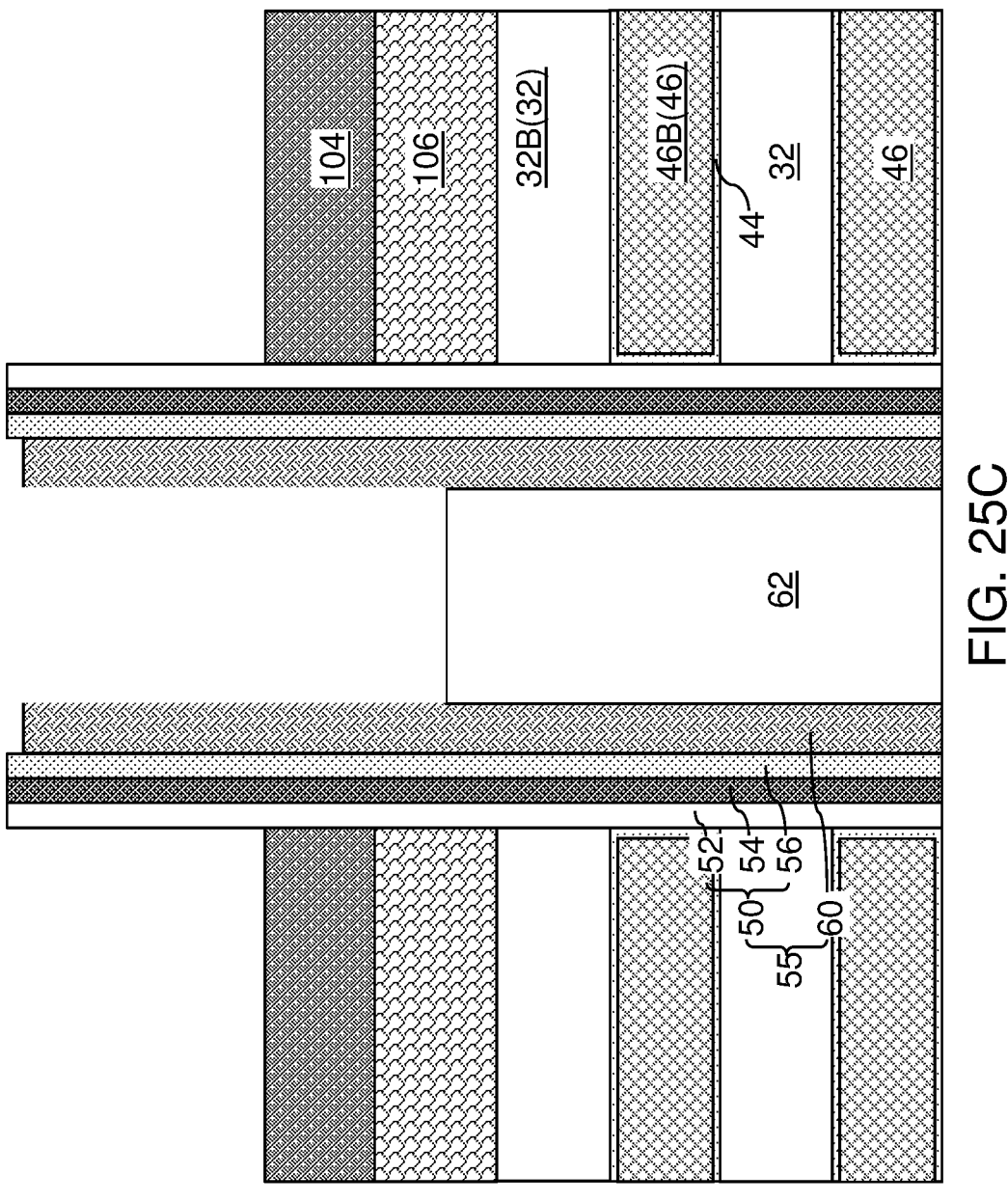

Referring to FIG. 25C, an etch process can be performed to remove the remaining portion of the planar dielectric layer 102. For example, if the planar dielectric layer 102 comprises undoped silicate glass or a doped silicate glass, a wet etch process employing dilute hydrofluoric acid may be performed to remove the planar dielectric layer 102. The dielectric cores 62 can be collaterally vertically recessed to a height at or around the semiconductor material layer 106. The vertically exposed portions of the memory film 50 may optionally also be collaterally recessed during this step.

Figure 25D:
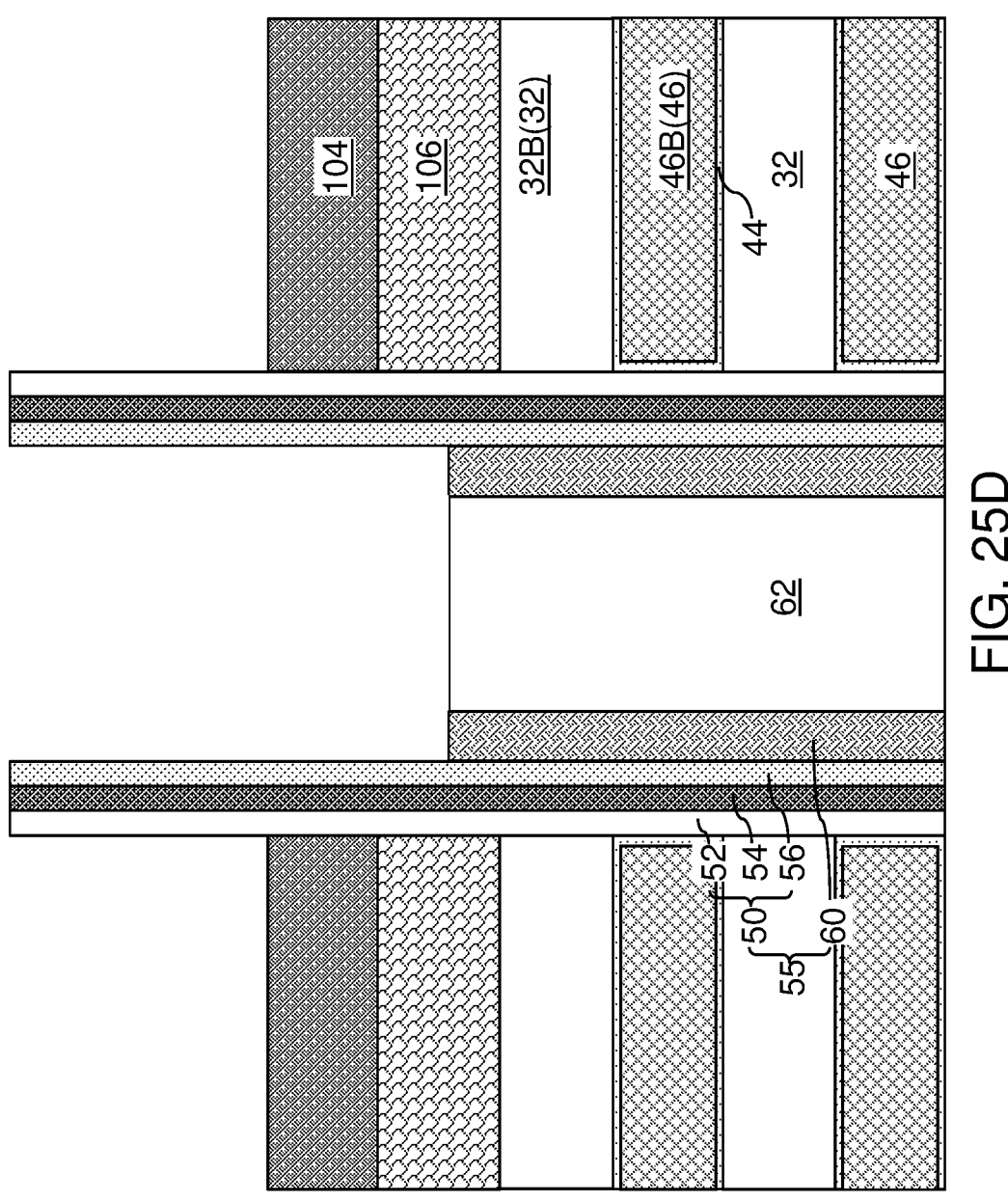

Referring to FIG. 25D, a cylindrical end portion of each vertical semiconductor channel 60 can be subsequently removed, for example, by performing an isotropic etch process. For example, a wet etch process employing hot trimethyl-2 hydroxyethyl ammonium hydroxide ("hot TMY") or tetramethyl ammonium hydroxide (TMAH) may be performed to remove the cylindrical end portion of each vertical semiconductor channel 60.

Figure 25E:
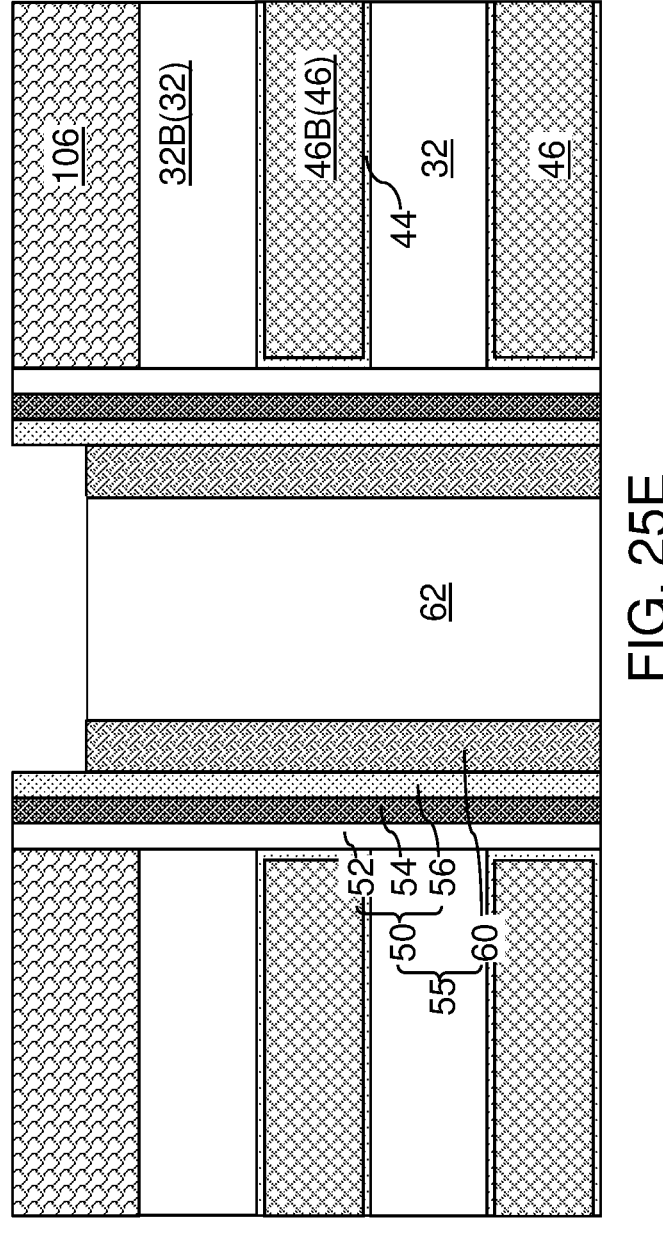

Referring to FIG. 25E, the stopper dielectric layer 104 can be subsequently removed selective to thus semiconductor material layer 106, the vertical semiconductor channels 60, and the dielectric cores 62. For example, if the stopper dielectric layer 104 comprises silicon nitride, a wet etch process employing hot phosphoric acid may be performed to remove the stopper dielectric layer 104. The bottom surface of the semiconductor material layer 106 acts as an etch stop layer and can be physically exposed. The remaining vertically exposed portions of the memory film 50 may also be collaterally recessed during this step.

Figure 25F:
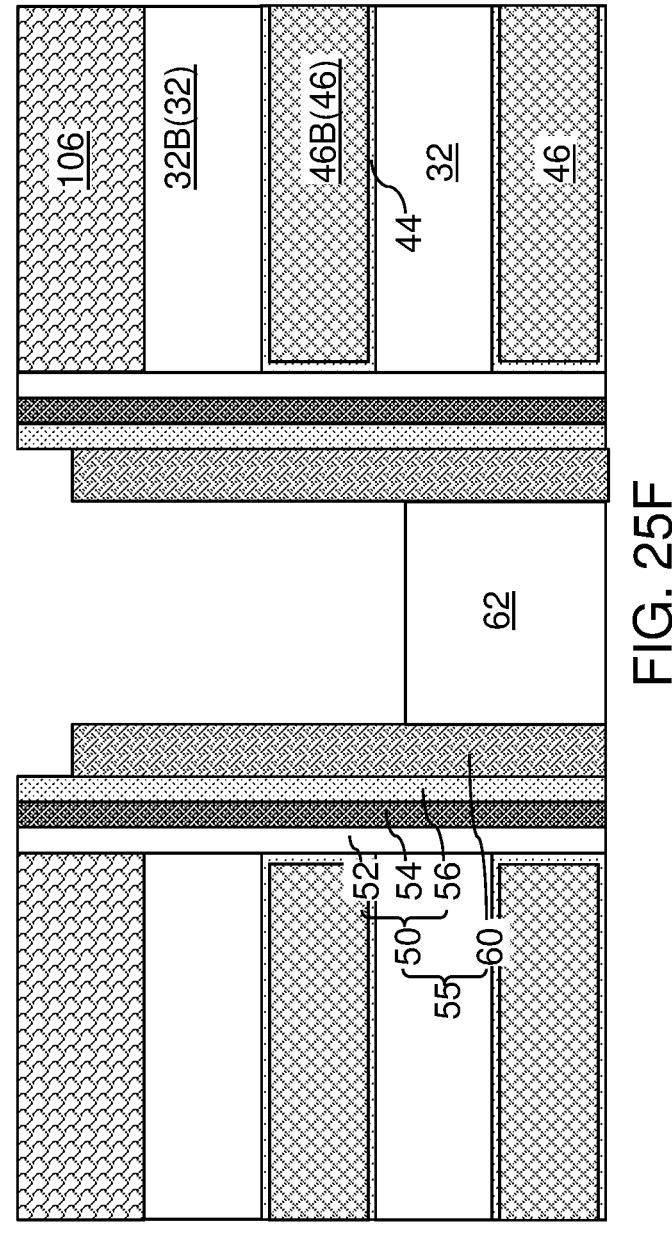

Referring to FIG. 25F, a second recess etch process can be performed to vertically recess the dielectric cores 62. For example, a wet etch process employing dilute hydrofluoric acid can be performed to vertically recess the dielectric cores 62. In one embodiment, the recessed bottom surfaces of the dielectric cores 62 may be located at or around a horizontal plane which extends through an insulating layer 32 within the alternating stack (32, 46) that is vertically spaced from the semiconductor material layer 106 by at least one electrically conductive layer 46 (such as a bottommost electrically conductive layer). The exposed end portions of the memory film 50 may also be collaterally recessed during this step.

Figure 25G:
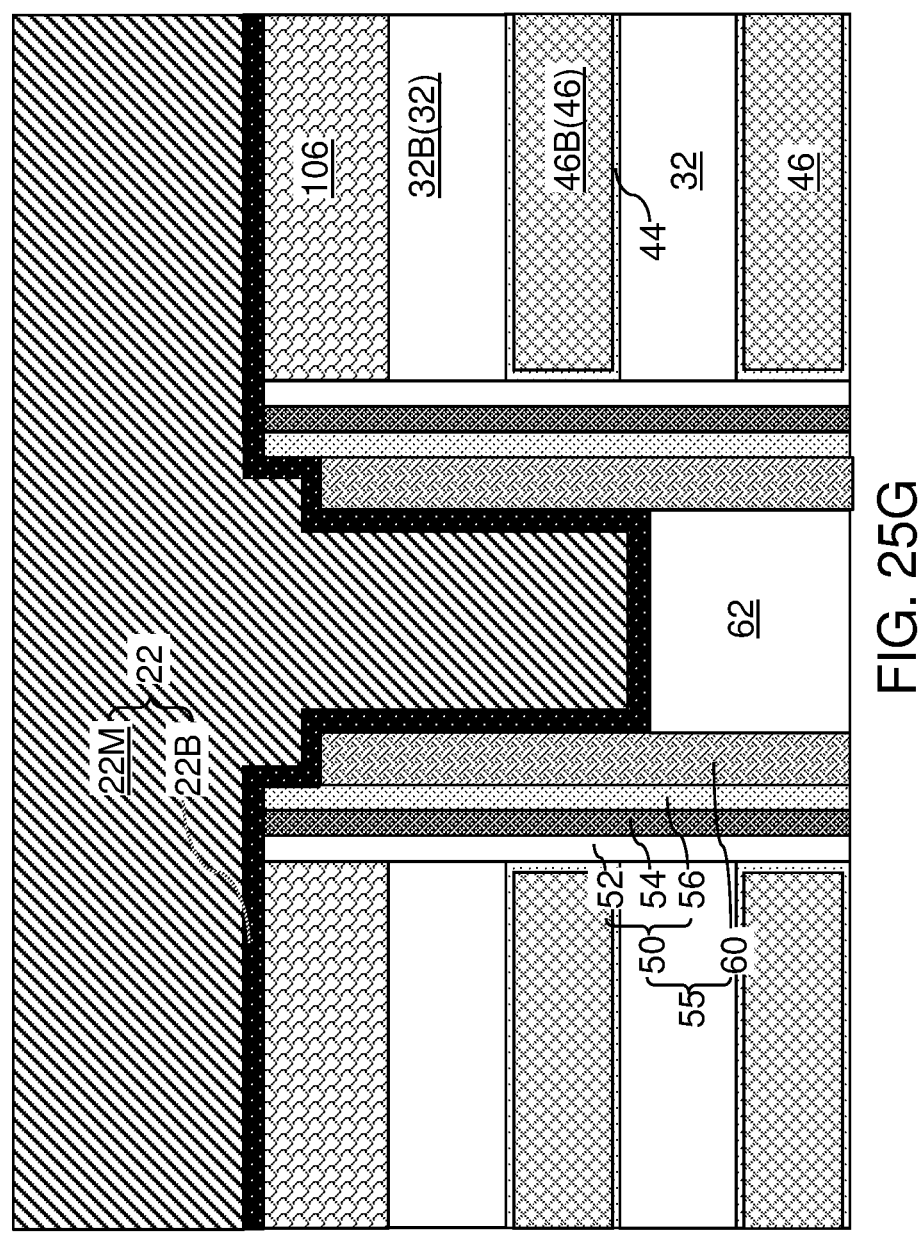

Referring to FIG. 25G, the source layer 22 described above can be formed directly on each physically exposed cylindrical surface segment of the inner sidewalls and the end surfaces of the vertical semiconductor channels 60 and on the physically-exposed horizontal surface of the semiconductor material layer 106. The source layer 22 contacts the bottom surface of the semiconductor material layer 106 and the bottom surfaces of the vertical semiconductor channels 60. Thus, the source line in this embodiment comprises a combination of the source layer 22 and the semiconductor material layer 106.

In this embodiment, the source layer 22 contacts the inner sidewall of the vertical semiconductor channel 60 and the bottom surface of the semiconductor material layer 106 underlying the alternating stack (32, 46). The semiconductor material layer 106 contacts an outer sidewall of the memory film 50 and does not directly contact the vertical semiconductor channel 60.

Specifically, the source layer 22 is located on a bottom portion of an inner sidewall of each vertical semiconductor channel 60 and a bottom surface of each vertical semiconductor channel 60, and protrudes above a horizontal plane including a top surface of a bottommost electrically conductive layer 46B within the alternating stack (32, 46).

In one embodiment, each memory film 50 comprises the outer sidewall that contacts a cylindrical surface segment of the semiconductor material layer 106, and an annular planar bottom surface that contacts the source layer 22. In one embodiment, the source layer 22 contacts a cylindrical surface segment of an inner sidewall of the memory film 50. In one embodiment, the entirety of the contact area between the source layer 22 and the vertical semiconductor channel 60 is located above (i.e., in the direction of the drain region 63) a horizontal plane including a horizontal interface between the source layer 22 and the semiconductor material layer 106. In one embodiment, an annular bottom surface of each memory film 50 contacts the source layer 22 within a horizontal plane including a bottom surface of the semiconductor material layer 106.

Figure 26:
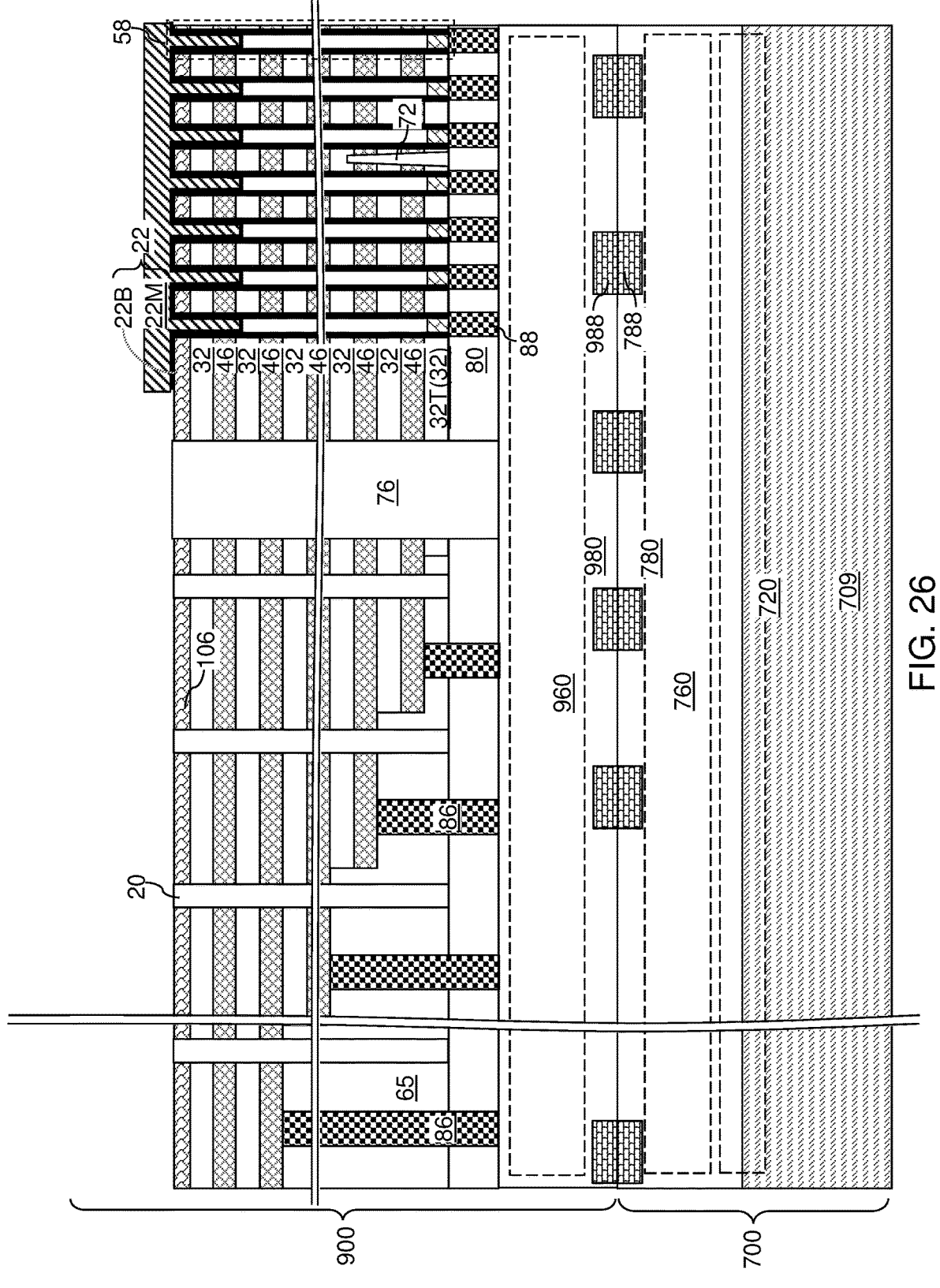
FIG. 26 is a vertical cross-sectional view of the second exemplary structure after formation of the Schottky source structure according to the second embodiment of the present disclosure.

Referring to FIG. 26, the source layer 22 can be patterned as described above. The patterned source layer 22 comprises a Schottky source structure providing Schottky junctions to a respective set of vertical semiconductor channels 60.

Figure 27:
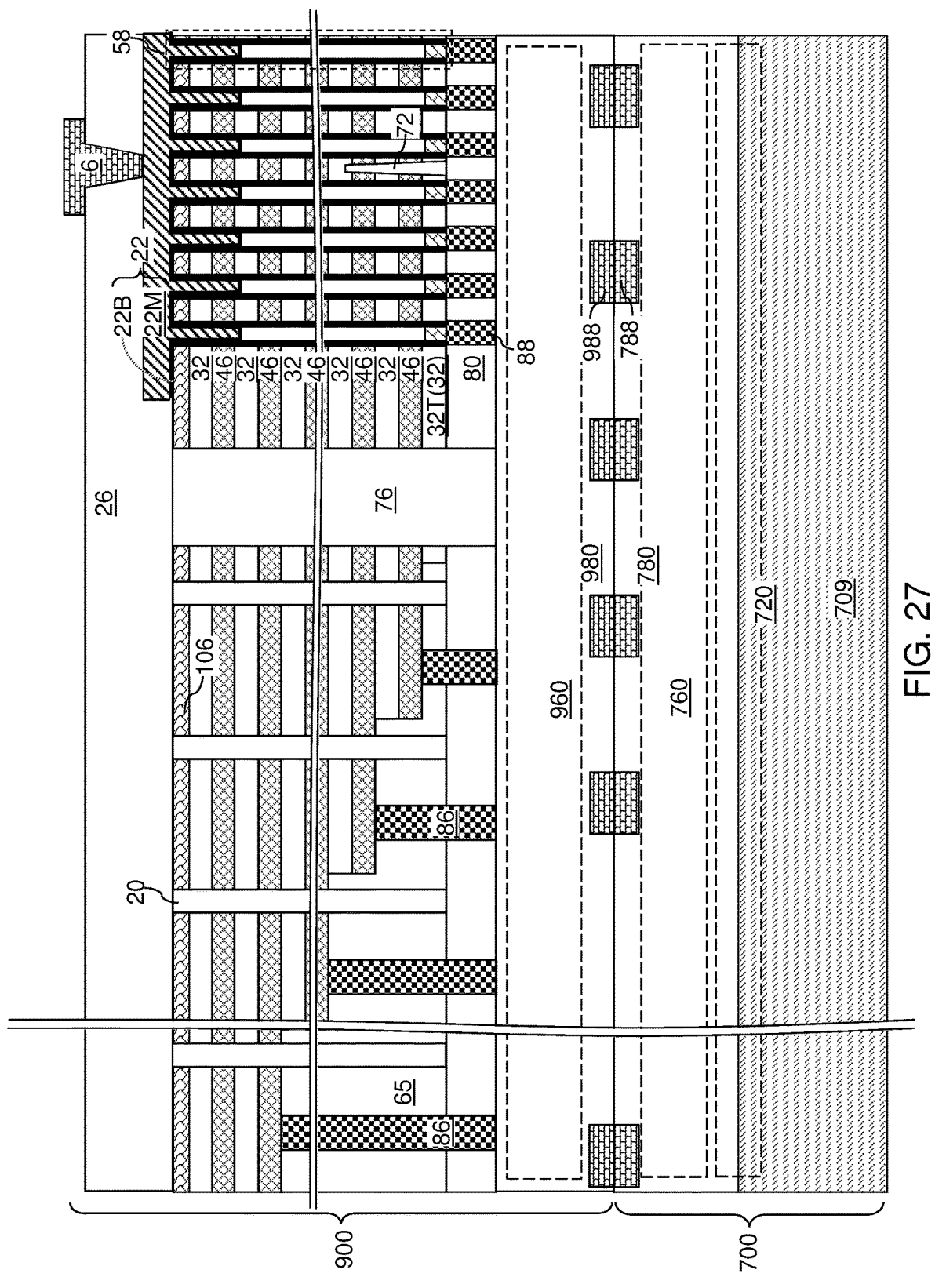
FIG. 27 is a vertical cross-sectional view of the second exemplary structure after formation of a backside dielectric layer and a source contact structure according to the second embodiment of the present disclosure.

Referring to FIG. 27, a backside dielectric layer 26 can be deposited over the source layers 22. At least one source contact structure 6 can be formed through the backside dielectric layer 26 on the source layer 22.

Figure 28:
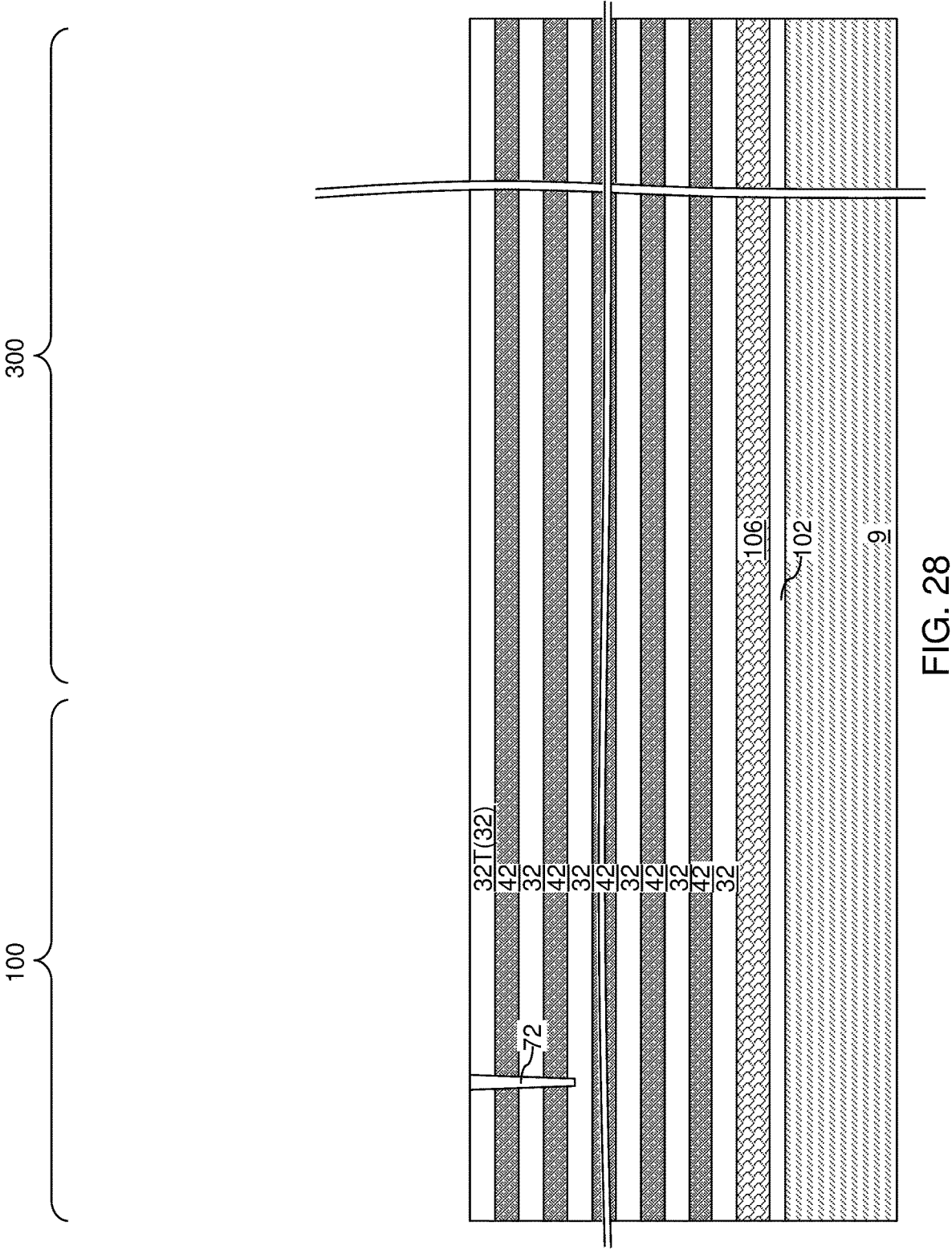
FIG. 28 is a schematic vertical cross-sectional view of a third exemplary structure after formation of a planar dielectric layer, a semiconductor material layer, and an alternating stack of insulating layers and sacrificial material layers over a carrier substrate according to a third embodiment of the present disclosure.

Referring to FIG. 28, a third exemplary structure according to a third embodiment of the present disclosure can be derived from the second exemplary structure illustrated in FIG. 20 by omitting formation of the stopper dielectric layer 104.

Figure 29:
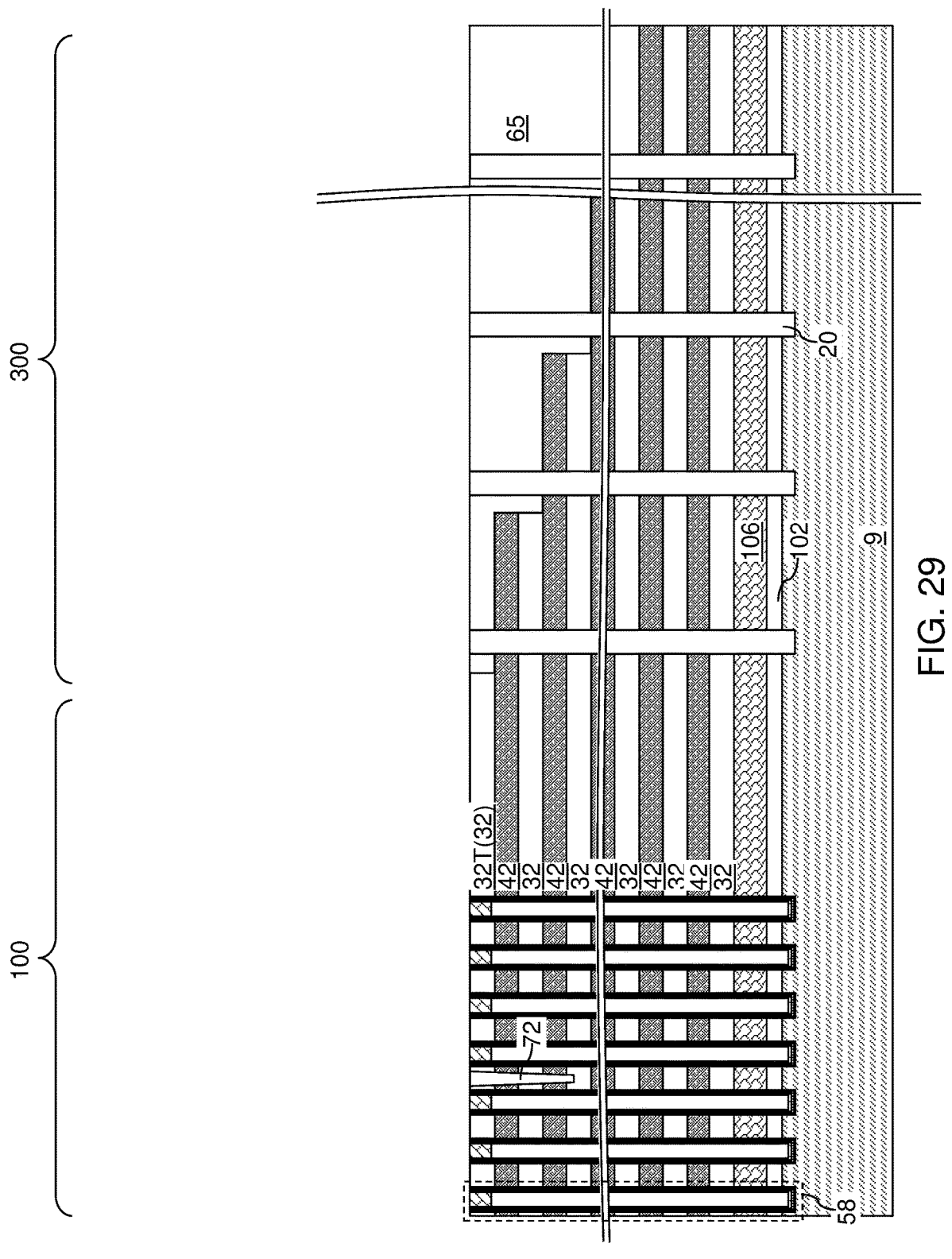
FIG. 29 is a schematic vertical cross-sectional view of the third exemplary structure after formation of memory opening fill structures and support pillars according to the third embodiment of the present disclosure.

Referring to FIG. 29, the processing step described with reference to FIGS. 2-8B can be subsequently performed. The chemistry of the anisotropic etch process employed to form the memory openings 49 and the support openings 19 may be modified as needed in view of the presence of the layer stack of the semiconductor material layer 106 and the planar dielectric layer 102. In one embodiment, bottom surfaces of the memory openings 49 and the support openings 19 may formed in an upper portion of the carrier substrate 9. Accordingly, bottom surfaces of the memory opening fill structures 58 and the support pillars 20 may formed in an upper portion of the carrier substrate 9.

Figure 30:
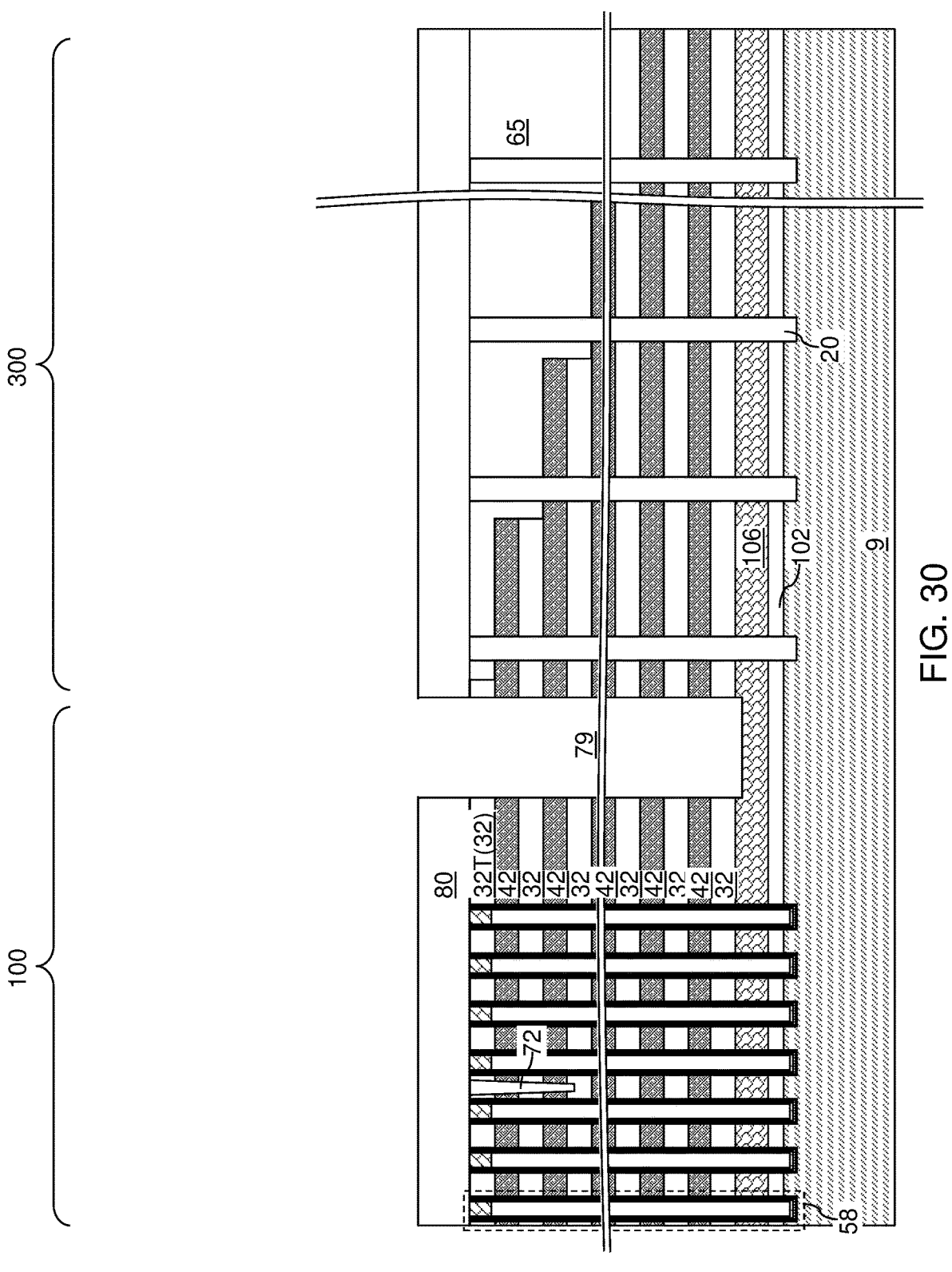
FIG. 30 is a schematic vertical cross-sectional view of the third exemplary structure after formation of lateral isolation trenches according to the third embodiment of the present disclosure.

Referring to FIG. 30, the processing steps described with reference to FIGS. 9A and 9B can be performed to form a contact-level dielectric layer 80, and to form lateral isolation trenches 79. In one embodiment, the semiconductor material layer 106 may be employed as an etch stop structure during formation of the lateral isolation trenches 79.

Figure 31:
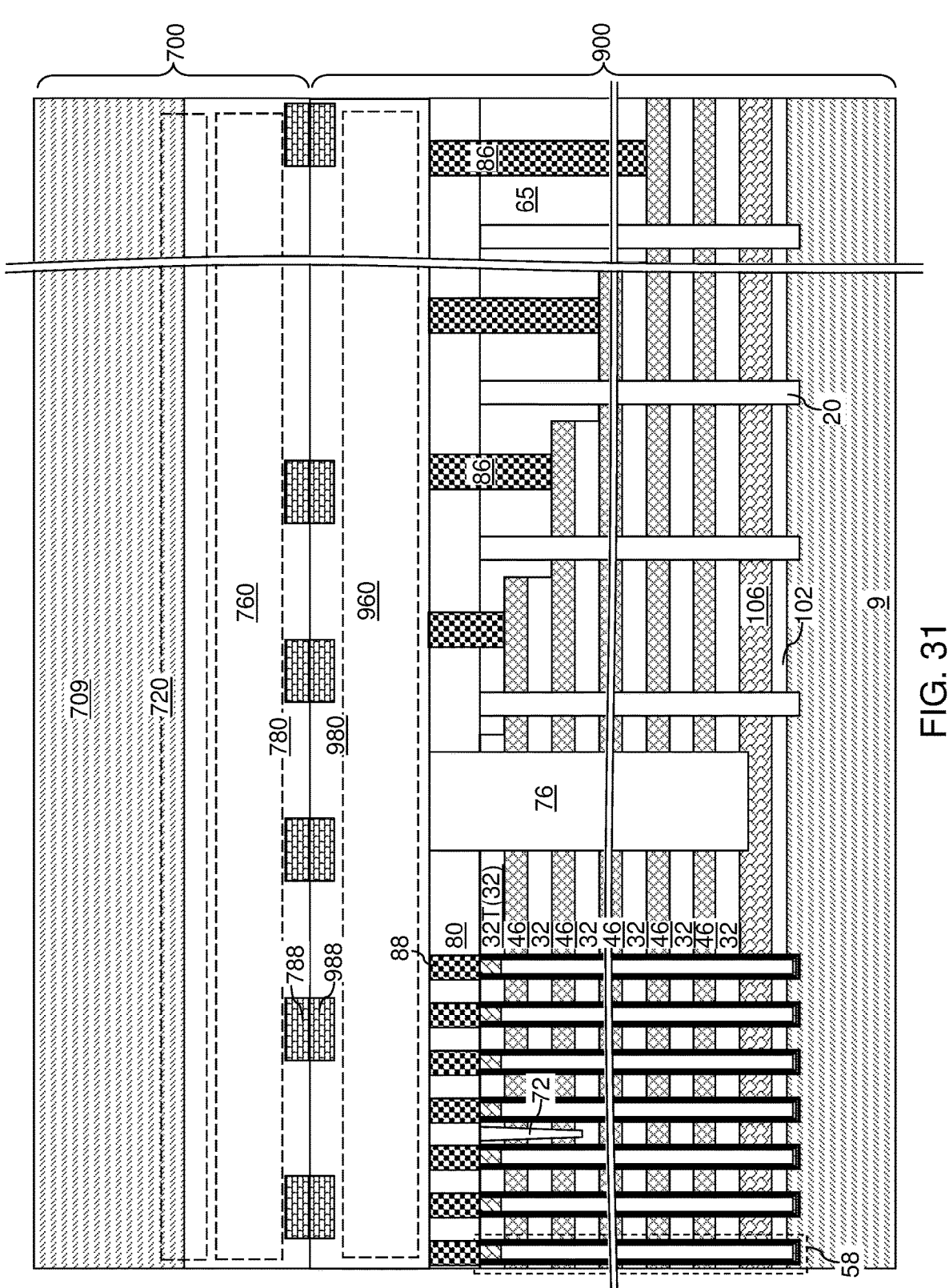
FIG. 31 is a vertical cross-sectional view of the third exemplary structure after attaching the logic die to the memory die according to the third embodiment of the present disclosure.

Referring to FIG. 31, the processing steps described with reference to FIGS. 10-13 can be performed to replace the sacrificial material layers 42 with electrically conductive layers 46. Various contact via structures (88, 86) can be formed, and memory-side dielectric material layers 960 embedding memory-side metal interconnect structures 980 and memory-side bonding pads 988 can be formed. A memory die 900 can be provided. Subsequently, the processing steps described with reference to FIGS. 14 and 15 can be performed to provide a logic die 700, and to bond the logic die 700 to the memory die 900.

Figure 32A:
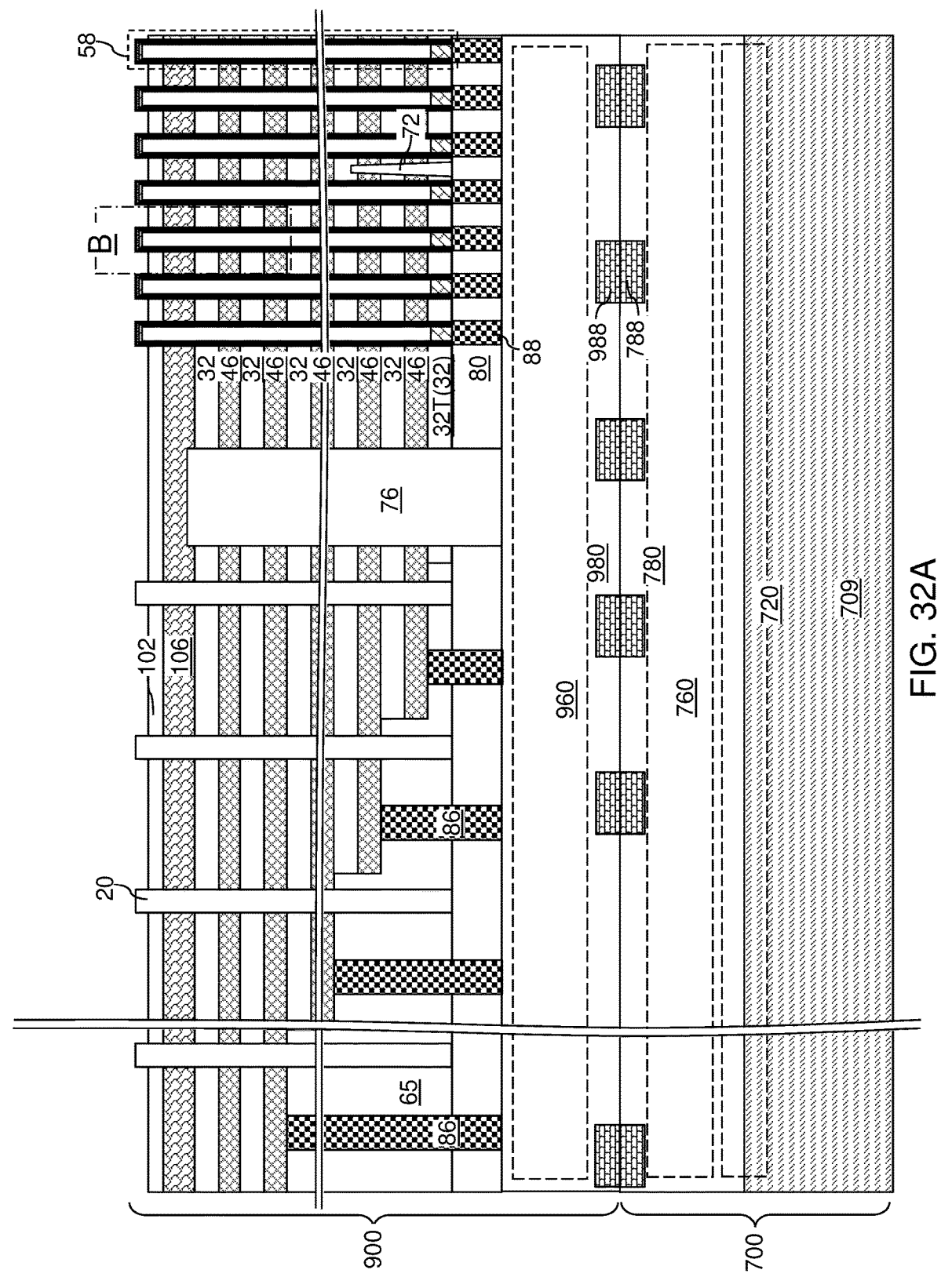
FIG. 32A is a vertical cross-sectional view of the third exemplary structure after removal of the carrier substrate according to the third embodiment of the present disclosure.
Figure 32B:
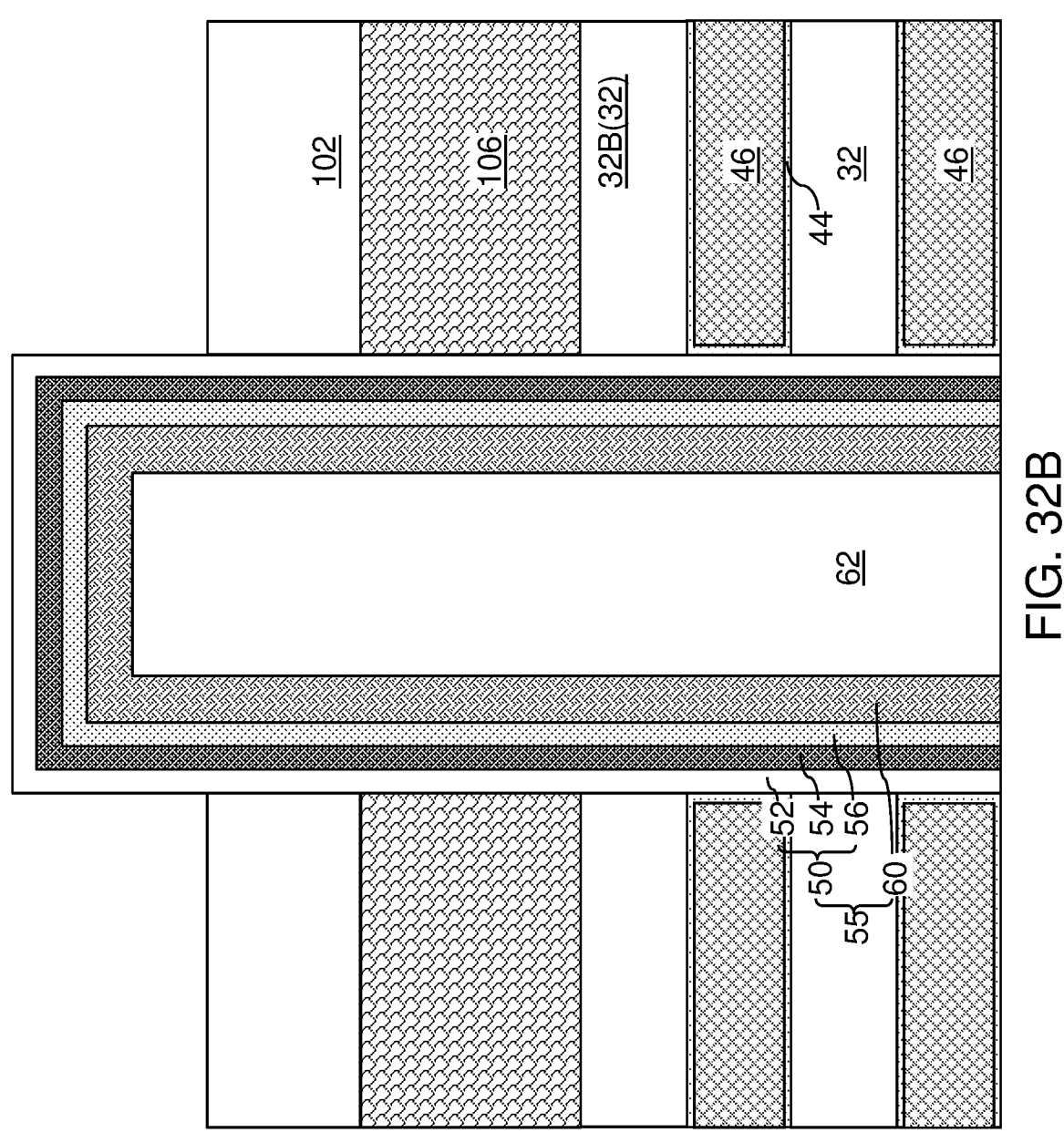
FIG. 32B is a magnified view of region B of FIG. 32A.

Referring to FIGS. 32A and 32B, the processing steps described with reference to FIGS. 16A and 16B can be performed to remove the carrier substrate 9 selective to the planar dielectric layer 102 and the memory opening fill structures 58, i.e., selective to the memory films 50.

FIGS. 33A-33E are sequential vertical cross-sectional views of a region of the third exemplary structure during formation of a Schottky source structure according to the third embodiment of the present disclosure.

Figure 33A:
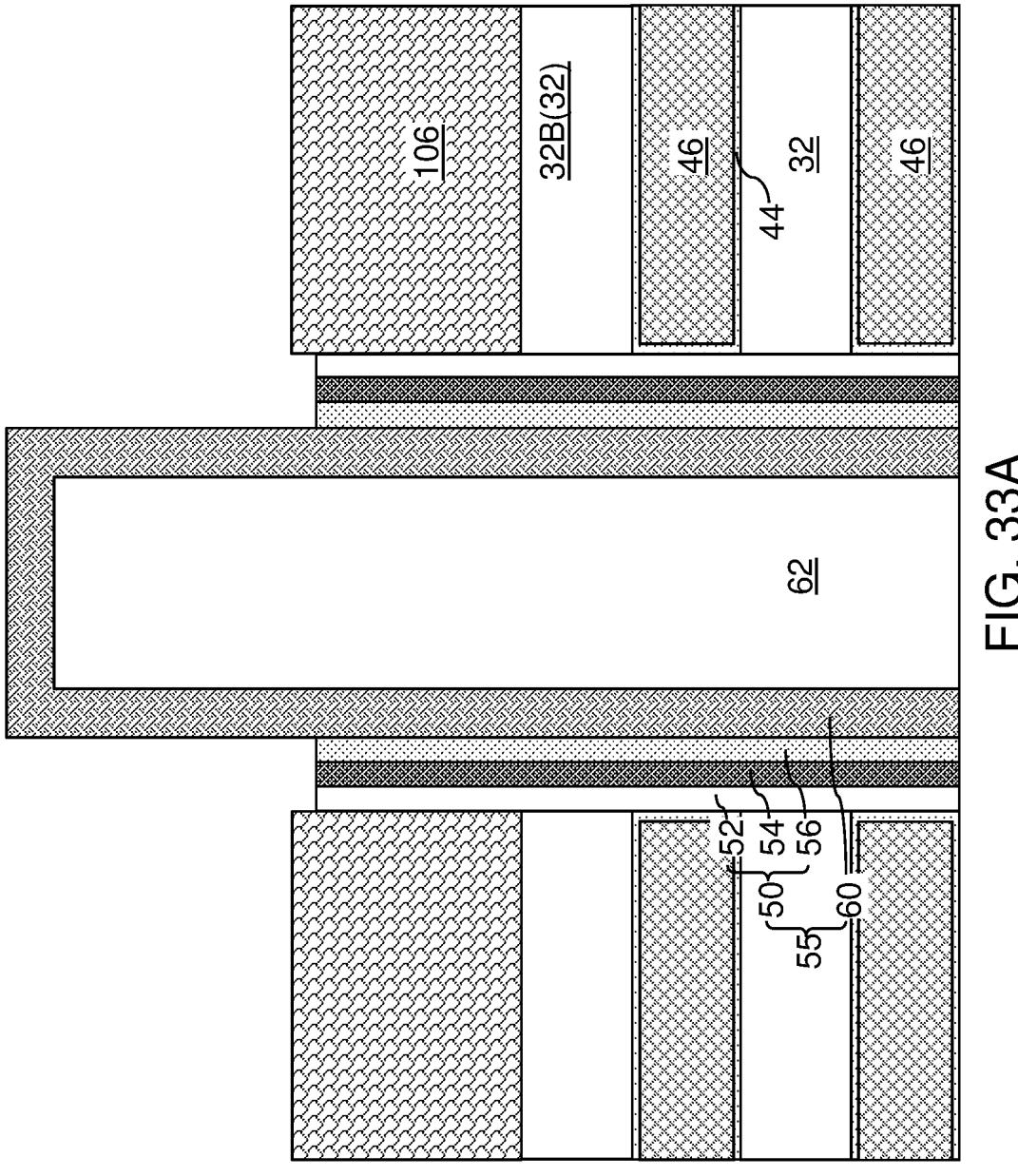
FIGS. 33A-33E are sequential vertical cross-sectional views of a region of the third exemplary structure during formation of a Schottky source structure according to the third embodiment of the present disclosure.

Referring to FIG. 33A, a sequence of selective etch processes can be performed to remove a physically exposed end portion of the memory film 50 selective to the vertical semiconductor channel 60 in each memory opening fill structure 58. For example, the sequence of selective etch processes may comprise a first selective etch process that etches the material of the blocking dielectric layer 52 selective to the material of the memory material layer 54, a second selective etch process that etches the material of the memory material layer 54 selective to the material of the dielectric liner 56, and a third selective etch process that etches the material of the dielectric liner 56 selective to the material of the vertical semiconductor channel 60. A portion of planar dielectric layer 102 or the entire planar dielectric layer 102 is also collaterally removed during removal of the physically exposed to end portion of each memory film 50.

Subsequently, if any portion of the planar dielectric layer 102 remains, an isotropic etch process can be performed to remove the remaining portion of the planar dielectric layer 102 selective to the semiconductor materials of the semiconductor material layer 106 and the vertical semiconductor channels 60. For example, a wet etch process employing dilute hydrofluoric acid can be performed to remove the planar dielectric layer 102. The bottom surface of the semiconductor material layer 106 can be exposed upon removal of the planar dielectric layer 102.

Figure 33B:
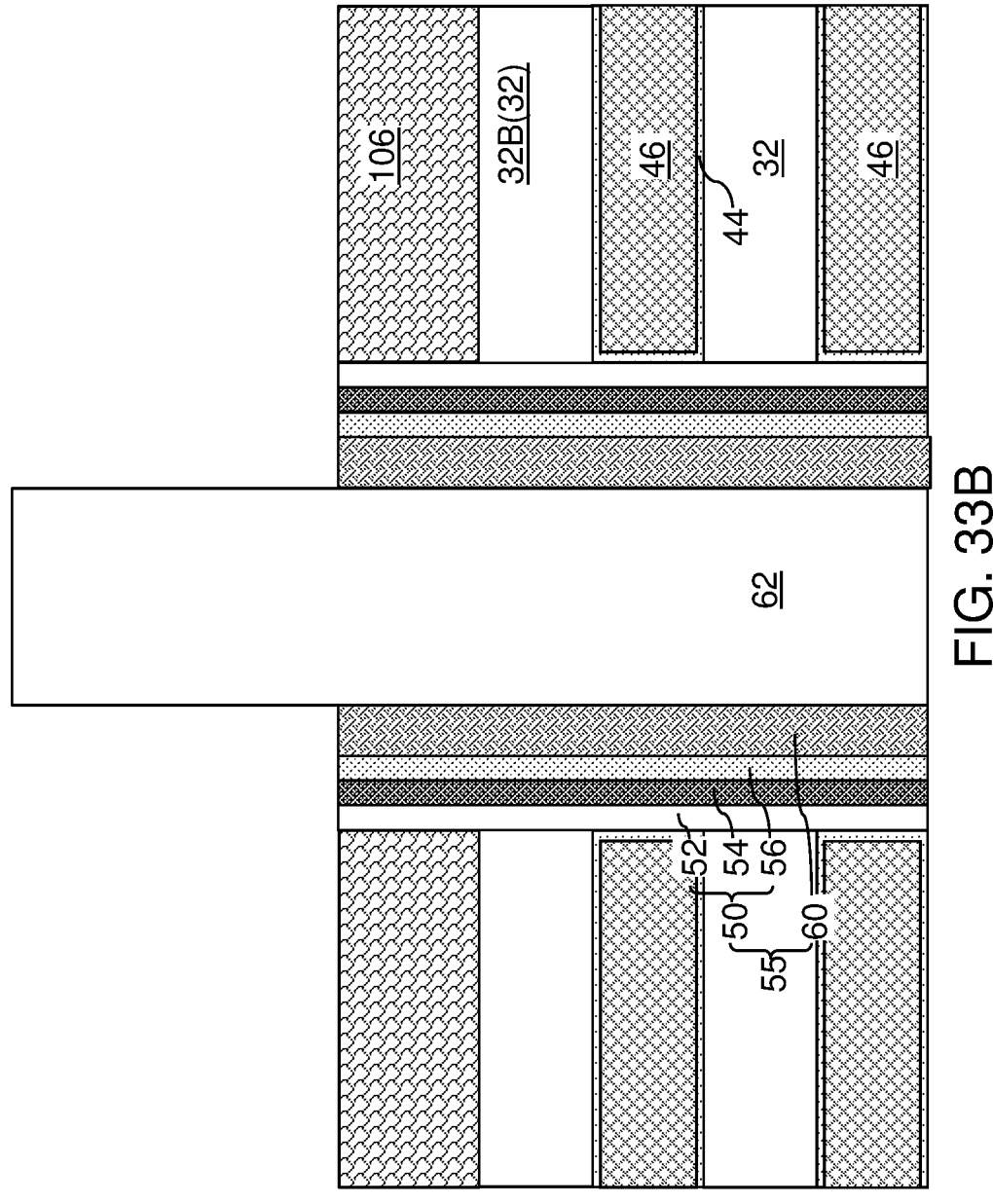

Referring to FIG. 33B, an isotropic etch process is performed to remove a physically exposed end portion of each vertical semiconductor channel 60 and to vertically recess a bottom portion of the semiconductor material layer 106. For example, a wet etch process employing hot trimethyl-2 hydroxyethyl ammonium hydroxide ("hot TMY") or tetramethyl ammonium hydroxide (TMAH) may be performed to remove the physically exposed end portion of each vertical semiconductor channel 60 and to vertically recess the semiconductor material layer 106. Surfaces of dielectric cores 62 can be exposed after this step.

Figure 33C:
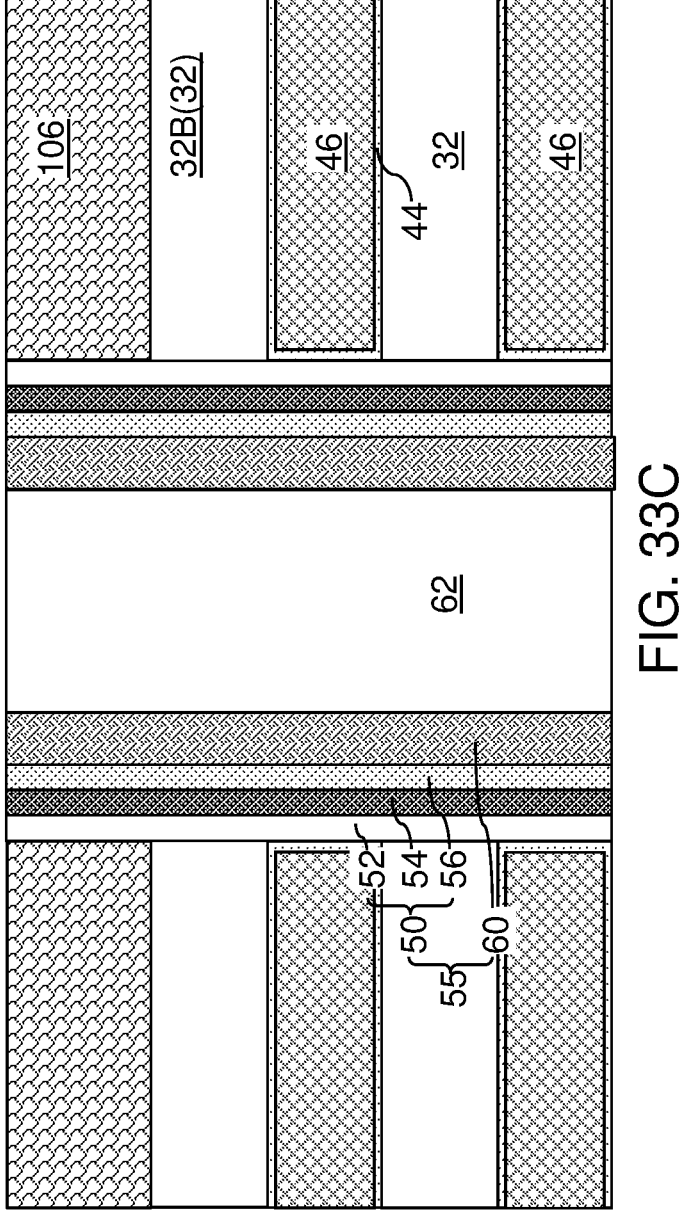

Referring to FIG. 33C, a chemical mechanical polishing process can be performed to remove portions of the memory opening fill structures 58 that protrude below the horizontal plane including the bottom surface of the semiconductor material layer 106. Thus, the end portion of each dielectric core 62 that underlies the horizontal plane including the planar bottom surface of the semiconductor material layer 106 can be removed by the chemical mechanical polishing process.

Figure 33D:
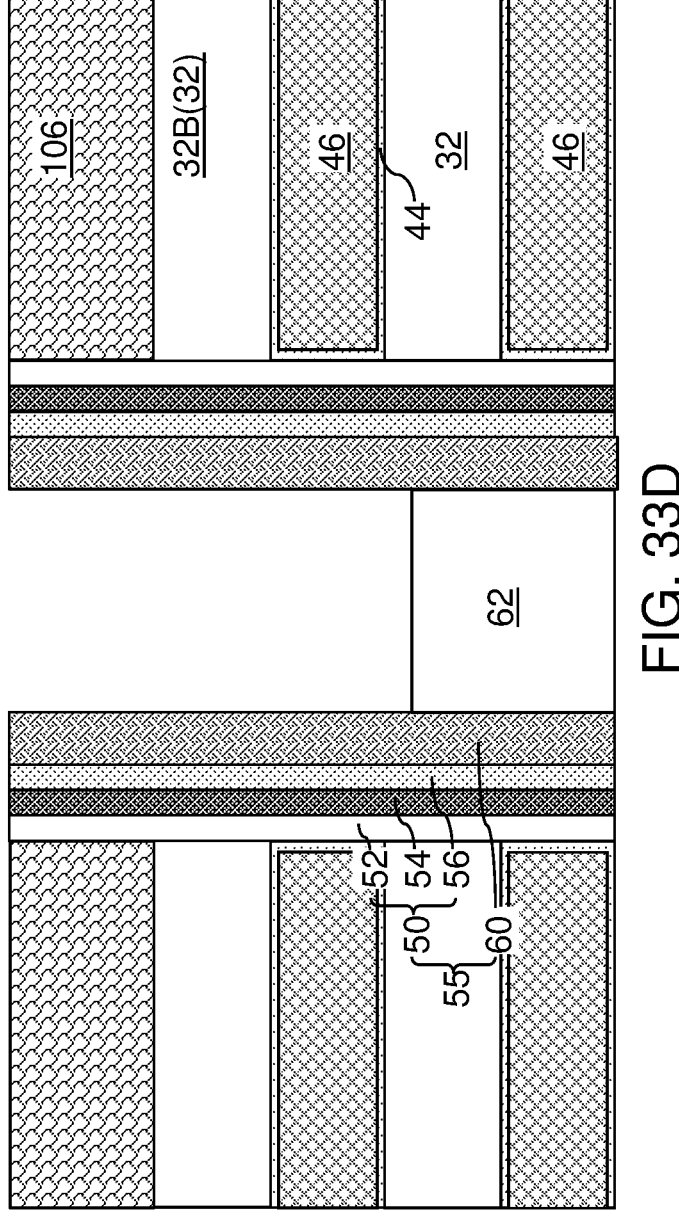

Referring to FIG. 33D, a recess etch process can be performed to vertically recess the dielectric cores 62. For example, a wet etch process employing dilute hydrofluoric acid can be performed to vertically recess the dielectric cores 62. In one embodiment, the recessed surfaces of the dielectric cores 62 may be formed at or around an insulating layer 32 within the alternating stack (32, 46) that is vertically spaced from the semiconductor material layer 106 by at least one electrically conductive layer 46 (such as a bottommost electrically conductive layer).

Figure 33E:
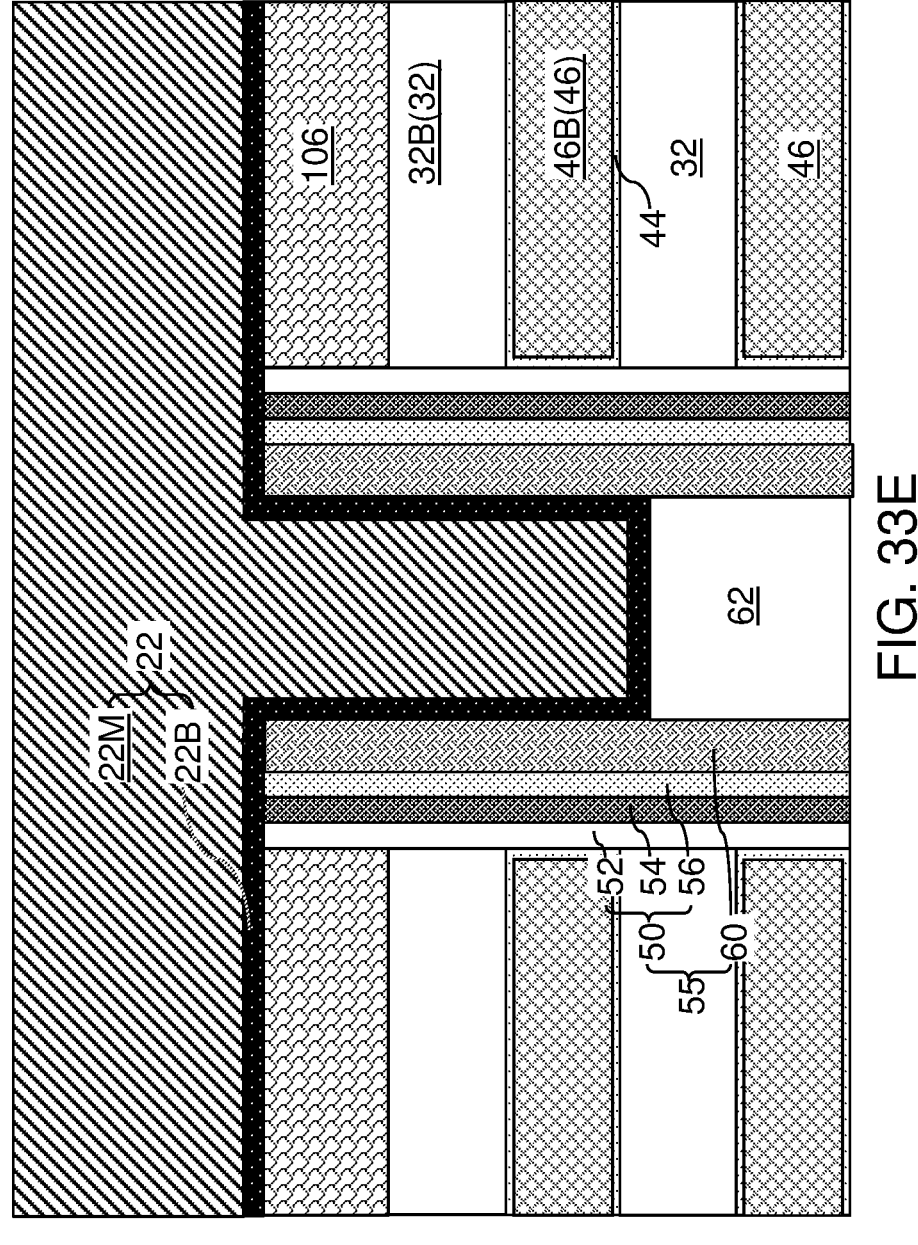

Referring to FIG. 33E, the above described source layer 22 is formed directly on each physically exposed cylindrical surface segment of the inner sidewalls and end surfaces of the vertical semiconductor channels 60, and on the physically-exposed horizontal surface of the semiconductor material layer 106. Thus, the source layer 22 contacts the bottom surface of the semiconductor material layer 106 and the bottom surfaces of the vertical semiconductor channels 60. In one embodiment, the source layer 22 is located on a bottom portion of an inner sidewall of each vertical semiconductor channel 60 and a bottom surface of each vertical semiconductor channel 60, and protrudes above a horizontal plane including a top surface of a bottommost electrically conductive layer 46B within the alternating stack (32, 46).

In one embodiment, each memory film 50 comprises an outer sidewall that contacts a cylindrical surface segment of the semiconductor material layer 106, and an annular planar bottom surface that contacts the source layer 22. In one embodiment, the source layer 22 contacts a cylindrical surface segment of an inner sidewall of the memory film 50. In one embodiment, a horizontal surface segment of the contact area between the source layer 22 and the vertical semiconductor channel 60 may be located within a horizontal plane including a horizontal interface between the source layer 22 and the semiconductor material layer 106. In one embodiment, an annular bottom surface of each memory film 50 contacts the source layer 22 within the horizontal plane including a bottom surface of the semiconductor material layer 106.

Each vertical semiconductor channel 60 may comprise an annular bottom surface located within the horizontal plane including a bottom surface of the semiconductor material layer 106. In one embodiment, an annular bottom surface of each memory film 50 contacts the source layer 22 within a horizontal plane including a bottom surface of the semiconductor material layer 106.

Figure 34:
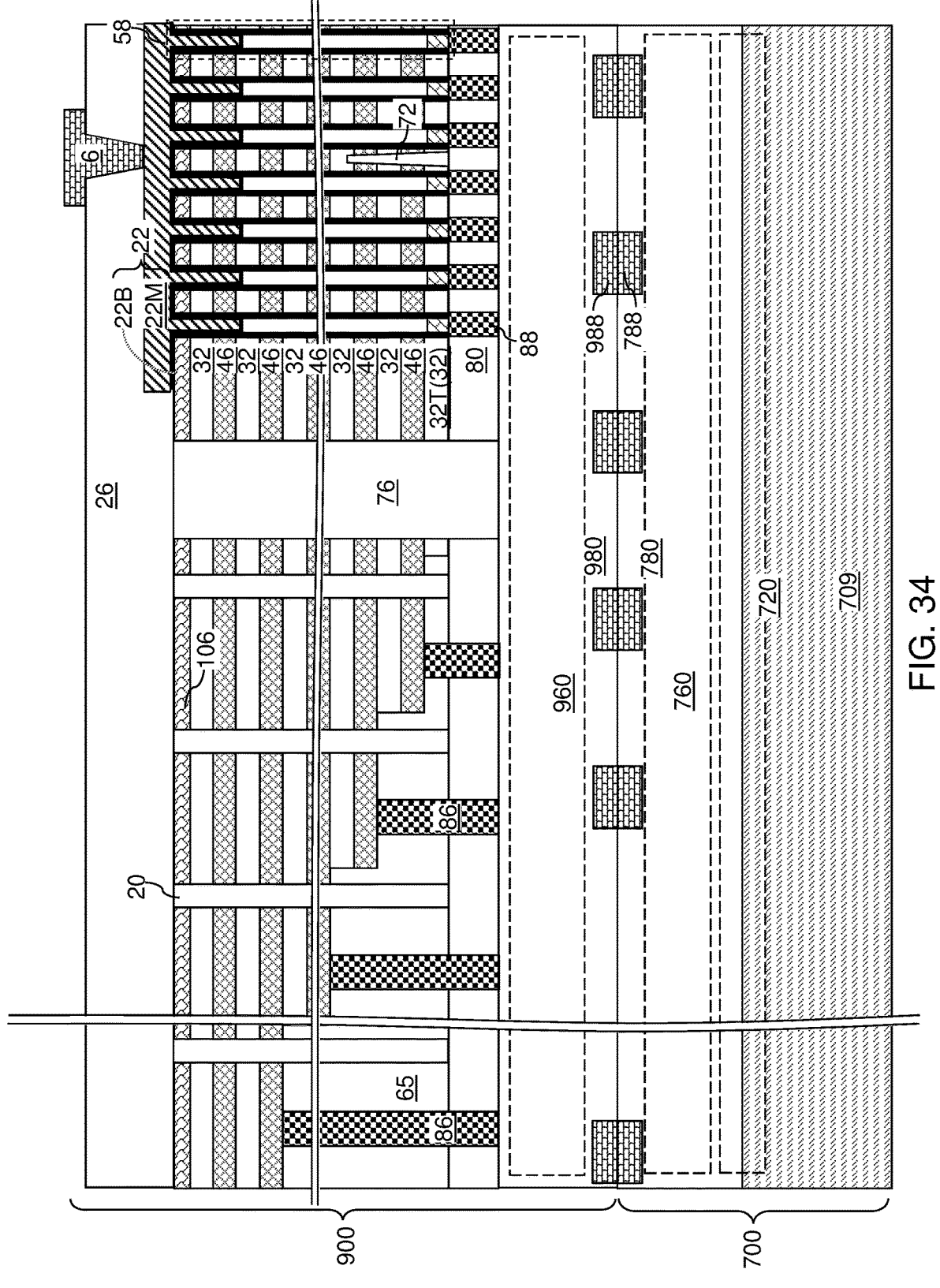
FIG. 34 is a vertical cross-sectional view of the third exemplary structure after formation of a backside dielectric layer and a source contact structure according to the third embodiment of the present disclosure.

Referring to FIG. 34, the source layer 22 can be patterned as described above. The patterned source layer 22 comprises a Schottky source structure providing Schottky junctions to a respective set of vertical semiconductor channels 60. A backside dielectric layer 26 can be deposited over the source layer 22. At least one source contact structure 6 is formed through the backside dielectric layer 26 in contact with the source layer 22.

Figure 35A:
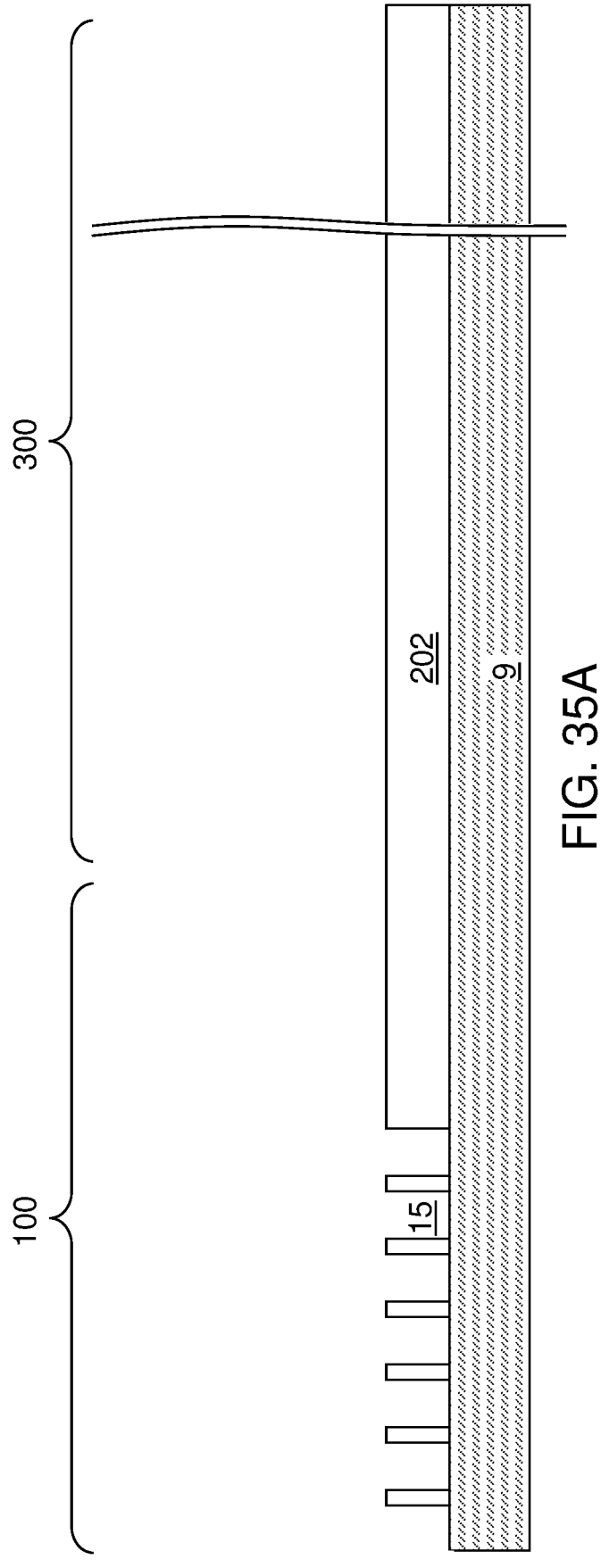
FIG. 35A is a vertical cross-sectional view of a fourth exemplary structure after formation of an array of openings through a planar dielectric layer according to a fourth embodiment of the present disclosure.
Figure 35B:
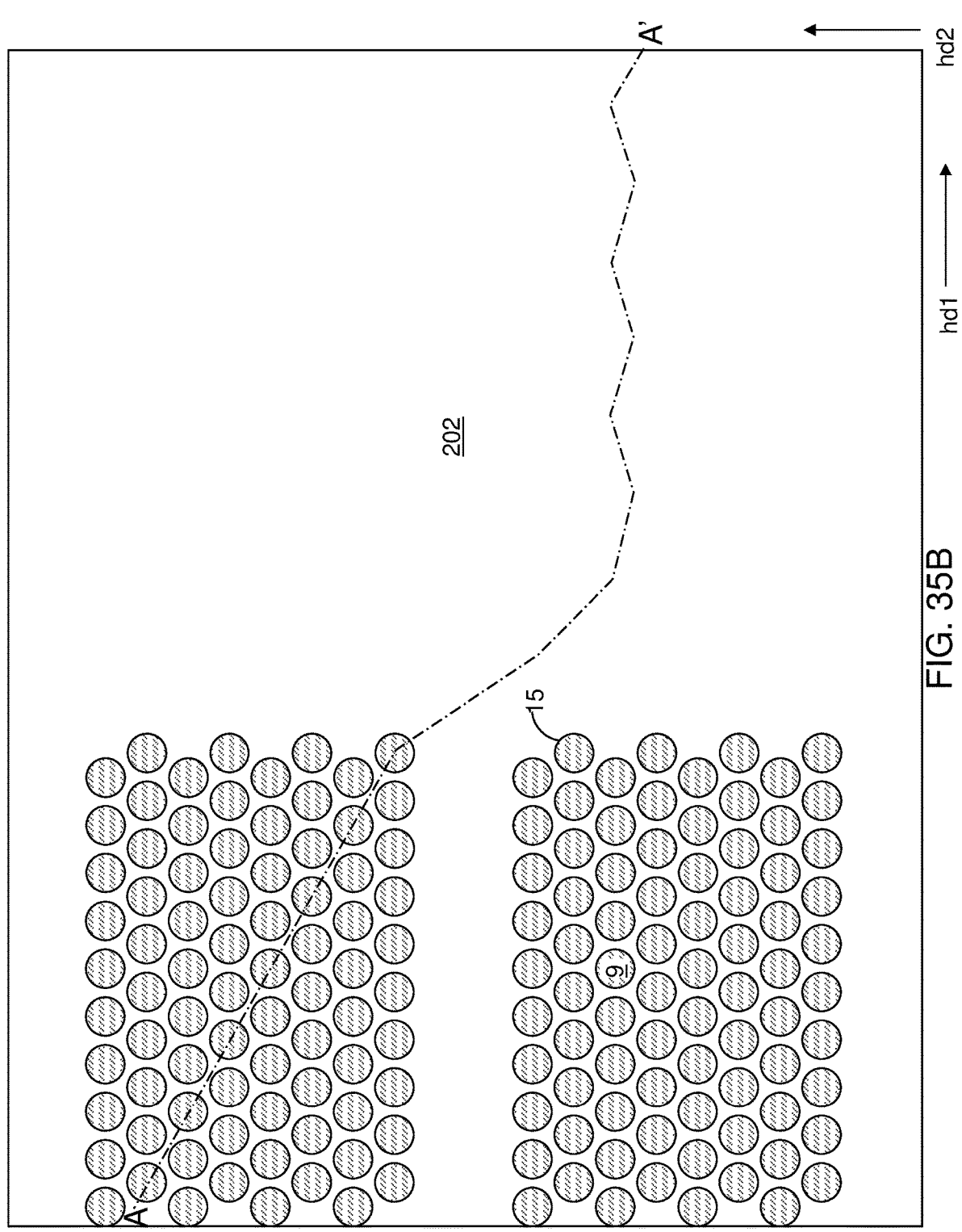
FIG. 35B is a top-down view of the fourth exemplary structure of FIG. 35A. The hinged vertical plane A-A' is the cut plane of the vertical cross-sectional view of FIG. 35A.

Referring to FIGS. 35A and 35B, a fourth exemplary structure according to a fourth embodiment of the present disclosure is illustrated. The fourth exemplary structure comprises a planar dielectric layer 202 that is formed on the top surface of a carrier substrate 9, which may be the same as described above. The planar dielectric layer 202 comprises a dielectric material, such as undoped silicate glass (e.g., silicon oxide) or a doped silicate glass. The thickness of the planar dielectric layer 202 may be in a range from 100 nm to 600 nm, although lesser and greater thicknesses may also be employed.

A photoresist layer (not shown) can be formed over the planar dielectric layer 202, and can be lithographically patterned to form openings therein. The pattern of the openings in the photoresist layer can be the same as the pattern of the memory openings 49 as described above. In some embodiment, the openings in the photoresist layer may have a greater lateral dimension (e.g., a diameter) than the lateral dimension of memory openings 49 to be subsequently formed. An anisotropic etch process can be performed to transfer the pattern of the openings in the photoresist layer through the planar dielectric layer 202. An array of cavities 15 can be formed in the planar dielectric layer 202. A bottom surface of the carrier substrate 9 can be physically exposed at the bottom of each cavity 15. In one embodiment, the cavities 15 may be formed with tapered straight sidewalls, such that each cavity 15 has a greater lateral dimension (such as a diameter) at the top than at the bottom.

Figures 36, 37A:
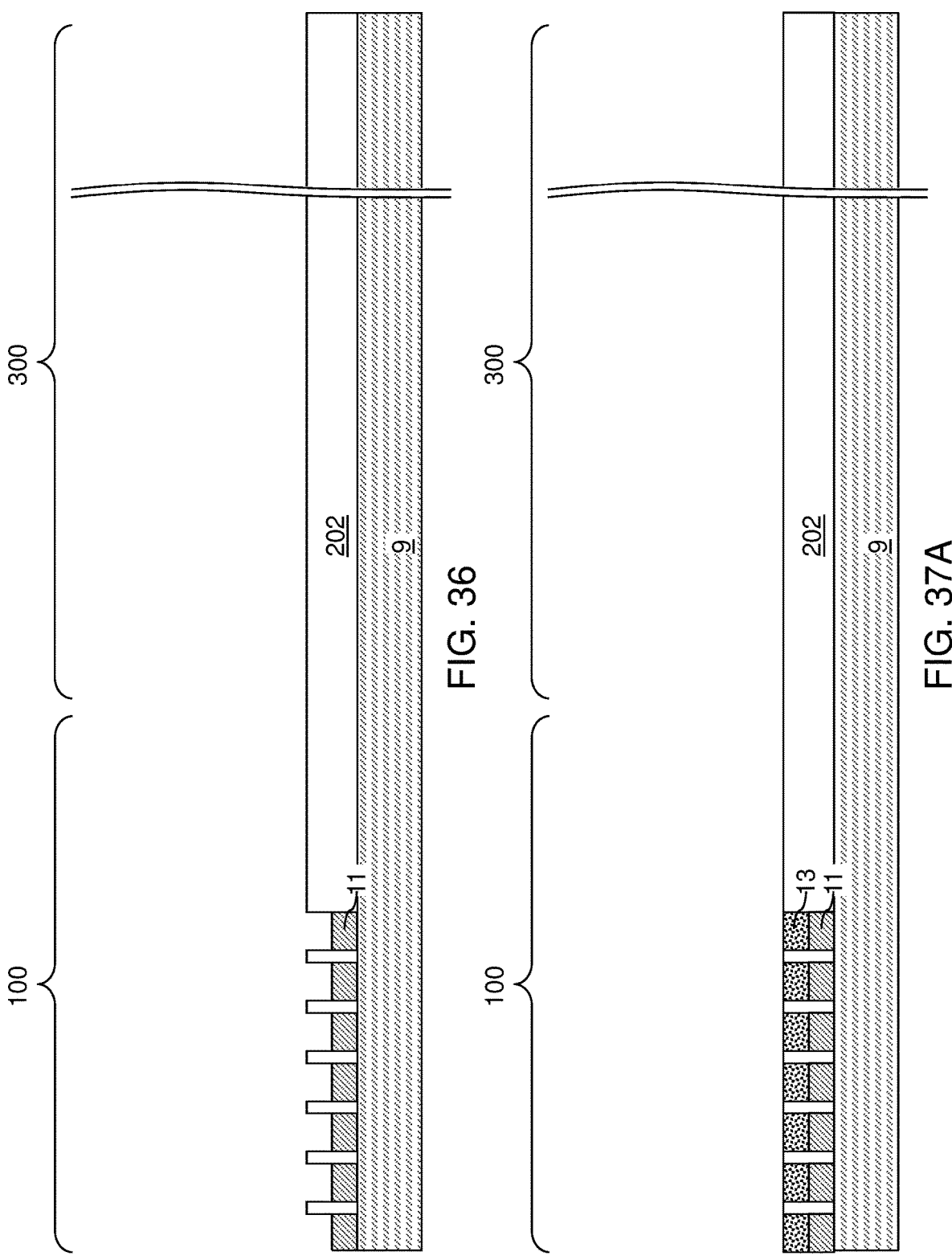
FIG. 36 is a vertical cross-sectional view of the fourth exemplary structure after formation of first sacrificial pedestals according to the fourth embodiment of the present disclosure.
FIG. 37A is a vertical cross-sectional view of the fourth exemplary structure after formation of second sacrificial pedestals according to the fourth embodiment of the present disclosure.

Referring to FIG. 36, first sacrificial pedestals 11 can be formed in the lower portions of the cavities 15. The first sacrificial pedestals 11 comprises a first pedestal material, which is a material that can be subsequently removed selective to the material of the planar dielectric layer 202. In one embodiment, the first sacrificial pedestals 11 may comprise, and/or may consist essentially of, a semiconductor material such as silicon or silicon-germanium. In one embodiment, the carrier substrate 9 comprises a first semiconductor material, such as single crystal silicon, and the first sacrificial pedestals 11 comprise the same first semiconductor material, such as single crystal silicon. The first sacrificial pedestals 11 may be formed by performing a selective deposition process such as a selective epitaxy process, or may be formed by a non-conformal semiconductor deposition process followed by a planarization process that removes a deposited semiconductor material from above the horizontal plane including the top surface of the planar dielectric layer 202 and by vertically recessing the semiconductor material below the horizontal plane including the top surface of the planar dielectric layer 202. The height of each first sacrificial pedestal 11 may be in a range from 20% to 80% of the thickness of the planar dielectric layer 202.

Figure 37B:
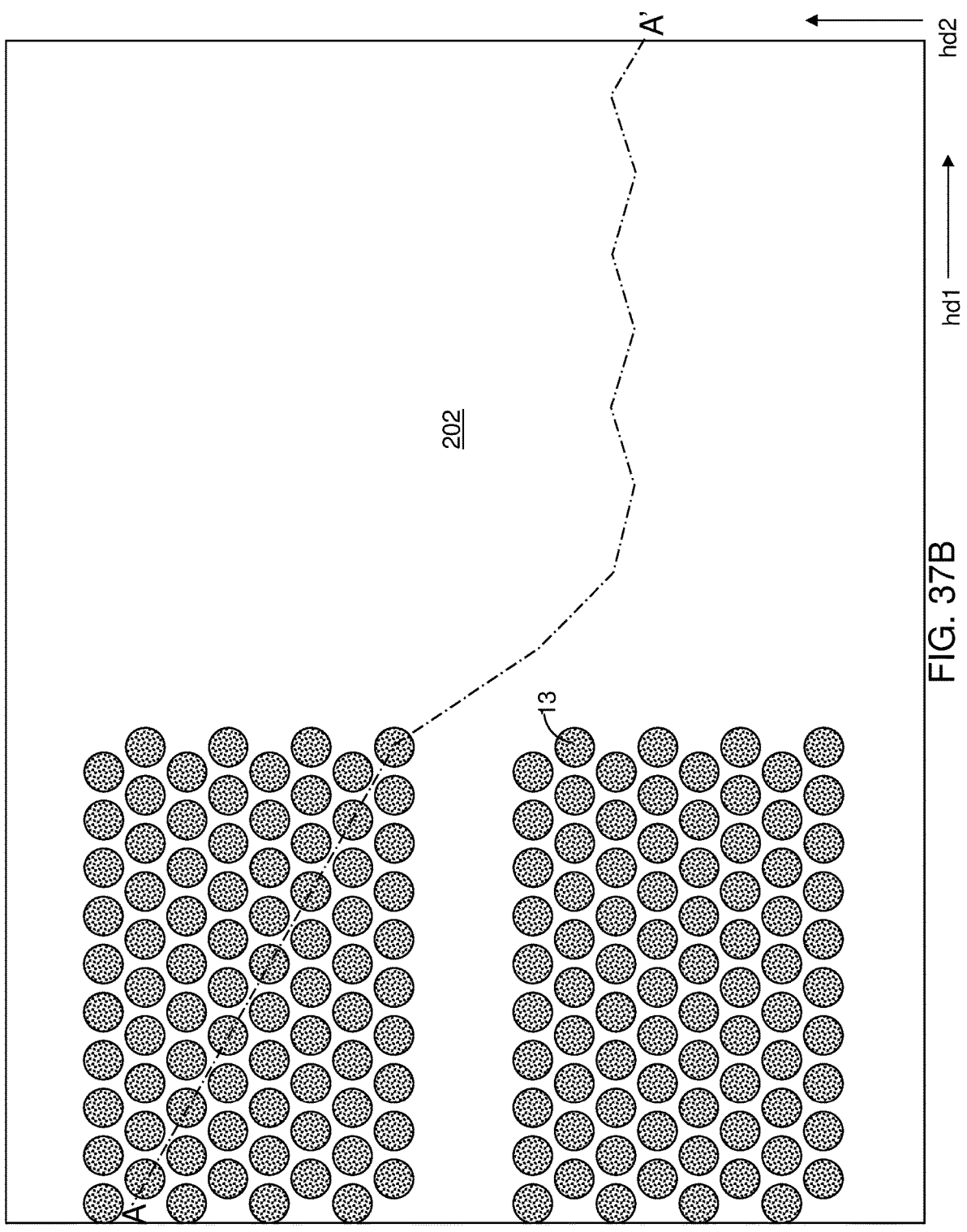
FIG. 37B is a top-down view of the fourth exemplary structure of FIG. 37A. The hinged vertical plane A-A' is the cut plane of the vertical cross-sectional view of FIG. 37A.

Referring to FIGS. 37A and 37B, a second pedestal material can be deposited in remaining unfilled volumes of the cavities 15. The second pedestal material comprises a sacrificial material that may be subsequently removed selective to the materials of the first sacrificial pedestals 11 and the planar dielectric layer 202. For example, the second pedestal material may comprise a carbon-based material, such as amorphous carbon or diamond-like carbon. Alternatively, the second pedestal material may comprise an electrically conductive material, such as TiN or W. Excess portions of the second pedestal material can be removed from above the horizontal plane including the top surface of the planar dielectric layer 202 by a planarization process, which may comprise a recess etch process or a chemical mechanical polishing process. Remaining portions of the second pedestal material constitute second sacrificial pedestals 13. A stack of a first sacrificial pedestal 11 and a second sacrificial pedestal 13 can be formed in each cavity 15.

In one embodiment, each second sacrificial pedestal 13 may have a greater lateral dimension than a bottom portion of a memory opening to be subsequently formed. In one embodiment, each second sacrificial pedestal 13 may have a height that is greater than twice the sum of the thickness of a memory film to be subsequently formed and the thickness of a semiconductor channel to be subsequently formed. In summary, each stack of a first sacrificial pedestal 11 and a second sacrificial pedestal 13 can be provided by forming an opening (i.e., a cavity 15) through the planar dielectric layer 202, by forming the first sacrificial pedestal 11 in a lower portion of the opening, and by forming the second sacrificial pedestal 13 in an upper portion of the opening.

Figure 38:
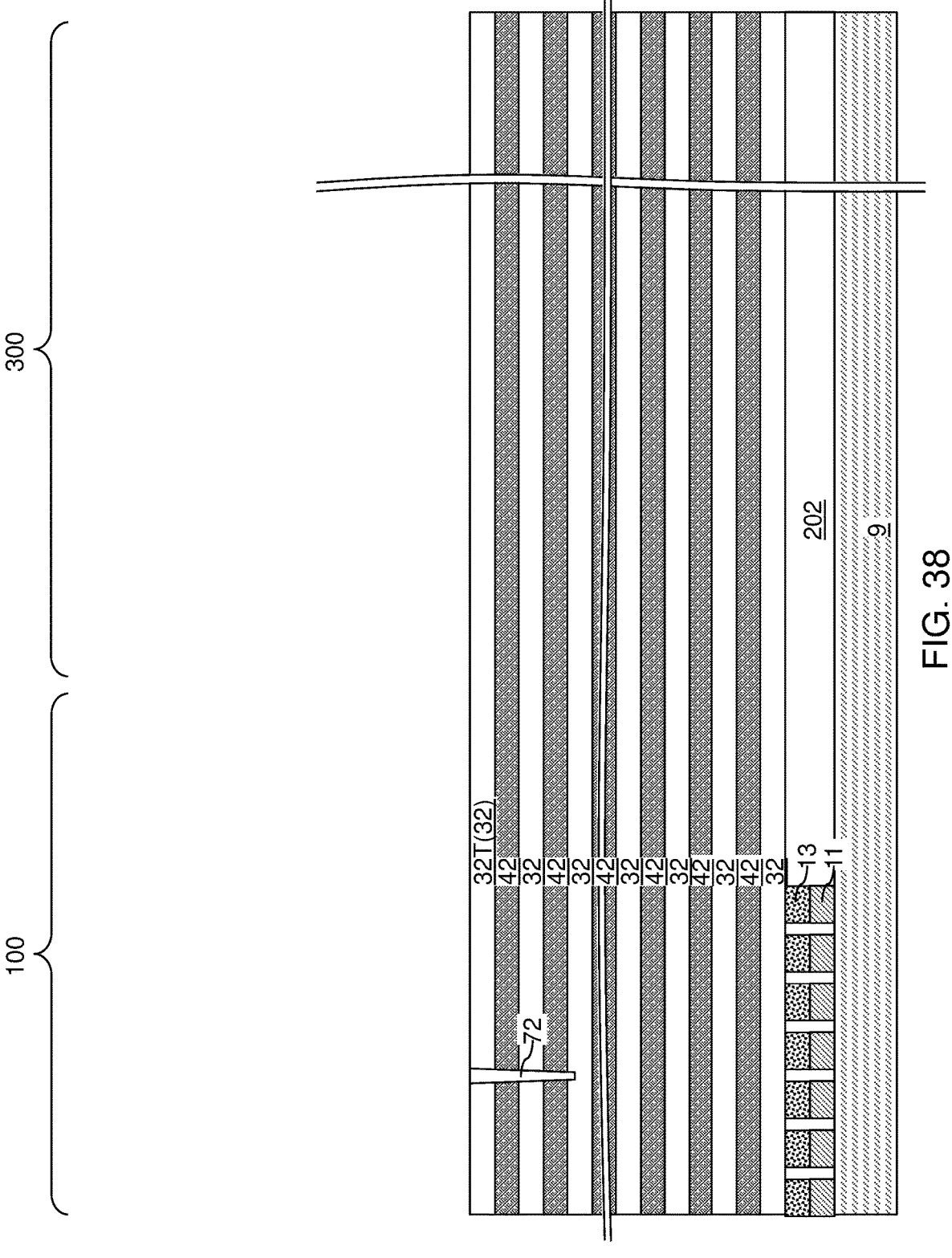
FIG. 38 is a schematic vertical cross-sectional view of a fourth exemplary structure after formation of an alternating stack of insulating layers and sacrificial material layers over a carrier substrate according to a fourth embodiment of the present disclosure.

Referring to FIG. 38, the processing steps described with reference to FIG. 1 can be performed to form the alternating stack of insulating layers 32 and sacrificial material layers 42, and to form the drain-select-level isolation structures 72.

Figure 39A:
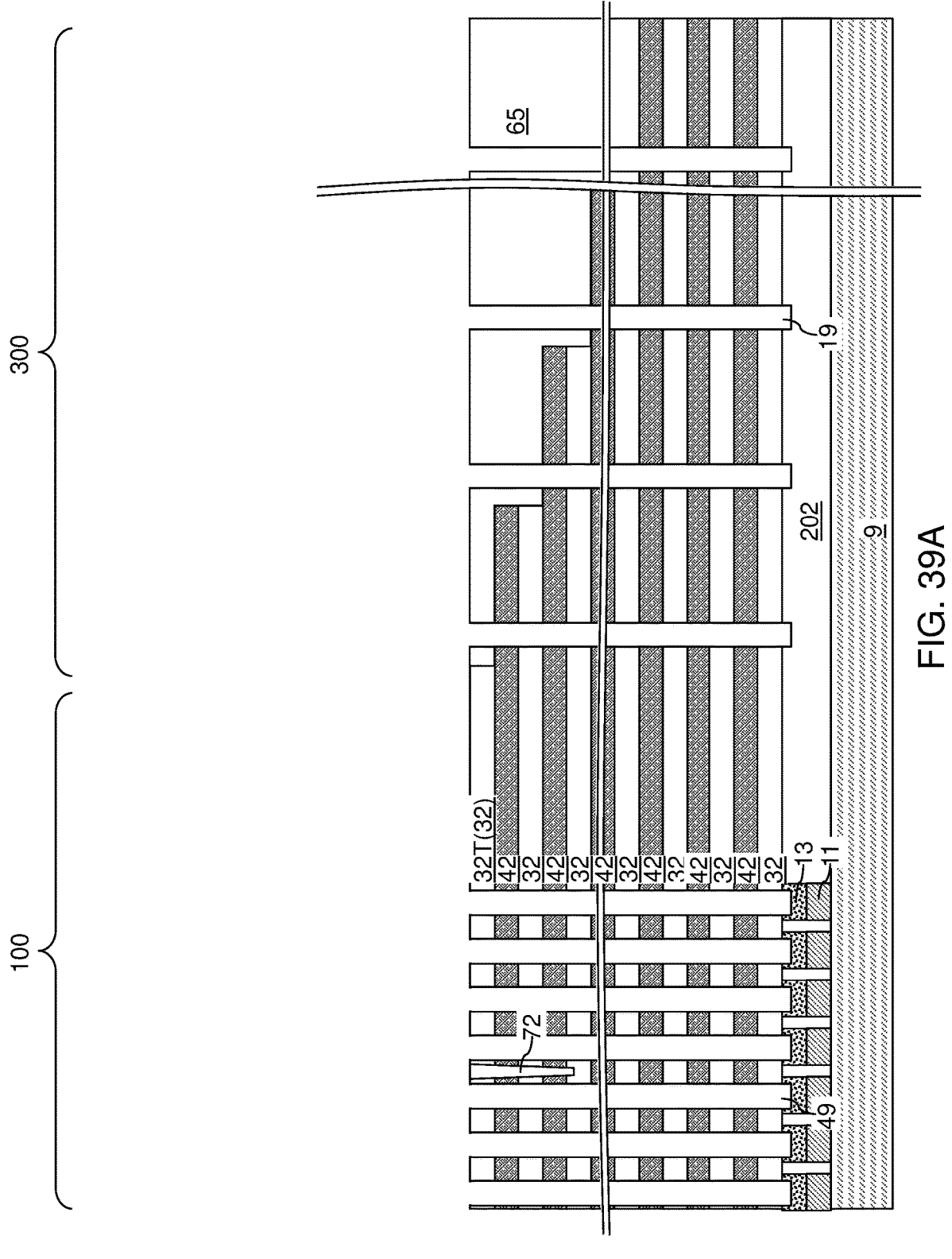
FIG. 39A is a schematic vertical cross-sectional view of the fourth exemplary structure after formation of memory openings and support openings according to the fourth embodiment of the present disclosure.
Figure 39B:
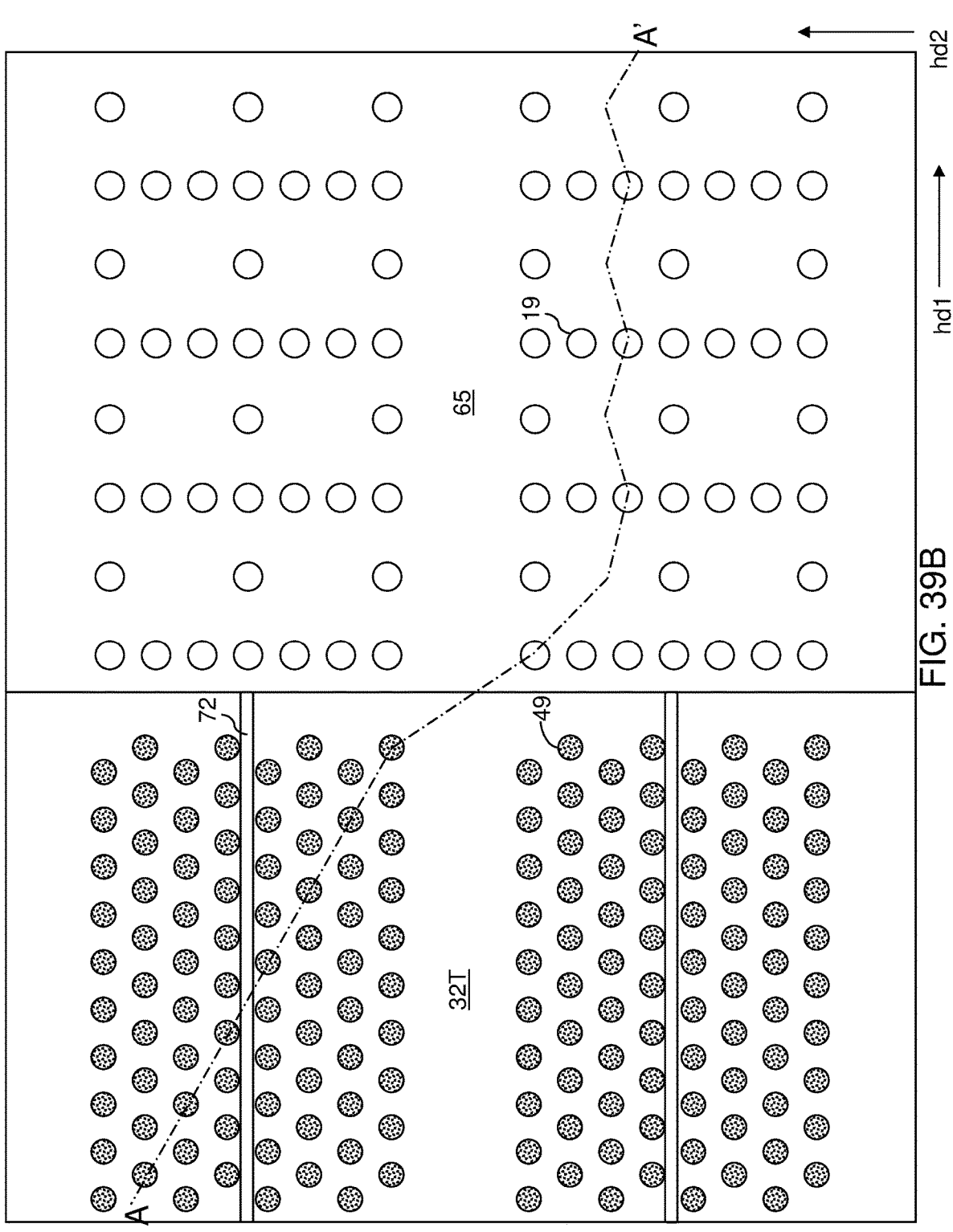
FIG. 39B is a top-down view of the fourth exemplary structure of FIG. 39A. The hinged vertical plane A-A' is the cut plane of the vertical cross-sectional view of FIG. 39A.

Referring to FIGS. 39A and 39B, the processing steps described with reference to FIG. 2 can be performed to form stepped surfaces and a stepped dielectric material portion 65. The processing steps described with reference to FIGS. 3A and 3B can be performed to form the memory openings 49 and support openings 19. A terminal portion of the anisotropic etch process that forms the memory openings 49 and the support openings 19 may be selective to the material of the second sacrificial pedestals 13, such that the second sacrificial pedestals 13 are exposed at the bottom of the respective memory openings 49. The second sacrificial pedestals 13 function as etch stop structures during the etch process.

Figure 40:
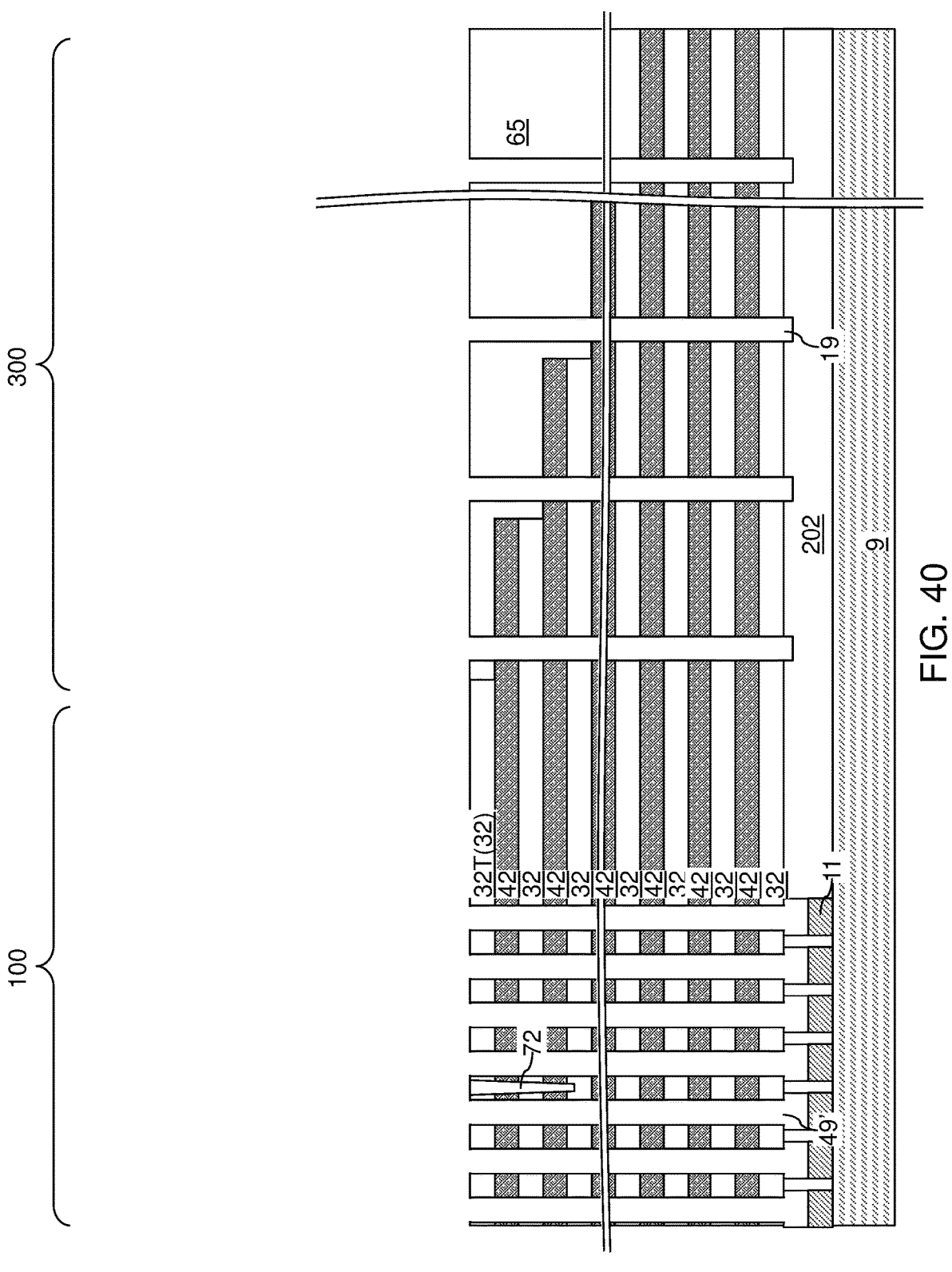
FIG. 40 is a schematic vertical cross-sectional view of the fourth exemplary structure after removal of second sacrificial pedestals according to the fourth embodiment of the present disclosure.

Referring to FIG. 40, the second sacrificial pedestals 13 can be removed selective to the first sacrificial pedestals 11, the alternating stack (32, 42), and the planar dielectric layer 202. For example, if the second sacrificial pedestals 13 comprise a carbon-based material, such as amorphous carbon, an ashing process can be performed to remove the second sacrificial pedestals 13. If the second sacrificial pedestals 13 comprise an electrically conductive material, such as TiN or W, a selective wet etch process using an acid mixture can be performed to remove the second sacrificial pedestals 13. The memory openings 49 are vertically extended by adding the volumes of the voids from which the second sacrificial pedestals 13 are removed. Expanded memory openings 49' can be formed by expanding the memory openings 49 through removal of the second sacrificial pedestals 13 selective to the first sacrificial pedestals 11. Each of the expanded memory openings 49' may have a respective bottom portion located at the level of the planar dielectric layer 202 and having a greater lateral dimension than a cylindrical portion of the expanded memory opening 49' that vertically extends through the alternating stack (32, 42).

Figure 41A:
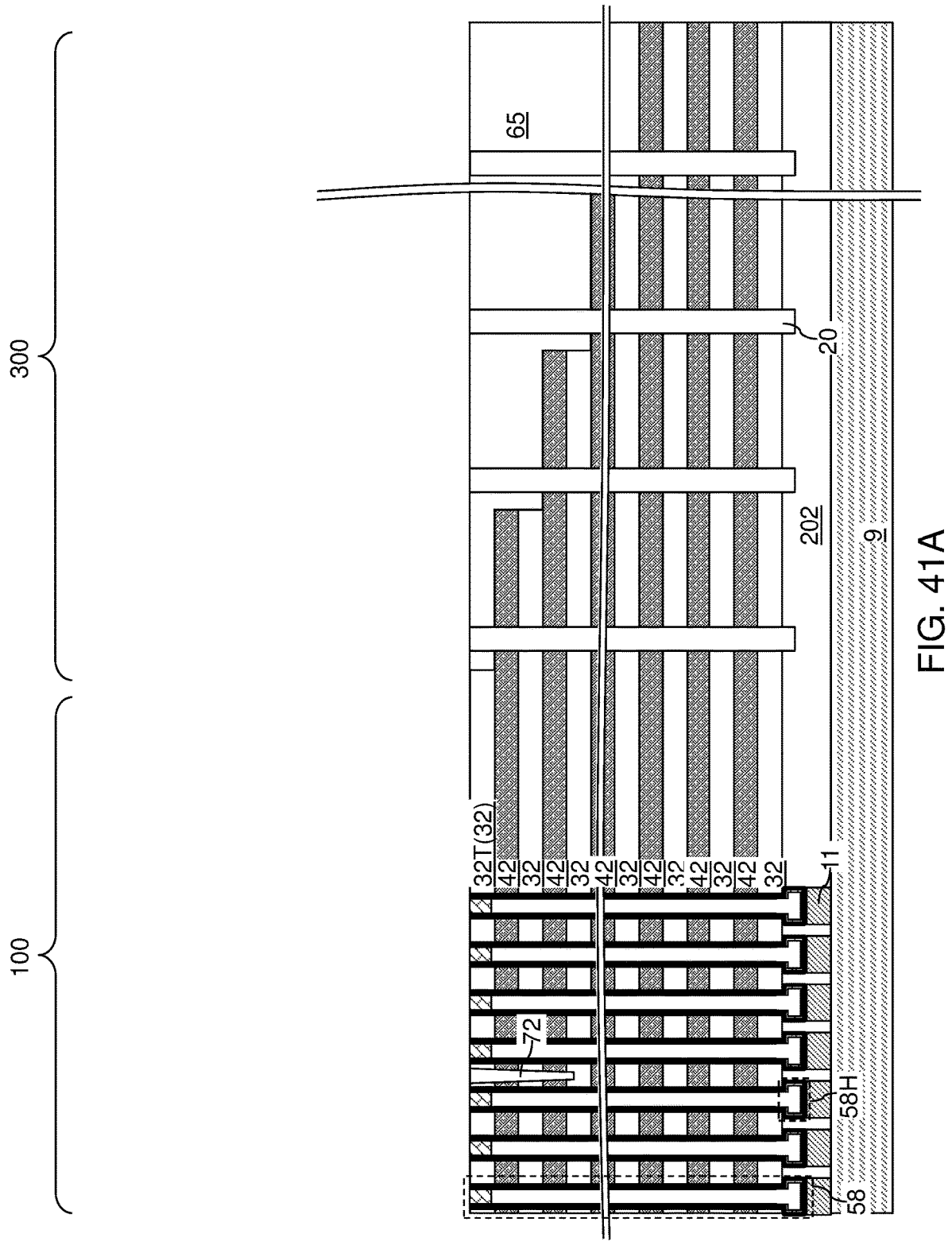
FIG. 41A is a schematic vertical cross-sectional view of the fourth exemplary structure after formation of memory opening fill structures and support opening fill structures according to the fourth embodiment of the present disclosure.
Figure 41B:
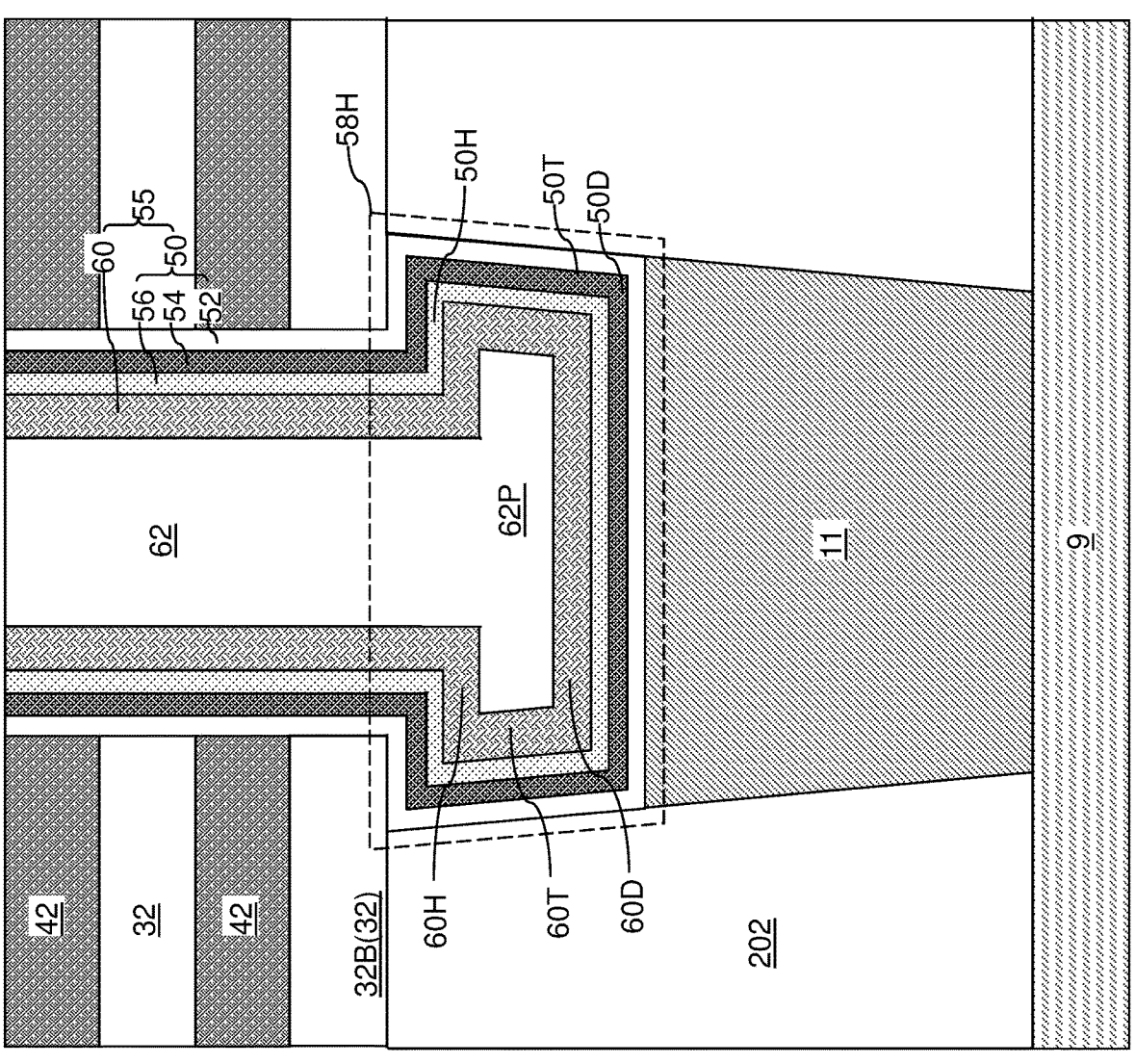
FIG. 41B is a magnified view of a region of the fourth exemplary structure of FIG. 41A.

Referring to FIGS. 41A and 41B, the processing steps described with reference to FIGS. 4 and 5 can be performed to form the support pillar structures in the support openings 19. Subsequently, the processing steps described with reference to FIGS. 6, 7A-7F, and 8A and 8B can be performed to form the memory opening fill structures 58 in the expanded memory openings 49'.

In one embodiment, each bottom portion of the expanded memory opening 49' embedded in the planar dielectric layer 202 may have a greater lateral dimension than a bottom portion of the overlying cylindrical portion of the expanded memory opening 49' that vertically extends through the alternating stack (32, 42). In one embodiment, each bottom portion of the expanded memory opening 49' may have a height that is greater than twice the sum of the thickness of a memory film 50 and the thickness of a semiconductor channel 60. In this case, the dielectric core 62 of each memory opening fill structure 58 may have a hammerhead configuration in which a bottom plate portion 62P of the dielectric core 62 has a greater lateral dimension than an overlying cylindrical portion of the dielectric core 62. In one embodiment, each memory opening fill structure 58 may have a hammerhead configuration, in which a hammerhead portion 58H of the memory opening fill structure 58 is embedded in the planar dielectric layer 202 and has a greater lateral dimension than an overlying cylindrical portion of the memory opening fill structure 58.

In one embodiment, the hammerhead portion 58H of each memory opening fill structure 58 may comprise a circular disc portion 50D of a memory film 50, a substantially vertical tubular portion 50T of the memory film 50, and a horizontal annular portion 50H of the memory film 50. Further, the hammerhead portion 58H of each memory opening fill structure 58 may comprise a circular disc portion 60D of a semiconductor channel 60, a substantially vertical tubular portion 60T of the semiconductor channel 60, and a horizontal annular portion 60H of the semiconductor channel 60. In addition, the hammerhead portion 58H of each memory opening fill structure 58 may comprise a plate portion 62P of a dielectric core 62.

Figure 42:
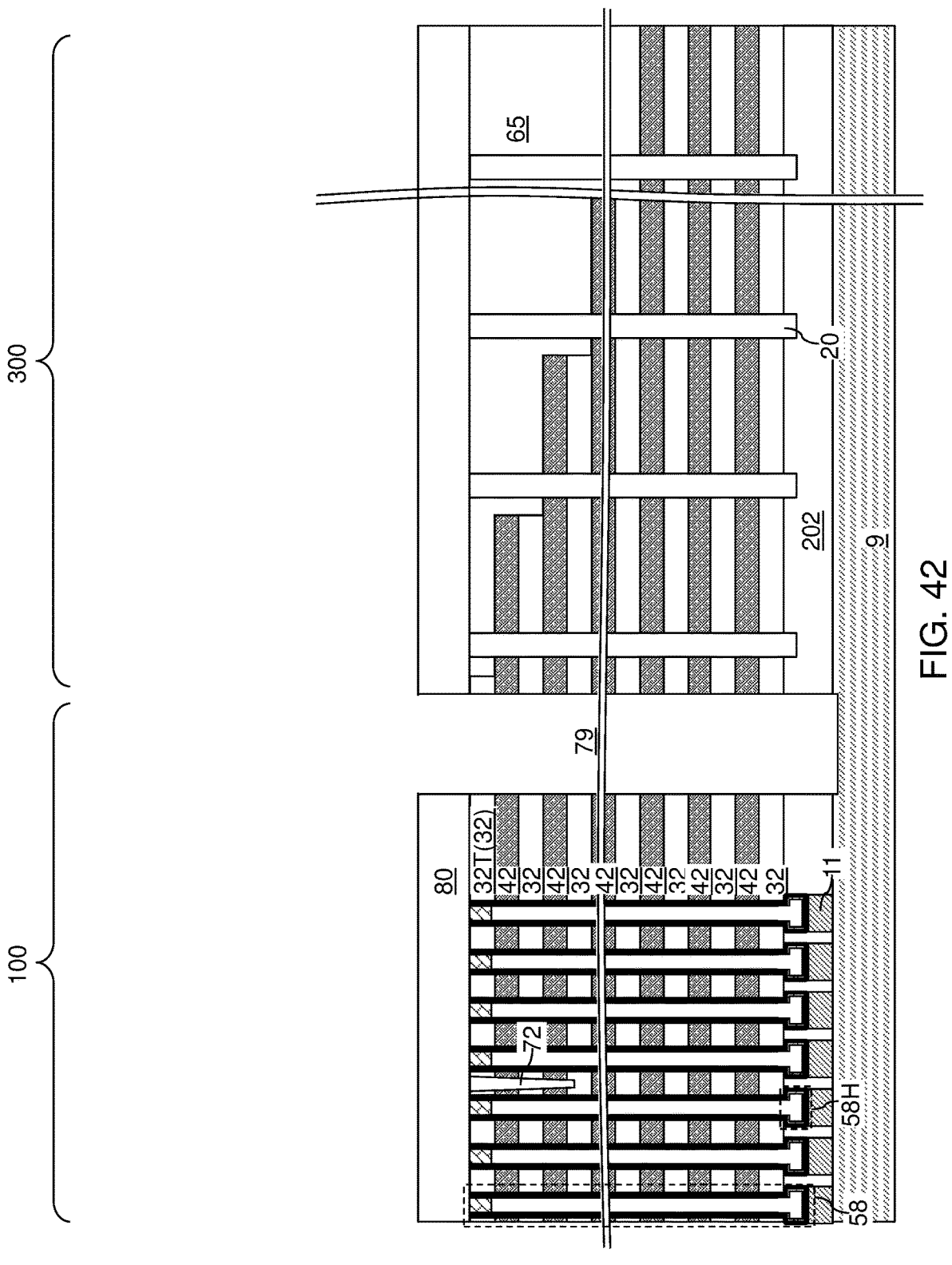
FIG. 42 is a schematic vertical cross-sectional view of the fourth exemplary structure after formation of lateral isolation trenches according to the fourth embodiment of the present disclosure.

Referring to FIG. 42, the processing steps described with reference to FIGS. 9A and 9B can be performed to form a contact-level dielectric layer 80, and to form lateral isolation trenches 79. In one embodiment, the carrier substrate 9 may be employed as an etch stop structure during formation of the lateral isolation trenches 79.

Figure 43:
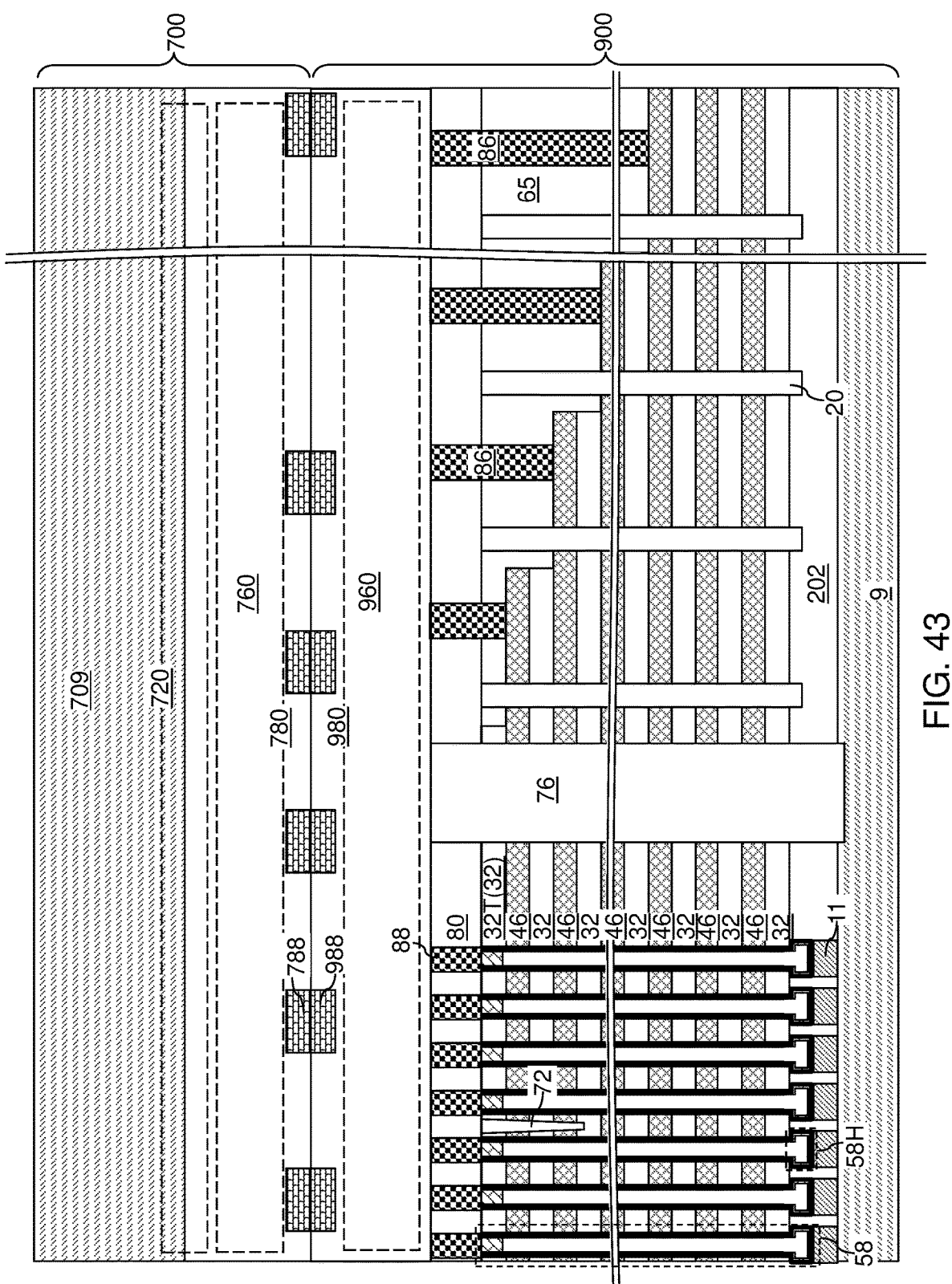
FIG. 43 is a vertical cross-sectional view of the fourth exemplary structure after attaching the logic die to the memory die according to the fourth embodiment of the present disclosure.

Referring to FIG. 43, the processing steps described with reference to FIGS. 10-13 can be performed to replace the sacrificial material layers 42 with electrically conductive layers 46. Various contact via structures (88, 86) can be formed, and memory-side dielectric material layers 960 embedding memory-side metal interconnect structures 980 and memory-side bonding pads 988 can be formed. A memory die 900 can be provided. Subsequently, the processing steps described with reference to FIGS. 14 and 15 can be performed to provide a logic die 700, and to bond the logic die 700 to the memory die 900.

Figure 44A:
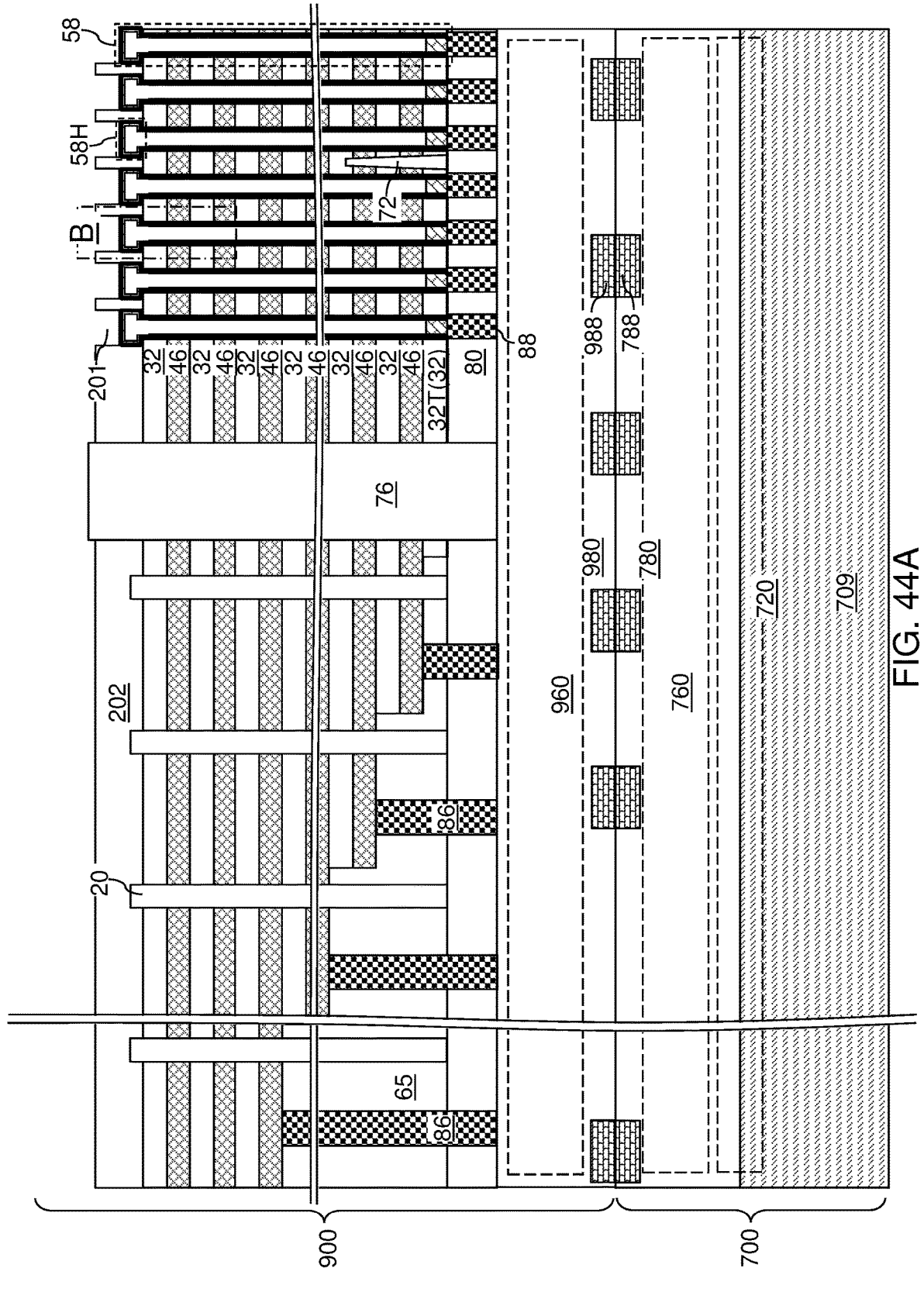
FIG. 44A is a vertical cross-sectional view of the fourth exemplary structure after removal of the carrier substrate according to the fourth embodiment of the present disclosure.
Figure 44B:
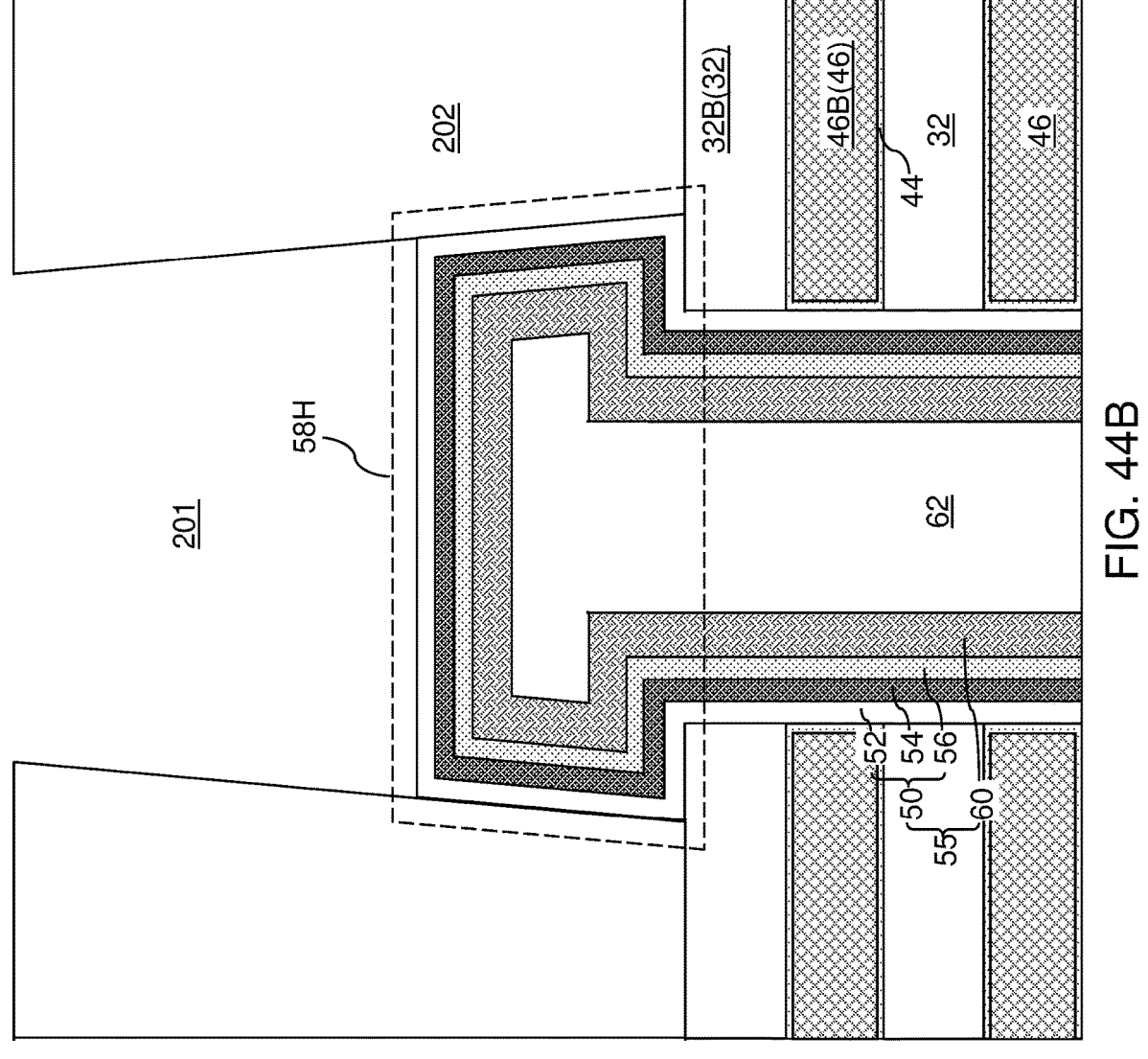
FIG. 44B is a magnified view of region B of FIG. 44A.

Referring to FIGS. 44A and 44B, the processing steps described with reference to FIGS. 16A and 16B can be performed to remove the carrier substrate 9 and the first sacrificial pedestals 11 selective to the planar dielectric layer 202 and selective to the memory films 50 of the memory opening fill structures 58. In one embodiment, the carrier substrate 9 and the first sacrificial pedestals 11 may be removed selective to the planar dielectric layer 202 and the memory film 50 by performing a selective etch process. Cavities 201 are formed in the volumes from which the first sacrificial pedestals 11 are removed.

Figure 45A:
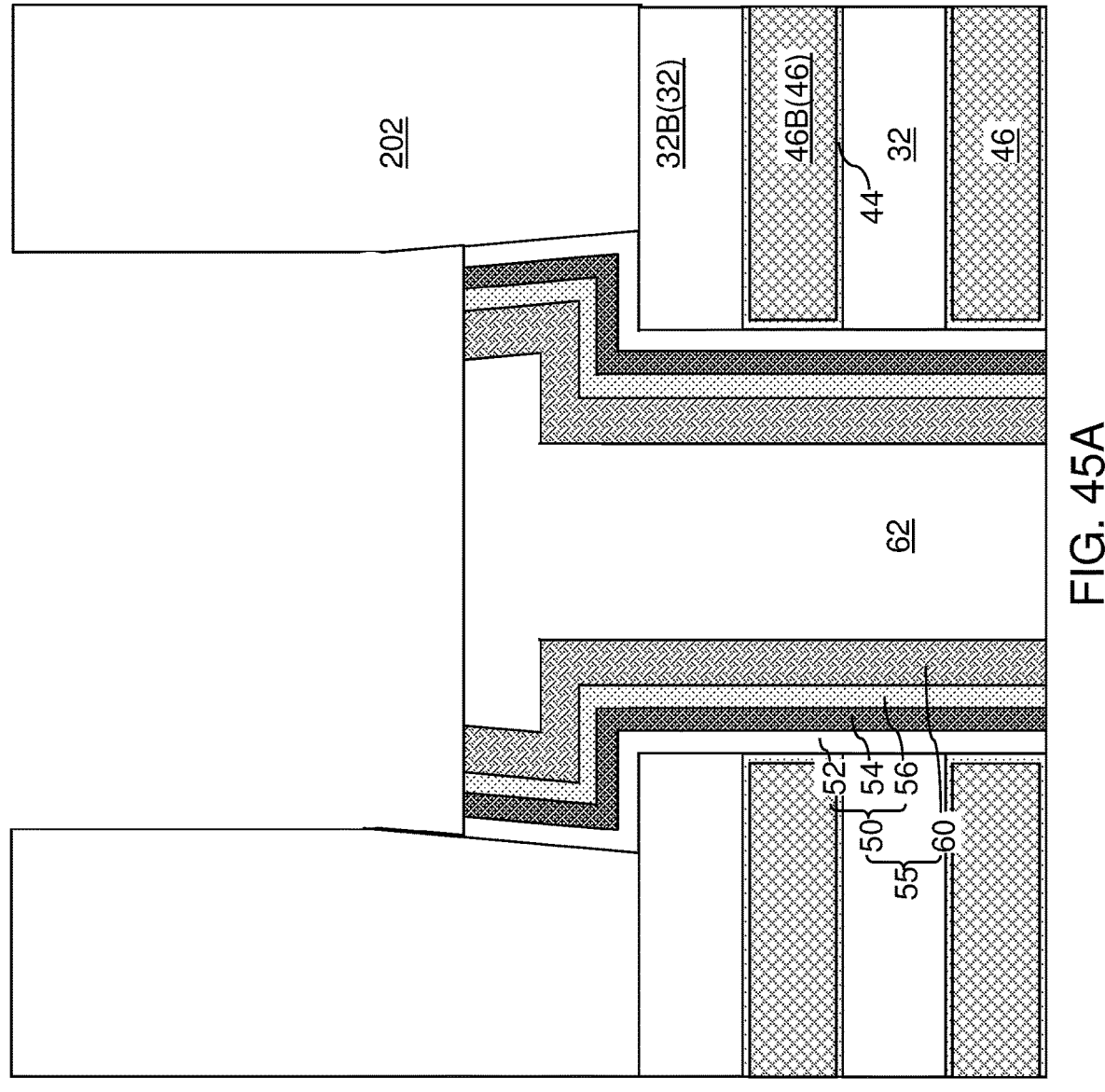
FIGS. 45A-45C are sequential vertical cross-sectional views of a region of the fourth exemplary structure during formation of a Schottky source structure according to the fourth embodiment of the present disclosure.
Figure 45B:
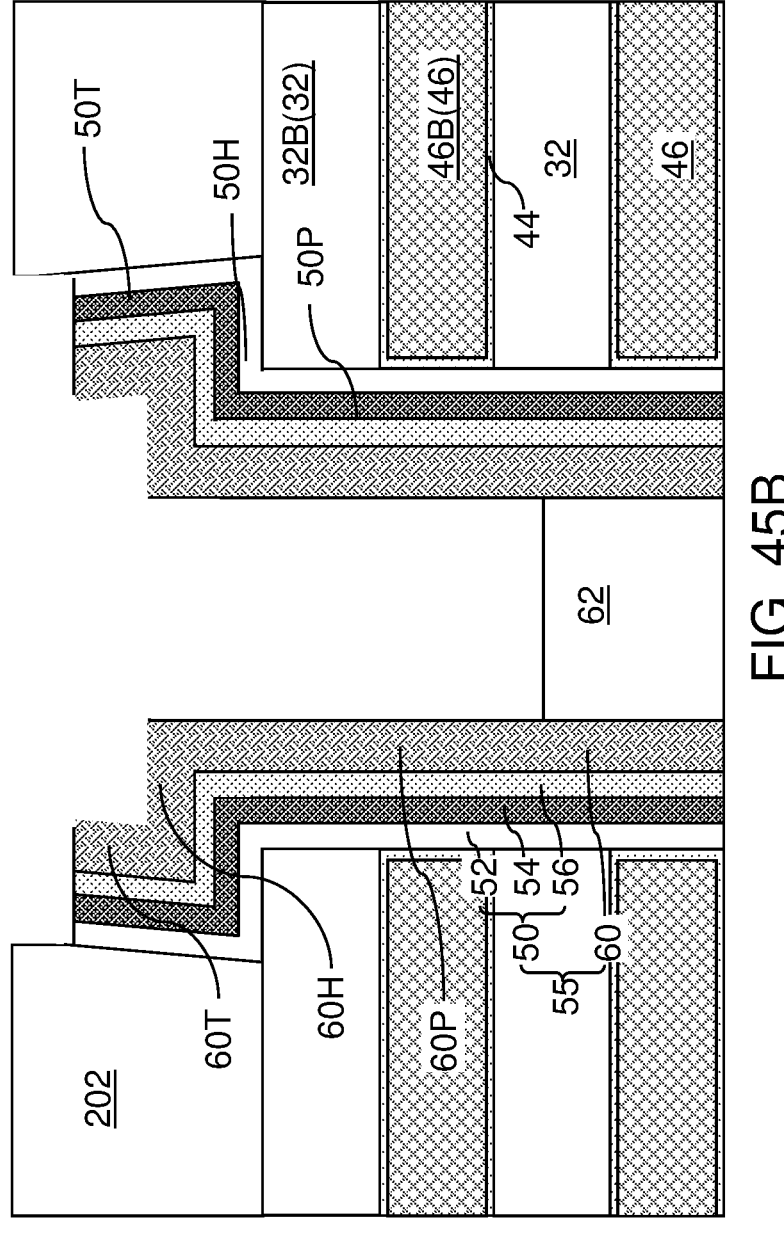
Figure 45C:
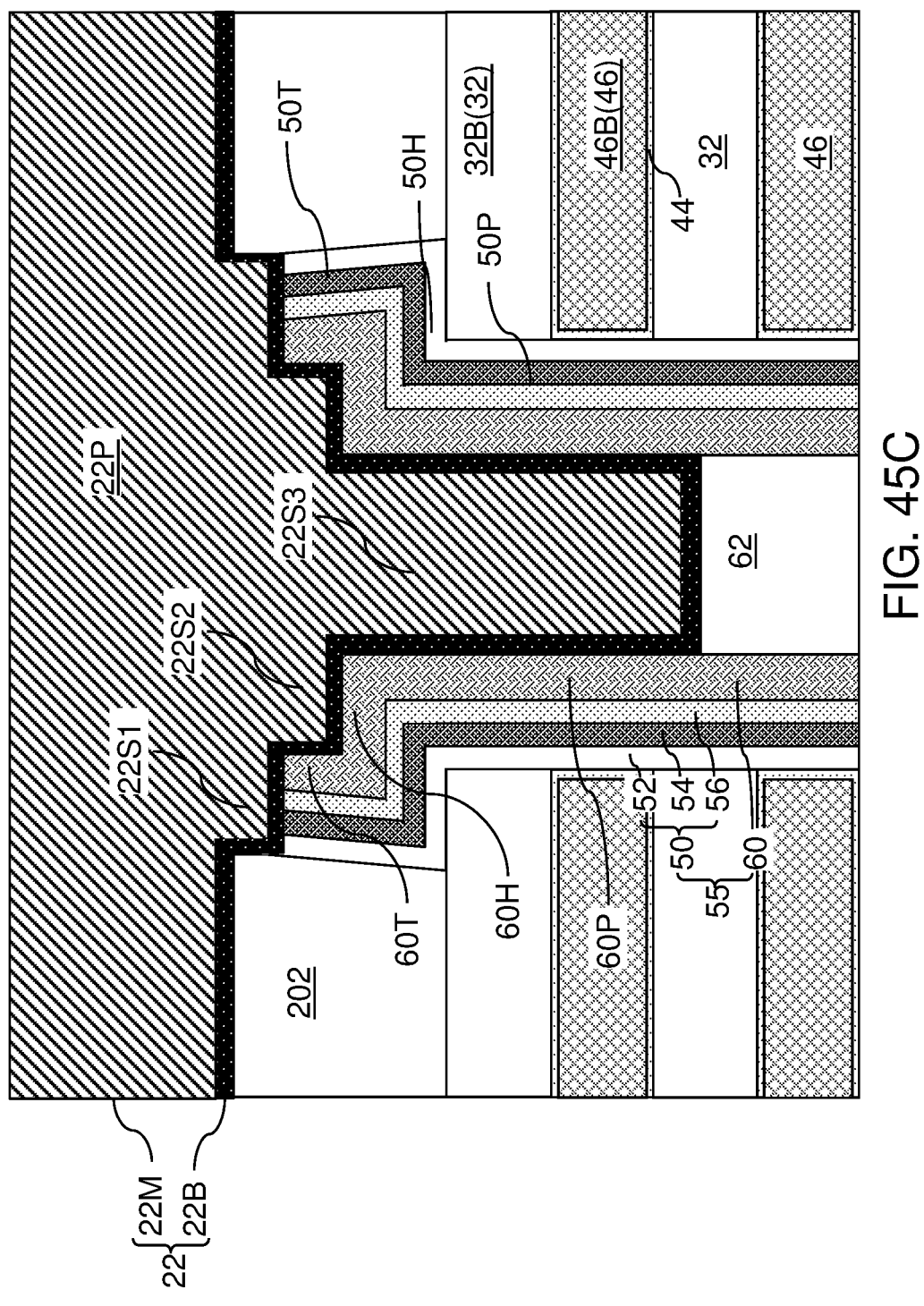

FIGS. 45A-45C are sequential vertical cross-sectional views of a region of the fourth exemplary structure during formation of a Schottky source structure according to the fourth embodiment of the present disclosure.

Referring to FIG. 45A, a sequence of selective etch processes can be performed to remove a physically exposed end portion of the memory film 50 selective to the semiconductor channel 60 in each memory opening fill structure 58. For example, the sequence of selective etch processes may comprise a first selective etch process that etches the material of the blocking dielectric layer 52 selective to the material of the memory material layer 54, a second selective etch process that etches the material of the memory material layer 54 selective to the material of the dielectric liner 56, and a third selective etch process that etches the material of the dielectric liner 56 selective to the material of the semiconductor channel 60. These steps remove the disc portion 50D of the memory film 50.

Subsequently, an isotropic etch process can be performed to remove a physically exposed end portion of each semiconductor channel 60. For example, a wet etch process employing hot trimethyl-2 hydroxyethyl ammonium hydroxide ("hot TMY") or tetramethyl ammonium hydroxide (TMAH) may be performed to remove the physically exposed end portion of each semiconductor channel 60. End surfaces of dielectric cores 62 can be exposed. This step removes the disc portion 60D of the semiconductor channel 60.

Referring to FIG. 45B, an etch process can be performed to vertically recess the dielectric material of the dielectric core 62 selective to the semiconductor material of the semiconductor channels 60. The duration of the etch process can be selected such that recessed surfaces of the dielectric cores 62 are formed at or about the level of an insulating layer 32 that is more distal from the planar dielectric layer 202 than the bottommost electrically conductive layer 46B is from the planar dielectric layer 202.

The etch process also collaterally etches the planar dielectric layer 202. In one embodiment, the duration of the anisotropic etch process can be selected such that the planar dielectric layer 202 is not completely removed by the anisotropic etch process. In one embodiment, a physically exposed planar surface of the planar dielectric layer 202 may protrude farther outward than the remaining portions (e.g., the tubular portions 60T) of the semiconductor channels 60. In one embodiment, the combination of the planar dielectric layer 202 and the memory films 50 may have tapered sidewalls each laterally surrounding an end portion of a respective one of the semiconductor channels 60. The taper angle of each tapered sidewall of the combination of the planar dielectric layer 202 and the memory films 50 may be in a range from 0.5 degree to 10 degrees, although lesser and greater taper angles may also be employed. The blocking dielectric 52 and the tunneling dielectric 56 may also be collaterally recessed during the etch process if they comprise the same material as the dielectric core 62.

The memory opening fill structure 58 comprises a semiconductor channel 60, a vertical stack of memory elements (e.g., portions of the memory film 50), a drain region 63 which electrically contacts and upper portion of the semiconductor channel 60, and a dielectric core 62 which is laterally surrounded by the semiconductor channel 60. The remaining semiconductor channel 60 comprises a primary tubular portion 60P that vertically extends through the alternating stack (32, 46) and an upper portion of the planar dielectric layer 202, a horizontal annular portion 60H adjoined to a bottom end of the primary tubular portion 60P, and a tubular base portion 60T adjoined to an outer periphery of the horizontal annular portion 60H. The primary tubular portion 60P contains the upper portion of the semiconductor channel 60 and also laterally surrounds the dielectric core 62. The tubular base portion 60T extends vertically or substantially vertically (e.g., within 10 degrees of a vertical direction which is parallel to a central axis of the memory opening fill structure 58). Each memory film 50 comprises: a primary tubular portion 50P that vertically extends through the alternating stack (32, 46); a horizontal annular portion 50H adjoined to a bottom end of the primary tubular portion 50P and contacting a bottom surface of the bottommost insulating layer 32B; and a tubular base portion 50T adjoined to an outer periphery of the horizontal annular portion 50T and having a tapered annular surface.

Referring to FIG. 45C, the above described source layer 22 can be formed directly on each physically exposed lower portion of the semiconductor channels 60 and the memory films 50. The source layer 22 includes three step portions 22S1, 22S2, 22S3 which protrude upwards toward the drain regions 63 from a planar base portion 22P. The second step portion 22S2 protrudes upward further then the first step portion 22S1, and third step portion 22S3 protrudes upward further then the second step portion 22S2. The first step portion 22S1 is laterally adjoined to the base portion 22P. The second step portion 22S2 is laterally adjoined to the first step portion 22S1 and is laterally surrounded by the first step portion 22S1. The third step portion 22S3 is laterally adjoined to the second step portion 22S2 and is laterally surrounded by the second step portion 22S2.

The planar base portion 22P contacts the planar bottom surface of the planar dielectric layer 202. The top surface of the first step portion 22S1 contacts the bottom surface of the tubular base portion 50T of the memory film 50 and the tubular base portion 60T of the semiconductor channel 60. The sidewall of the first step portion 22S1 contacts a sidewall of the planar dielectric layer 202 in the memory opening 49.

The top surface of the second step portion 22S2 contacts the horizontal bottom surface of the horizontal annular portion 50H of the memory film 50 and the horizontal annular portion 60H of the semiconductor channel 60. The sidewall of the second step portion 22S2 contacts an inner sidewall of the tubular base portion 60T of the semiconductor channel 60 in the memory opening 49.

The top surface of the third step portion 22S3 contacts the horizontal bottom surface of the recessed dielectric core 62. The sidewall of the third step portion 22S3 contacts an inner sidewall of the primary tubular portion 60P of the semiconductor channel 60 in the memory opening 49.

Figure 46:
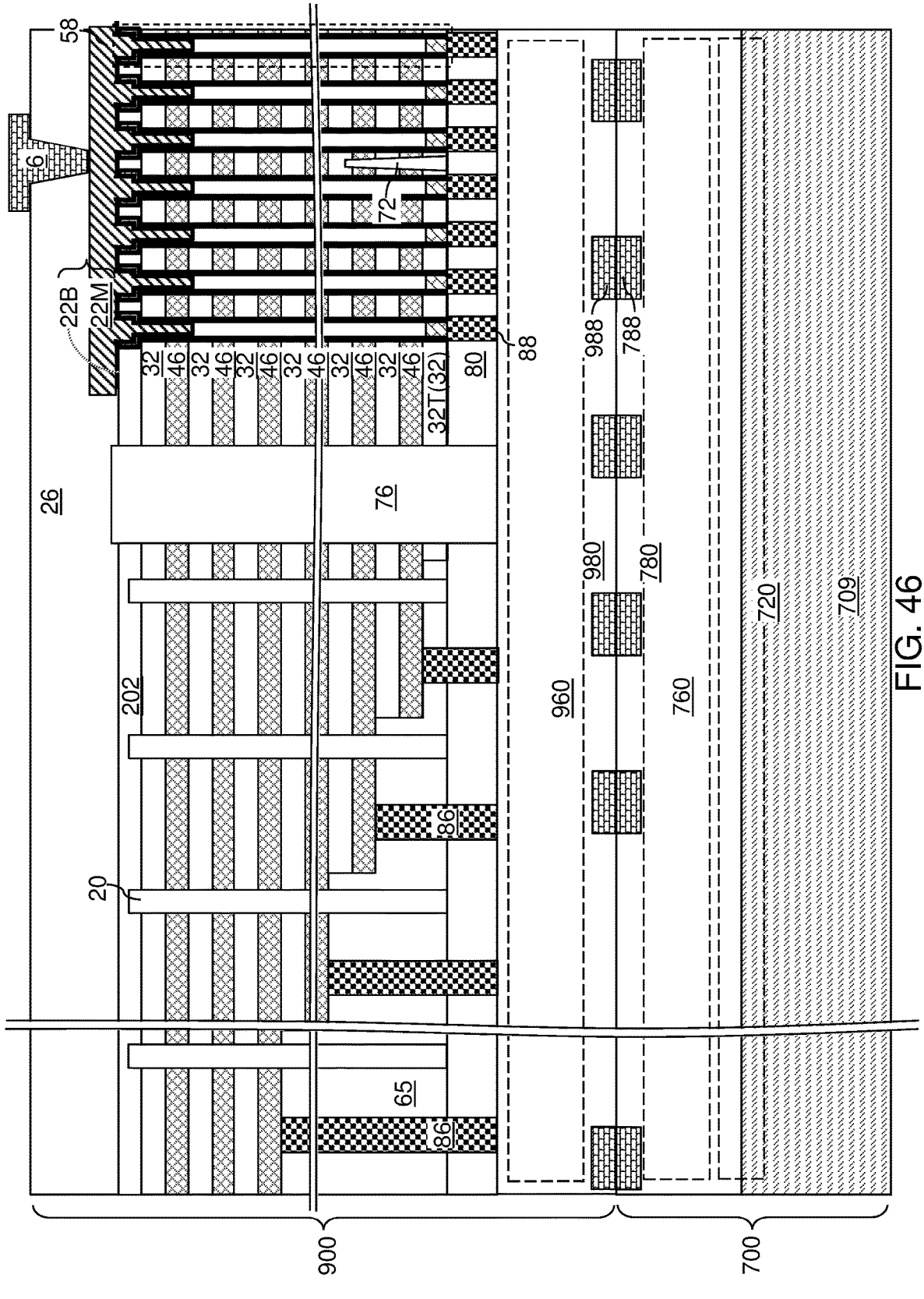
FIG. 46 is a vertical cross-sectional view of the fourth exemplary structure after formation of a backside dielectric layer and a source contact structure according to the fourth embodiment of the present disclosure.

Referring to FIG. 46, the source layer 22 can be patterned as described above. The patterned source layer 22 comprises a Schottky source structure providing Schottky junctions to a respective set of semiconductor channels 60. A backside dielectric layer 26 can be deposited over the source layer 22. At least one source contact structure 6 can be formed through the backside dielectric layer 26 on the source layer 22.

Figures 47, 48A:
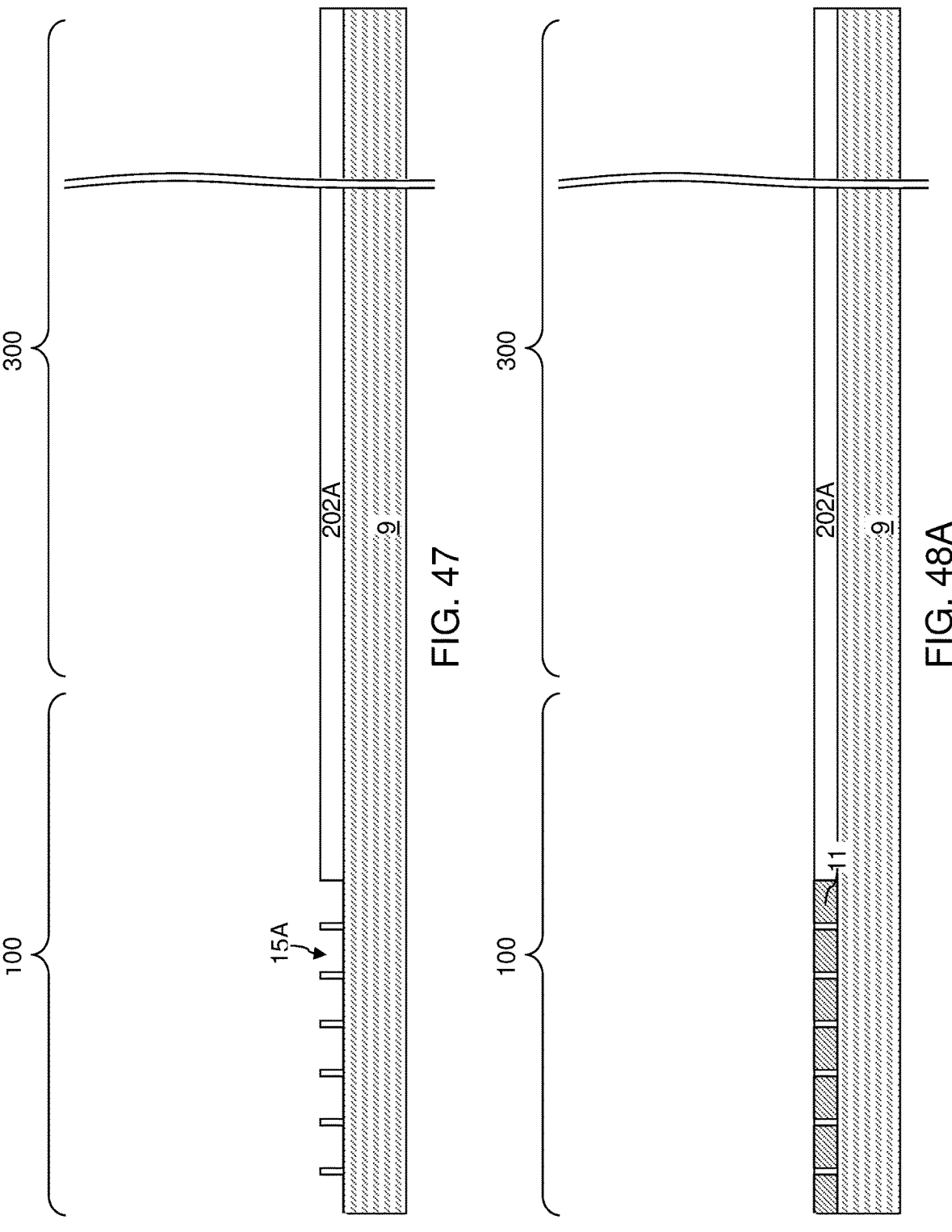
FIG. 47 is a vertical cross-sectional view of a fifth exemplary structure after formation of an array of first openings through a first planar dielectric layer according to a fifth embodiment of the present disclosure.
FIG. 48A is a vertical cross-sectional view of the fifth exemplary structure after formation of first sacrificial pedestals according to the fifth embodiment of the present disclosure.

Referring to FIG. 47, a fifth exemplary structure according to a fifth embodiment of the present disclosure can be provided by forming a first planar dielectric layer 202A on a top surface of a carrier substrate 9, and by forming an array of first cavities 15A through the first planar dielectric layer 202A. The first planar dielectric layer 202A comprises a dielectric material, such as undoped silicate glass or a doped silicate glass. The thickness of the first planar dielectric layer 202A may be in a range from 50 nm to 400 nm, although lesser and greater thicknesses may also be employed. The pattern of the first cavities 15A can be the same as the pattern of the cavities 15 as described with reference to FIGS. 35A and 35B.

Figure 48B:
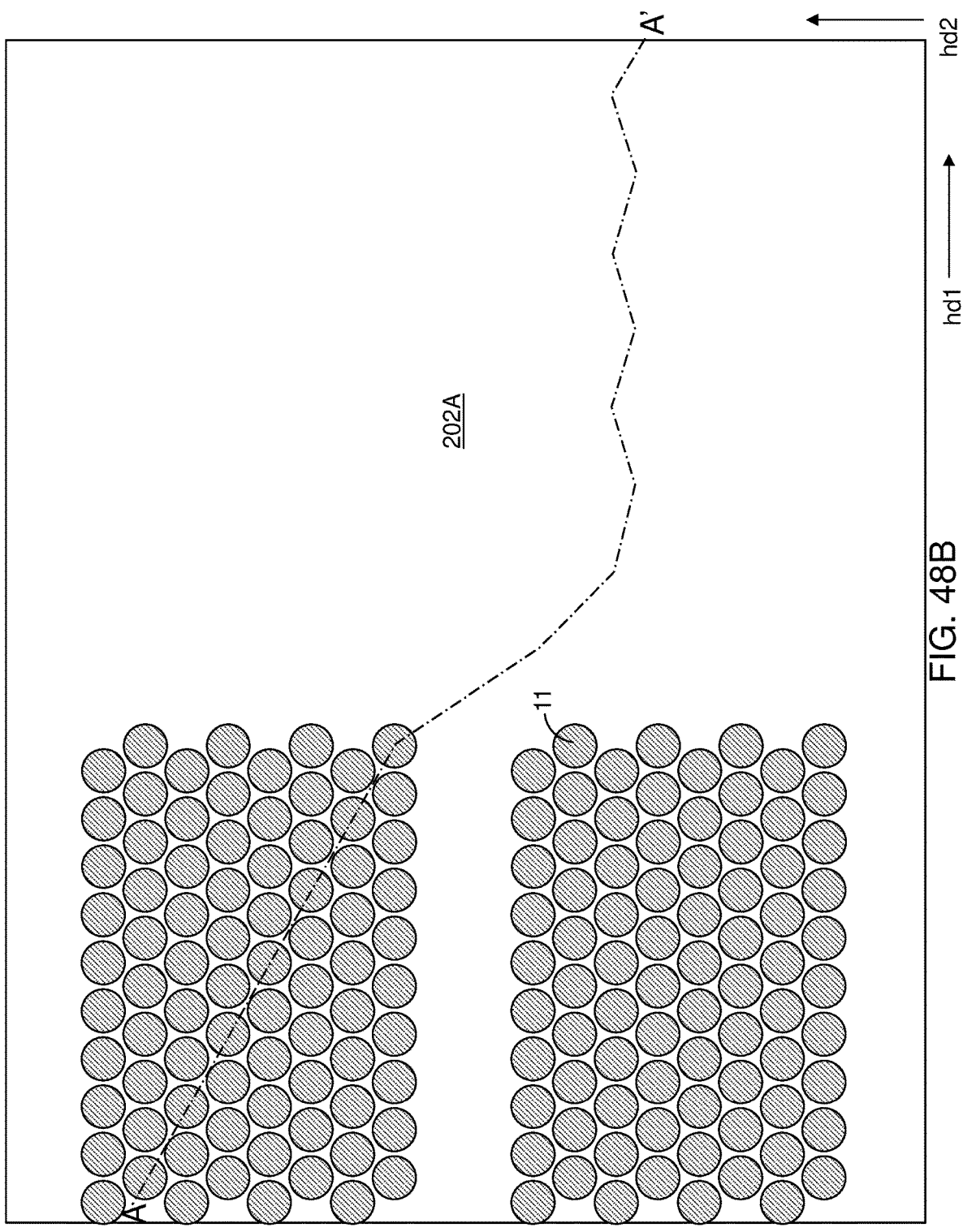
FIG. 48B is a top-down view of the fifth exemplary structure of FIG. 48A. The hinged vertical plane A-A' is the cut plane of the vertical cross-sectional view of FIG. 48A.

Referring to FIGS. 48A and 48B, the first sacrificial pedestals 11 can be formed in the first cavities 15A. The first sacrificial pedestals 11 comprise the same material as in the fourth embodiment.

Figures 49, 50A:
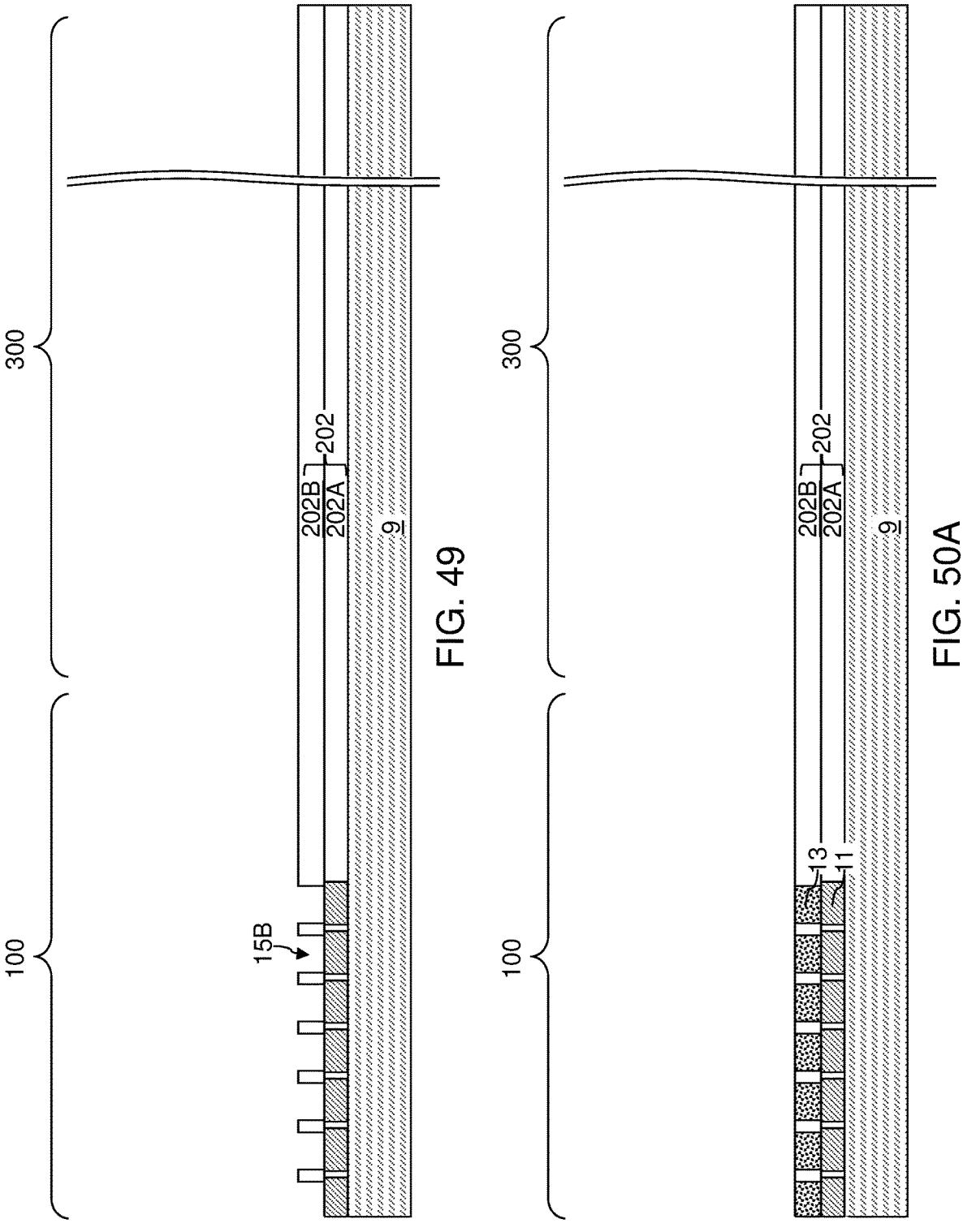
FIG. 49 is a vertical cross-sectional view of a fifth exemplary structure after formation of an array of second openings through a second planar dielectric layer according to the fifth embodiment of the present disclosure.
FIG. 50A is a vertical cross-sectional view of the fifth exemplary structure after formation of second sacrificial pedestals according to the fifth embodiment of the present disclosure.

Referring to FIG. 49, a second planar dielectric layer 202B can be formed on a top surface of the first planar dielectric layer 202A. An array of second cavities 15B can be formed through the second planar dielectric layer 202B. The second planar dielectric layer 202B comprises a dielectric material, such as undoped silicate glass or a doped silicate glass. The thickness of the second planar dielectric layer 202B may be in a range from 50 nm to 400 nm, although lesser and greater thicknesses may also be employed. The pattern of the second cavities 15B can be the same as the pattern of the cavities 15 as described with reference to FIGS. 35A and 35B. In one embodiment, the second cavities 15B may be wider than the first cavities 15A. In another embodiment, the second cavities 15B may be narrower than the first cavities 15A. In yet another embodiment, the first and second cavities may have the same width.

Figure 50B:
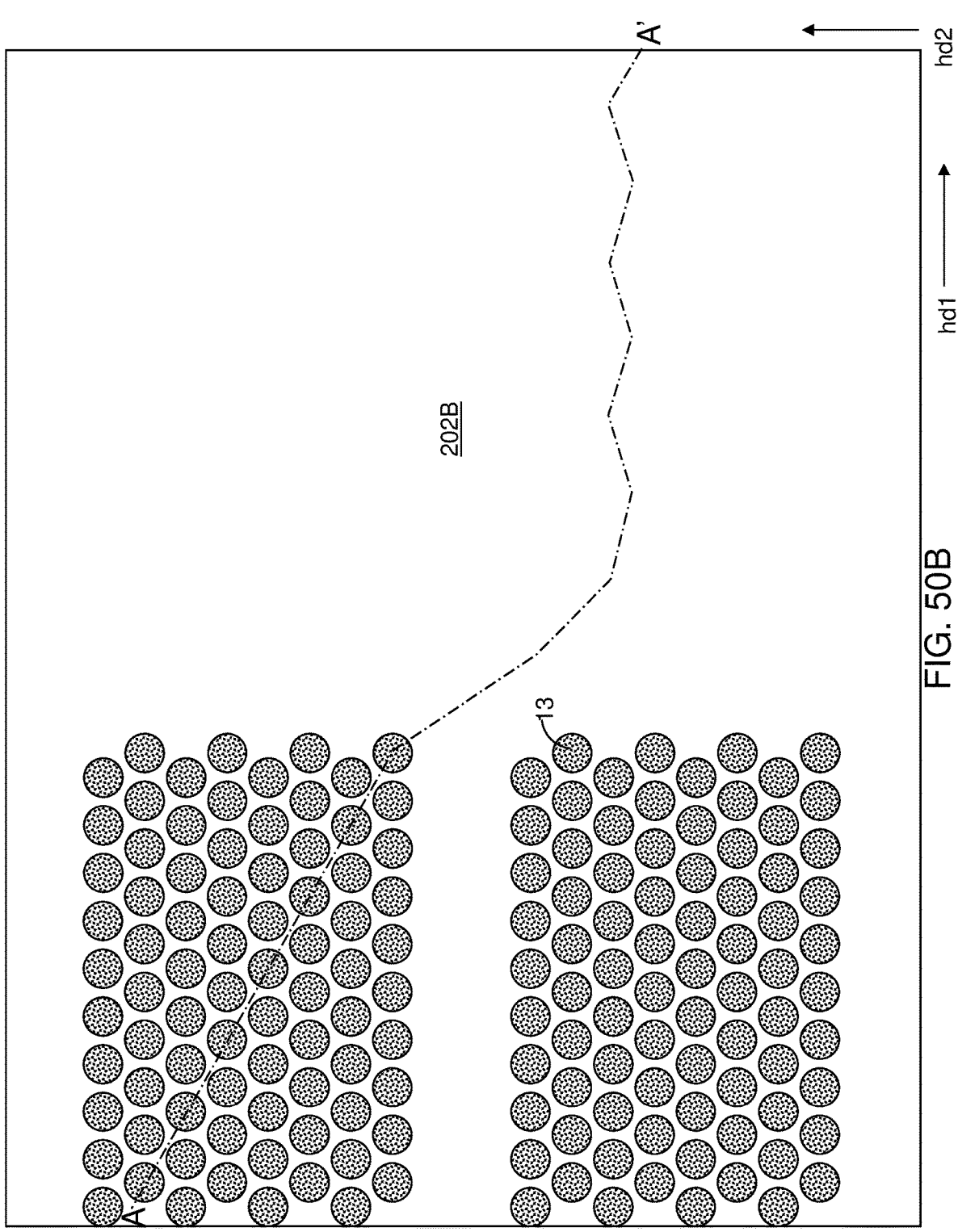
FIG. 50B is a top-down view of the fifth exemplary structure of FIG. 50A. The hinged vertical plane A-A' is the cut plane of the vertical cross-sectional view of FIG. 50A.

Referring to FIGS. 50A and 50B, the second pedestal material can be deposited in the second cavities 15B to form the second sacrificial pedestals 13 as described above with reference to FIGS. 37A and 37B. The second sacrificial pedestals 13 may be narrower than, wider than, or have the same width as the first sacrificial pedestals 11.

Figure 51A:
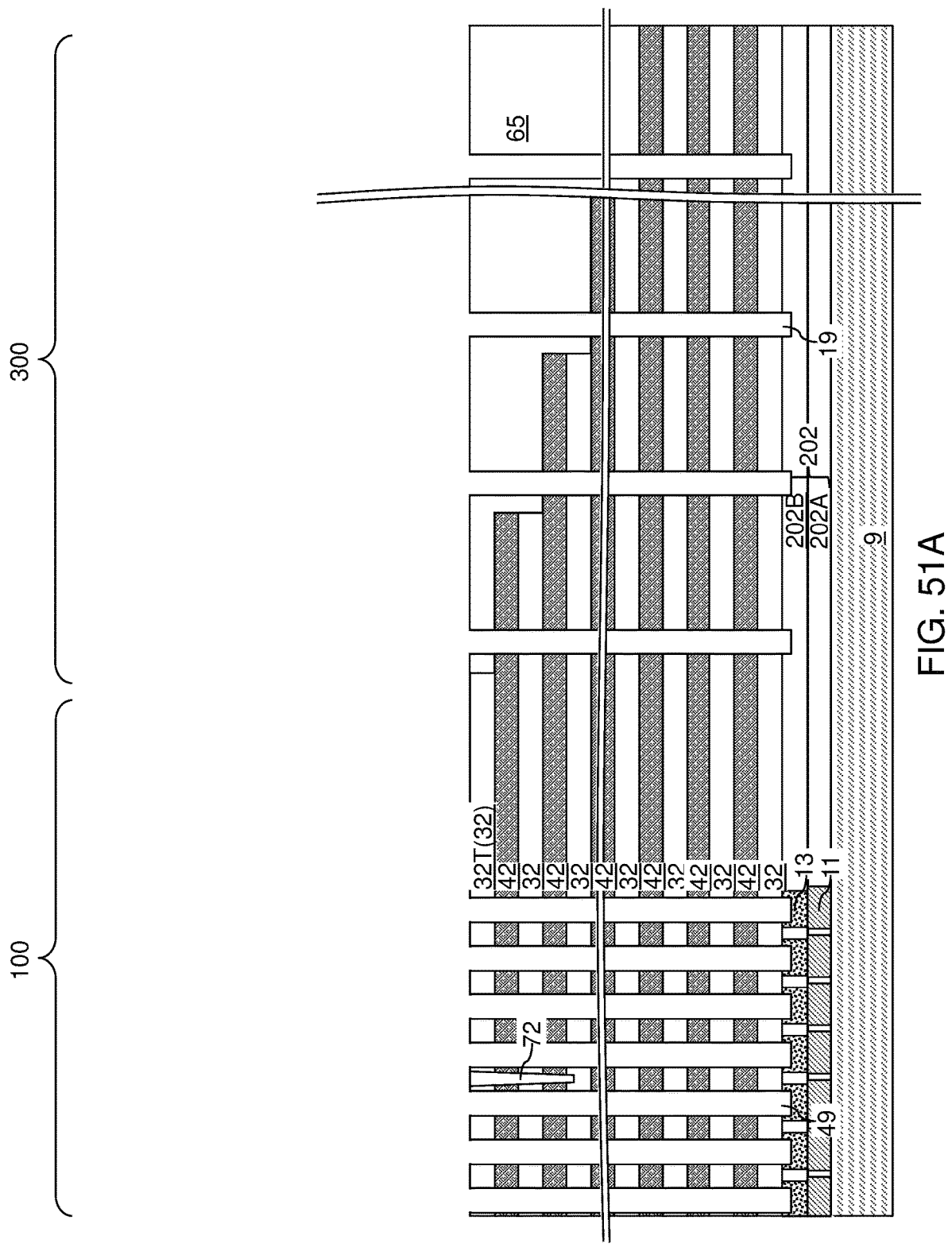
FIG. 51A is a schematic vertical cross-sectional view of the fifth exemplary structure after formation of an alternating stack of insulating layers and sacrificial material layers and formation of memory openings and support openings according to the fifth embodiment of the present disclosure.
Figure 51B:
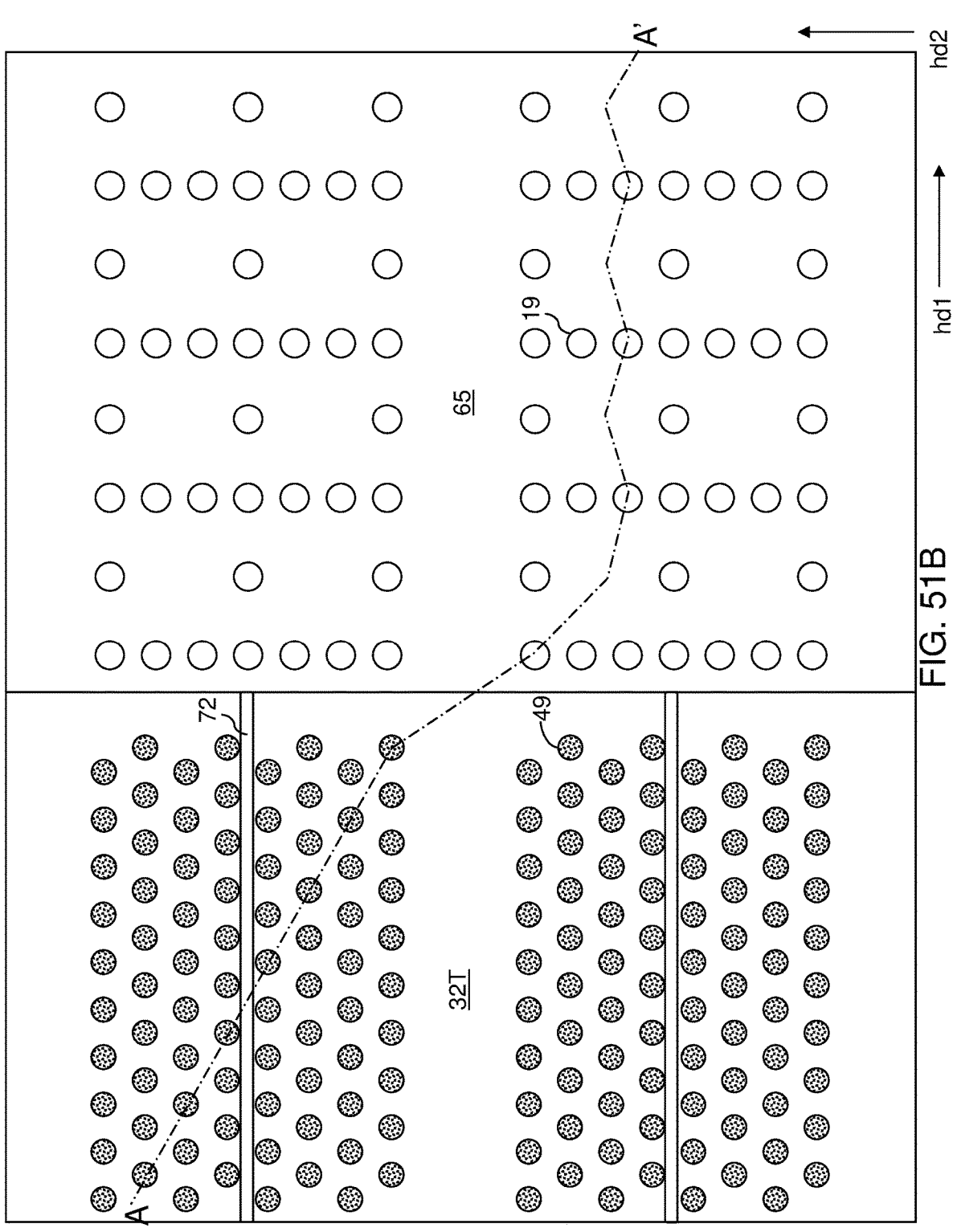
FIG. 51B is a top-down view of the fifth exemplary structure of FIG. 51A. The hinged vertical plane A-A' is the cut plane of the vertical cross-sectional view of FIG. 51A.

Referring to FIGS. 51A and 51B, the processing steps described with reference to FIG. 1 can be performed to form an alternating stack of insulating layers 32 and sacrificial material layers 42, and to form drain-select-level isolation structures 72.

Subsequently, the processing steps described with reference to FIG. 2 can be performed to form stepped surfaces and a stepped dielectric material portion 65. The processing steps described with reference to FIGS. 3A and 3B can be performed to form memory openings 49 and support openings 19. A terminal portion of the anisotropic etch process that forms the memory openings 49 and the support openings 19 may be selective to the material of the second sacrificial pedestals 13.

Figure 52:
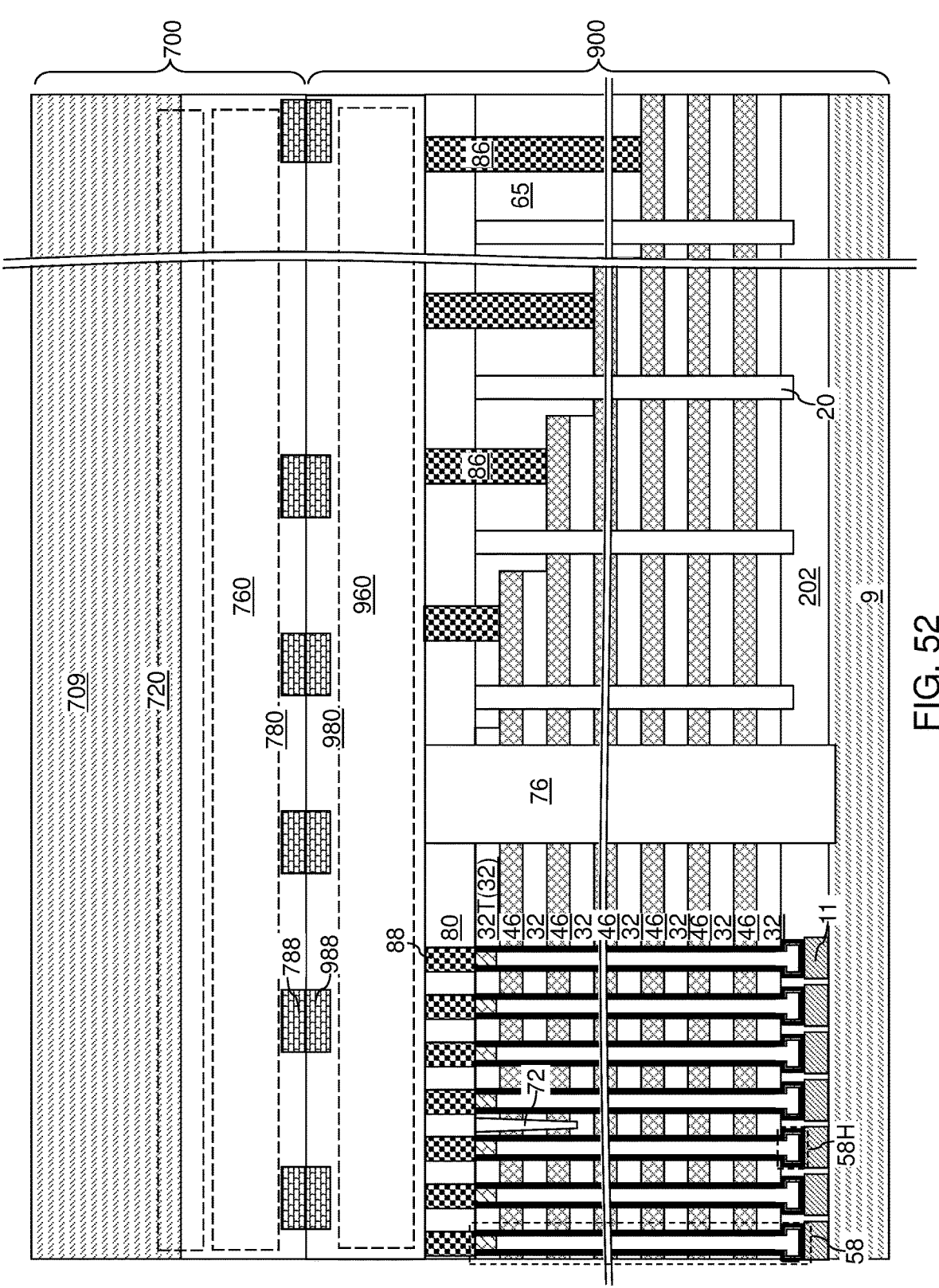
FIG. 52 is a vertical cross-sectional view of the fifth exemplary structure after attaching the logic die to the memory die according to the fifth embodiment of the present disclosure.

Referring to FIG. 52, the processing steps described with reference to FIGS. 40, 41A and 41B, 42, and 43 can be performed to form a bonded assembly of a logic die 700 and a memory die 900.

Figure 53:
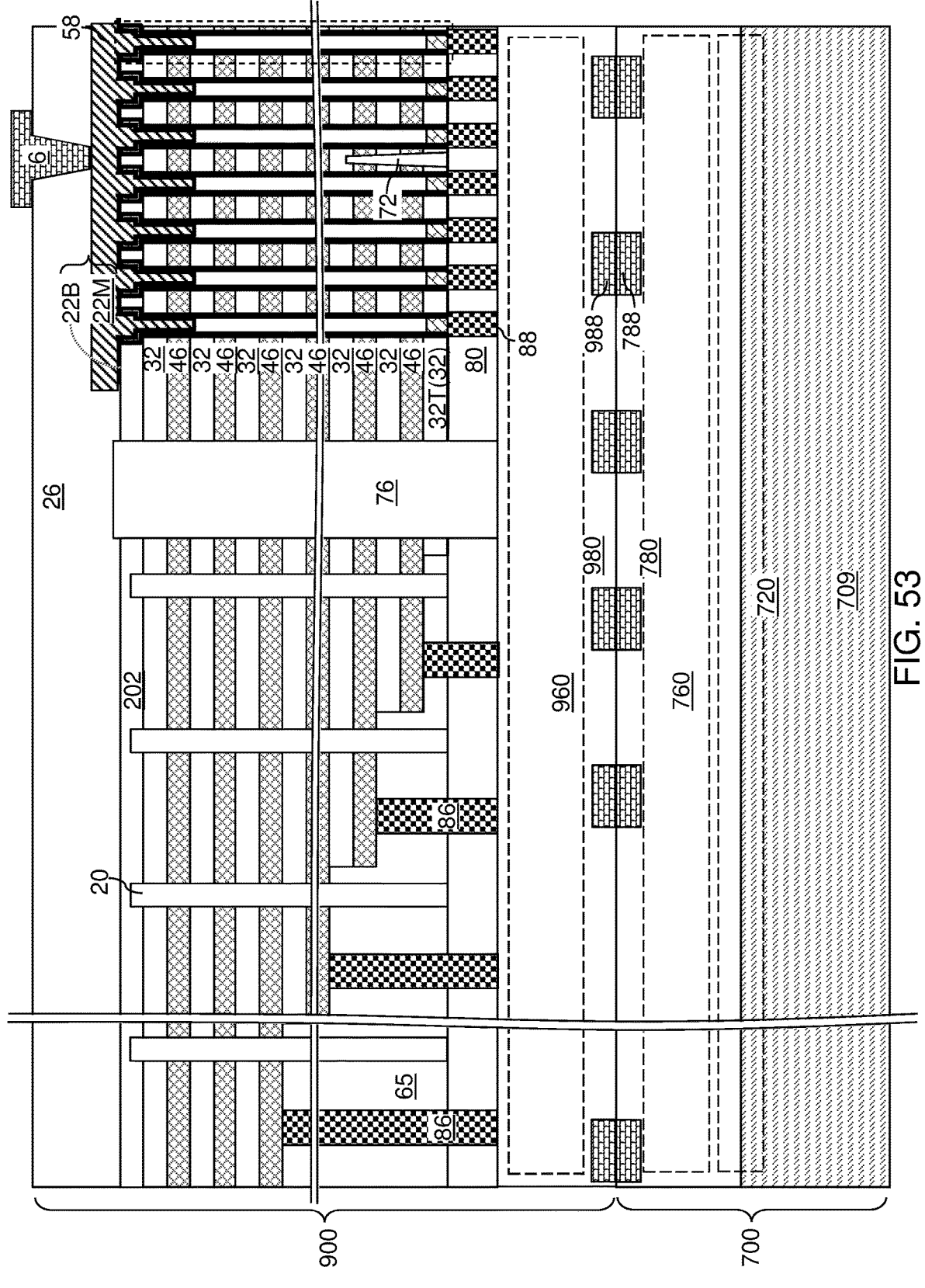
FIG. 53 is a vertical cross-sectional view of the fifth exemplary structure after formation of a backside dielectric layer and a source contact structure according to the fifth embodiment of the present disclosure.

Referring to FIG. 53, the processing steps described with reference to FIGS. 44A and 44B, 45A-45C, and 46 can be performed to deposit and pattern the source layer 22, to form the backside dielectric layer 26, and to form the contact structure 6.

Figure 54:
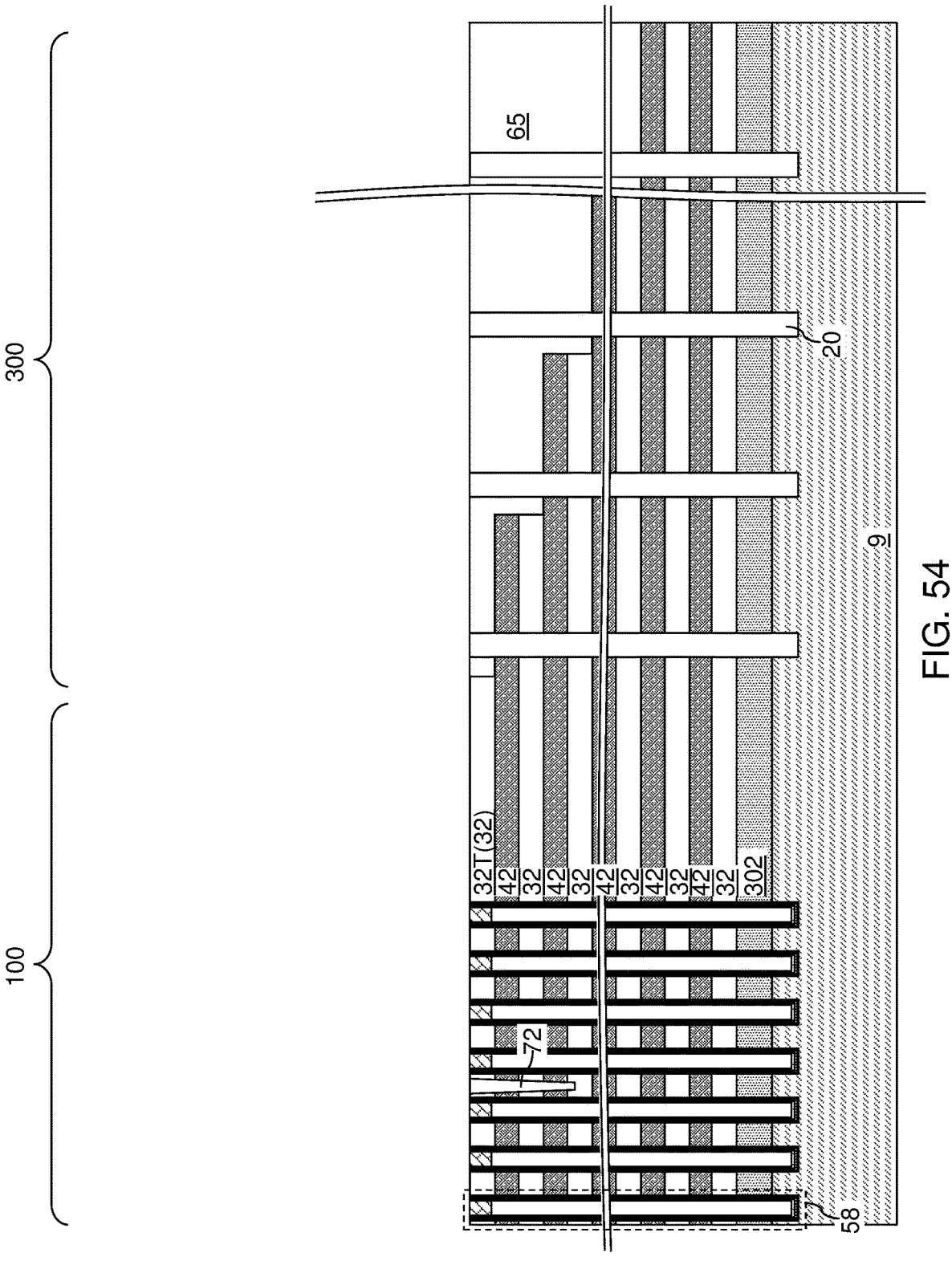
FIG. 54 is a schematic vertical cross-sectional view of a sixth exemplary structure after formation of memory opening fill structures and support opening fill structures according to a sixth embodiment of the present disclosure.

Referring to FIG. 54, a sixth exemplary structure according to a sixth embodiment of the present disclosure is illustrated. The sixth exemplary structure can be derived from the first exemplary structure illustrated in FIGS. 8A and 8B by forming an etch-stop dielectric layer 302 on the top surface of the carrier substrate 9 prior to formation of an alternating stack of insulating layers 32 and sacrificial material layers 42. In anisotropic etch process employed to form the memory openings 49 and the support openings 19 may be modified to etch through the etch-stop dielectric layer 302.

The etch-stop dielectric layer 302 comprises a material that can be employed as an etch stop structure during a subsequent processing step employed to remove the carrier substrate 9. For example, the etch-stop dielectric layer 302 may comprise silicon carbide nitride (i.e., silicon carbonitride). The thickness of the etch-stop dielectric layer 302 may be in a range from 50 nm to 500 nm, such as from 100 nm to 300 nm, although lesser and greater thicknesses may also be employed.

Subsequently, the processing steps described with reference to FIGS. 9-16B can be performed.

FIGS. 55A-55G are sequential vertical cross-sectional views of a region of the sixth exemplary structure during formation of a Schottky source structure according to the sixth embodiment of the present disclosure.

Figure 55A:
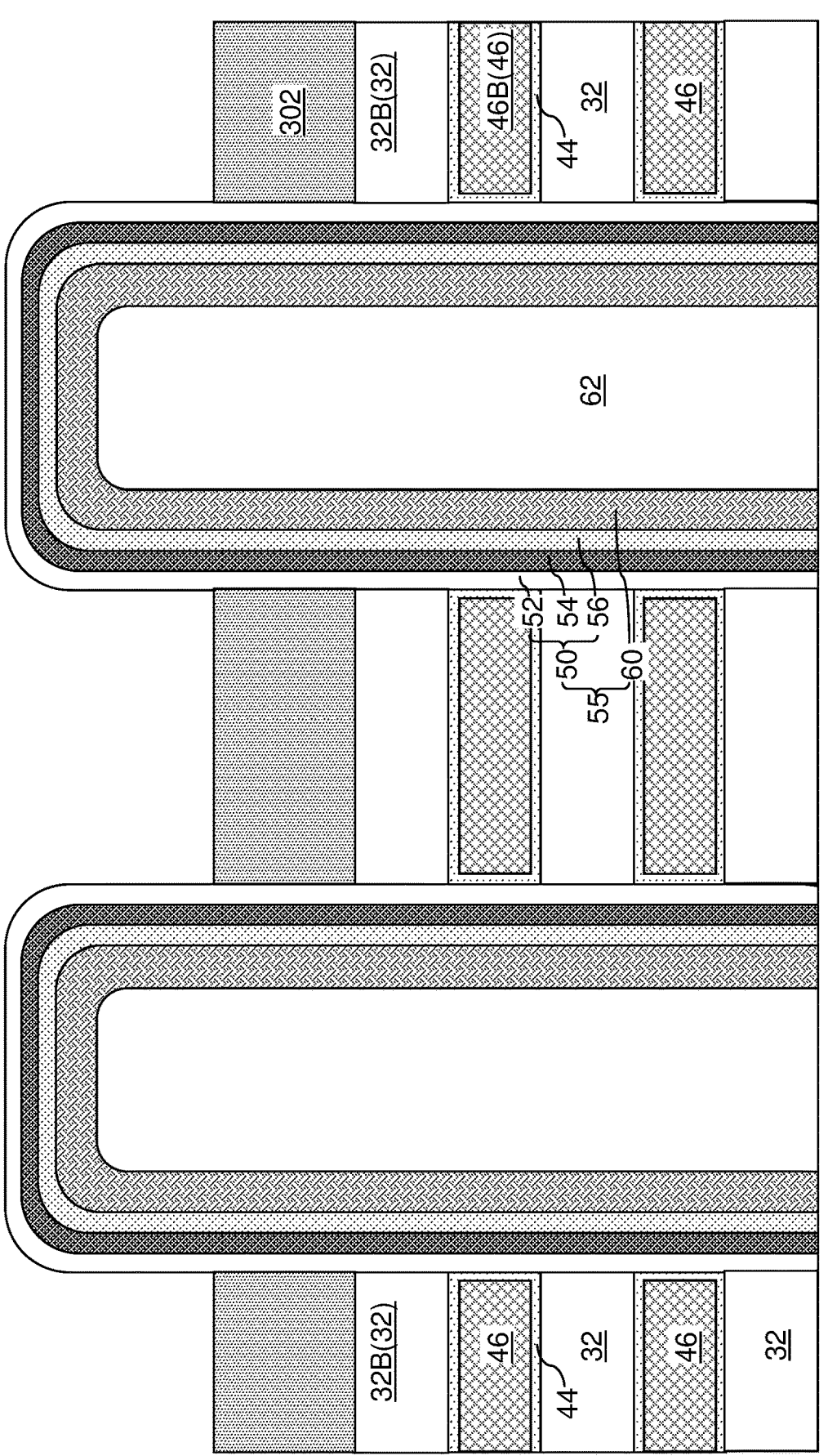
FIGS. 55A-55G are sequential vertical cross-sectional views of a region of the sixth exemplary structure during formation of a Schottky source structure according to the sixth embodiment of the present disclosure.

Referring to FIG. 55A, a region of the sixth exemplary structure is illustrated after removal of the carrier substrate 9. In the sixth embodiment, the removal of the carrier substrate 9 may be selective to the material of the etch-stop dielectric layer 302 and may be selective to the material of the outermost layer of each memory film 50 (such as the blocking dielectric layer 52).

Figure 55B:
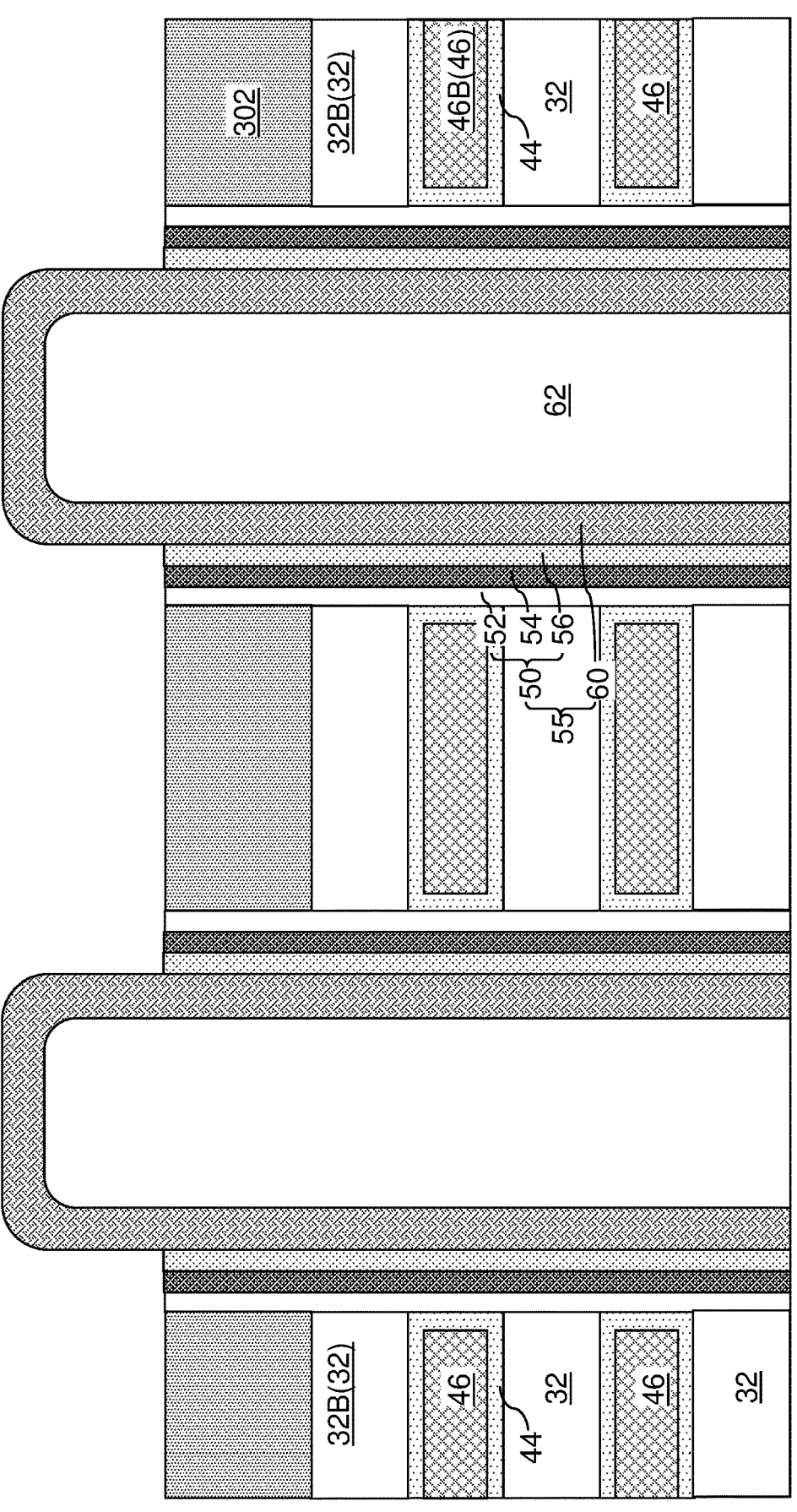

Referring to FIG. 55B, an end portion of each memory film 50 may be removed by performing a sequence of wet etch and/or chemical dry processes. End portions of the vertical semiconductor channels 60 can be exposed after removal of the end portions of the memory films 50.

Figure 55C:
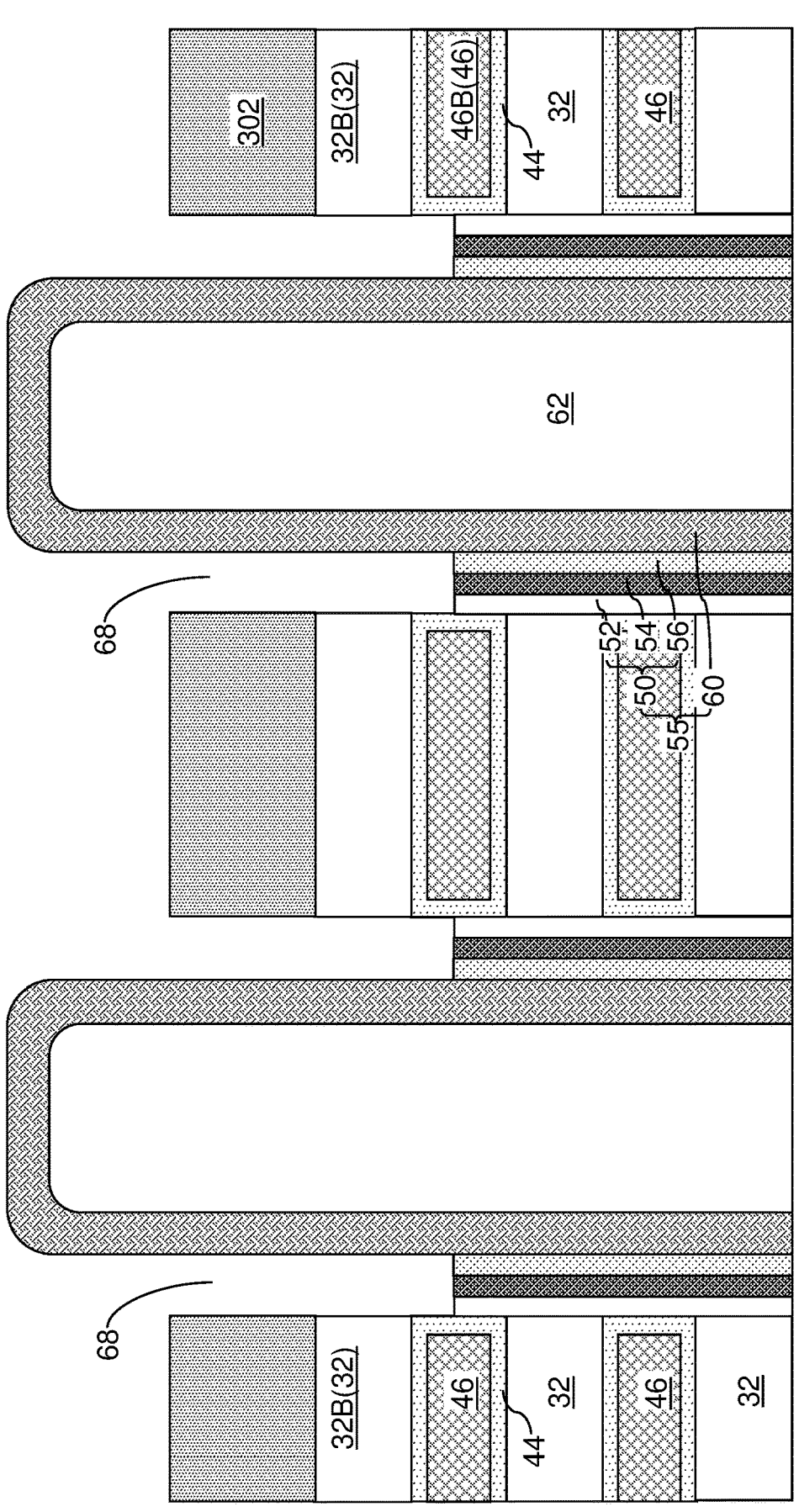

Referring to FIG. 55C, an anisotropic etch process can be performed to etch the materials of the memory films 50 selective to the materials of the vertical semiconductor channels 60 and selective to the material of the etch-stop dielectric layer 302. In one embodiment, the anisotropic etch process may comprise a reactive ion etch process employing a fluorine-based etchant gas (such as $CF_4$ or $CHF_3$) as an etchant gas. Cylindrical recess cavities 68 can be formed around the vertical semiconductor channels 60. Recessed end surfaces of the memory films 50 may be formed at or around the level the bottommost electrically conductive layer 46B. In one embodiment, each memory film 50 may be entirely removed from underneath the horizontal plane including the top surface of the etch-stop dielectric layer 302.

Figure 55D:
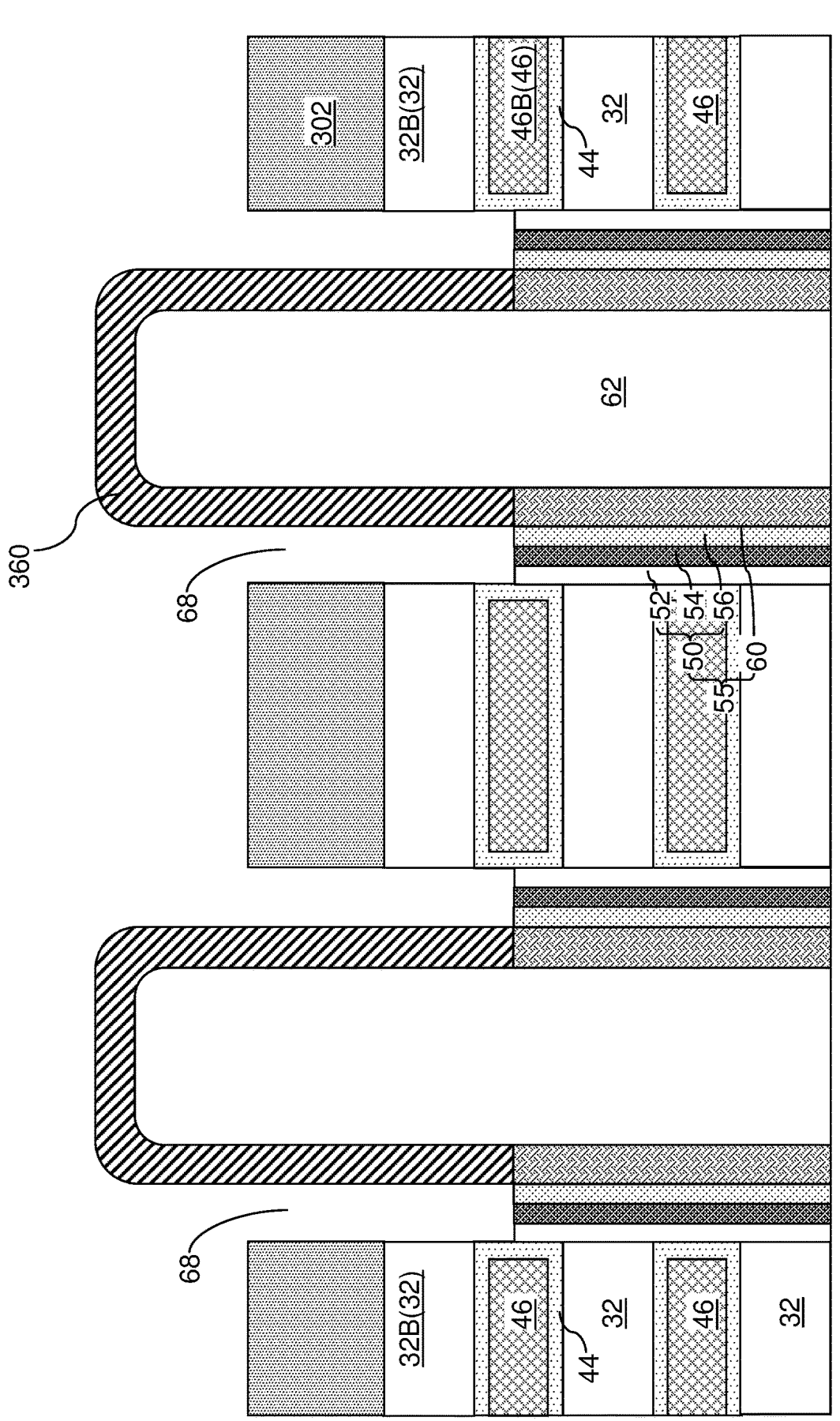

Referring to FIG. 55D, a semiconductor-to-metal conversion process can be performed to convert physically exposed portions of the vertical semiconductor channels 60 into metal capping layers 360. The metal capping layers 360 may comprise tungsten, titanium, molybdenum, tantalum or ruthenium. The semiconductor-to-metal conversion process may comprise a low-pressure reactant soaking process in which a metal-containing precursor gas that can nucleate on a semiconductor material is provided at a low pressure ambient at an elevated temperature above room temperature.

The elevated temperature is selected to be sufficiently high to provide semiconductor-mediated decomposition of the metal-containing precursor gas. For example, the metal-containing precursor gas may comprise tungsten hexafluoride, molybdenum hexafluoride, titanium tetrachloride, tantalum pentachloride, ruthenium trichloride, etc. The semiconductor material may comprise silicon, such as amorphous silicon or polysilicon. The elevated temperature may be in a range from 250 degrees Celsius to 400 degrees Celsius, although lower and higher temperatures may also be employed. In one embodiment, the silicon material may be pre-soaked in disilane gas prior to exposure to tungsten hexafluoride gas to convert silicon to tungsten.

Thus, the physically exposed portions of the vertical semiconductor channels 60, such as silicon channels, may be replaced with metal layers, such as tungsten, which are herein referred to as metal capping layers 360. In one embodiment, each metal capping layer 360 comprises a tubular portion that laterally surrounds a dielectric core 62 within a respective memory opening fill structure 58, and bottom portion that contacts a bottom surface of the dielectric core 62. In one embodiment, the metal capping layer 360 optionally comprises residual silicon atoms at a variable atomic concentration that decreases with a distance from an interface with the dielectric core 62.

Figure 55E:
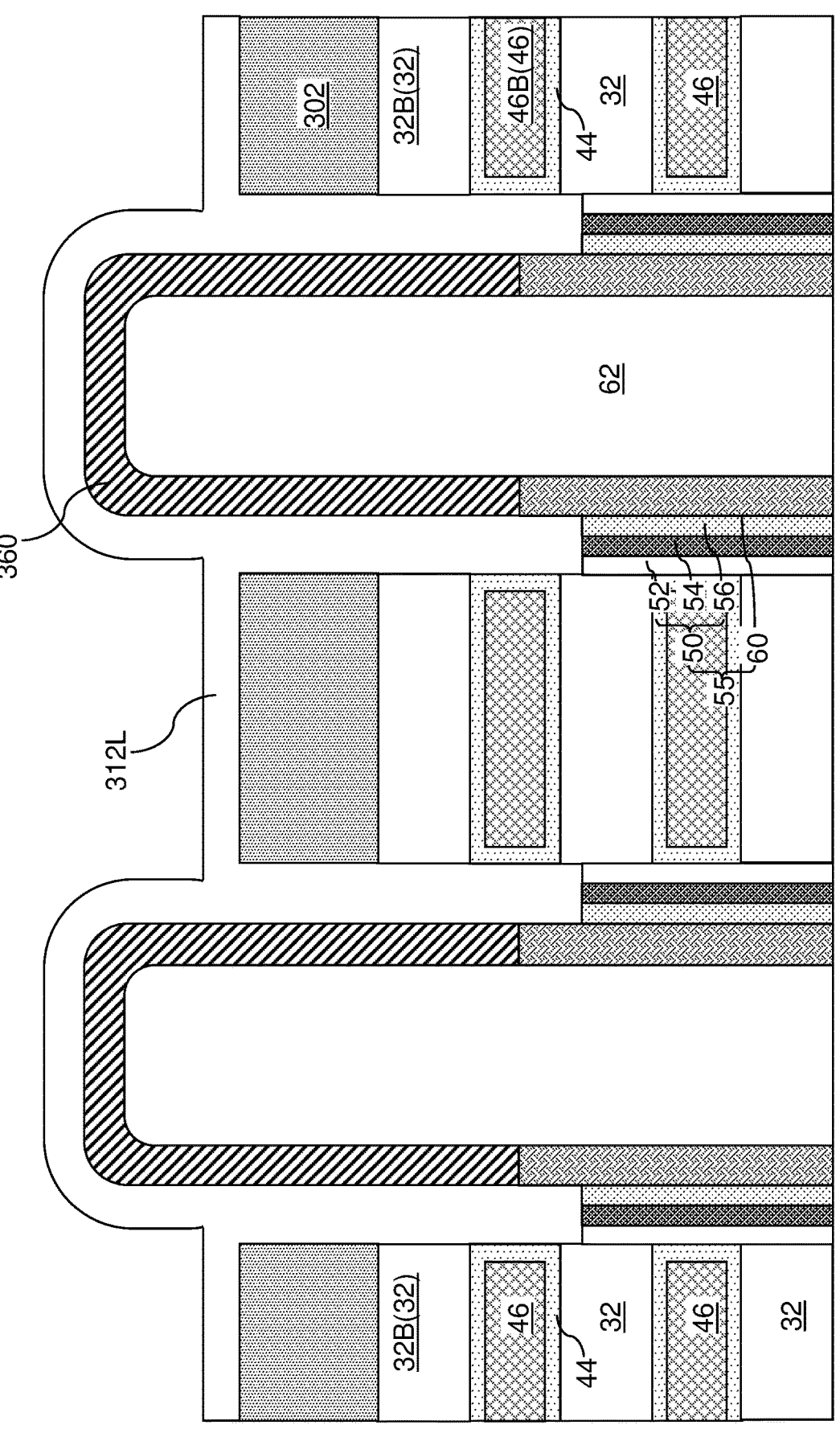

Referring to FIG. 55E, the memory film 50 may be recessed further using a selective anisotropic etch process which selectively etches the memory film 50 relative to the metal capping layer 360 and the etch-stop dielectric layer 302. The memory film 50 may be recessed above the bottommost electrically conductive layer 46B to extend the height of the recess cavities 68.

An insulating material layer 312L can be conformally deposited in the recess cavities 68 and over the metal capping layers 360 and the etch-stop dielectric layer 302. The insulating material layer 312L includes an insulating material, such as undoped silicate glass or a doped silicate glass. The thickness of the insulating material layer 312L can be greater than one half of the lateral distance between an inner sidewall and an outer sidewall of each cylindrical recess cavity 68 to completely fill the recess cavities 68.

Figure 55F:
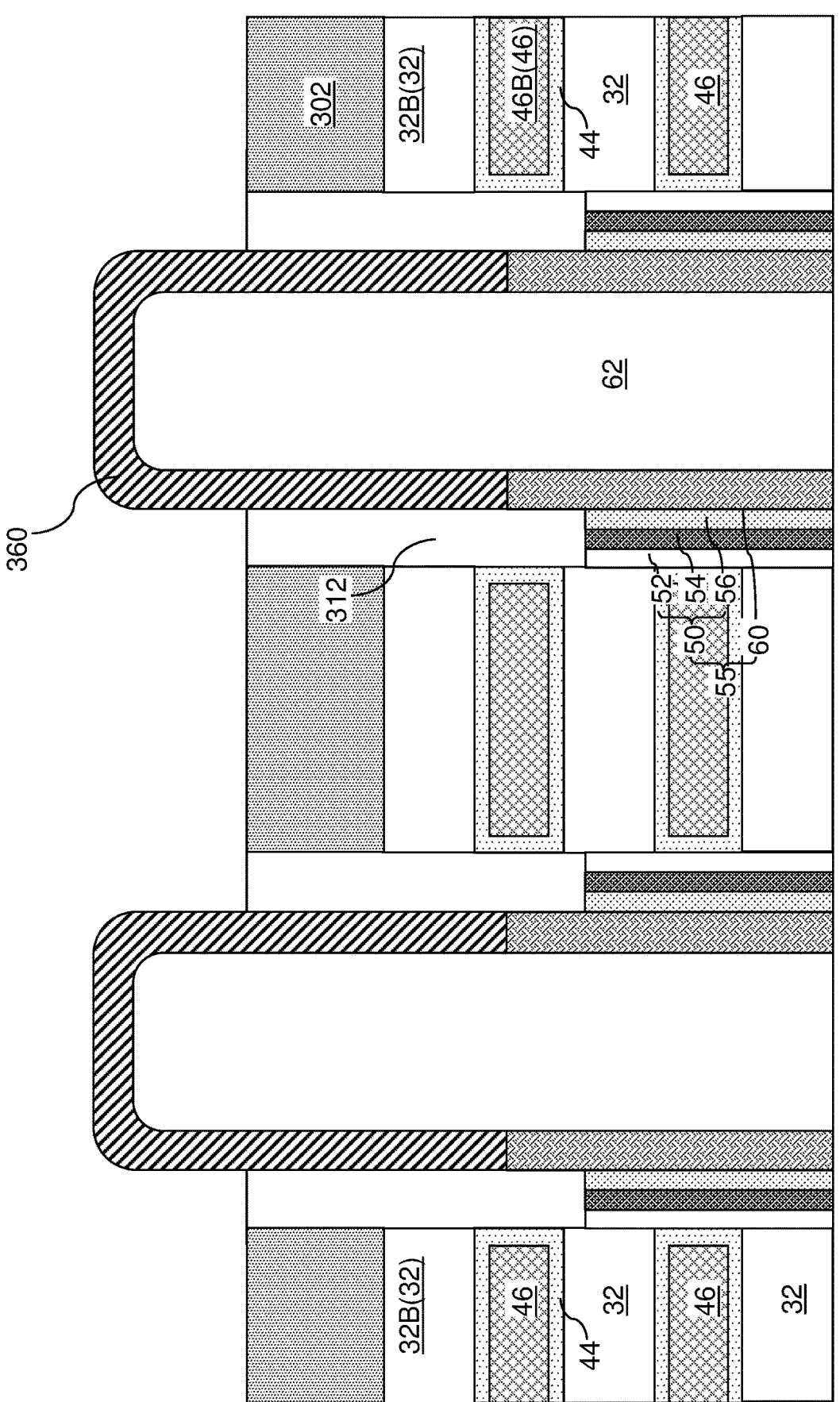
Figure 55G:
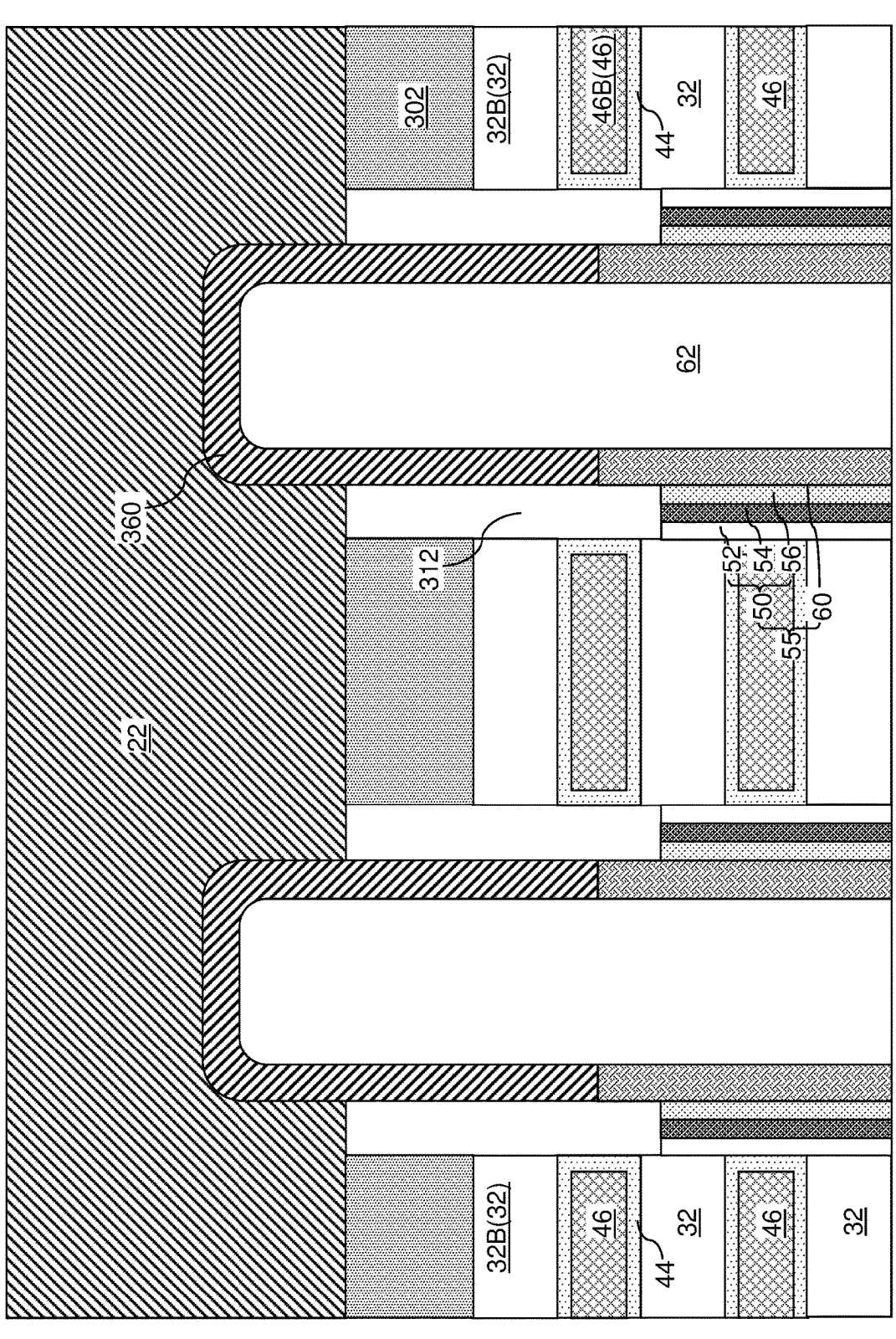

Referring to FIG. 55F, a reactive ion etch process can be performed to remove portions of the insulating material layer 312L that are located outside the cylindrical recess cavities 68. Remaining portions of the insulating material layer 312L that fill the cylindrical recess cavities constitute insulating spacers 312. In one embodiment, the insulating spacers 312 may have cylindrical configurations.

In one embodiment, each memory opening fill structure 58 comprises a vertical semiconductor channel 60, a dielectric core 62 that is laterally surrounded by the vertical semiconductor channel 60, and a memory film 50 that laterally surrounds the vertical semiconductor channel 60. A metal capping layer 360 contacts an end portion of the vertical semiconductor channel 60 and a bottom portion of the dielectric core 62. In one embodiment, an insulating spacer 312 may be located between each metal capping layer 360 and a combination of the etch-stop dielectric layer 302 and a bottommost electrically conductive layer 46B within an alternating stack (32, 46). In one embodiment, insulating spacer 312 has a tubular configuration, and laterally surrounds the upper portion of the metal capping layer 360.

Referring to FIG. 55F, the source layer 22 can be formed directly on the metal capping layers 360, on the annular bottom surfaces of the insulating spacers 312, and on the bottom surface of the etch-stop material layer 302.

In one embodiment, the metallic barrier liner 22B may be omitted from the source layer 22. The source layer 22 may consist essentially of an elemental metal (such as W, Co, Cu, Ru, Mo, Ti, Ta, etc.). In one embodiment, the source layer 22 and the metal capping layers 360 may comprise the same elemental metal, such as tungsten.

In one embodiment, the source layer 22 contacts the metal capping layers 360 and the bottom surface of the etch-stop dielectric layer 302. In one embodiment, the entirety of the etch-stop dielectric layer 302 may be located above a horizontal plane including the topmost surface of the source layer 22. In one embodiment, the vertical semiconductor channels 60 and the memory films 50 may be located entirely above the horizontal plane. In one embodiment, each memory opening fill structure 58 comprises a dielectric core 62 that is laterally surrounded by the vertical semiconductor channel 60.

In one embodiment, an insulating spacer 312 may be in contact with the metal capping layer 360, a bottommost outer blocking dielectric layer 44, a bottommost insulating layer 32B within the alternating stack (32, 46), and the memory film 50. In one embodiment, a bottom surface of the metal capping layer 360 is located below a horizontal plane including a horizontal interface between the source layer 22 and the etch-stop dielectric layer 302. In one embodiment, a top surface of the metal capping layer 360 is located above the horizontal plane.

Figure 56:
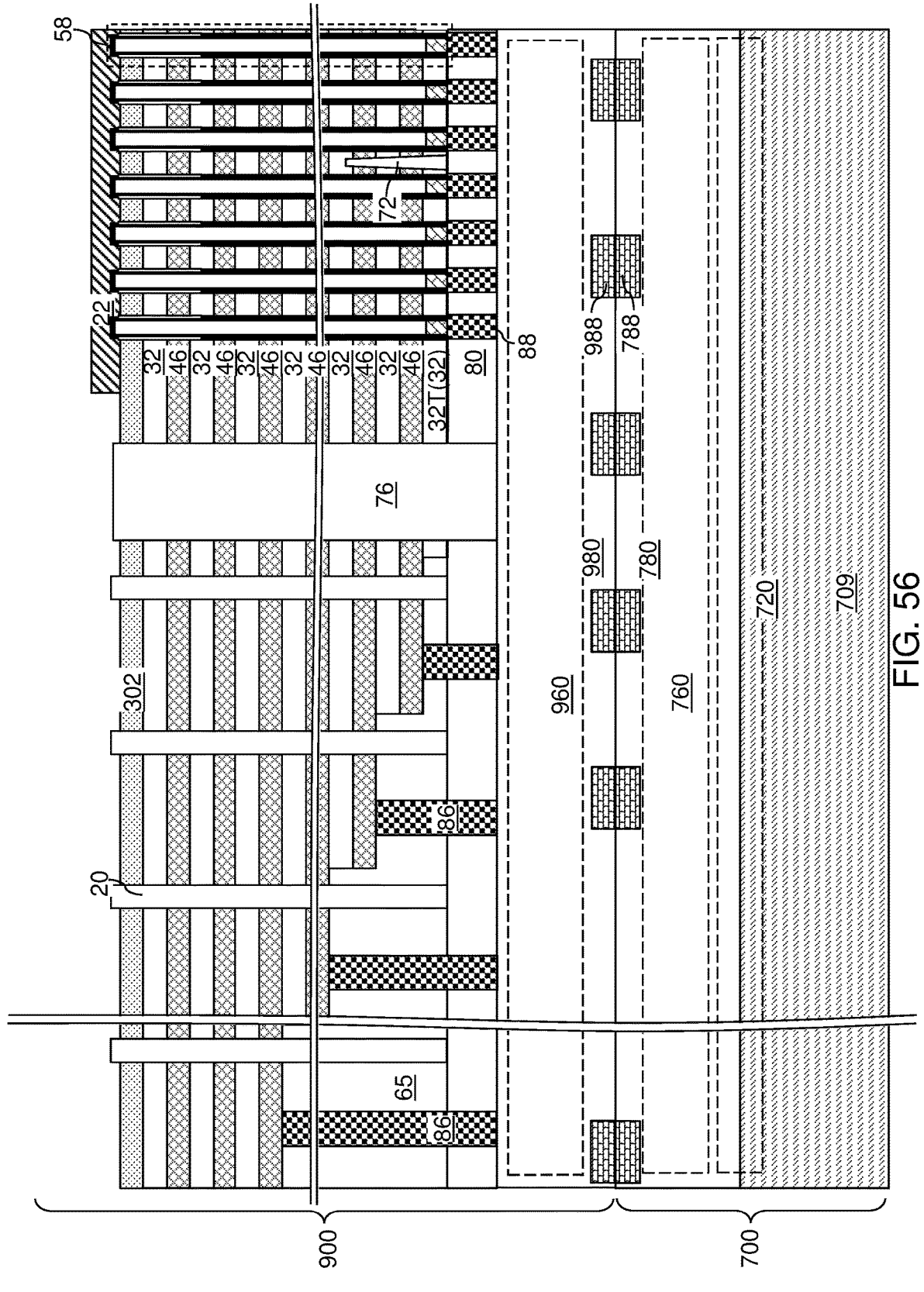
FIG. 56 is a vertical cross-sectional view of the sixth exemplary structure after formation of the Schottky source structure according to the sixth embodiment of the present disclosure.

Referring to FIG. 56, the source layer 22 can be patterned as described above. Each patterned source layer 22 comprises a Schottky source structure providing Schottky junctions to a respective set of vertical semiconductor channels 60.

Figure 57:
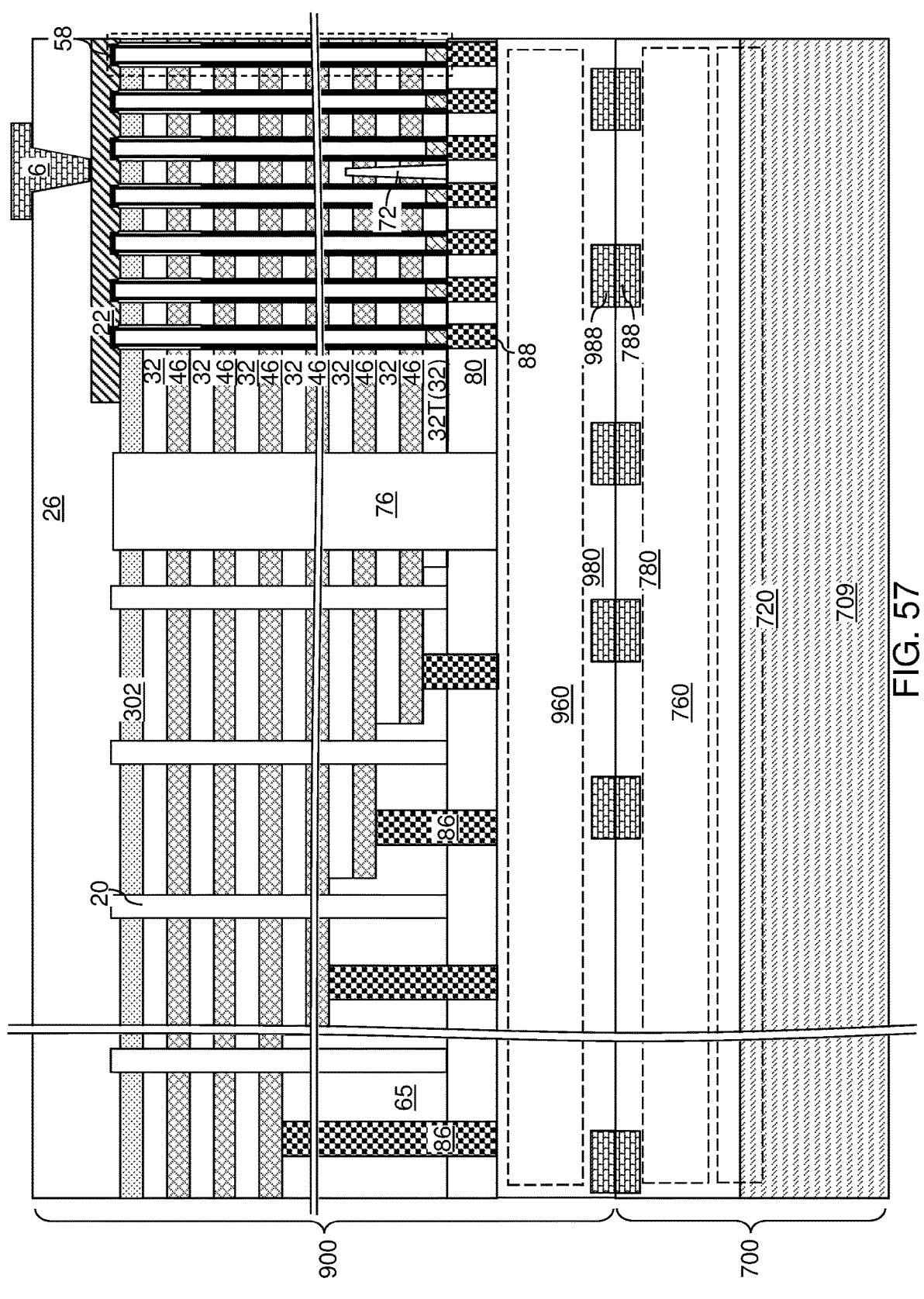
FIG. 57 is a vertical cross-sectional view of the sixth exemplary structure after formation of a backside dielectric layer and a source contact structure according to the sixth embodiment of the present disclosure.

Referring to FIG. 57, a backside dielectric layer 26 can be deposited over the source layer 22. At least one source contact structure 6 can be formed through the backside dielectric layer 26 on the source layer 22. In the seventh embodiment, the pedestal formation and dielectric core recessing steps of the previous embodiments may be omitted, thus simplifying the process. Furthermore, formation of the metal capping layer 360 allows a larger tolerance for the height of the insulating spacers 312 while still establishing a Schottky contact between the source layer 22 and vertical semiconductor channel 60 through the metal capping layer 360.

Figure 58A:
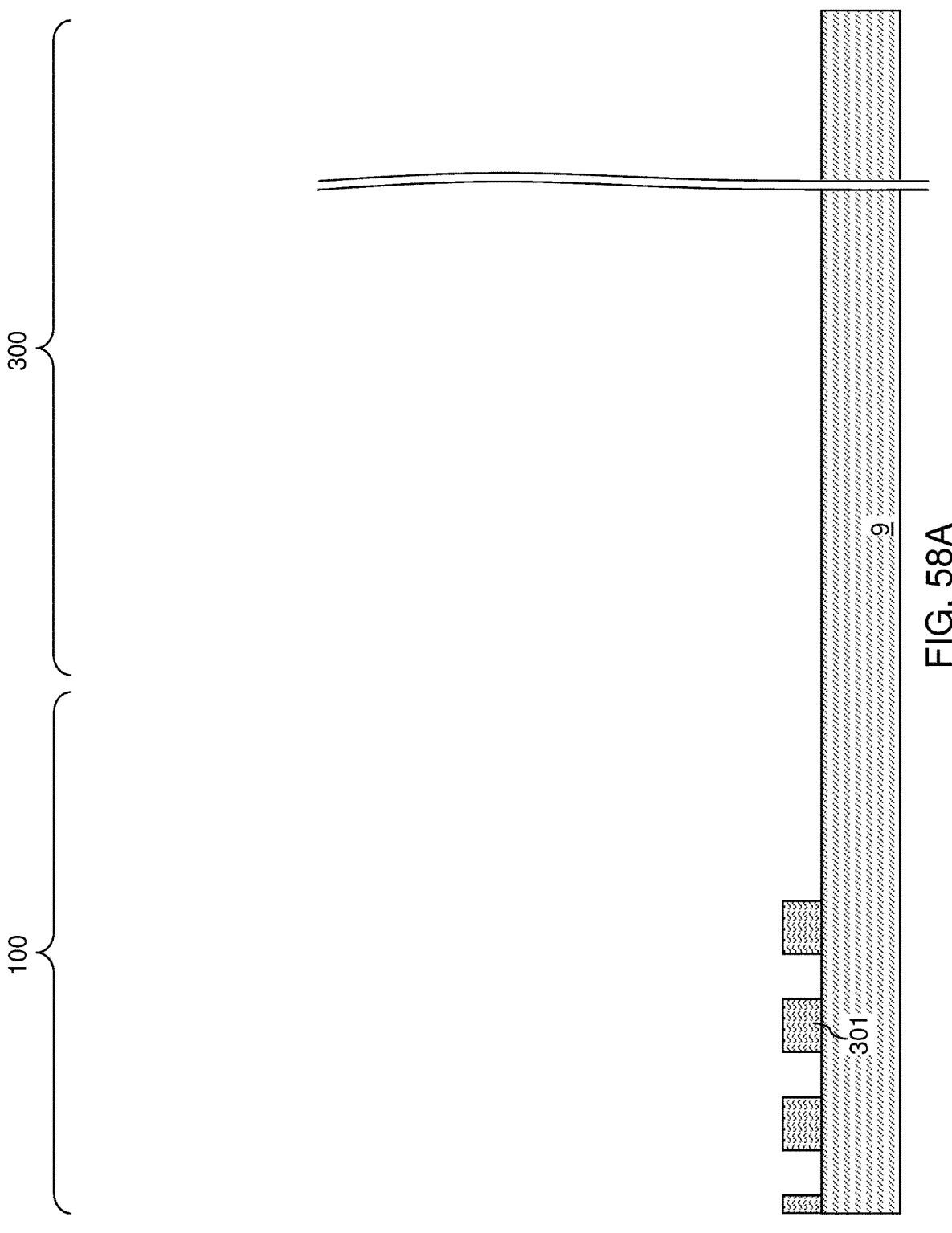
FIG. 58A is a vertical cross-sectional view of a seventh exemplary structure after formation of the sacrificial material strips over a carrier substrate according to the seventh embodiment of the present disclosure.
Figure 58B:
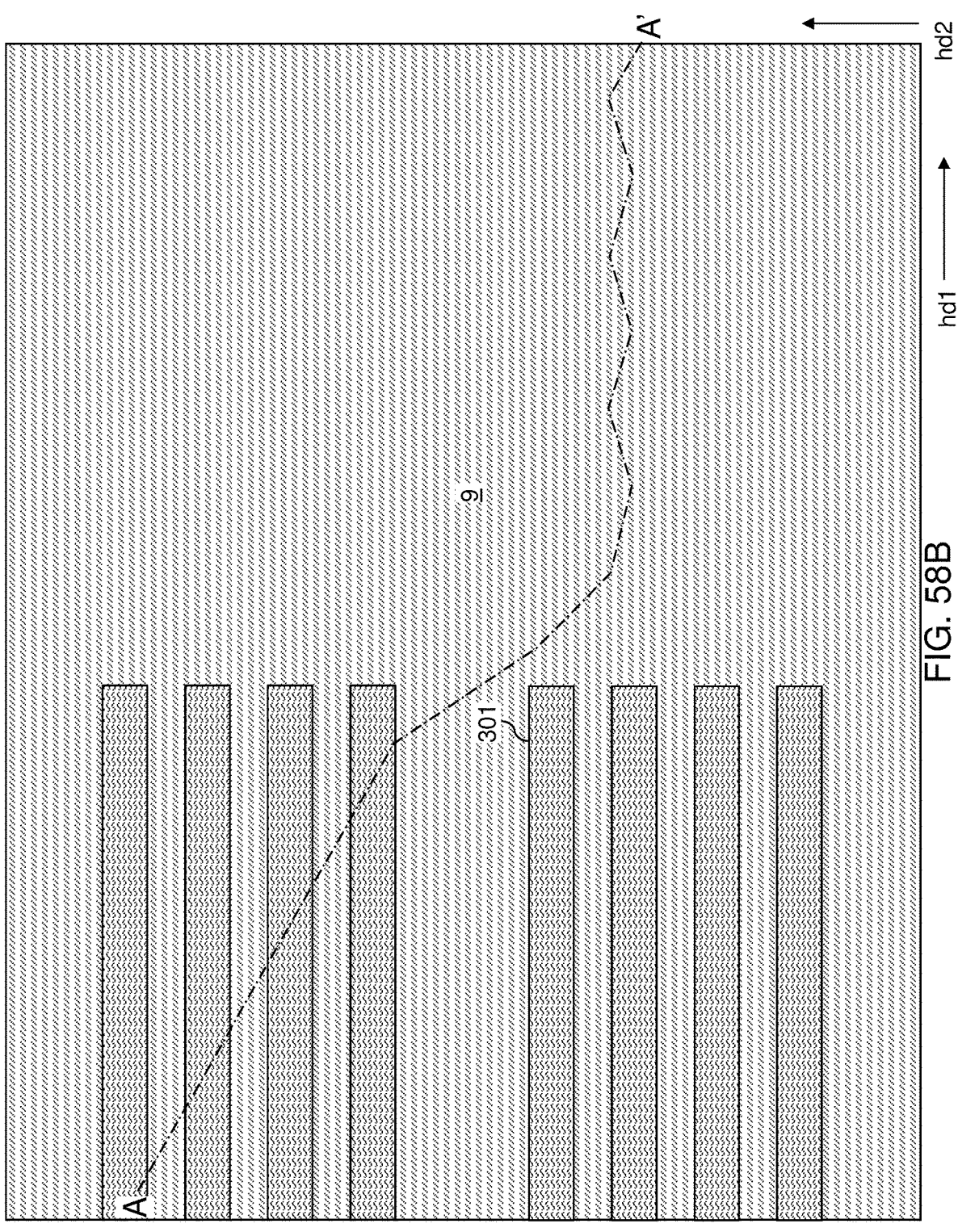
FIG. 58B is a top-down view of the seventh exemplary structure of FIG. 58A. The hinged vertical plane A-A' is the cut plane of the vertical cross-sectional view of FIG. 58A.

Referring to FIGS. 58A and 58B, a seventh exemplary structure according to a seventh embodiment of the present disclosure is illustrated. In this embodiment, sacrificial material strips 301 can be formed over a carrier substrate 9. The sacrificial material strips 301 comprise a sacrificial material that can be subsequently removed selective to an etch-stop dielectric layer to be subsequently formed. For example, the sacrificial material strips 301 may comprise a semiconductor material, such as silicon (e.g., amorphous silicon or polysilicon) or silicon-germanium. The sacrificial material strips 301 can be formed in the memory array region 100, and may laterally extend along the first horizontal direction hd1 with a uniform width and a uniform pitch along the second horizontal direction hd2. The height of the sacrificial material strips 301 may be in a range from 50 nm to 300 nm, although lesser and greater heights may also be employed.

Generally, a group of sacrificial material strips 301 can be formed within each area of a memory block in which an array of memory openings is to be subsequently formed. The pitch of the sacrificial material strips 301 within each group of sacrificial material strips 301 may be the same as twice the pitch of rows of memory openings to be subsequently formed. The width of each sacrificial material strip 301 may be selected such that each sacrificial material strip 301 may have an areal overlap with a respective pair of rows of memory openings to be subsequently formed. In one embodiment, the width of each sacrificial material strip 301 may be in a range from 60 nm to 400 nm, such as from 120 nm to 300 nm, although lesser and greater widths may be employed.

Figure 59:
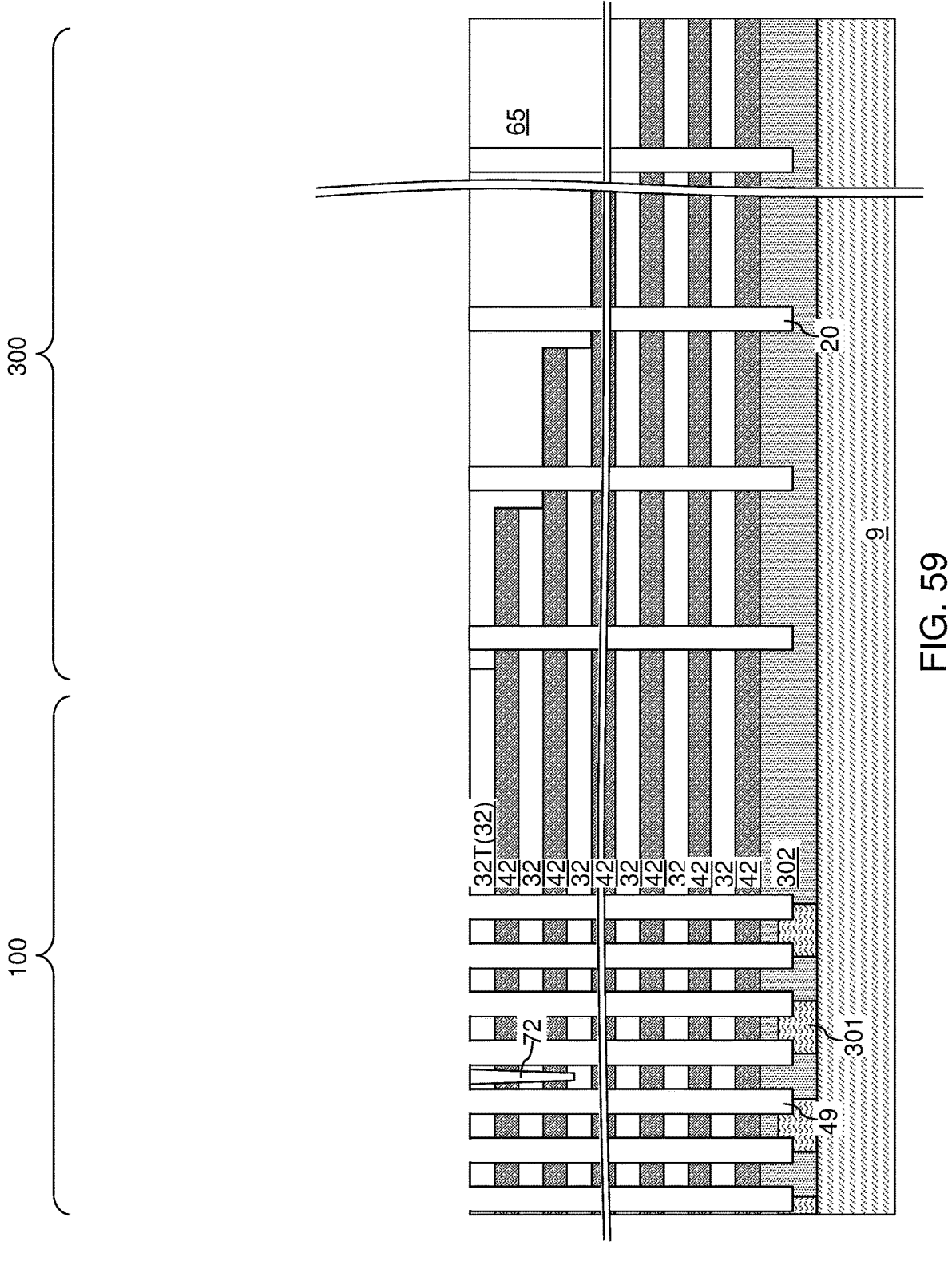
FIG. 59 is a schematic vertical cross-sectional view of the seventh exemplary structure after formation of an alternating stack of insulating layers and sacrificial material layers and the support pillars and the formation of voids in the memory openings according to the seventh embodiment of the present disclosure.

Referring to FIG. 59, an etch-stop dielectric layer 302 can be formed over the sacrificial material strips 301. The etch-stop dielectric layer 302 comprises a material that can be employed as an etch stop structure during a subsequent processing step employed to remove the carrier substrate 9. For example, the etch-stop dielectric layer 302 may comprise silicon carbide nitride. The etch-stop dielectric layer 302 may be planarized by chemical mechanical polishing to provide a horizontal top surface. The thickness (i.e., height) of the etch-stop dielectric layer 302 is greater than the height of the sacrificial material strips 301. The etch stop dielectric layer 302 fills the spaces between the sacrificial material strips 301 and covers the top surfaces of the sacrificial material strips 301. The thickness of the etch-stop dielectric layer 302, as measured in the contact region 300 may be in a range from 100 nm to 500 nm, such as from 200 nm to 400 nm, although lesser and greater thicknesses may also be employed.

Still referring to FIG. 59, the processing steps described with reference to FIGS. 1-6 can be performed to form memory openings 49 and support openings 19, to form sacrificial opening fill structures (48, 18), to replace the sacrificial support opening fill structures 18 with support pillar structures 20, and to remove the sacrificial memory opening fill structures 48 from inside the memory openings 49. The memory opening 49 vertically extend partially through the etch-stop dielectric layer 302 and the sacrificial material strips 301.

Figure 60A:
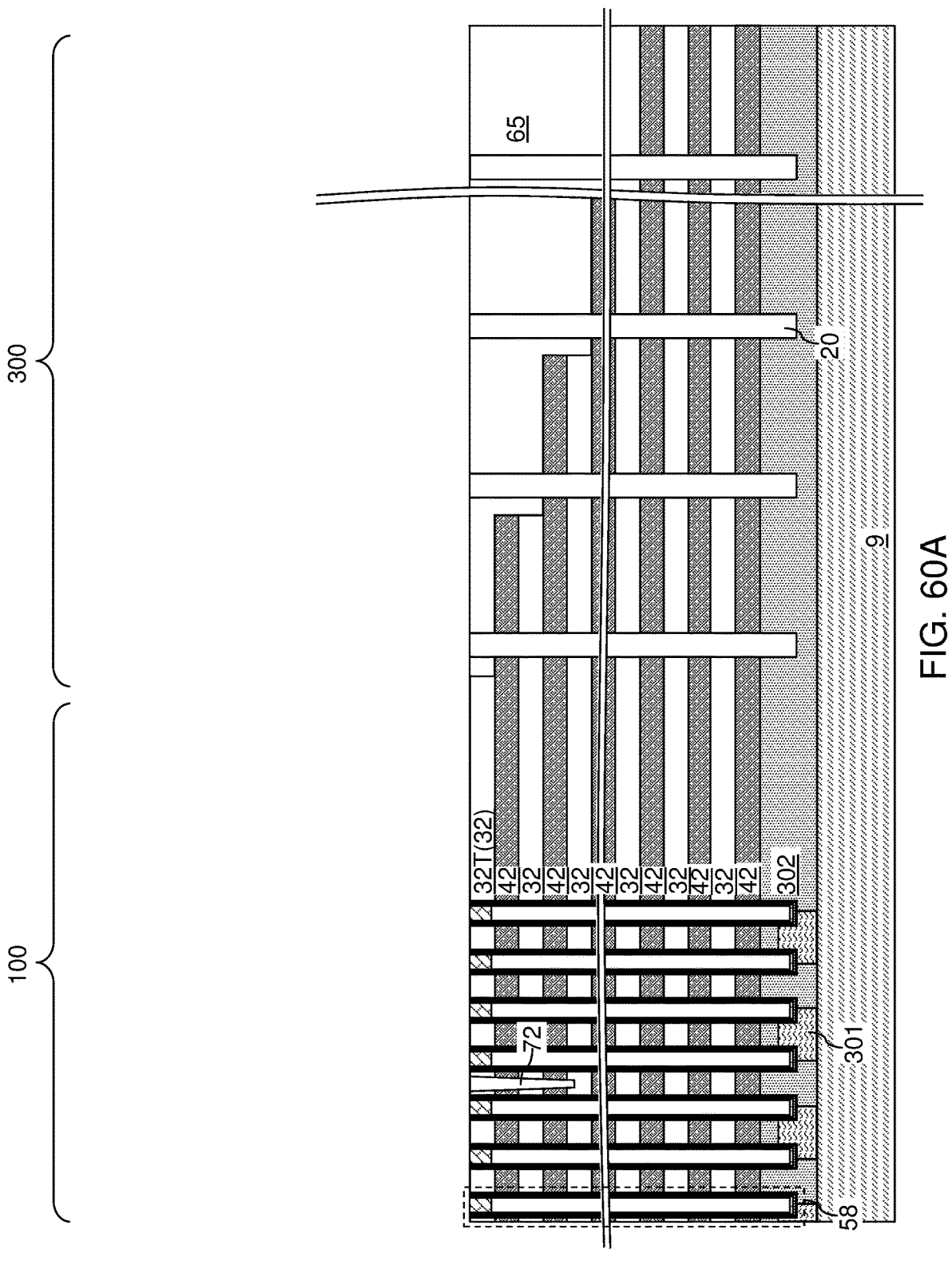
FIG. 60A is a vertical cross-sectional view of the seventh exemplary structure after formation of the memory opening fill structures according to the seventh embodiment of the present disclosure.
Figure 60B:
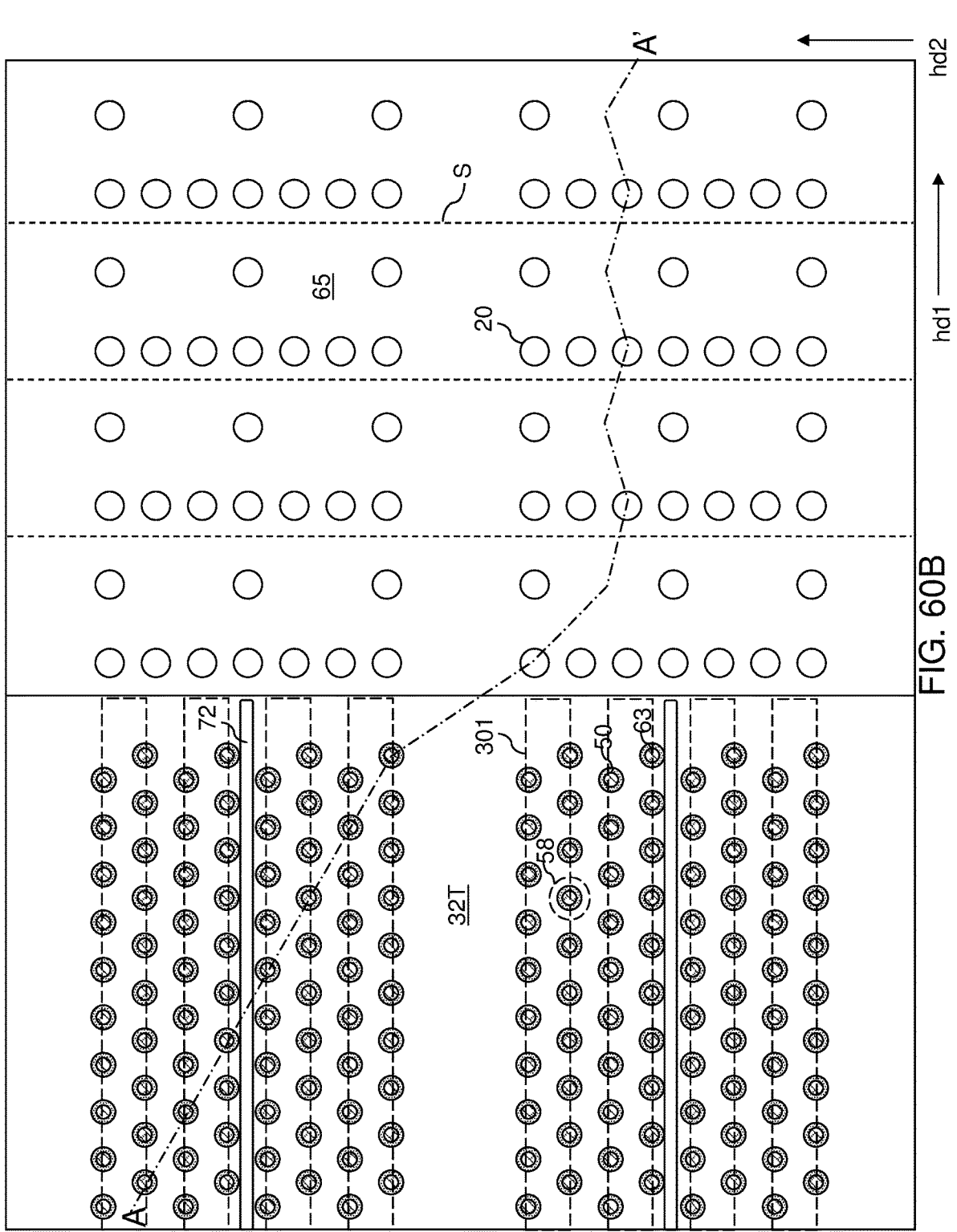
FIG. 60B is a top-down view of the seventh exemplary structure of FIG. 60A. The hinged vertical plane A-A' is the cut plane of the vertical cross-sectional view of FIG. 60A.
Figure 60C:
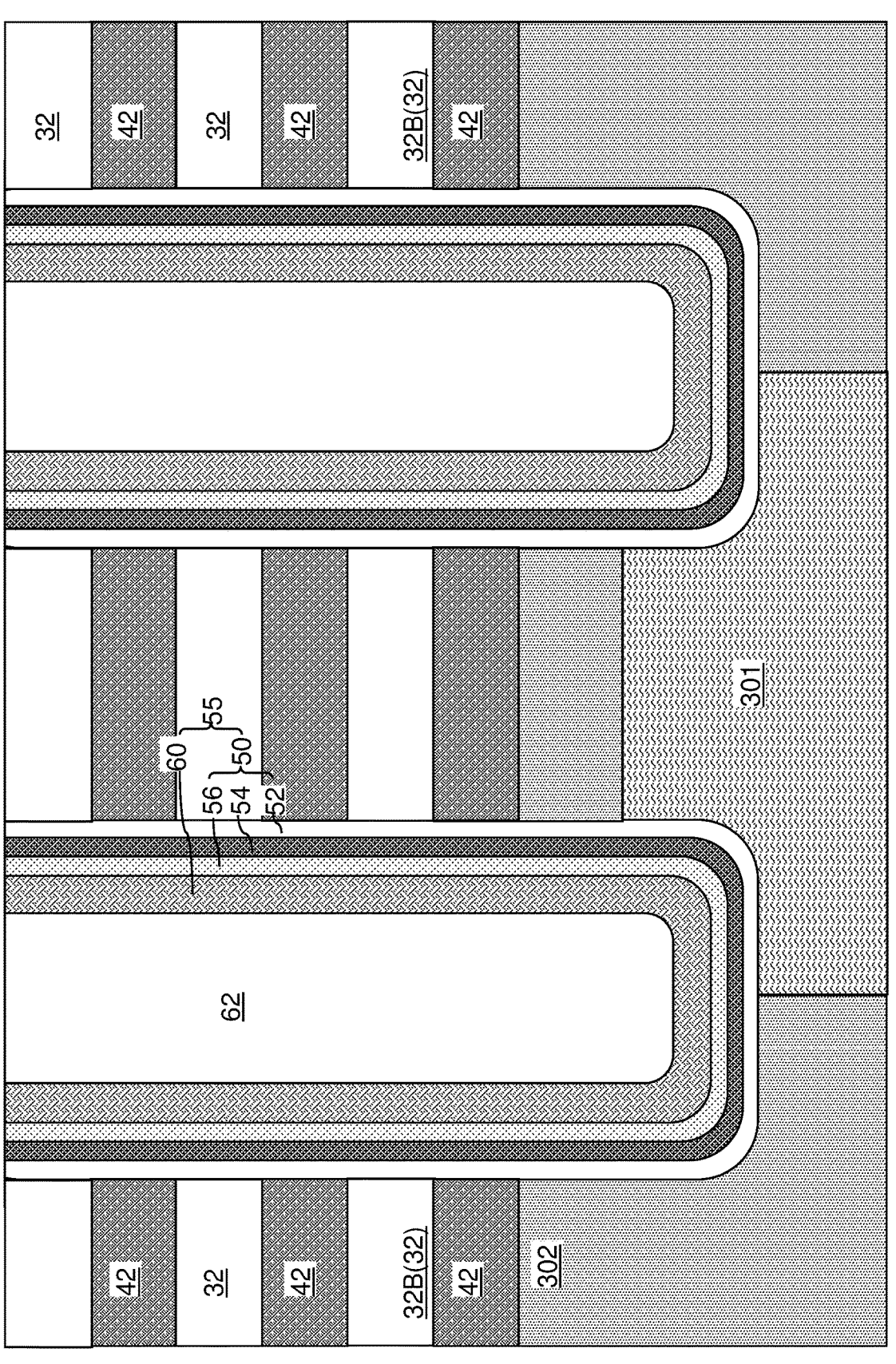
FIG. 60C is a magnified view of a region of the seventh exemplary structure of FIGS. 60A and 60B.

Referring to FIGS. 60A-60C, the processing steps described with reference to FIGS. 7A-7F, 8A, and 8B can be performed to form memory opening fill structures 58 in the memory openings 49. Each of the memory opening fill structures 58 may comprise a memory film 50 in contact with a respective sacrificial material strip 301. In one embodiment, each sacrificial material strip 301 may be in contact with bottom portions of a pair of rows of memory opening fill structures 58. As shown in FIG. 60C, each sacrificial material strip may contact portions of the bottom surfaces of two rows of memory opening fill structures 58. Conversely, each bottom surface of each memory opening structure 58 contacts both a respective one of the sacrificial material strips 301 and the etch-stop dielectric layer 302.

Figure 61:
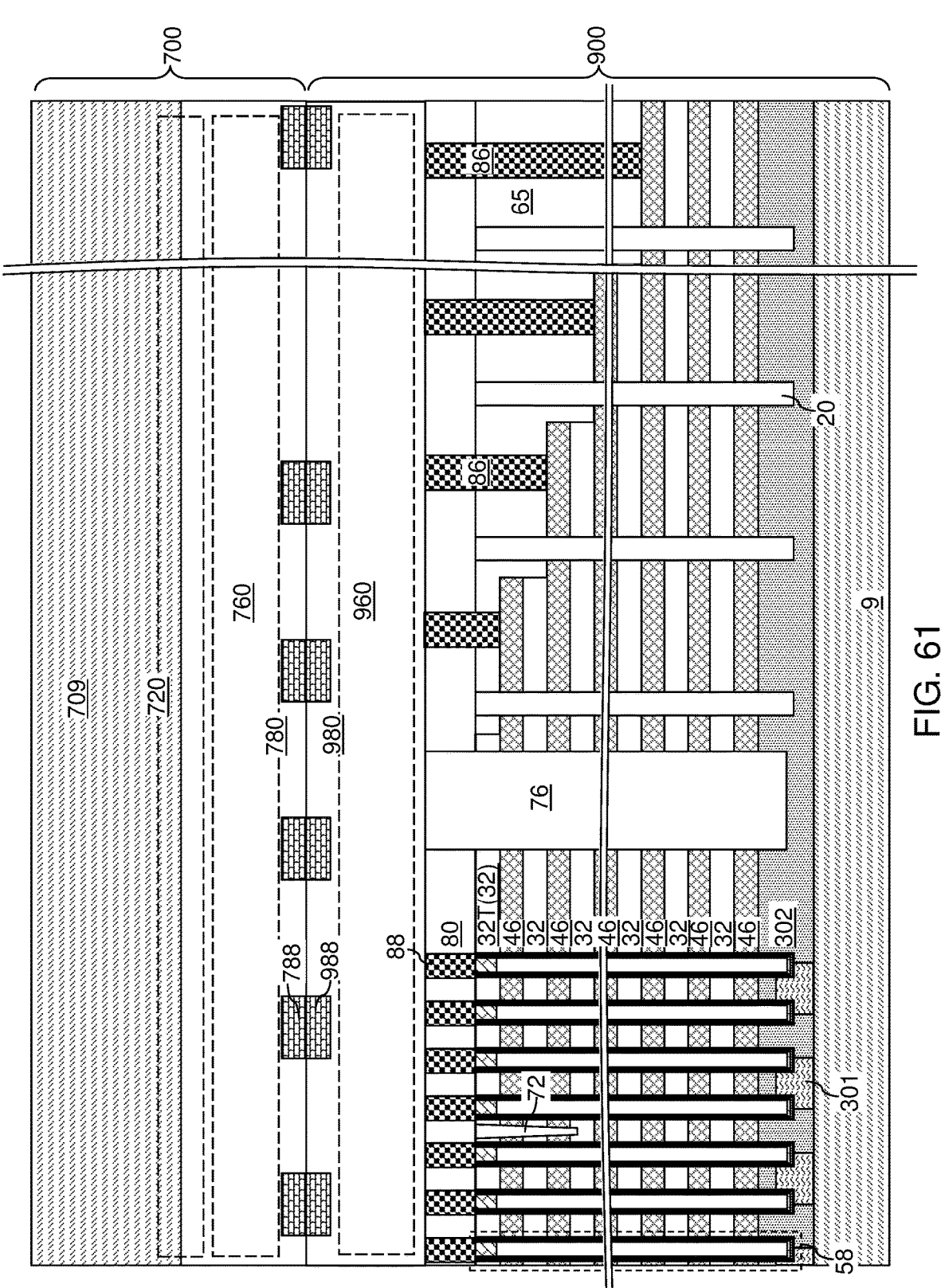
FIG. 61 is a vertical cross-sectional view of the seventh exemplary structure after attaching the logic die to the memory die according to the seventh embodiment of the present disclosure.

Referring to FIG. 61, the processing steps described with reference to FIGS. 9A and 9B can be performed to form a contact-level dielectric layer 80, and to form lateral isolation trenches 79. The processing steps described with reference to FIGS. 10-13 can be performed to replace the sacrificial material layers 42 with electrically conductive layers 46. Various contact via structures (88, 86) can be formed, and memory-side dielectric material layers 960 embedding memory-side metal interconnect structures 980 and memory-side bonding pads 988 can be formed. A memory die 900 can be provided. Subsequently, the processing steps described with reference to FIGS. 14 and 15 can be performed to provide a logic die 700, and to bond the logic die 700 to the memory die 900.

Figure 62A:
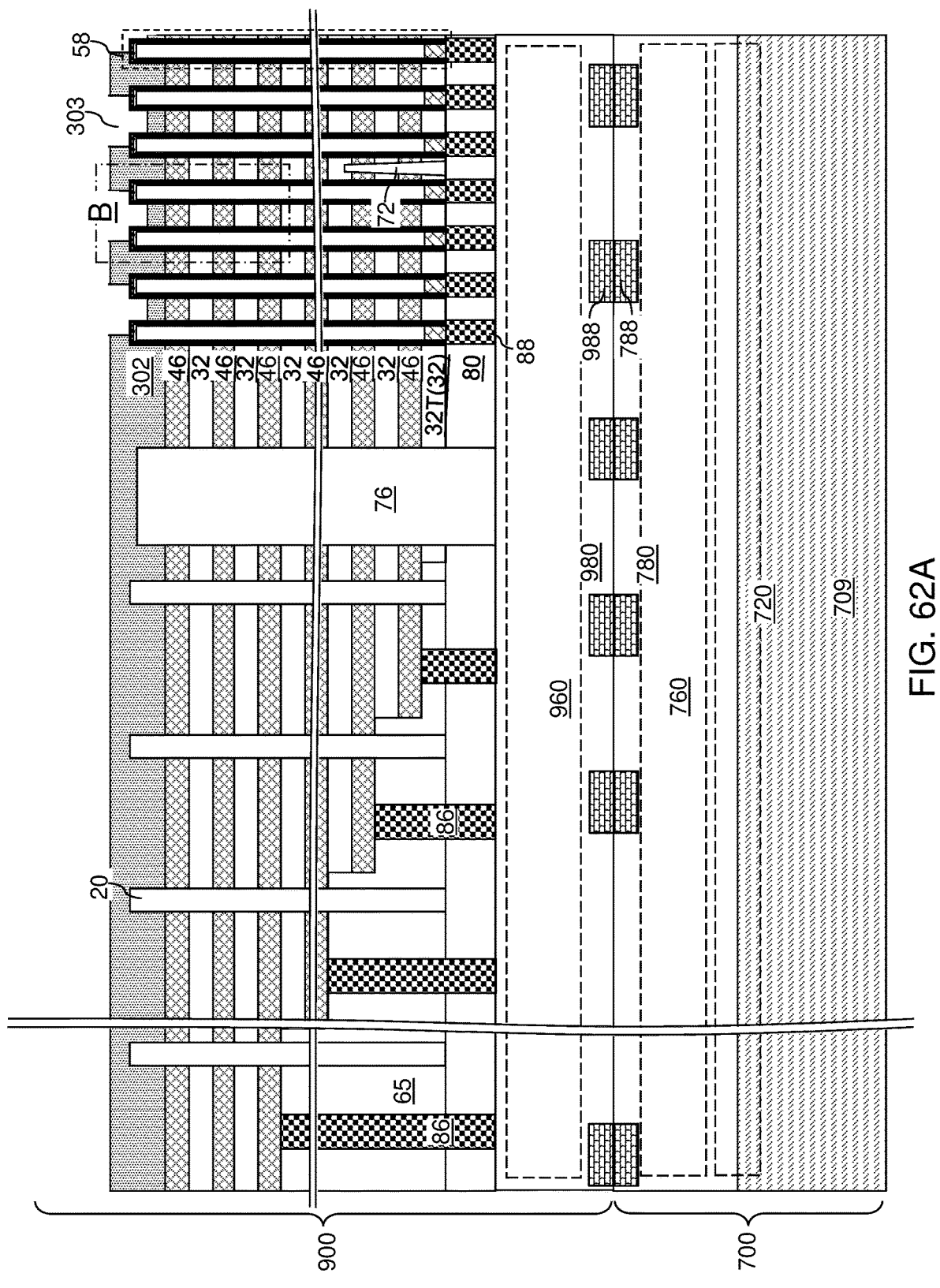
FIG. 62A is a vertical cross-sectional view of the seventh exemplary structure after removing the carrier substrate and the sacrificial material strips according to the seventh embodiment of the present disclosure.
Figure 62B:
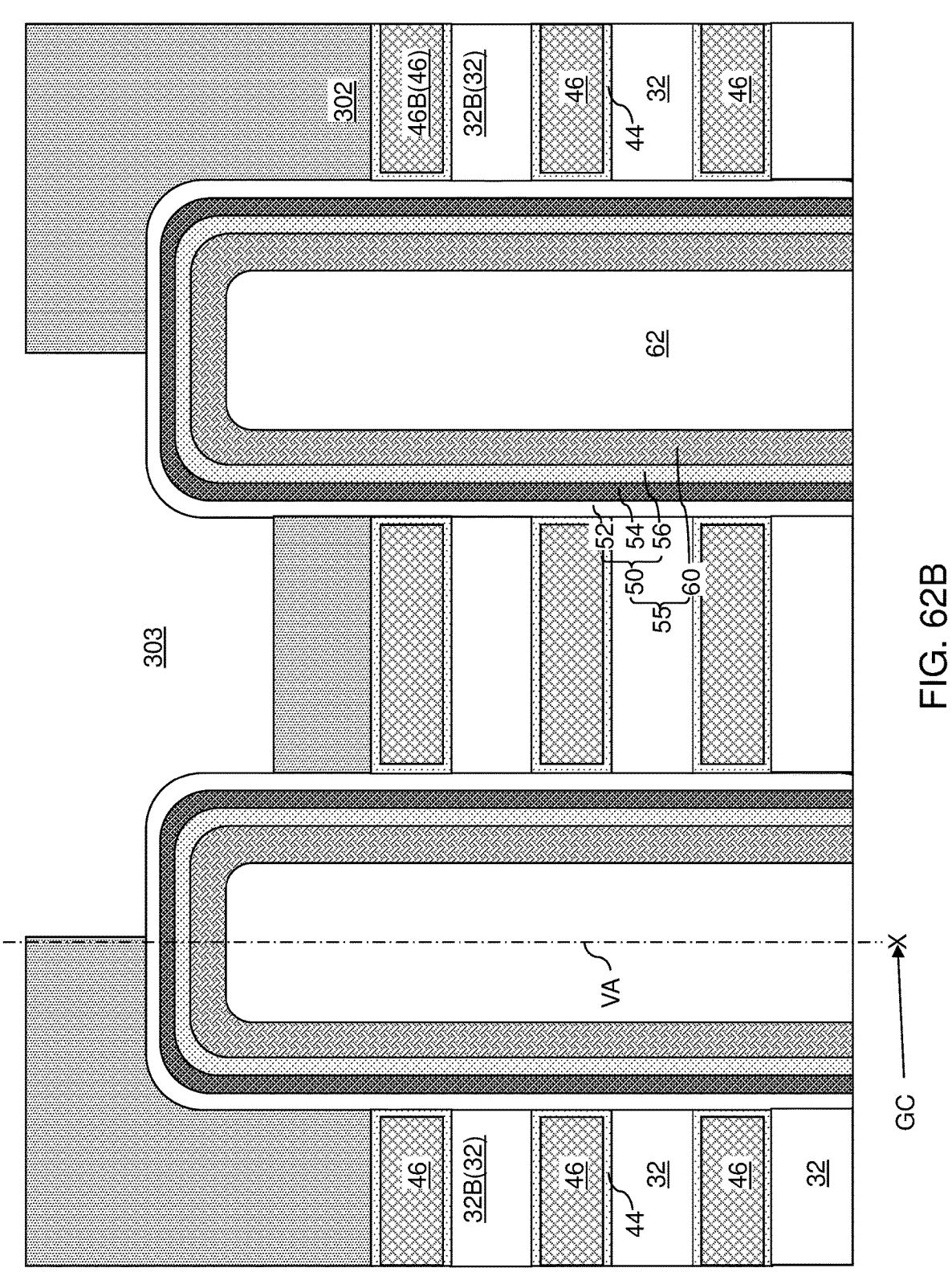
FIG. 62B is a magnified view of region B of FIG. 62A.

Referring to FIGS. 62A and 62B, the processing steps described with reference to FIGS. 16A and 16B can be performed to remove the carrier substrate 9 and the sacrificial material strips 301 selective to the etch-stop dielectric layer 302 and the memory films 50 in the memory opening fill structures 58. In one embodiment, the carrier substrate 9 and the sacrificial material strips 301 may be removed selective to the etch-stop dielectric layer 302 and the memory film 50 by performing a selective silicon etch process. Strip-shaped cavities 303 are formed in the volumes from which the sacrificial material strips 301 are removed.

Parts of the bottom surfaces and bottom ends of the sidewalls of the memory opening fill structures 58 are exposed in the strip-shaped cavities 303. In one embodiment, each memory opening fill structure 58 may have an axial symmetry around a vertical axis VA that passes through the center of gravity GC of the memory opening fill structure 58. In one embodiment, physically-exposed sidewalls of each memory opening fill structures 58 may have an azimuthal extent around the vertical axis VA passing through the geometrical center GC of the memory opening fill structure 58 that is not greater than $3\pi/2$, i.e., not greater than 270 degrees. Generally, the physically-exposed sidewalls of each memory opening fill structures 58 may have an azimuthal extent around the vertical axis VA passing through the geometrical center GC of the memory opening fill structure 58 that is about 180 degrees.

FIGS. 63A-63F are sequential vertical cross-sectional views of a region of the seventh exemplary structure during formation of a Schottky source structure according to the seventh embodiment of the present disclosure.

Figure 63A:
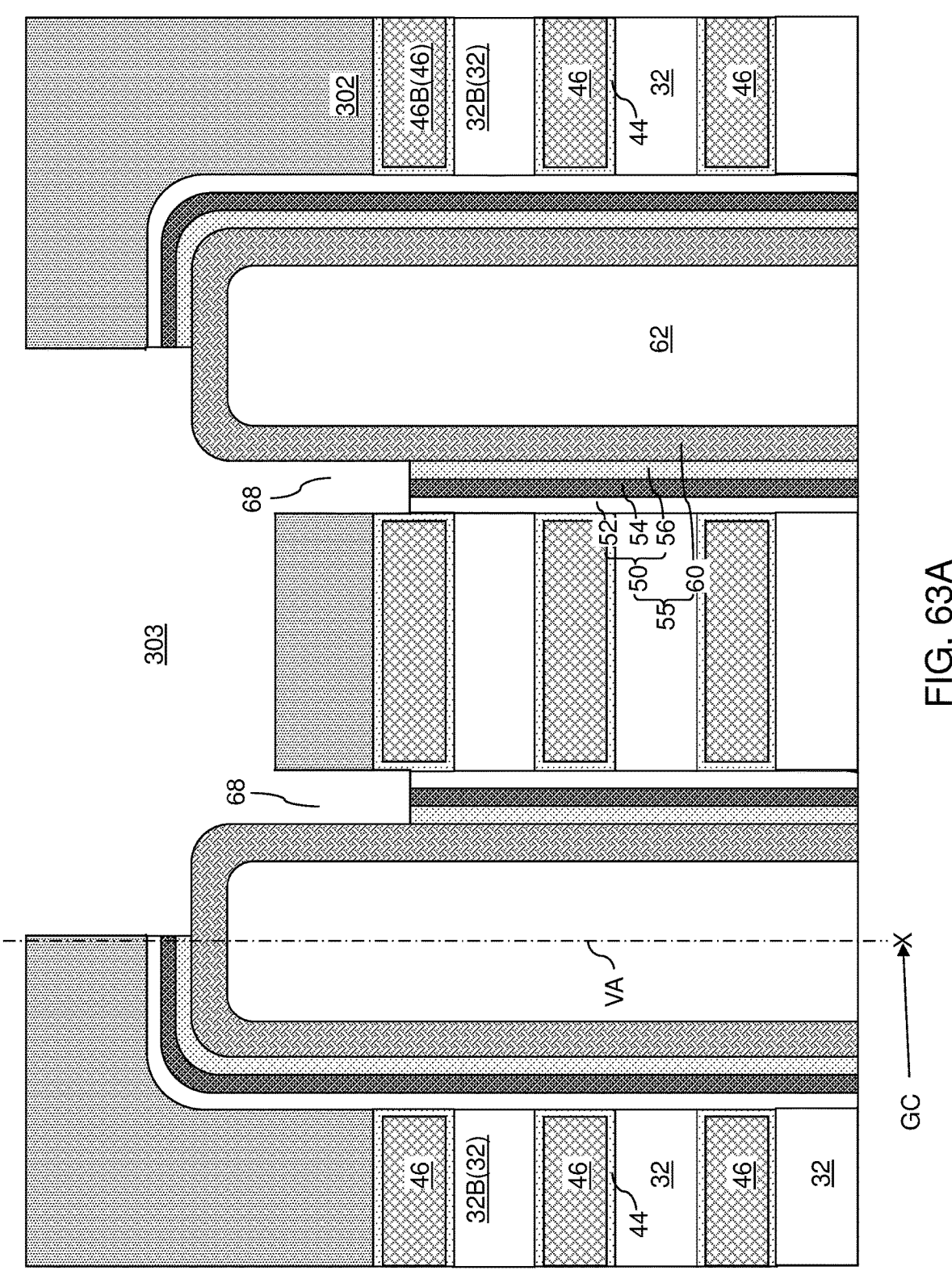
FIGS. 63A-63F are sequential vertical cross-sectional views of a region of the seventh exemplary structure during formation of a Schottky source structure according to the seventh embodiment of the present disclosure.

Referring to FIG. 63A, physically-exposed end portion of the memory film 50 may be removed around the strip-shaped cavities 303. For example, a sequence of selective etch processes can be performed to remove a physically exposed end portion of the memory film 50 selective to the vertical semiconductor channel 60 in each memory opening fill structure 58 to form the recess cavities 68. For example, the sequence of selective etch processes may comprise a first selective etch process that etches the material of the blocking dielectric layer 52 selective to the material of the memory material layer 54, a second selective etch process that etches the material of the memory material layer 54 selective to the material of the dielectric liner 56, and a third selective etch process that etches the material of the dielectric liner 56 selective to the material of the vertical semiconductor channel 60. Each of the selective etch processes may be selective to the material of the etch-stop dielectric layer 302.

Figure 63B:
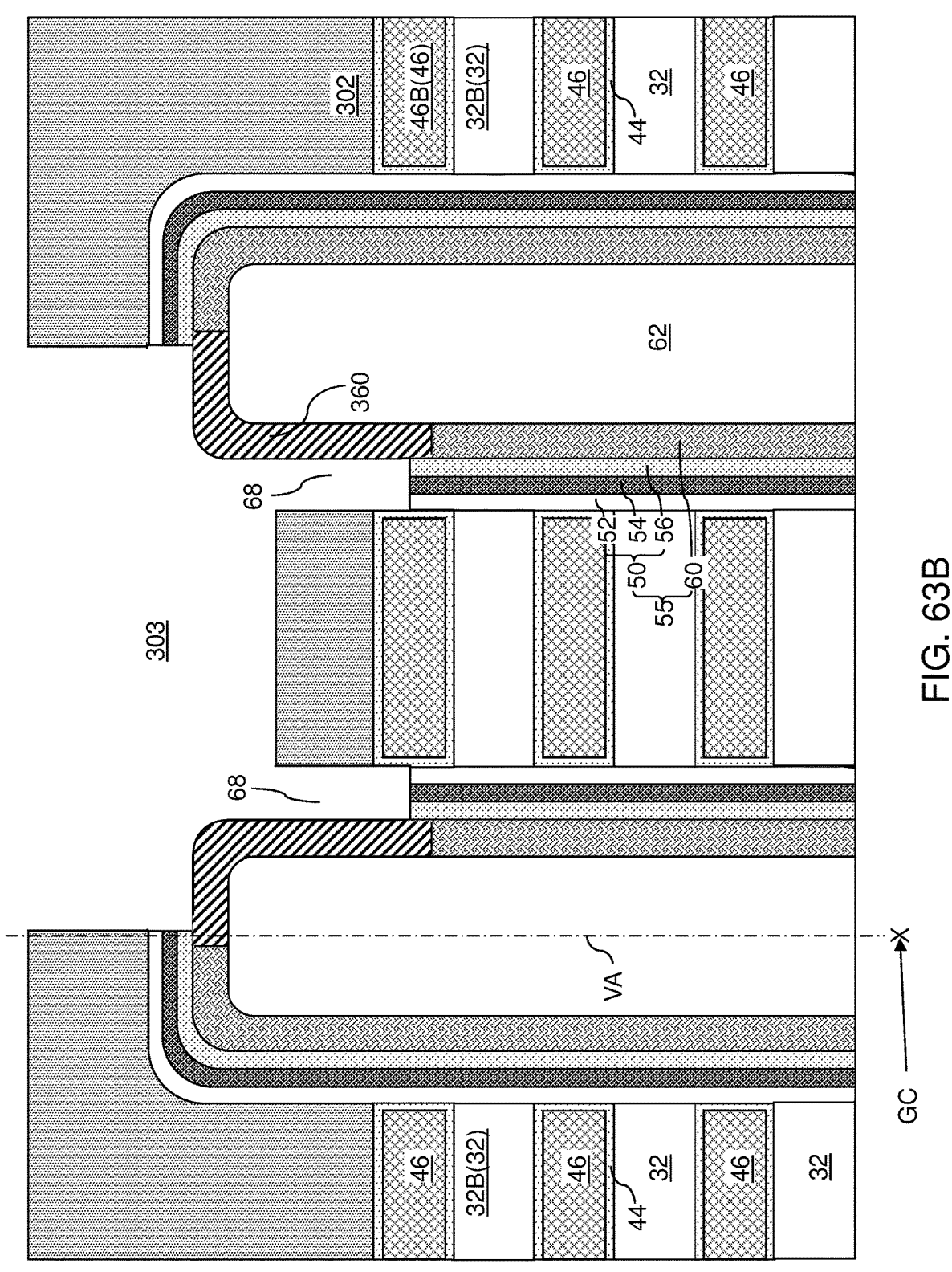

Referring to FIG. 63B, the semiconductor-to-metal conversion process described with reference to FIG. 55D can be performed to replace physically-exposed end portions of the vertical semiconductor channels 60 with metal capping layers 360. The metal capping layers 360 in the seventh exemplary structure may have the same material composition and the same thickness range as the metal capping layers 360 in the sixth exemplary structure.

In one embodiment, each metal capping layer 360 may have a thickness in a range from 50% to 120% of a thickness of the vertical semiconductor channel 60. The vertically-extending portion of each metal capping layer 360 may have a first azimuthal extent around a vertical axis VA passing through a geometrical center GC of the memory opening fill structure 58, the first azimuthal extent being not greater than $3\pi/2$. In one embodiment, a bottom surface of the metal capping layer 360 may be exposed below a horizontal plane that contains a horizontal surface of the etch-stop dielectric layer 302 that is exposed to a strip-shaped cavity 303, and a top surface of the metal capping layer 360 (which contacts a bottom end surface of the vertical semiconductor channel 60) is located above the horizontal plane.

Figure 63C:
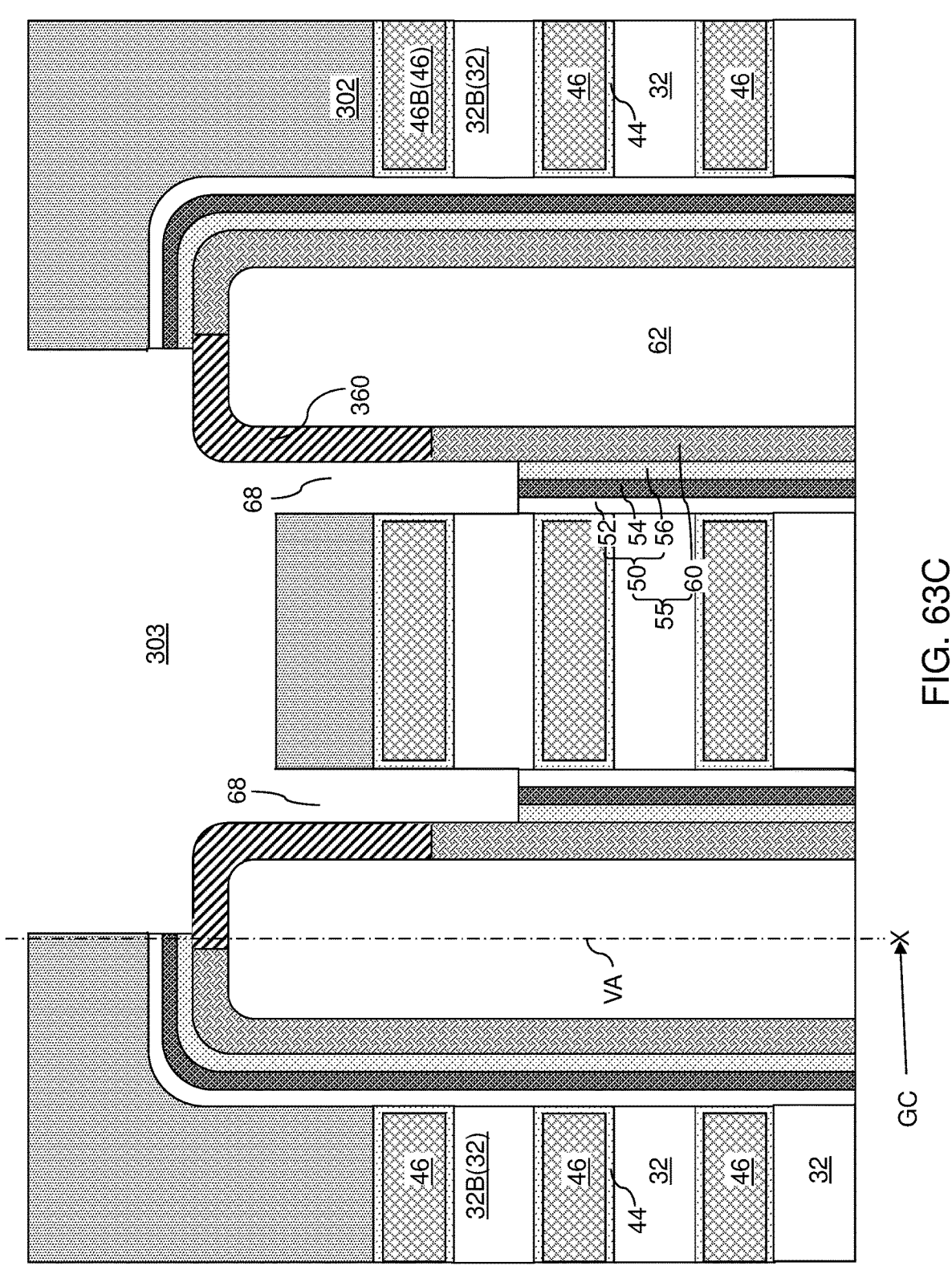

Referring to FIG. 63C, an anisotropic etch process can be performed to etch the materials of the memory films 50 selective to the materials of the metal capping layers 360 and selective to the material of the etch-stop dielectric layer 302 to further recess the memory films 50 and to expand the recess cavities 68 upward. In one embodiment, the anisotropic etch process may comprise a reactive ion etch process employing a fluorine-based etchant gas (such as $CF_4$ or $CHF_3$) as an etchant gas. Recessed end surfaces of the memory films 50 may be formed at or around the level of an insulating layer 32 that is more distal from the etch-stop dielectric layer 302 than the bottommost electrically conductive layer 46B is from the etch-stop dielectric layer 302. Each recess cavity 68 may have an azimuthal extent around a vertical axis VA passing through a geometrical center GC of the memory opening fill structure 58, the azimuthal extent being not greater than $3\pi/2$.

Figure 63D:
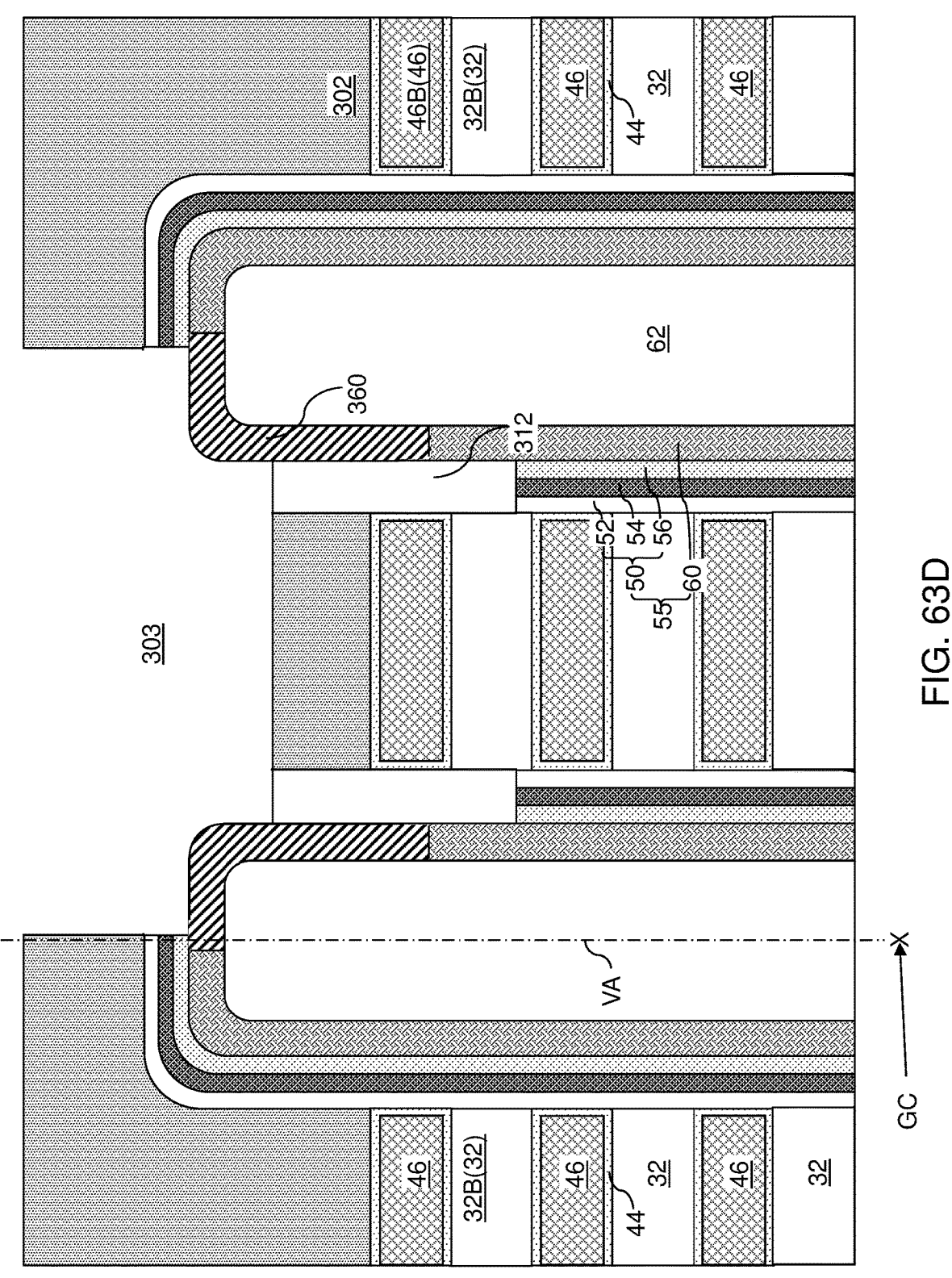

Referring to FIG. 63D, an insulating material layer can be conformally deposited in the recess cavities 68 around the metal capping layers 360 and over the etch-stop dielectric layer 302. The insulating material layer includes an insulating material, such as undoped silicate glass or a doped silicate glass. The thickness of the insulating material layer can be greater than one half of the lateral distance between an inner sidewall and an outer sidewall of each recess cavity 68. In one embodiment, the entirety of each recess cavity 68 can be filled with the insulating material layer. An isotropic etch process can be performed to remove portions of the insulating material layer that are located outside the recess cavities 68. Remaining portions of the insulating material layer that fill the recess cavities constitute the insulating spacers 312.

In one embodiment, the insulating spacer 312 has a first azimuthal extent around a vertical axis VA passing through a geometrical center GC of the memory opening fill structure 58, the first azimuthal extent being not greater than $3\pi/2$. The bottom surfaces of the memory film 50 contacts sidewalls of the insulating spacer 312.

Figure 63E:
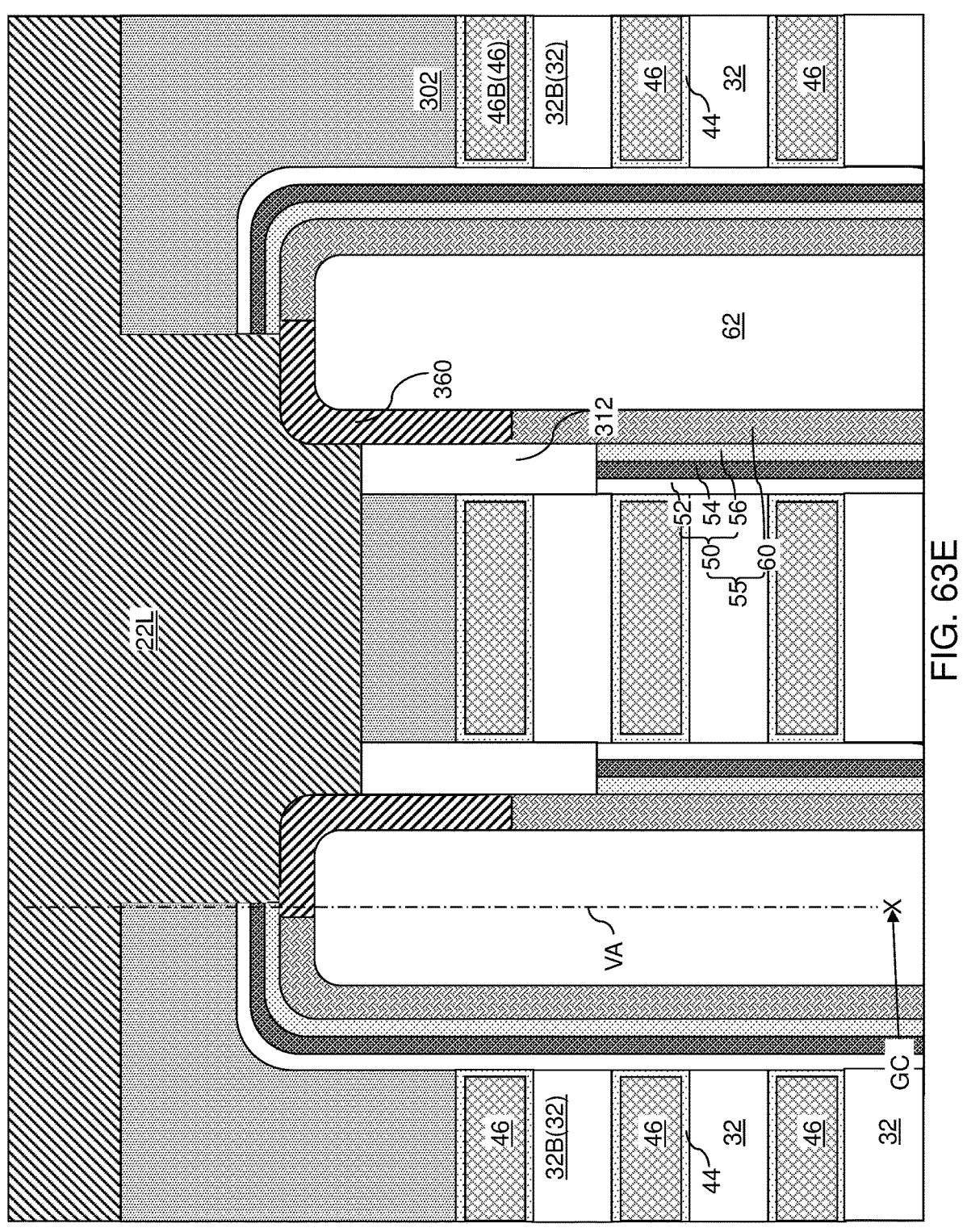

Referring to FIG. 63E, a continuous source layer 22L can be formed directly on each metal capping layer 360, and on the physically-exposed surfaces of the insulating spacers 312 and the memory films 50 in the strip-shaped cavities 303, and on the physically-exposed surfaces the etch-stop dielectric layer 302. In one embodiment, the continuous source layer 22L comprises an elemental metal (such as W, Co, Cu, Ru, Mo, Ti, Ta, etc.). The continuous source layer 22L may comprise the same metal (e.g., tungsten) as the metal capping layer 360. The thickness of a planar portion of the metal layer 22M may be in a range from 30 nm to 300 nm, although lesser and greater thicknesses may also be employed.

Figure 63F:
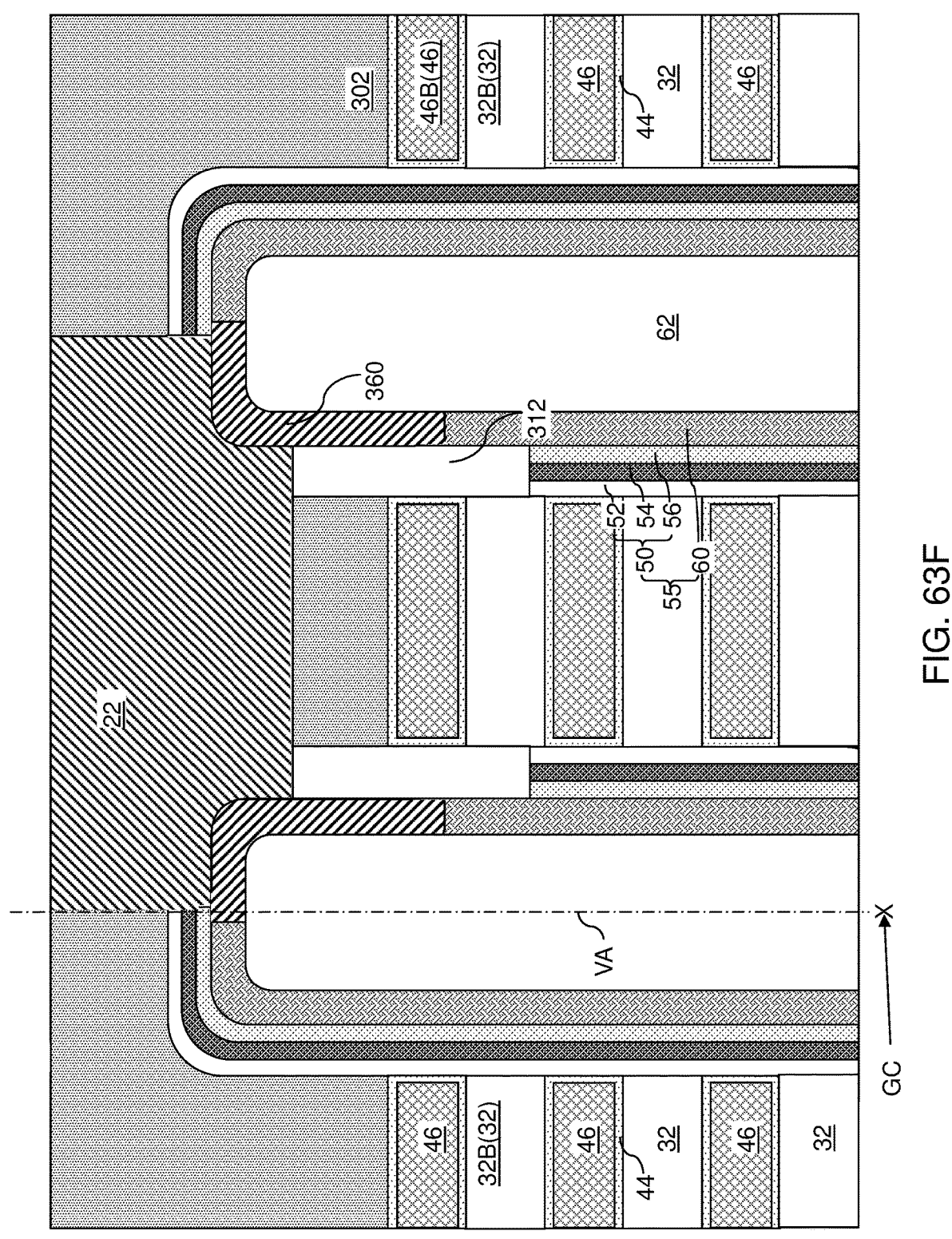

Referring to FIG. 63F, a chemical mechanical polishing process can be performed to remove portions of the continuous source layer 22L located below the etch-stop dielectric layer 302, which acts as a polish stop layer. Thus, portions of the continuous source layer 22L that are more distal from the alternating stack (32, 46) than the distal horizontal surface of the etch-stop dielectric layer 302 are removed. Each remaining portion of the continuous source layer 22L that fills the volume of a respective strip-shaped cavity constitutes the source layer 22, which is also referred to as a source strip. The distal planar surfaces of the source layers 22 may be coplanar with the distal planar surface of the etch-stop dielectric layer 302.

Each source layer 22 may contact surfaces of a respective pair of rows of metal capping layers 360, and contacts a horizontal bottom surface of the etch-stop dielectric layer 302 located between the pair of rows of the metal capping layers 360 (i.e., the bottom surface that is more proximal to the alternating stack (32, 46) than the distal horizontal surface of the etch-stop dielectric layer 302 is to the alternating stack (32, 46)). Each source layer 22 is embedded within the etch-stop dielectric layer 302. The bottommost surface of the etch-stop dielectric layer 302 may be coplanar with the bottom surface of each source layer 22.

In one embodiment, each memory opening fill structure 58 comprises a dielectric core 62 that is laterally surrounded by a vertical semiconductor channel 60. A metal capping layer 360 located on the memory opening fill structure 58 may comprise residual silicon atoms at a variable atomic concentration that decreases with a distance from an interface with the dielectric core 62. In one embodiment, a bottom surface of the metal capping layer 360 is located below a horizontal plane including a horizontal interface between the source layer 22 and the etch-stop dielectric layer 302, and a top surface of the metal capping layer 360 is located above the horizontal plane.

In one embodiment, each of the electrically conductive layers 46 is embedded within a respective outer blocking dielectric layer 44. In one embodiment, the etch-stop dielectric layer 302 is in direct contact with a horizontally-extending portion of a bottommost outer blocking dielectric layer 44. In one embodiment, an insulating spacer 312 may be in contact with the metal capping layer 360, the bottommost outer blocking dielectric layer 44, a bottommost insulating layer 32B within the alternating stack (32, 46), the vertical semiconductor channel 60, and the memory film 50.

Figure 63G:
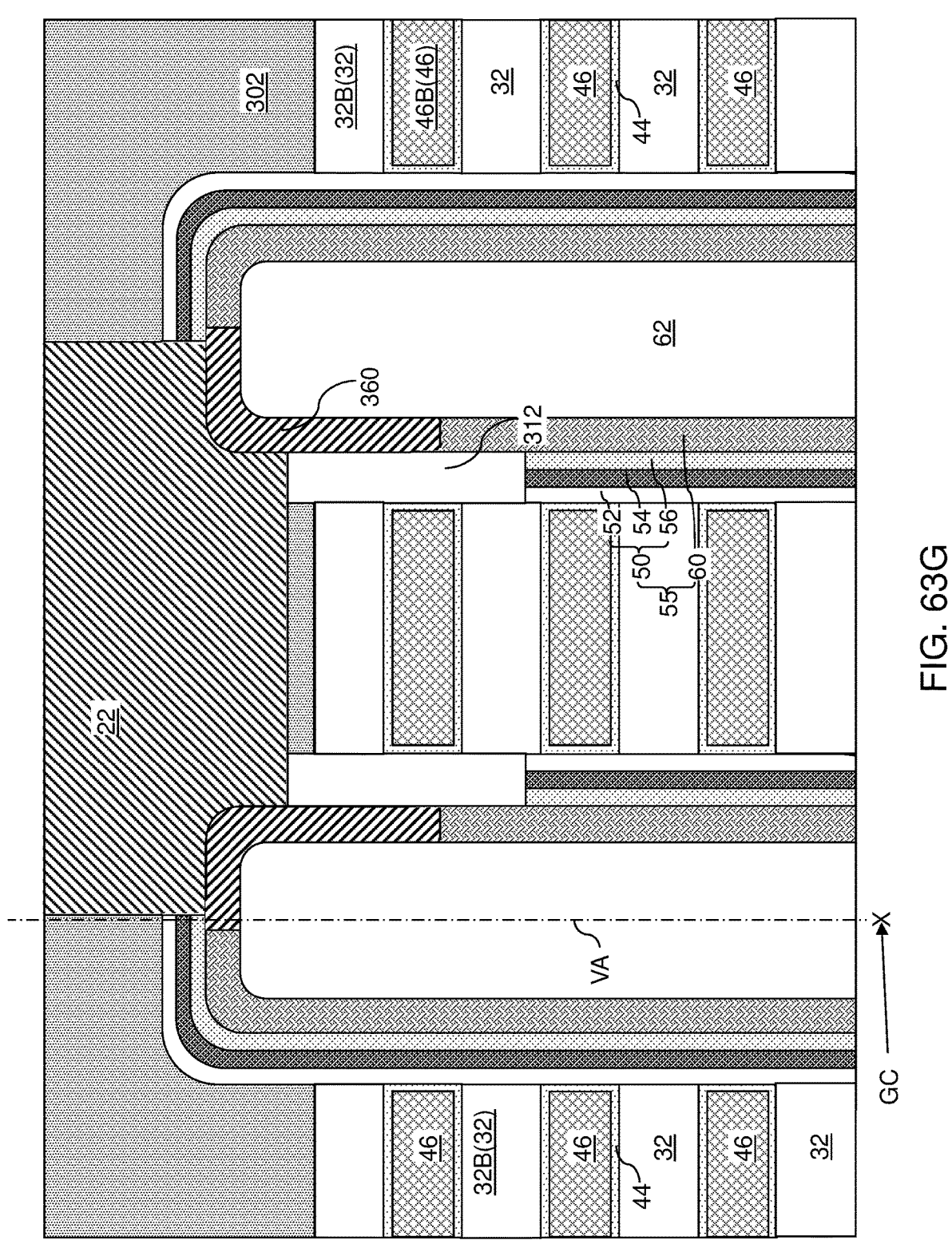
FIG. 63G is a vertical cross-sectional view of a region of an alternative configuration of the seventh exemplary structure according to the seventh embodiment of the present disclosure.

FIG. 63G is a vertical cross-sectional view of a region of an alternative configuration of the seventh exemplary structure according to the seventh embodiment of the present disclosure. The alternative configuration illustrated in FIG. 63G may be derived from the seventh exemplary structure by forming a bottommost insulating layer 32B as the first layer of an alternating stack of insulating layers 32 and sacrificial material layers 42 at the processing steps of FIG. 59. Thus, the etch-stop dielectric layer 302 may contact either the bottommost insulating layer 32B or the bottommost electrically conductive layer 46B in the alternating stack (32, 46).

Figure 64:
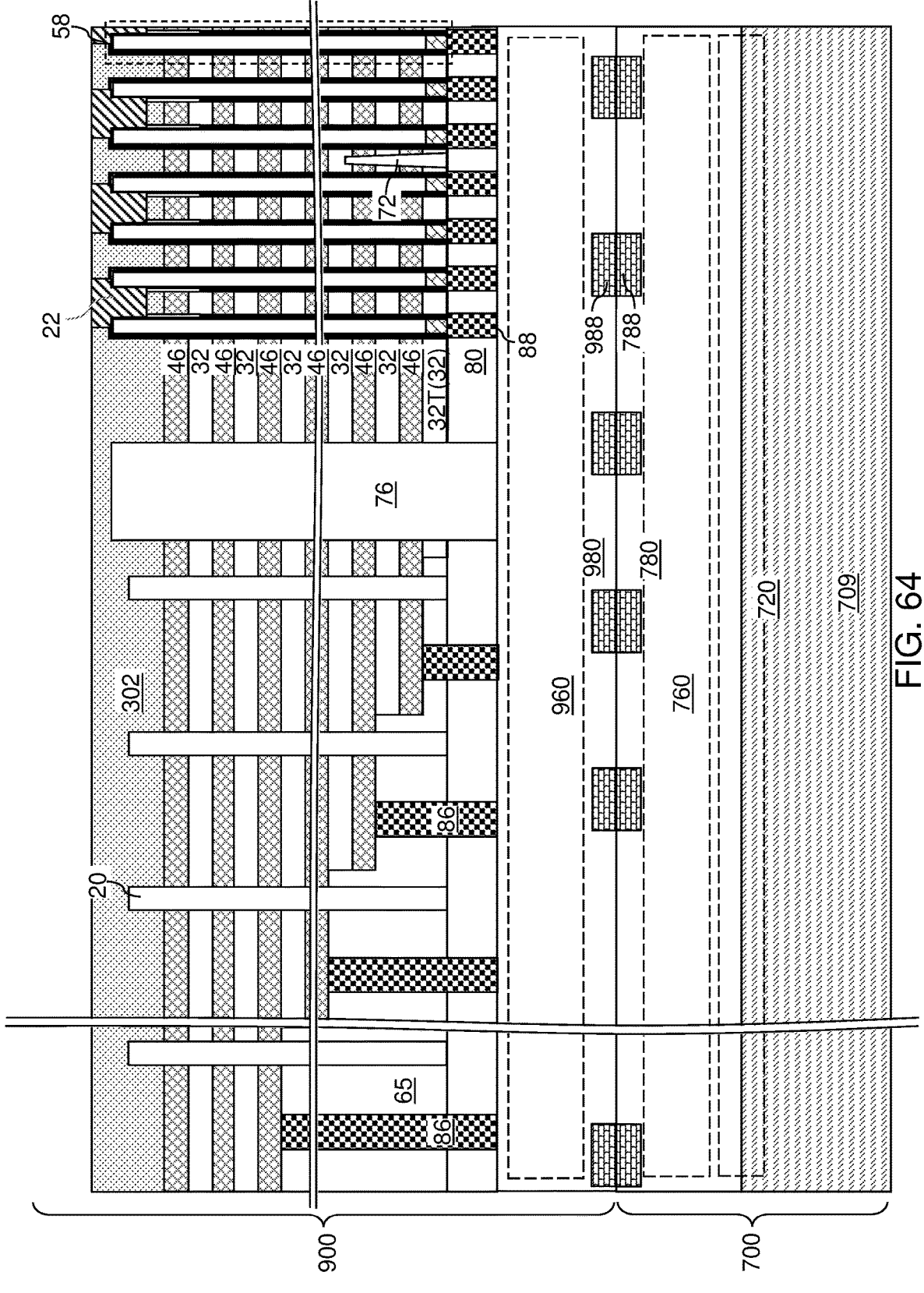
FIG. 64 is a vertical cross-sectional view of the seventh exemplary structure after formation of the Schottky source structure according to the seventh embodiment of the present disclosure.

Referring to FIG. 64, the seventh exemplary structure is illustrated after the processing steps of FIG. 63F or after the processing steps of FIG. 64G.

Figure 65:
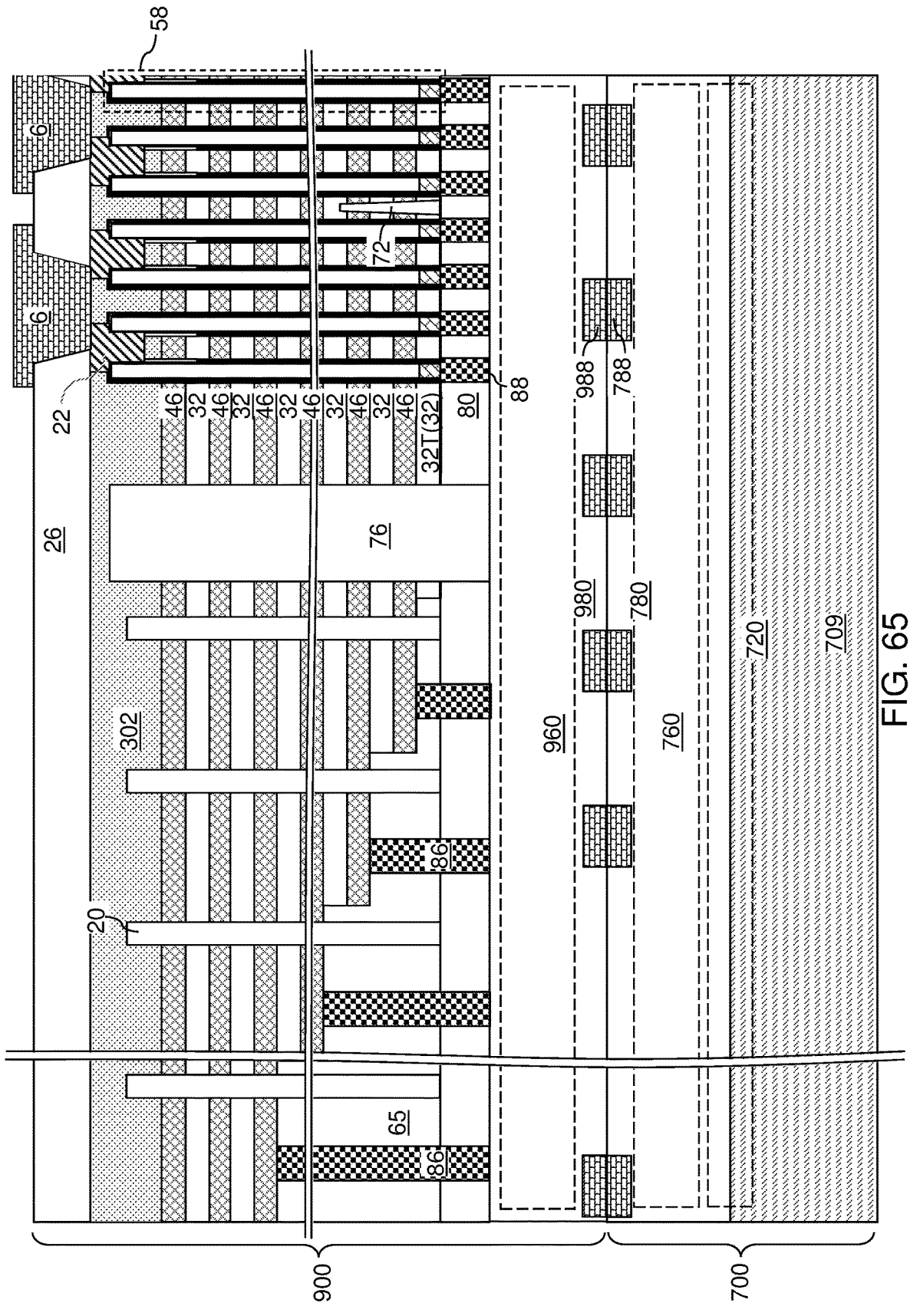
FIG. 65 is a vertical cross-sectional view of the seventh exemplary structure after formation of a backside dielectric layer and a source contact structure according to the seventh embodiment of the present disclosure.

Referring to FIG. 65, a backside dielectric layer 26 can be deposited over the source layers 22. Source contact structures 6 can be formed through the backside dielectric layer 26 on a respective one of the source layers 22. For example, the source contact structures 6 may comprise source lines which electrically contact two rows of the source layers 22 (i.e., two rows of the source strips). In one embodiment, if each memory block contains four rows of memory opening fill structures, then each source line (i.e., source contact structure 6) may electrically contact all source layers 22 (i.e., two source layers 22) in each memory block. In this embodiment, laterally adjacent memory blocks are electrically connected to separate source lines.

Thus, in the seventh embodiment, the source layer 22 comprises a source layer strip which contacts two rows of metal capping layers 360 which contact two rows of memory opening fill structures 58 in a first memory block; the first memory block contains two source layer strips 22; a first source line 6 electrically contacts the two source layer strips 22 in the first memory block; and a second source line 6 different from the first source line 6 electrically contacts additional source layer strips 22 in second memory block which is located laterally adjacent to the first memory block.

The various embodiments of the present disclosure can be employed to provide a source structure including a Schottky source contact structure for a three-dimensional memory device. The metal-semiconductor contact between each vertical semiconductor channel 60 and a source layer 22 or a metal capping layer 360 provides a Schottky contact, which provides a larger hole current to the vertical semiconductor channel 60 than a comparable Ohmic contact, during a GIDL erase step.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph of in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A semiconductor structure, comprising:
   a planar dielectric layer;
   an alternating stack of insulating layers and electrically conductive layers located over the planar dielectric layer;

a memory opening vertically extending through the alternating stack and the planar dielectric layer;

a memory opening fill structure located in the memory opening and comprising a semiconductor channel, a drain region electrically contacting an upper portion of the semiconductor channel, and a vertical stack of memory elements; and a source layer electrically contacting a lower portion of the semiconductor channel, wherein the source layer comprises a planar base portion and first, second and third step portions which protrude upwards toward the drain region from the planar base portion.

2. The semiconductor structure of claim 1, wherein the second step portion protrudes upward further then the first step portion, and third step portion protrudes upward further then the second step portion.

3. The semiconductor structure of claim 2, wherein:

the first step portion is laterally adjoined to the planar base portion;

the second step portion is laterally adjoined to the first step portion and is laterally surrounded by the first step portion; and the third step portion is laterally adjoined to the second step portion and is laterally surrounded by the second step portion.

4. The semiconductor structure of claim 3, wherein the semiconductor channel comprises:

a primary tubular portion that vertically extends through the alternating stack and an upper portion of the planar dielectric layer, and that comprises the upper portion of the semiconductor channel which electrically contacts the drain region;

a horizontal annular portion adjoined to a bottom end of the primary tubular portion; and a tubular base portion extending vertically or substantially vertically and adjoined to an outer periphery of the horizontal annular portion.

5. The semiconductor structure of claim 4, wherein the planar base portion of the source layer contacts a planar bottom surface of the planar dielectric layer.

6. The semiconductor structure of claim 5, wherein a top surface of the first step portion contacts a bottom surface tubular base portion of the semiconductor channel.

7. The semiconductor structure of claim 6, wherein a sidewall of the first step portion contacts a sidewall of the planar dielectric layer located in the memory opening.

8. The semiconductor structure of claim 7, wherein a top surface of the second step portion contacts the horizontal annular portion of the semiconductor channel.

9. The semiconductor structure of claim 8, wherein a sidewall of the second step portion contacts an inner sidewall of the tubular base portion of the semiconductor channel in the memory opening.

10. The semiconductor structure of claim 9, wherein:

the memory opening fill structure further comprises a dielectric core which is laterally surrounded by the primary semiconductor channel portion; and a top surface of the third step portion contacts a horizontal bottom surface of the dielectric core.

11. The semiconductor structure of claim 10, wherein a sidewall of the third step portion contacts an inner sidewall of the primary tubular portion of the semiconductor channel in the memory opening.

12. The semiconductor structure of claim 1, wherein the source layer comprises:

a metallic barrier liner comprising a conductive metallic nitride material in direct contact with the semiconductor channel and forming Schottky junction with the semiconductor channel; and a metal layer consisting essentially of an elemental metal and underlying the metallic barrier liner.

13. The semiconductor structure of claim 1, wherein the vertical stack of memory elements comprises a memory film.

14. The semiconductor structure of claim 13, wherein the memory film comprises:

a primary tubular portion that vertically extends through the alternating stack and an upper portion of the planar dielectric layer;

a horizontal annular portion adjoined to a bottom end of the primary tubular portion; and a tubular base portion extending vertically or substantially vertically and adjoined to an outer periphery of the horizontal annular portion.

15. A method of forming a semiconductor structure, comprising:

forming a stack of a first sacrificial pedestal and a second sacrificial pedestal in at least one planar dielectric layer that overlies a carrier substrate;

forming an alternating stack of insulating layers and spacer material layers over the planar dielectric layer, wherein the spacer material layers are formed as or are subsequently replaced with electrically conductive layers;

forming a memory opening through the alternating stack and into the second sacrificial pedestal;

removing the second sacrificial pedestal selective to the first sacrificial pedestal to expand the memory opening;

forming a memory opening fill structure in the expanded memory opening, wherein the memory opening fill structure comprises a memory film, a semiconductor channel and a drain region electrically contacting an upper portion of the semiconductor channel;

removing the carrier substrate;

removing the first sacrificial pedestal and an end portion of the memory film; and forming a source layer on a lower portion of the semiconductor channel and the at least one planar dielectric layer.

16. The method of claim 15, wherein:

the second sacrificial pedestal has a greater lateral dimension than a bottom portion of the memory opening that adjoins the second sacrificial pedestal; and the second sacrificial pedestal has a height that is greater than twice a sum of a thickness of the memory film and a thickness of the semiconductor channel.

17. The method of claim 15, wherein the step of forming the stack of the first sacrificial pedestal and the second sacrificial pedestal comprises:

forming an opening through the at least one planar dielectric layer;

forming the first sacrificial pedestal in a lower portion of the opening; and forming the second sacrificial pedestal in an upper portion of the opening.

18. The method of claim 15, wherein:

the at least one planar dielectric layer comprises a stack of a lower planar dielectric layer and an upper planar dielectric layer;

the first sacrificial pedestal is formed in an opening in the lower planar dielectric layer by forming a first opening in the lower planar dielectric layer and by filling the first opening with a first sacrificial fill material; and the second sacrificial pedestal is formed in an opening the upper planar dielectric layer which is deposited over the lower planar dielectric layer and over the first sacrificial pedestal such that a bottom surface of the second sacrificial pedestal contacts a top surface of the first sacrificial pedestal.

19. The method of claim 15, wherein:

the source layer comprises at least one metallic layer which forms a Schottky junction with the semiconductor channel;

the memory opening fill structure comprises a dielectric core that is laterally surrounded by the vertical semiconductor channel; and the method further comprises vertically recessing a bottom portion of the dielectric core prior to forming the source layer.

20. The method of claim 19, wherein the source layer comprises a planar base portion and first, second and third step portions which protrude upwards toward the drain region from the planar base portion.

\*  \*  \*  \*  \*